(12) United States Patent
Inasaki et al.

(10) Patent No.: US 8,735,048 B2
(45) Date of Patent: May 27, 2014

(54) ACTINIC RAY-SENSITIVE OR RADIATION-SENSITIVE RESIN COMPOSITION, RESIST FILM USING THE COMPOSITION AND PATTERN FORMING METHOD

(75) Inventors: Takeshi Inasaki, Shizuoka (JP); Takayuki Ito, Shizuoka (JP); Tomotaka Tsuchimura, Shizuoka (JP); Tadateru Yatsuo, Shizuoka (JP); Koutarou Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/575,833

(22) PCT Filed: Jan. 27, 2011

(86) PCT No.: PCT/JP2011/052193
§ 371 (c)(1),
(2), (4) Date: Jul. 27, 2012

(87) PCT Pub. No.: WO2011/093520
PCT Pub. Date: Aug. 4, 2011

(65) Prior Publication Data
US 2012/0301817 A1    Nov. 29, 2012

(30) Foreign Application Priority Data

Jan. 29, 2010 (JP) .................................. 2010-019677
Aug. 26, 2010 (JP) .................................. 2010-190109

(51) Int. Cl.
*G03F 7/039*    (2006.01)
*G03F 7/038*    (2006.01)
*G03F 7/20*     (2006.01)
*G03F 7/30*     (2006.01)

(52) U.S. Cl.
USPC .................. 430/270.1; 430/271.1; 430/275.1; 430/311; 430/325; 430/326; 430/905; 430/942; 430/966

(58) Field of Classification Search
None
See application file for complete search history.

(56) References Cited

U.S. PATENT DOCUMENTS

| 5,861,231 | A | 1/1999 | Barclay et al. |
| 6,042,997 | A | 3/2000 | Barclay et al. |

| 2004/0091817 | A1 | 5/2004 | Komatsu et al. |
| 2008/0090179 | A1 | 4/2008 | Takeda et al. |
| 2009/0202940 | A1 | 8/2009 | Hatakeyama et al. |
| 2009/0202947 | A1 | 8/2009 | Hatakeyama et al. |

FOREIGN PATENT DOCUMENTS

| JP | 2002169295 A | 6/2002 |
| JP | 2002341523 A | 11/2002 |
| JP | 2004158287 A | 6/2004 |
| JP | 200599558 A | 4/2005 |
| JP | 3843115 B2 | 8/2006 |
| JP | 200850568 A | 3/2008 |
| JP | 200895009 A | 4/2008 |
| JP | 2008162101 A | 7/2008 |
| JP | 2008268871 A | 11/2008 |
| JP | 200986354 A | 4/2009 |
| JP | 2009192617 A | 8/2009 |
| JP | 2009211050 A | 9/2009 |
| JP | 2009211051 A | 9/2009 |
| JP | 201139315 A | 2/2011 |
| WO | 2007046453 A1 | 4/2007 |

OTHER PUBLICATIONS

Machine-assisted English translation of JP2005-99558 (Mizutani et al), as provided by JPO.*
International Search Report dated Mar. 8, 2011 from the International Searching Authority in counterpart application No. PCT/JP2011/052193.
Written Opinion dated Mar. 8, 2011 from the International Searching Authority in counterpart application No. PCT/JP2011/052193.
Office Action dated Dec. 26, 2013 issued by the State Intellectual Property Office of P.R. China in corresponding Chinese Application No. 201180000740 8.6.
Office Action dated Jan. 28, 2014 issued by the Japanese Patent Office in counterpart Japanese Patent Application No. 2010-190109.

* cited by examiner

*Primary Examiner* — Sin J. Lee
(74) *Attorney, Agent, or Firm* — Sughrue Mion, PLLC

(57) ABSTRACT

An actinic ray-sensitive or radiation-sensitive resin composition comprising (P) a resin having a repeating unit represented by the following formula (1), a resist film using the composition, and a pattern forming method.

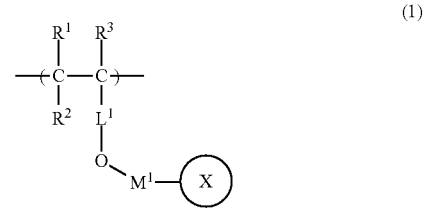

15 Claims, No Drawings

ACTINIC RAY-SENSITIVE OR RADIATION-SENSITIVE RESIN COMPOSITION, RESIST FILM USING THE COMPOSITION AND PATTERN FORMING METHOD

TECHNICAL FIELD

The present invention relates to an actinic ray-sensitive or radiation-sensitive resin composition, a resist film using the composition, and a pattern forming method. In particular, the present invention relates to an actinic ray-sensitive or radiation-sensitive composition suitably used in the ultramicrolithography process applicable to, for example, the production process of VLSI or a high-capacity microchip, the preparation process of a nanoimprint mold, or the production process of a high-density information recording medium, and in other photofabrication processes, and a resist film using the composition, and a pattern forming method. More specifically, the present invention relates to an actinic ray-sensitive or radiation-sensitive composition suitably usable in the semiconductor device microfabrication using an electron beam or EUV light, a resist film using the composition, and a pattern forming method.

BACKGROUND ART

In the microfabrication using a resist composition, with an increase in the integration degree of an integrated circuit, formation of an ultrafine pattern is required. To meet this requirement, the exposure wavelength tends to become shorter and, for example, development of a lithography technique using an electron beam, an X-ray or EUV light in place of excimer laser light is proceeding.

In order to form such an ultrafine pattern, thin film formation of the resist is necessary, but when the resist is formed as a thin film, its dry etching resistance is sometimes impaired.

In the electron beam (EB) lithography, it is known that the effect of electron scattering in the resist film, that is, forward scattering, is reduced by increasing the accelerating voltage of EB. For this reason, recently, there is a tendency to increase the accelerating voltage of EB. However, when the accelerating voltage of EB is increased, the resist film is sometimes reduced in the electron energy trapping ratio and in turn, in the sensitivity.

As one of methods to solve such a problem, use of a resin having a polycyclic aromatic structure, such as naphthalene, is being studied (see, for example, JP-A-2008-95009 (the term "JP-A" as used herein means an "unexamined published Japanese patent application"), International Publication No. 2007-046453, JP-A-2008-50568, JP-A-2008-268871, JP-A-2009-86354). By using a resin having a polycyclic aromatic structure, for example, dry etching resistance and sensitivity can be enhanced.

When the accelerating voltage of EB is increased, the effect of forward scattering becomes small, but the effect of scattering of electrons reflected on the resist substrate, that is, back scattering, increases. This effect of back scattering is great particularly when forming an isolated pattern having a large exposure area. Therefore, the increase of accelerating voltage of EB may cause, for example, reduction in the resolution of an isolate pattern.

Particularly, in the case of patterning a photomask blank used for semiconductor exposure, a light-shielding film containing a heavy atom such as chromium, molybdenum and tantalum is present as a resist underlayer and compared with the case of coating a resist on a silicon wafer, the effect of back scattering attributable to reflection from the resist underlayer is more prominent. Therefore, formation of an isolated pattern on a photomask blank is susceptible to the effect of back scattering and the resolution is highly likely to decrease.

As one of the methods to enhance the resolution of an isolated pattern, use of a resin containing a group for adjusting the solubility of the resin is being studied (see, for example, Japanese Patent No. 3,843,115, JP-A-2005-99558), but it has not been achieved to sufficiently satisfy the resolution and rectangularity of an isolated pattern.

In late years, other than the excimer laser light, development of lithography using an electron beam, an X-ray or EUV light is proceeding. Furthermore, microfabrication by a resist composition is applied not only directly to the production of an integrated circuit but recently also to the fabrication of a so-called imprint mold structure (see, for example, JP-A-2004-158287, JP-A-2008-162101, Yoshihiko Hirai (compiler), *Nanoimprint no Kiso to Gijutsu Kaihatsu/Oyo Tenkai-Nanoimprint no Kiban Gijutsu to Saishin no Gijutsu Tenkai (Basic and Technology Expansion/Application Development of Nanoimprint-Substrate Technology of Nanoimprint and Latest Technology Expansion)*, Frontier Shuppan (issued June, 2006)). Therefore, particularly in the case of forming an isolated pattern by using an X-ray, a soft X-ray or an electron beam for the exposure light source, it is also an important task to simultaneously satisfy high sensitivity, high resolution and good dry etching resistance, and this needs to be solved.

SUMMARY OF INVENTION

An object of the present invention is to provide an actinic ray-sensitive or radiation-sensitive resin composition capable of forming a pattern simultaneously satisfying high sensitivity, high resolution and good dry etching resistance even in the formation of an isolated pattern, a resist film using the composition, and a pattern forming method.

[1] An actinic ray-sensitive or radiation-sensitive resin composition comprising (P) a resin having a repeating unit represented by the following formula (1):

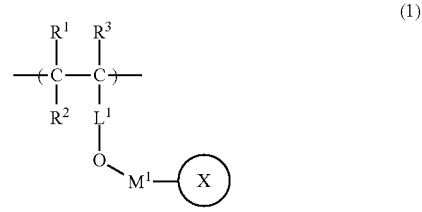

(1)

wherein each of $R^1$ to $R^3$ independently represents a hydrogen atom or a monovalent substituent, $L^1$ represents an arylene group, $M^1$ represents an alkylene group, a cycloalkylene group, an alkenylene group, —O—, —S— or a group comprising a combination of two or more of these members, X represents a group containing a plurality of aromatic rings, and the plurality of aromatic rings are condensed to form a polycyclic structure or connected to each other through a single bond.

[2] The actinic ray-sensitive or radiation-sensitive resin composition according to [1] above, wherein the resin (P) further contains a repeating unit represented by the following formula (2) and at least either one of a repeating unit represented by the following formula (3) and a repeating unit represented by the following formula (4):

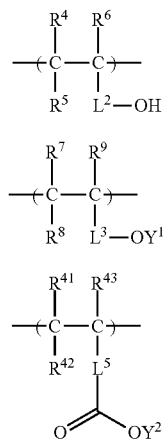

wherein each of $R^4$ to $R^9$ and $R^{41}$ to $R^{43}$ independently represents a hydrogen atom or a monovalent substituent, each of $L^2$ and $L^3$ independently represents an arylene group, $L^5$ represents a single bond or a divalent linking group, and each of $Y^1$ and $Y^2$ represents a group capable of leaving by the action of an acid.

[3] The actinic ray-sensitive or radiation-sensitive resin composition according to [1] or [2] above, wherein X is a group formed by removing one arbitrary hydrogen atom bonded to an atom constituting a plurality of aromatic rings or $R^{11}$ in the structural moiety represented by any one of the following formulae (X1) to (X6):

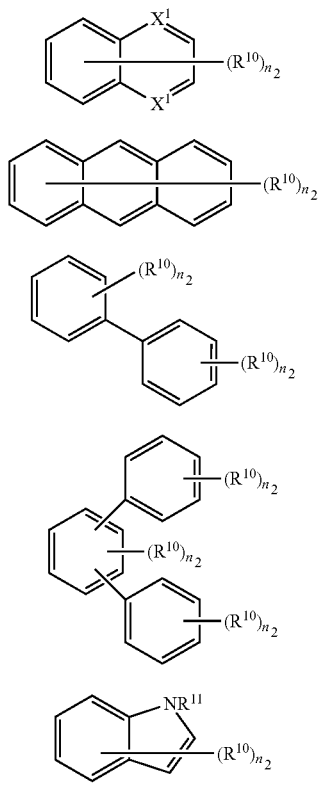

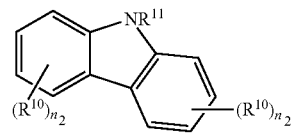

wherein $R^{10}$ represents a monovalent substituent and when a plurality of $R^{10}$'s are present, each $R^{10}$ may be the same as or different from every other $R^{10}$;

$R^{11}$ represents a hydrogen atom, an alkyl group, a cycloalkyl group or a bond bonded to $M^1$;

$n_2$ is independently an integer of 0 to 14;

$X^1$ represents CH or N, and two $X^1$'s may be the same or different; and each of $M^1$ and $R^{10}$ may be bonded to any atom constituting the plurality of aromatic rings.

[4] The actinic ray-sensitive or radiation-sensitive resin composition according to [2] or [3] above, wherein the resin (P) contains a repeating unit represented by formula (3) and at the same time, $Y^1$ is a group represented by the following formula (5):

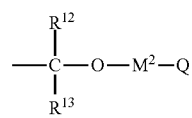

wherein each of $R^{12}$ and $R^{13}$ independently represents a hydrogen atom, an alkyl group, a cycloalkyl group, an aryl group, an aralkyl group, or a combination of two or more thereof, $M^2$ represents a single bond or a divalent linking group, Q represents an alkyl group, an alicyclic group which may contain a heteroatom, or an aromatic ring group which may contain a heteroatom, and at least two members of $R^{12}$, $R^{13}$, $M^2$ and Q may combine with each other to form a ring.

[5] The actinic ray-sensitive or radiation-sensitive resin composition according to any one of [1] to [4] above, wherein the resin (P) further contains a repeating unit represented by the following formula (6):

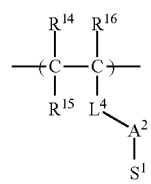

wherein each of $R^{14}$, $R^{15}$ and $R^{16}$ independently represents a hydrogen atom or a monovalent substituent, $L^4$ represents an arylene group, $A^2$ represents a single bond or a divalent linking group, and $S^1$ represents a structural moiety capable of decomposing upon irradiation with an actinic ray or radiation to generate an acid in the side chain.

[6] The actinic ray-sensitive or radiation-sensitive resin composition according to any one of [2] to [4] above, wherein the C Log P value of the resin (P) after leaving of $Y^1$ and $Y^2$ is 2.6 or more.

[7] The actinic ray-sensitive or radiation-sensitive resin composition according to any one of [2] to [4] above, wherein the resin (P) further contains a repeating unit represented by the following formula (6) and at the same time, the C Log P value of the resin (P) after leaving of $Y^1$ and $Y^2$ and decomposition of $S^1$ in the following formula (6) to generate an acid in the side chain is 2.6 or more.

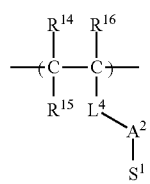

(6)

wherein each of $R^{14}$, $R^{15}$ and $R^{16}$ independently represents a hydrogen atom or a monovalent substituent, $L^4$ represents an arylene group, $A^2$ represents a single bond or a divalent linking group, and $S^1$ represents a structural moiety capable of decomposing upon irradiation with an actinic ray or radiation to generate an acid in the side chain.

[8] The actinic ray-sensitive or radiation-sensitive resin composition according to any one of [1] to [7] above, wherein the molecular weight distribution (Mw/Mn) of the resin (P) is from 1.00 to 1.30.

[9] The actinic ray-sensitive or radiation-sensitive resin composition according to any one of [1] to [8] above, which is exposed with an electron beam, an X-ray or EUV light.

[10] A resist film formed using the actinic ray-sensitive or radiation-sensitive resin composition according to any one of [1] to [9] above.

[11] A resist-coated mask blank coated with the resist film according to [10] above.

[12] A pattern forming method comprising exposing the resist film according to [10] above and developing the exposed film.

[13] A pattern forming method comprising exposing the resist-coated mask blank according to [11] above and developing the exposed mask blank.

[14] The pattern forming method according to [12] or [13] above, wherein the exposure is performed using an electron beam, an X-ray or EUV light.

In the present invention, the following embodiments are also preferred.

[15] The actinic ray-sensitive or radiation-sensitive resin composition according to any one of [1] to [9] above, wherein in formula (1), $M^1$ is an alkylene group, —O— or a combination thereof.

[16] The actinic ray-sensitive or radiation-sensitive resin composition according to any one of [1] to [9] and [15] above, wherein in formula (1), the minimum number of linked atoms of $M^1$ is from 1 to 15.

[17] The actinic ray-sensitive or radiation-sensitive resin composition according to any one of [1] to [9] and [15] above, wherein in formula (1), the minimum number of linked atoms of $M^1$ is from 1 to 10.

[18] The actinic ray-sensitive or radiation-sensitive resin composition according to any one of [1] to [9] and [15] above, wherein in formula (1), the minimum number of linked atoms of $M^1$ is from 1 to 5.

[19] The actinic ray-sensitive or radiation-sensitive resin composition according to any one of [1] to [9] and [15] to [18] above, wherein the content of the repeating unit represented by formula (1) occupying in the resin (P) is from 1 to 40 mol % based on all repeating units.

[20] The actinic ray-sensitive or radiation-sensitive resin composition according to any one of [1] to [9] and [15] to [18] above, wherein the content of the repeating unit represented by formula (1) occupying in the resin (P) is from 3 to 30 mol % based on all repeating units.

[21] The actinic ray-sensitive or radiation-sensitive resin composition according to any one of [1] to [9] and [15] to [18] above, wherein the content of the repeating unit represented by formula (1) occupying in the resin (P) is from 5 to 20 mol % based on all repeating units.

According to the present invention, an actinic ray-sensitive or radiation-sensitive resin composition capable of forming a pattern simultaneously satisfying high sensitivity, high resolution and good dry etching resistance even in the formation of an isolated pattern, a resist film using the composition, and a pattern forming method can be provided.

DESCRIPTION OF EMBODIMENTS

The mode for carrying out the present invention is described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation. In the present invention, unless otherwise indicated, the "exposure" includes not only exposure to a mercury lamp, a far ultraviolet ray typified by excimer laser, an X-ray, EUV light or the like but also lithography with a particle beam such as electron beam and ion beam.

The actinic ray-sensitive or radiation-sensitive resin composition of the present invention is, for example, a positive composition and is typically a positive resist composition. The configuration of this composition is described below.

[1] Resin (P)

The composition according to the present invention contains a resin (P). This resin (P) contains a repeating unit represented by the following formula (1) (hereinafter sometimes referred to as a "repeating unit (1)").

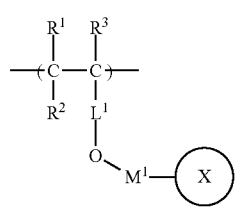

(1)

wherein each of $R^1$ to $R^3$ independently represents a hydrogen atom or a monovalent substituent, $L^1$ represents an arylene group, $M^1$ represents an alkylene group, a cycloalkylene group, an alkenylene group, —O—, —S— or a group comprising a combination of two or more of these members, X represents a group containing a plurality of aromatic rings, and the plurality of aromatic rings are condensed to form a polycyclic structure or connected to each other through a single bond.

In formula (1), each of $R^1$ to $R^3$ is, as described above, a hydrogen atom or a monovalent substituent. Examples of the monovalent substituent include an alkyl group; a cycloalkyl group; a halogen atom; a substituent containing a heteroatom such as oxygen atom, sulfur atom, nitrogen atom and silicon atom; and a combination of two or more thereof.

The carbon number of the alkyl group is preferably 20 or less, more preferably 8 or less. Examples of this alkyl group include a methyl group, an ethyl group, a propyl group, an isopropyl group, an n-butyl group, a sec-butyl group, a tert-butyl group, a hexyl group, a 2-ethylhexyl group, an octyl group and a dodecyl group. Among these, a methyl group, an ethyl group, a propyl group, an isopropyl group and a tert-butyl group are preferred.

The cycloalkyl group may be monocyclic or polycyclic, and the carbon number of this cycloalkyl group is preferably from 3 to 8.

The halogen atom includes a fluorine atom, a chlorine atom, a bromine atom and an iodine atom. Among these, a chlorine atom, a bromine atom and an iodine atom are preferred, and a bromine atom is more preferred.

Examples of the substituent containing a heteroatom include a hydroxyl group, an alkoxy group, a thiol group, a thioether group, a nitro group, a nitroso group, a cyano group, an amino group, an acyloxy group and an acylamido group.

The carbon number of the alkoxy group, acyloxy group and acylamido group is preferably 20 or less, more preferably 8 or less. Examples of the alkoxy group include a methoxy group, an ethoxy group, a propoxy group, an isopropoxy group, an n-butyloxy group, a tert-butoxy group and an octyloxy group. Among these, a methoxy group, an ethoxy group, a propoxy group, an isopropoxy group and a tert-butoxy group are preferred. Examples of the thioether group are the same as those of the alkoxy group except for using a sulfur atom in place of an oxygen atom. Examples of the acyloxy group include an acetyloxy group. Examples of the acylamido group include an acetylamido group.

The alkyl group, the cycloalkyl group and the group containing a heteroatom may further have a substituent.

Examples of the substituent which the alkyl group may further have include a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Examples of the substituent which the cycloalkyl group and the group containing a heteroatom may further have include those groups described above as specific examples of the alkyl group and the substituent which the alkyl group may further have.

The carbon number of the substituent which the alkyl group, the cycloalkyl group and the group containing a heteroatom may have is preferably 8 or less.

$L^1$ represents, as described above, an arylene group. This arylene group may have a heterocyclic ring. Also, the arylene group may further have a substituent.

The carbon number of the arylene group is preferably from 4 to 20, more preferably from 6 to 14. Examples of the arylene group include a phenylene group and a naphthylene group.

Examples of the substituent which the arylene group may further have include a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12) and an alkoxycarbonyloxy group (preferably having a carbon number of 2 to 7).

$M^1$ is, as described above, an alkylene group (e.g., methylene, ethenylene, propylene, butylene, hexylene, octylene), a cycloalkylene group (e.g., cyclopentylene, cyclohexylene), an alkenylene group (e.g., ethylene, propenylene, butenylene), —S—, —O—, or a group comprising a combination of two or more of these members. Here, $M^1$ is a group incapable of decomposing by the action of an acid.

$M^1$ is preferably an alkylene group, —S—, —O— or a combination thereof, more preferably an alkylene group, an alkylenethio group or an alkyleneoxy group, still more preferably an alkylene group or an alkyleneoxy group, yet still more preferably an alkylene group. The carbon number of the alkylene group, the alkylenethio group and the alkyleneoxy group is preferably from 1 to 5, more preferably from 1 to 3.

In the case where $M^1$ is a group comprising a combination of two or more of the members above and at the same time, is a group containing —S— or —O—, the —S— or —O— is preferably directly bonded to the group X and is not directly bonded to the oxygen atom bonded to $L^1$. For example, when $M^1$ is an alkylenethio group or an alkyleneoxy group, it is preferred that the alkylene group of such a group is directly bonded to the oxygen atom bonded to $L^1$ and —S— or —O— of the group is directly bonded to the group X.

The group X (a group containing a plurality of aromatic rings) contained in the repeating unit (1) of the resin (P) is considered to have a function of decreasing the alkali solubility of the resin (P), and this function probably contributes to the enhancement of resolution in the formation of a pattern (particularly, an isolated pattern), but if the alkali solubility of the resin (P) is too low, a desired pattern is not formed and the resolution tends to decrease.

In the present invention, $M^1$ defined as above intervenes between $L^1$ and X and thanks to the above-described function of the group X, the alkali solubility of the resin is prevented from excessively decreasing. Maybe for this reason, the resolution of a pattern (particularly, an isolated pattern) can be unfailingly enhanced.

The alkylene group is preferably an alkylene group having a carbon number of 1 to 12, such as methylene group, ethylene group, propylene group, butylene group, hexylene group, octylene group and dodecanylene group.

The cycloalkylene group is preferably a cycloalkylene group having a carbon number of 5 to 8, such as cyclopentylene group and cyclohexylene group.

These alkylene group and cycloalkylene group may further have a substituent.

Examples of the substituent which the alkylene group may further have include a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Examples of the substituent which the cycloalkylene group may further have include the groups described above as specific examples of the substituent which the alkyl group and the alkylene group may further have.

The "minimum number of linked atoms" of $M^1$ is preferably from 1 to 15, more preferably 1 to 10, still more preferably 1 to 5. If the "minimum number of linked atoms" is excessively large, the glass transition temperature of the resin (P) lowers and the acid generated in the film upon exposure is likely to diffuse, as a result, the roughness characteristics, resolution and the like may deteriorate.

Incidentally, the "minimum number of linked atoms" of $M^1$ is the number determined as follows. That is, out of atoms constituting $M^1$, a sequence of atoms connecting an atom bonded to the oxygen atom adjacent to $L^1$ and an atom bonded to X is selected, the number of atoms contained in each sequence is determined, and the minimum number of atoms thereamong is defined as the "minimum number of linked atoms" of $M^1$.

For example, when $M^1$ is a propylene group, the minimum number of linked atoms is 3; when $M^1$ is —$CH_2$—O—, the minimum number of linked atoms is 2; when $M^1$ is a 2-methyl-butylene group, the minimum number of linked atoms is 4; when $M^1$ is a cyclohexylene group, the minimum number of linked atoms is 4; and when $M^1$ is —O—$CH_2CH_2CH_2$—O—, the minimum number of linked atoms is 5. Incidentally, when $M^1$ is a linear alkylene group, the minimum number of linked atoms of $M^1$ is equal to the carbon number thereof.

X represents, as described above, a group containing a plurality of aromatic rings. The plurality of aromatic rings may be fused to form a polycyclic structure or may be connected with each other through a single bond. Here, each of these aromatic rings may contain a heteroatom. By using, as X, a structural unit containing a plurality of aromatic rings, enhancement of resolution based on the above-described function of decreasing the alkali solubility of the resin (P) and enhancement of sensitivity attributable to increase in the amount of secondary electrons generated can be attained.

Examples of the aromatic ring which X may contain include a benzene ring, a thiophene ring, a pyrrole ring, a furan ring, an imidazole ring, a pyridine ring and a pyrazole ring.

Examples of the polycyclic structure which may be formed by fusing a plurality of aromatic rings include a naphthalene ring, an anthracene ring, a phenanthrene ring, a pyrene ring, a triphenylene ring, an indole ring, a benzimidazole ring, a carbazole ring and a phenothiazine ring. Among these, an indole ring, a pyrene ring, a phenanthrene ring, an anthracene ring and a naphthalene ring are preferred, and an indole ring, an anthracene ring and a naphthalene ring are more preferred.

Examples of the structure where a plurality of aromatic rings are connected with each other through a single bond include a biphenyl structure, a terphenyl structure and a violo-gen structure. Among these, a biphenyl structure and a terphenyl structure are preferred.

The number of aromatic rings contained in X is preferably from 2 to 6, more preferably from 2 to 4, still more preferably 2 or 3. The term "number of aromatic rings" as used herein is the number of benzene rings or corresponding monocyclic heteroaryl rings. For example, that of the naphthalene residue structure, biphenyl residue structure and bipyridine residue structure is 2, and that of the anthracene residue structure, carbazole residue structure and phenothiazine residue structure is 3.

X is preferably a group formed by removing one arbitrary hydrogen atom bonded to an atom constituting a plurality of aromatic rings or $R^{11}$ in the structural moiety represented by any one of the following formulae (X1) to (X6):

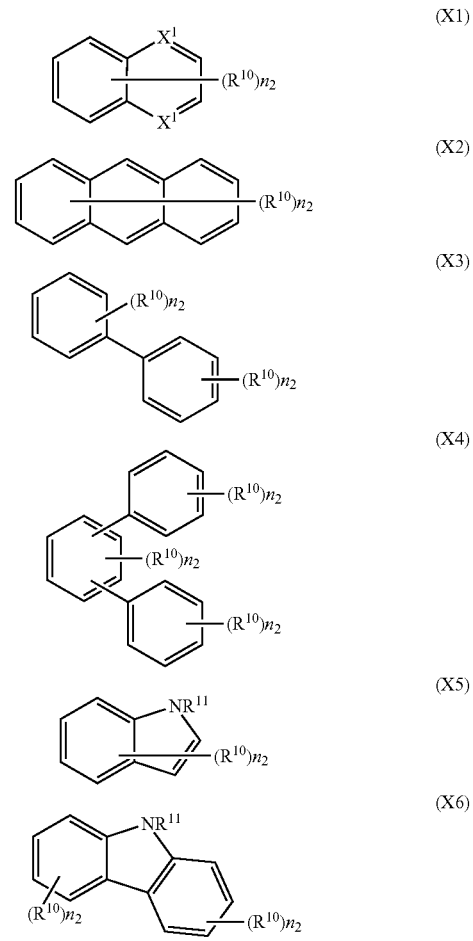

wherein $R^{10}$ represents a monovalent substituent and when a plurality of $R^{10}$'s are present, each $R^{10}$ may be the same as or different from every other $R^{10}$; $R^{11}$ represents a hydrogen atom, an alkyl group, a cycloalkyl group or a bond bonded to $M^1$ in formula (1); $n_2$ is independently an integer of 0 to 14; $X^1$ represents CH or N, and two $X^1$'s may be the same or different. In these X, each of $M^1$ and $R^{10}$ may be bonded to any atom constituting the plurality of aromatic rings.

$R^{10}$ is, as described above, a monovalent substituent. Examples of the monovalent substituent are the same as those enumerated above for $R^1$ to $R^3$ (excluding a hydroxyl group and a carboxyl group). Among these, a halogen atom such as fluorine atom and bromine atom, a nitro group, a nitroso group, a cyano group, an acetyloxy group, an acetylamido group and a methoxy group are preferred.

$R^{11}$ is, as described above, a hydrogen atom, an alkyl group, a cycloalkyl group or a bond bonded to $M^1$ in formula (1). Examples of the alkyl group and cycloalkyl group are the same as those enumerated above for $R^1$ to $R^3$.

$n_2$ is, as described above, an integer of 0 to 14. $n_2$ is preferably an integer of 0 to 10, more preferably an integer of 0 to 8.

Specific examples of the structural unit represented by any one of formulae (X1) to (X6) are illustrated below, but the present invention is not limited thereto. In specific examples, $M^1$ indicates $M^1$ in formula (1), and Ac indicates an acetyl group.

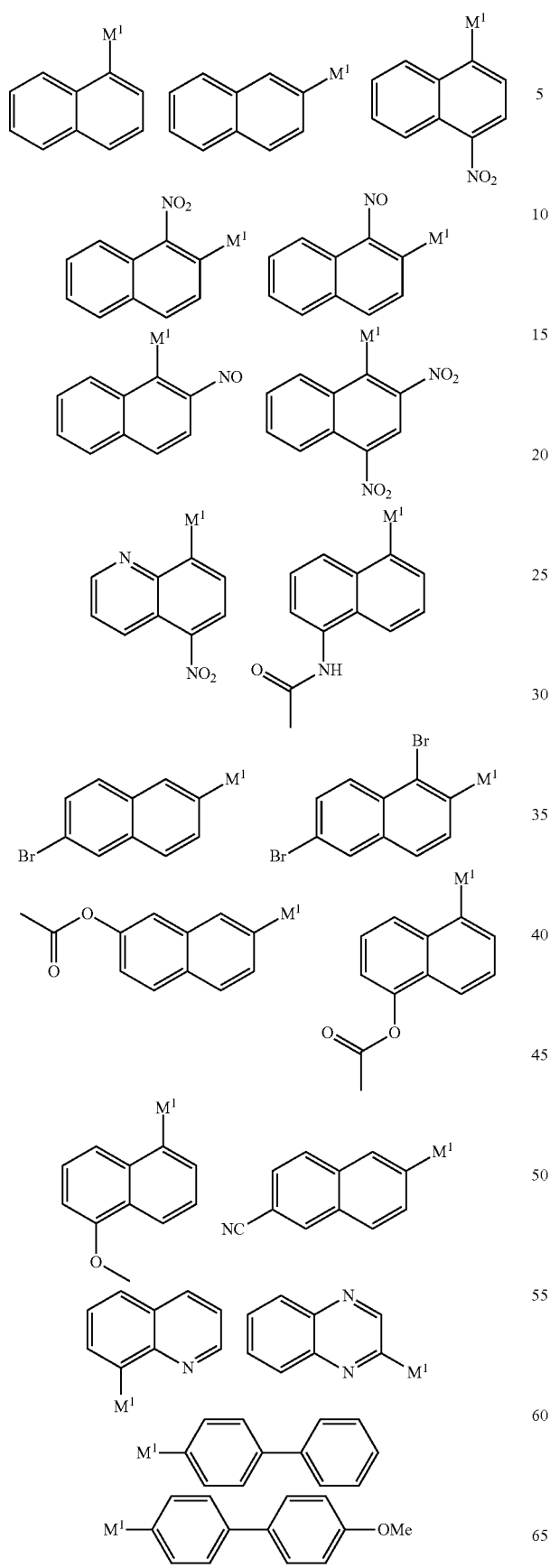
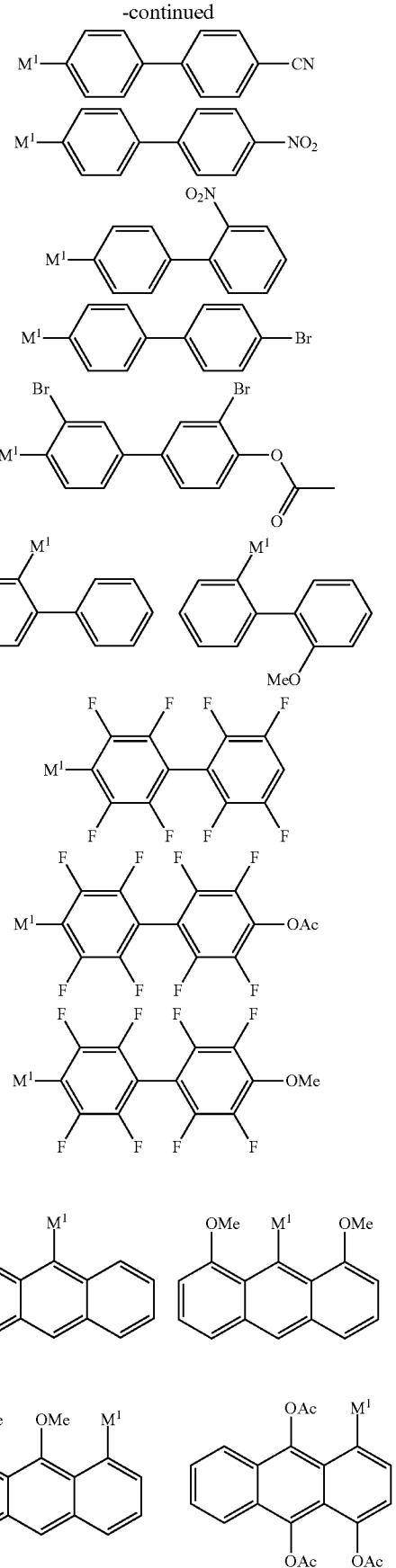

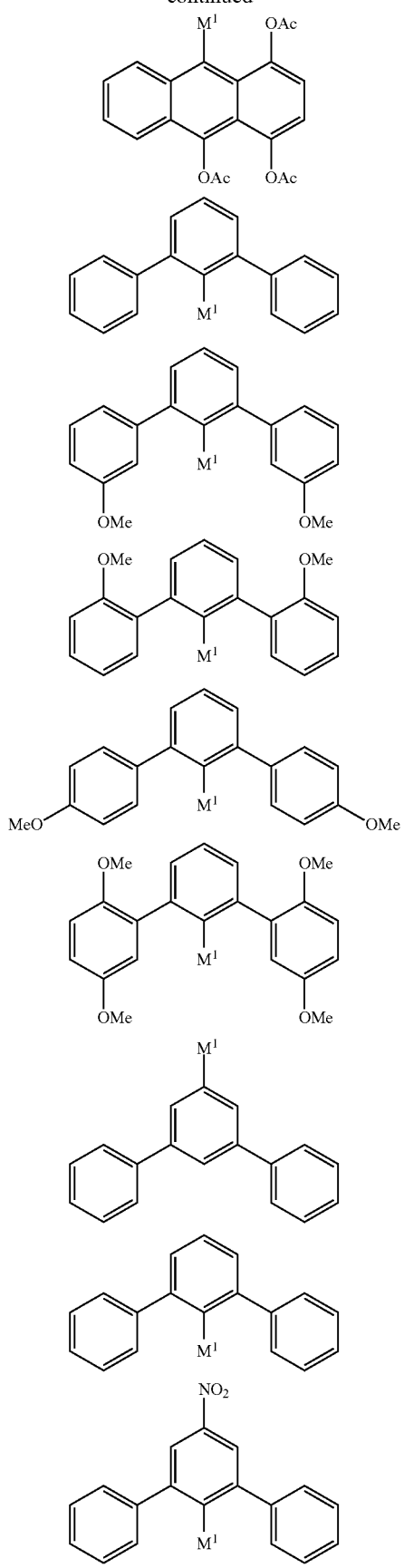
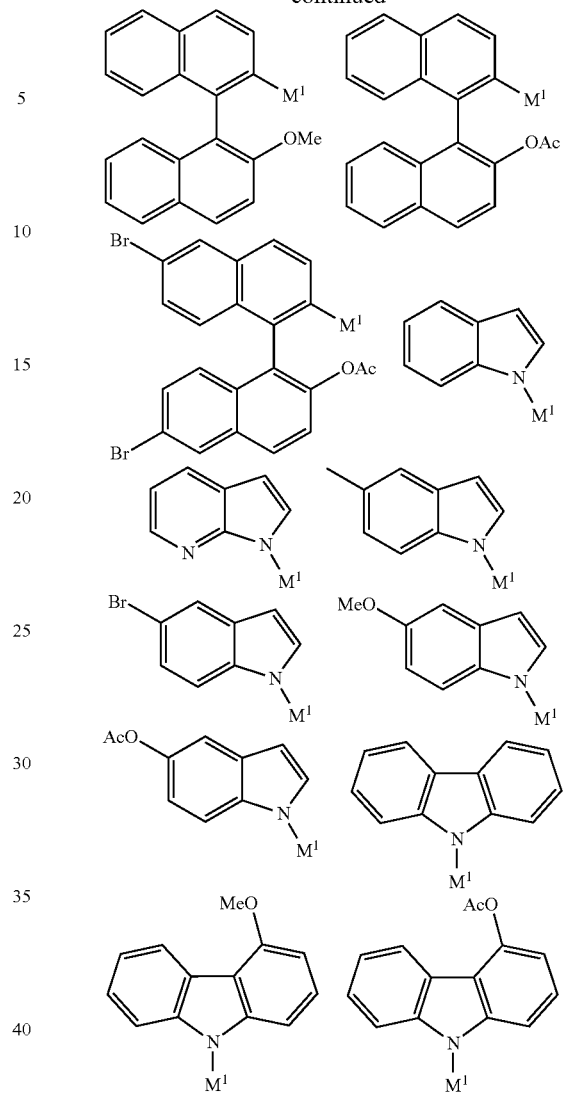
Specific examples of the repeating unit represented by formula (1) are illustrated below, but the present invention is not limited thereto. In specific examples, Ac indicates an acetyl group.
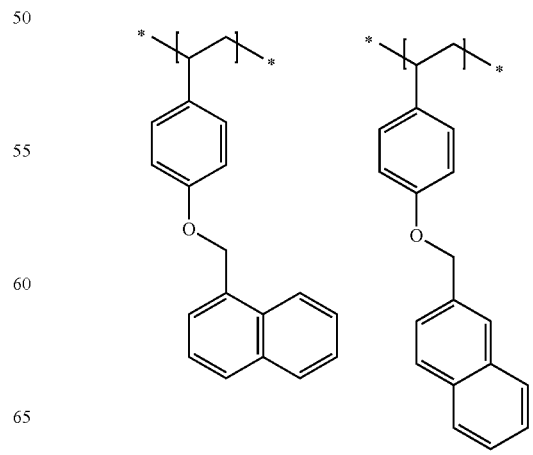

15
-continued
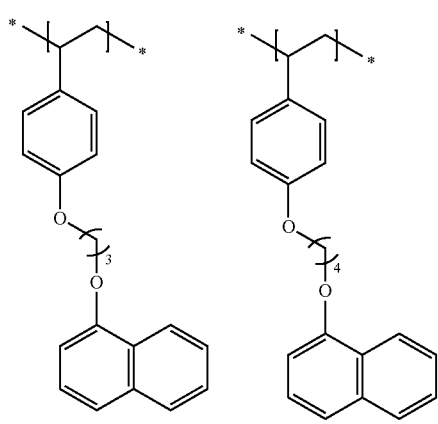
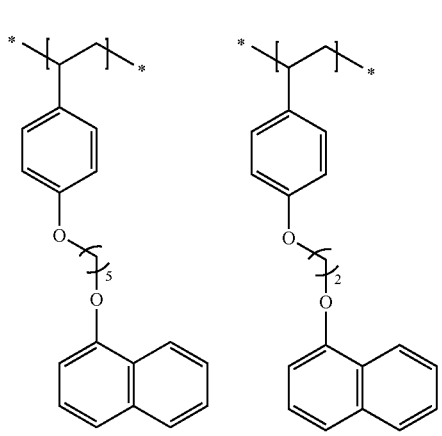
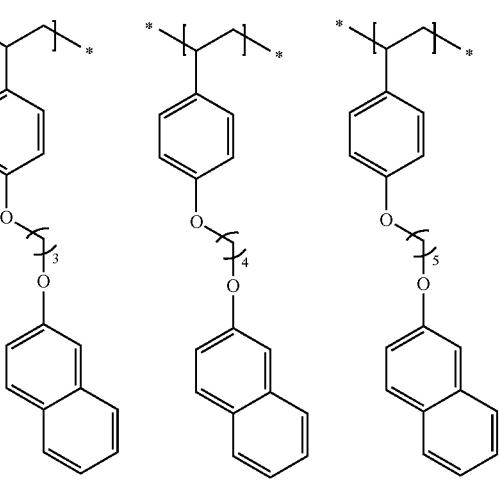
16
-continued
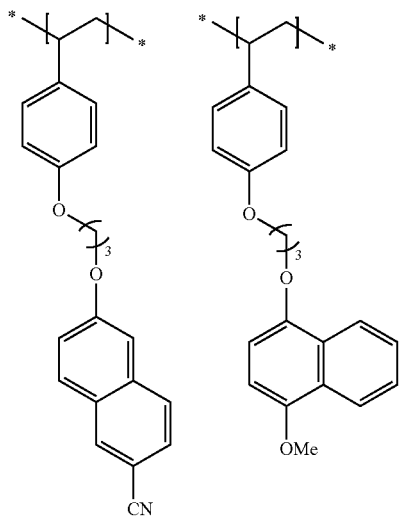
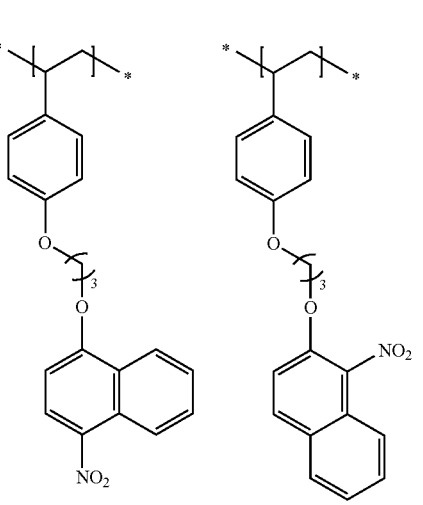
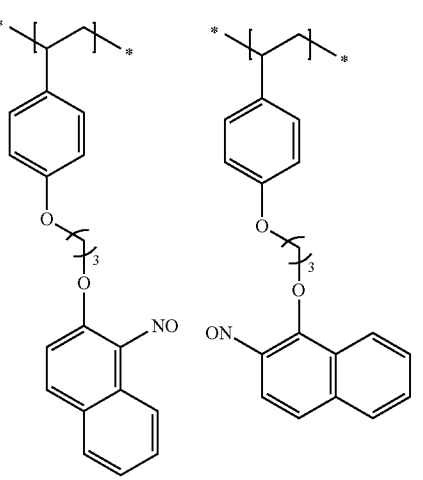

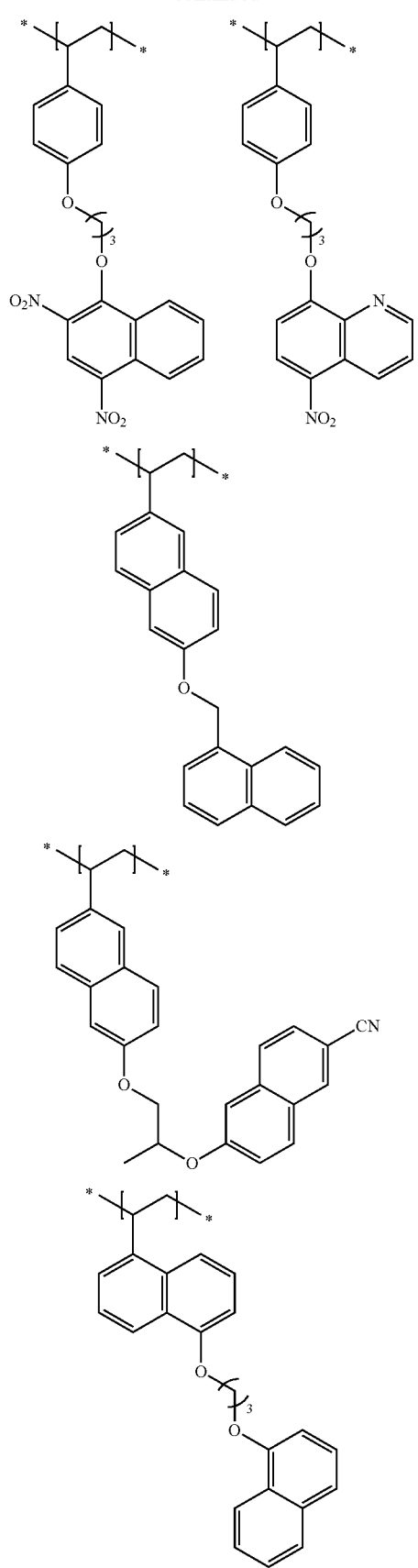
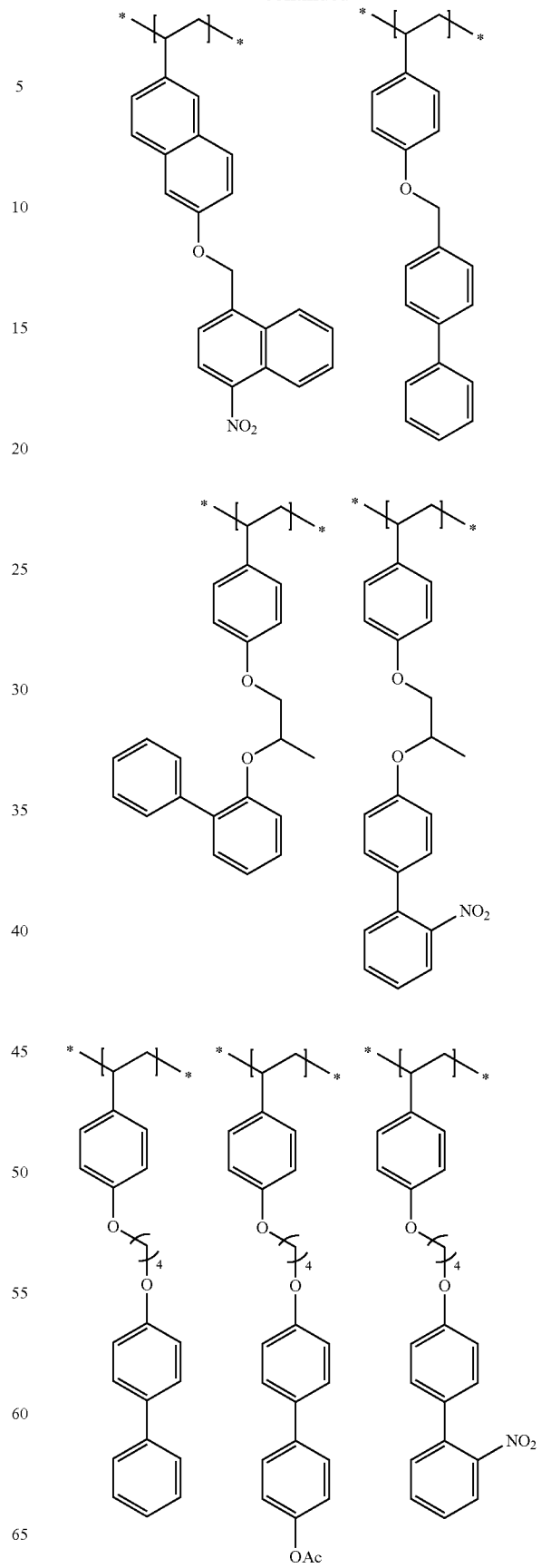

-continued
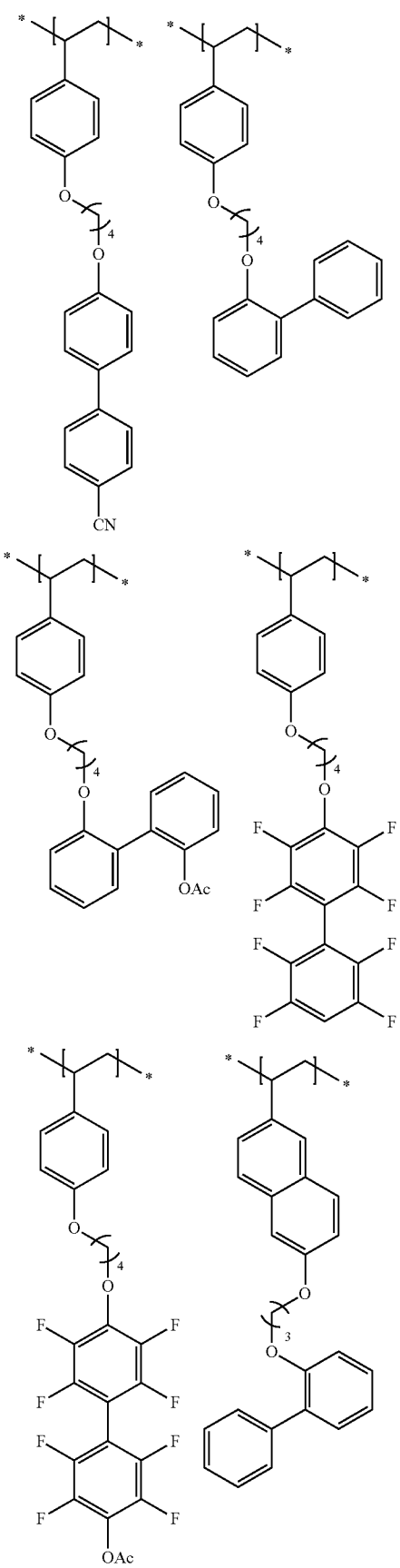
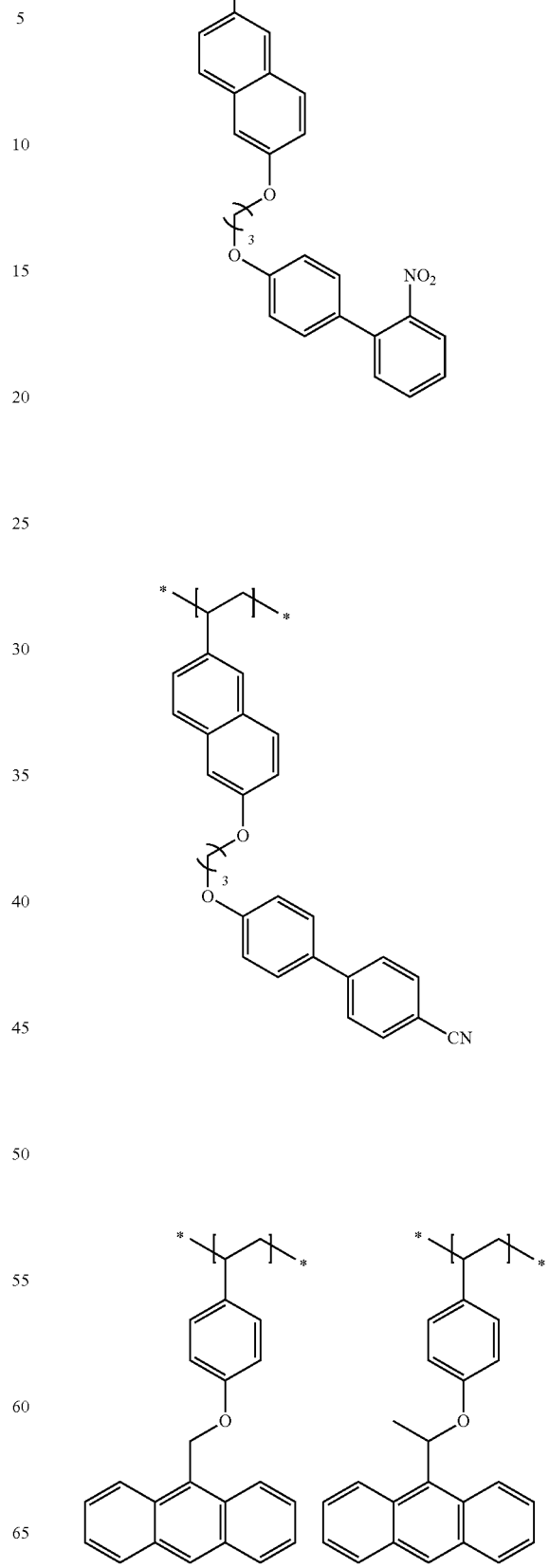

21
-continued
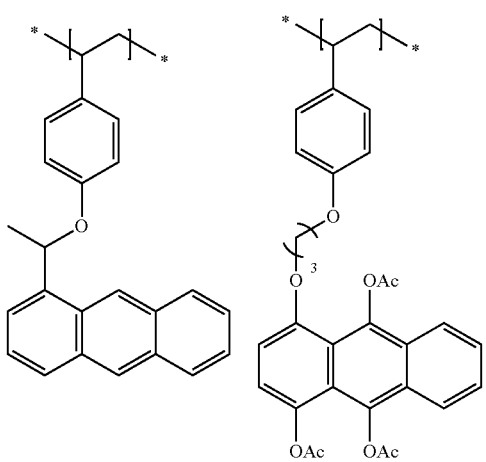
22
-continued
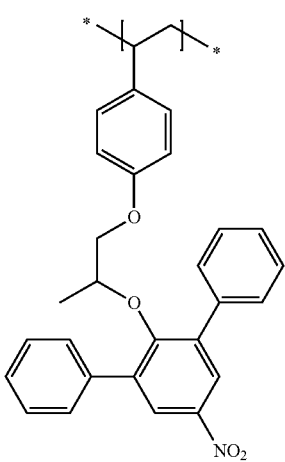
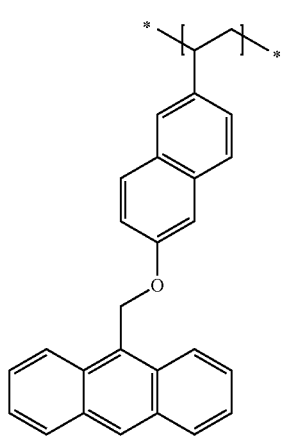
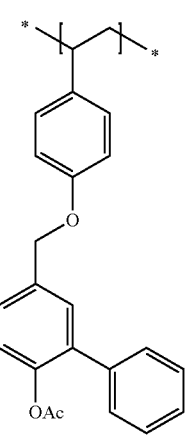
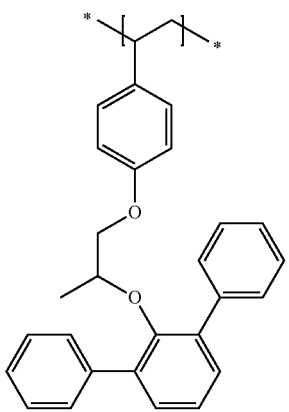
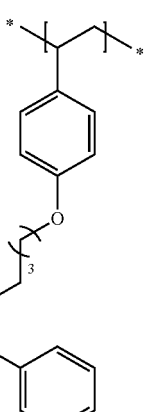 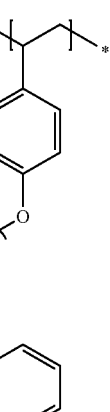

23
-continued
24
-continued
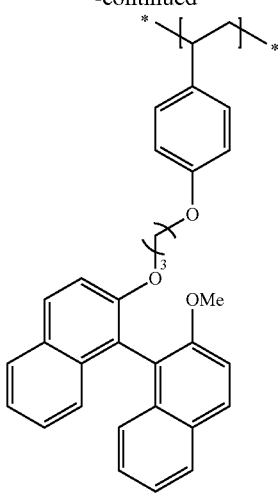
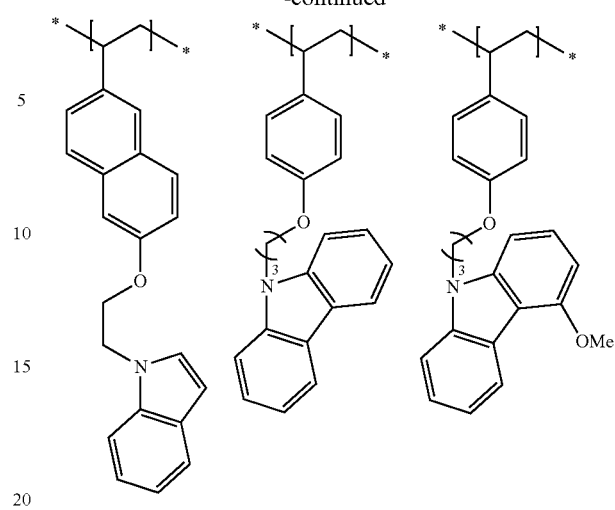
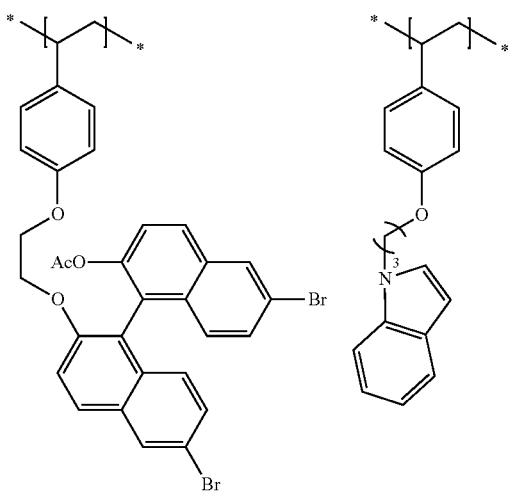
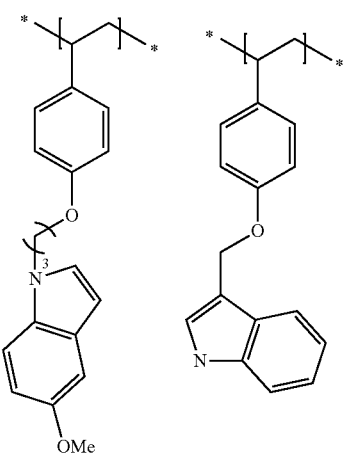
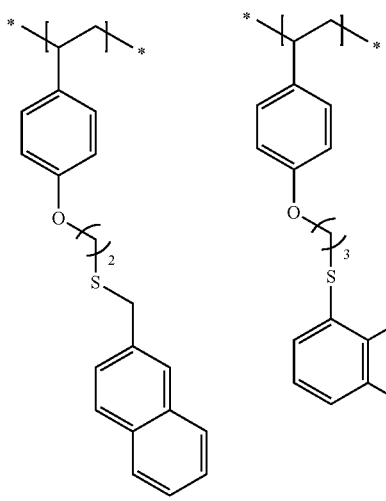

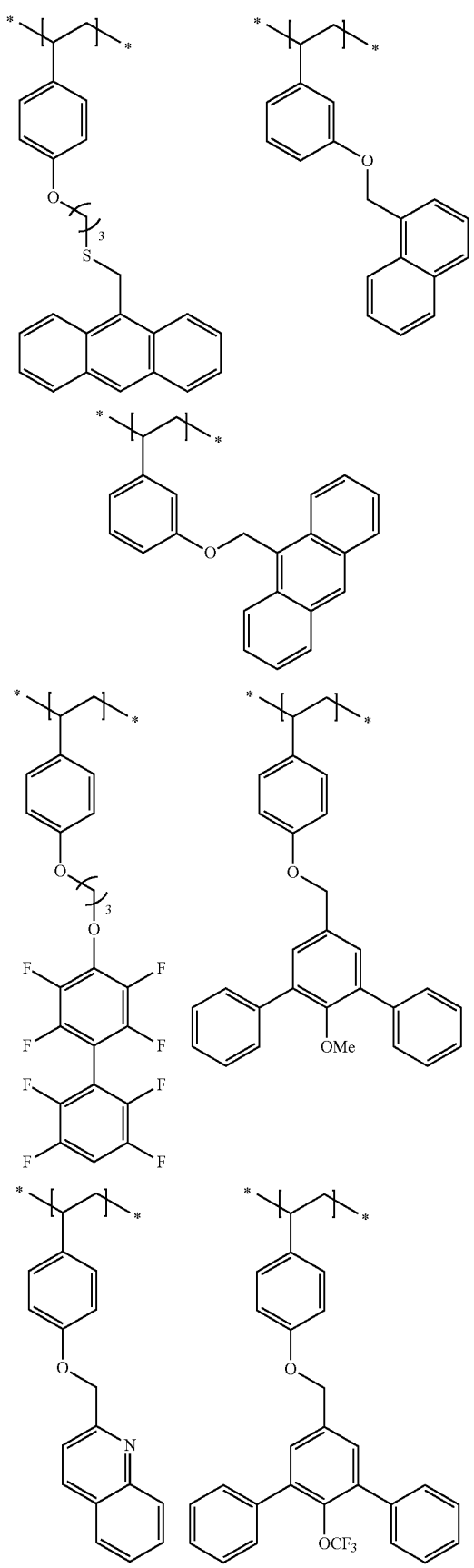
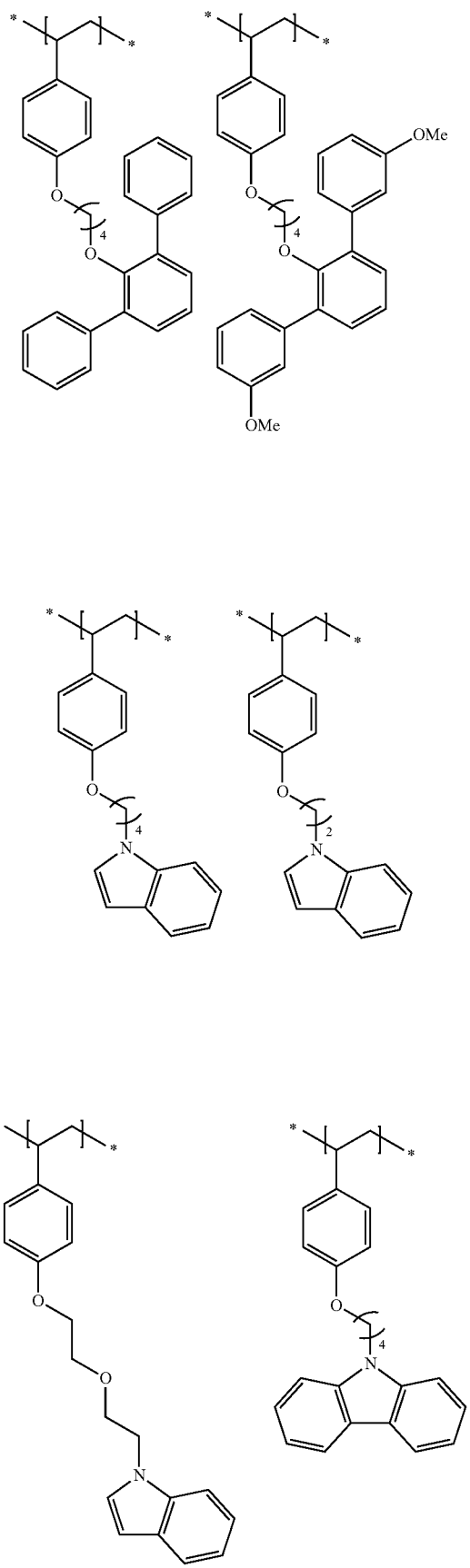

27
-continued
28
-continued
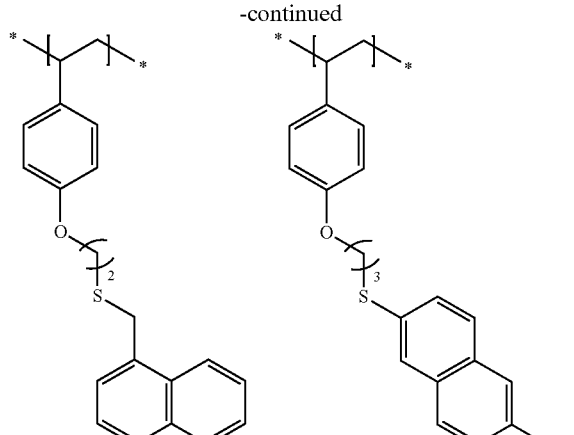
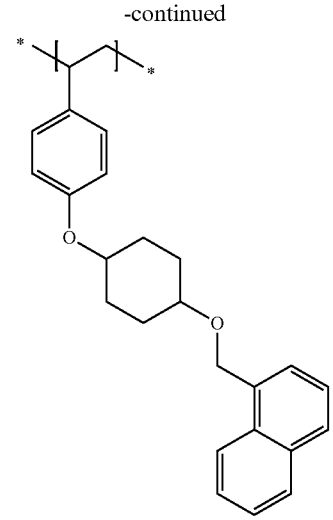
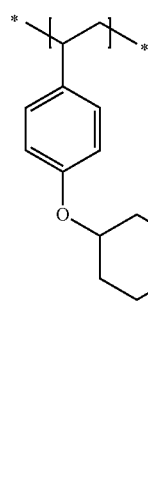
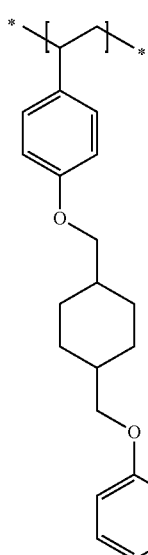
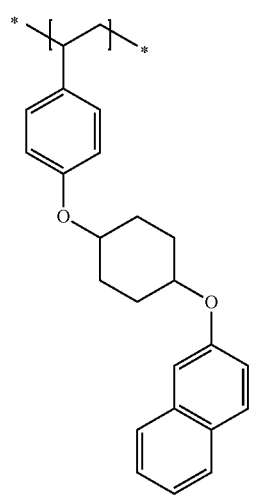
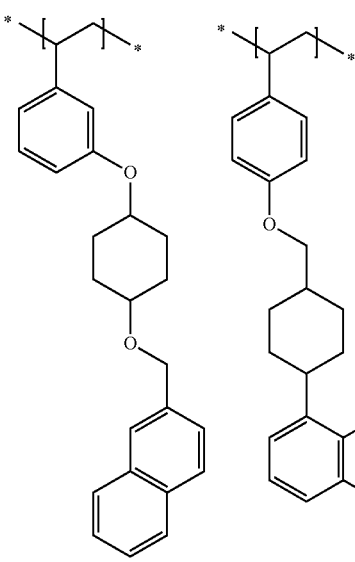
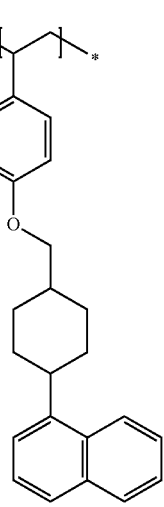

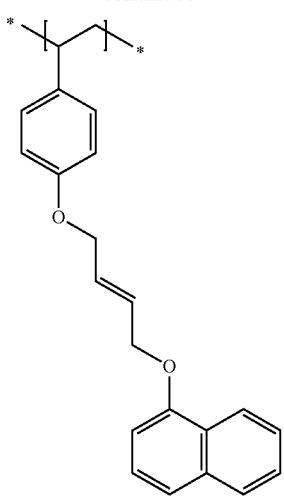

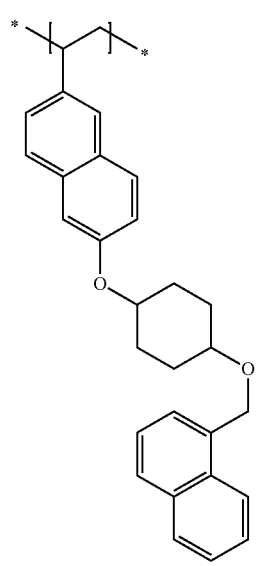

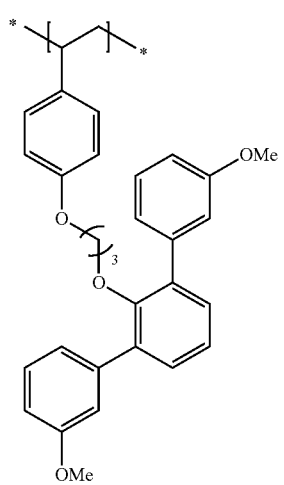

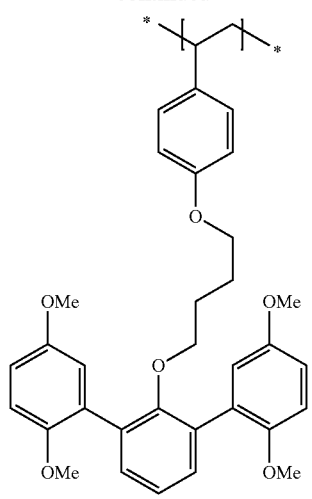

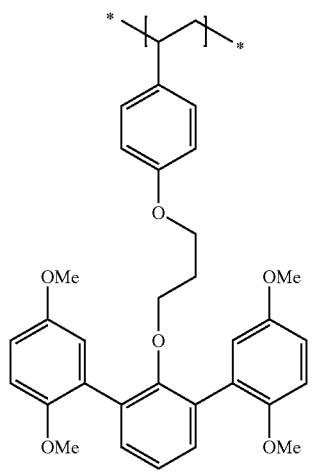

The synthesis method of the monomer corresponding to the repeating unit (1) is not particularly limited, but the monomer can be synthesized, for example, by stirring an alkyl halide compound having a group X, such as 1-chloromethylnaphthalene and 9-chloromethylanthracene, and a biphenol derivative in the presence of a base such as potassium carbonate. The repeating unit (1) may also be obtained by reacting a polymer having a phenolic hydroxyl group with the above-described alkyl halide compound having a group X.

The resin (P) preferably further contains a repeating unit represented by the following formula (2) (hereinafter sometimes referred to as a "repeating unit (2)") and at least either one of a repeating unit represented by the following formula (3) (hereinafter sometimes referred to as a "repeating unit (3)") and a repeating unit represented by formula (4) (hereinafter sometimes referred to as a "repeating unit (4)"):

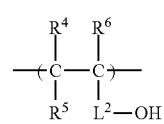

(2)

-continued

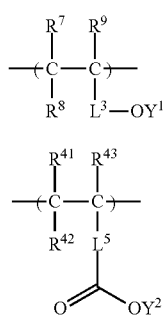

wherein each of $R^4$ to $R^9$ and $R^{41}$ to $R^{43}$ independently represents a hydrogen atom or a monovalent substituent, each of $L^2$ and $L^3$ independently represents an arylene group, $L^5$ represents a single bond or a divalent linking group, and each of $Y^1$ and $Y^2$ represents a group capable of leaving by the action of an acid.

In formula (2), each of $R^4$ to $R^6$ independently represents a hydrogen atom or a monovalent substituent, and examples thereof are the same as those described for $R^1$ to $R^3$. $L^2$ represents an arylene group, and examples thereof are the same as those described above for $L^1$.

Specific examples of the repeating unit represented by formula (2) are illustrated below, but the present invention is not limited thereto.

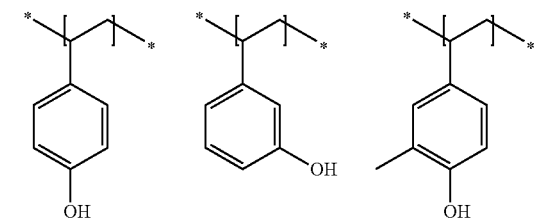

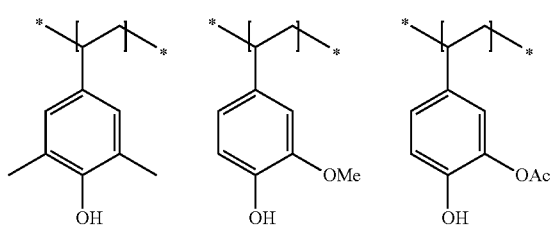

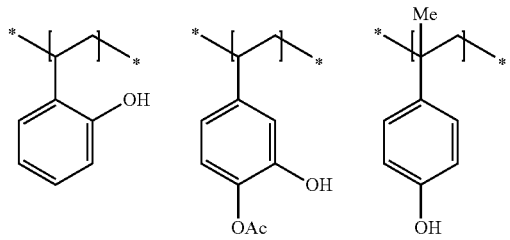

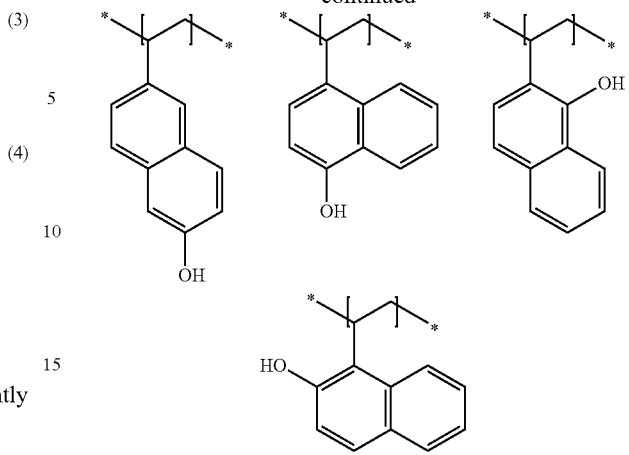

In formula (3), each of $R^7$ to $R^9$ independently represents a hydrogen atom or a monovalent substituent, and examples thereof are the same as those described for $R^1$ to $R^3$. $L^3$ represents an arylene group, and examples thereof are the same as those described above for $L^1$.

$Y^1$ represents a group capable of leaving by the action of an acid.

Examples of the group capable of leaving by the action of an acid include the group represented by any one of the following formulae (7) to (9):

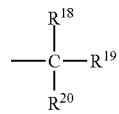

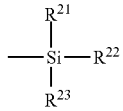

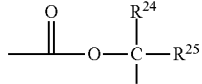

wherein each of $R^{18}$ to $R^{26}$ independently represents an alkyl group, a cycloalkyl group or an aryl group, and $R^{18}$ and $R^{19}$ may combine with each other to form a ring.

Examples of the alkyl group and cycloalkyl group are the same as those enumerated above for $R^1$ to $R^3$.

The aryl group may contain a heteroatom. The carbon number of this aryl group is preferably from 4 to 20, more preferably from 6 to 14, still more preferably from 6 to 12. Examples of the aryl group include a phenyl group and a naphthyl group.

The aryl group may further have a substituent. Examples of the substituent include a nitro group, a halogen atom such as fluorine atom, a carboxyl group, a hydroxyl group, an amino group, a cyano group, an alkyl group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12) and an alkoxycarbonyloxy group (preferably having a carbon number of 2 to 7).

Specific examples of the group represented by any one of formulae (7) to (9) are illustrated below, but the present invention is not limited thereto. In the formulae, "—" indicates a bond to the O atom, and the methyl group is indicated by "Me-" and distinguished.

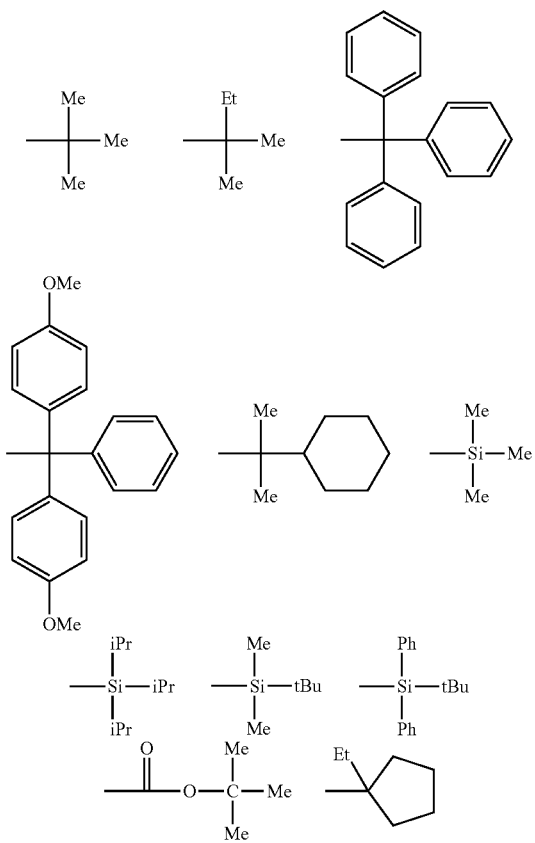

$Y^1$ is also preferably a group represented by the following formula (5):

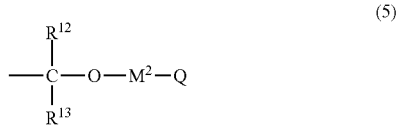

Each of $R^{12}$ and $R^{13}$ independently represents a hydrogen atom, an alkyl group, a cycloalkyl group, an aryl group, an aralkyl group, or a combination of two or more thereof. $M^2$ represents a single bond or a divalent linking group. Q represents an alkyl group, an alicyclic group which may contain a heteroatom, or an aromatic ring group which may contain a heteroatom.

Incidentally, at least two members of $R^{12}$, $R^{13}$, $M^2$ and Q may combine with each other to form a ring. This ring is preferably a 5- or 6-membered ring.

The alkyl group as $R^{12}$ or $R^{13}$ is, for example, an alkyl group having a carbon number of 1 to 8, and preferred examples thereof include a methyl group, an ethyl group, a propyl group, an isopropyl group, an n-butyl group, a sec-butyl group, a tert-butyl group, a hexyl group and an octyl group.

The cycloalkyl group as $R^{12}$ or $R^{13}$ is, for example, a cycloalkyl group having a carbon number of 3 to 15, and preferred examples thereof include a cyclopentyl group, a cyclohexyl group, a norbornyl group and an adamantyl group.

The aryl group as $R^{12}$ or $R^{13}$ is, for example, an aryl group having a carbon number of 6 to 15, and preferred examples thereof include a phenyl group, a tolyl group, a naphthyl group and an anthryl group.

The aralkyl group as $R^{12}$ or $R^{13}$ is, for example, an aralkyl group having a carbon number of 6 to 20, and preferred examples thereof include a benzyl group and a phenethyl group.

The divalent linking group as $M^2$ is, for example, an alkylene group (e.g., methylene, ethylene, propylene, butylene, hexylene, octylene), a cycloalkylene group (e.g., cyclopentylene, cyclohexylene), an alkenylene group (e.g., ethenylene, propenylene, butenylene), an arylene group (e.g., phenylene, tolylene, naphthylene), —S—, —O—, —CO—, —SO$_2$—, —N(R$_0$)—, or a combination of two or more thereof, and those having a total carbon number of 20 or less are preferred. Here, $R_0$ is a hydrogen atom or an alkyl group (for example, an alkyl group having a carbon number of 1 to 8, and specific examples thereof include a methyl group, an ethyl group, a propyl group, an n-butyl group, a sec-butyl group, a hexyl group and an octyl group).

The alkyl group as Q is, for example, the same as the above-described alkyl group of $R^{12}$ and $R^{13}$.

The alicyclic group and aromatic ring group as Q include, for example, the above-described cycloalkyl group and aryl group of $R^{12}$ and $R^{13}$. The carbon number thereof is preferably from 3 to 15. Incidentally, in the present invention, a group formed by combining a plurality of aromatic rings through a single bond (for example, a biphenyl group and a terphenyl group) is also included in the aromatic group of Q.

Examples of the heteroatom-containing alicyclic group and heteroatom-containing aromatic group include thiirane, cyclothiolane, thiophene, furan, pyrrole, benzothiophene, benzofuran, benzopyrrole, triazine, imidazole, benzimidazole, triazole, thiadiazole, thiazole and pyrrolidone. Incidentally, in the present invention, a group formed by combining a plurality of "heteroatom-containing aromatic rings" through a single bond (for example, a viologen group) is also included in the aromatic group of Q.

Examples of the case where at least two members of $R^{12}$, $R^{13}$, $M^2$ and Q combine with each other to form a ring include a case where $R^{12}$ and $R^{13}$ combine to form a butylene group or a pentylene group and thereby form a 5- or 6-membered ring, and a case where either $M^2$ or Q and either $R^{12}$ or $R^{13}$ combine to form a propylene group or a butylene group and thereby form a 5- or 6-membered ring containing oxygen atom.

Each of the groups represented by $R^{12}$, $R^{13}$, $M^2$ and Q may further have a substituent. Examples of this substituent are the same as those enumerated as the substituent which $R^1$ to $R^3$ may have. Incidentally, the carbon number of the substituent is preferably 8 or less.

The carbon number of the group represented by -($M^2$-Q) is preferably from 1 to 30, more preferably from 5 to 20.

Specific examples of the group represented by formula (5) are illustrated below, but the present invention is not limited thereto. In the formulae, "-" indicates a bond to the O atom, and the methyl group is indicated by "Me-" and distinguished. Also, in specific examples, Ac indicates an acetyl group.

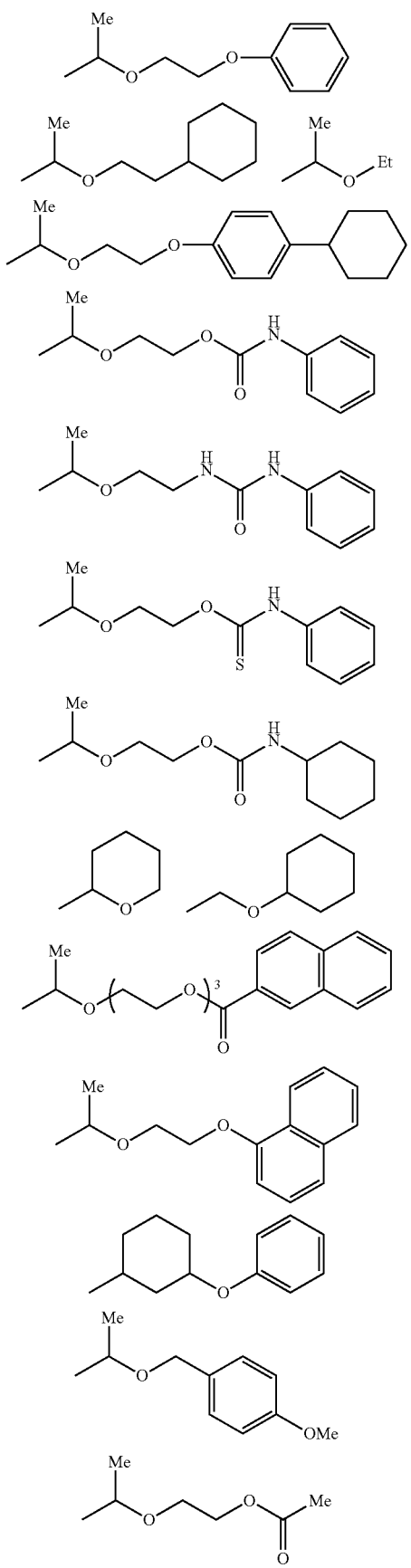
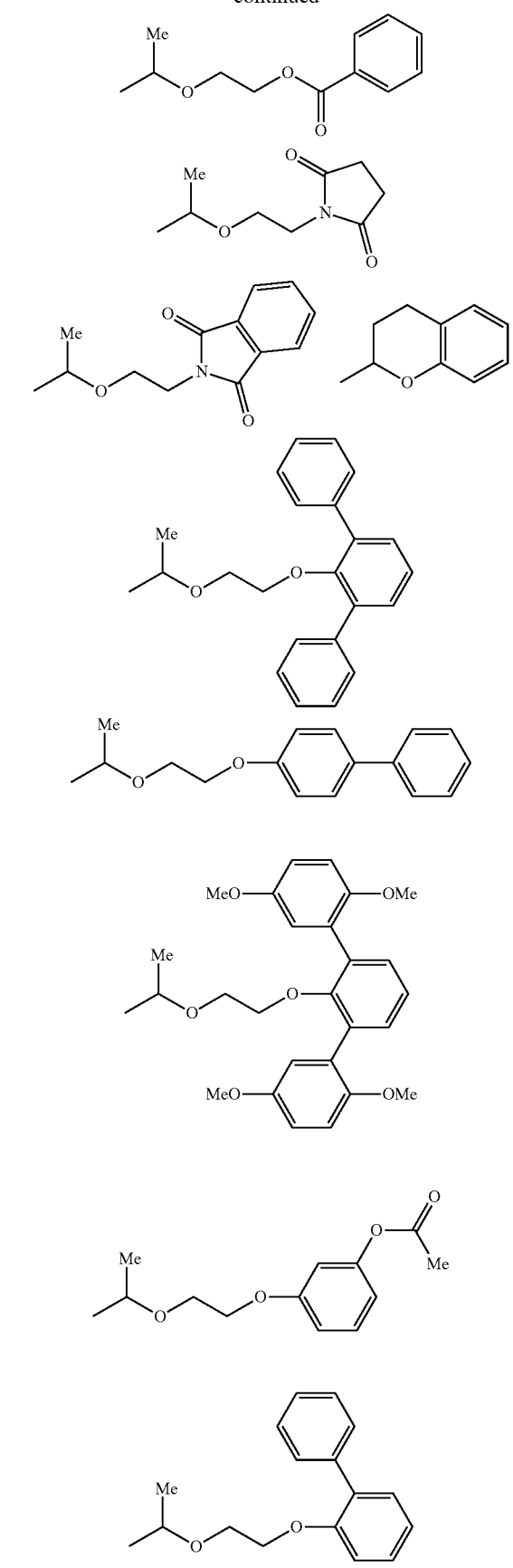

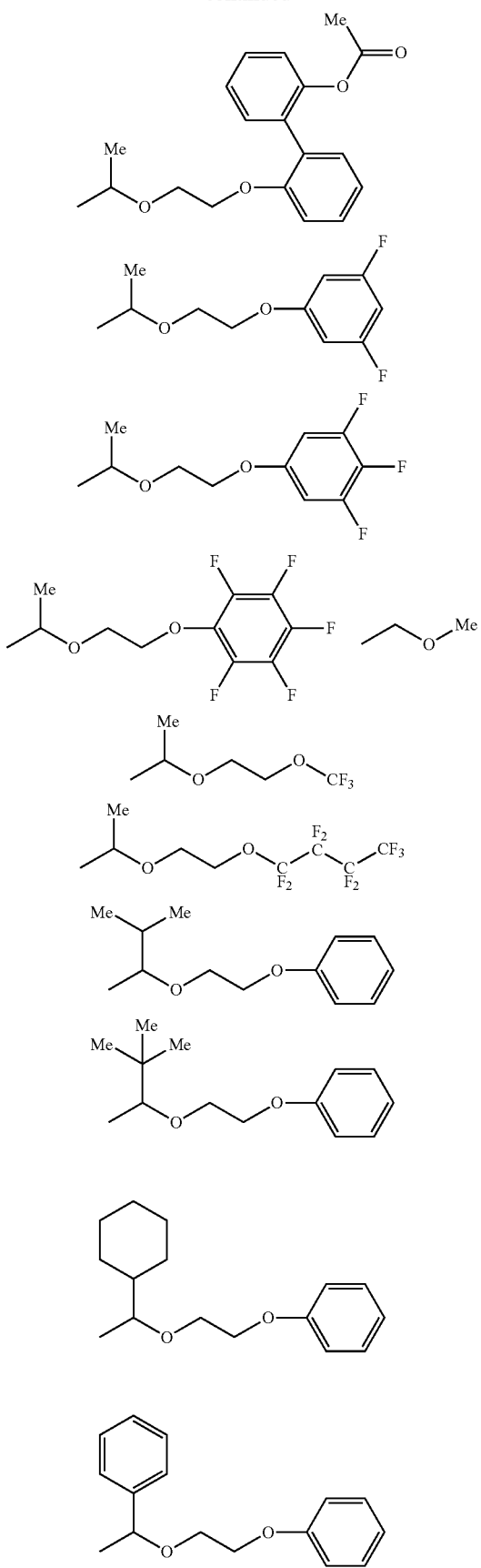
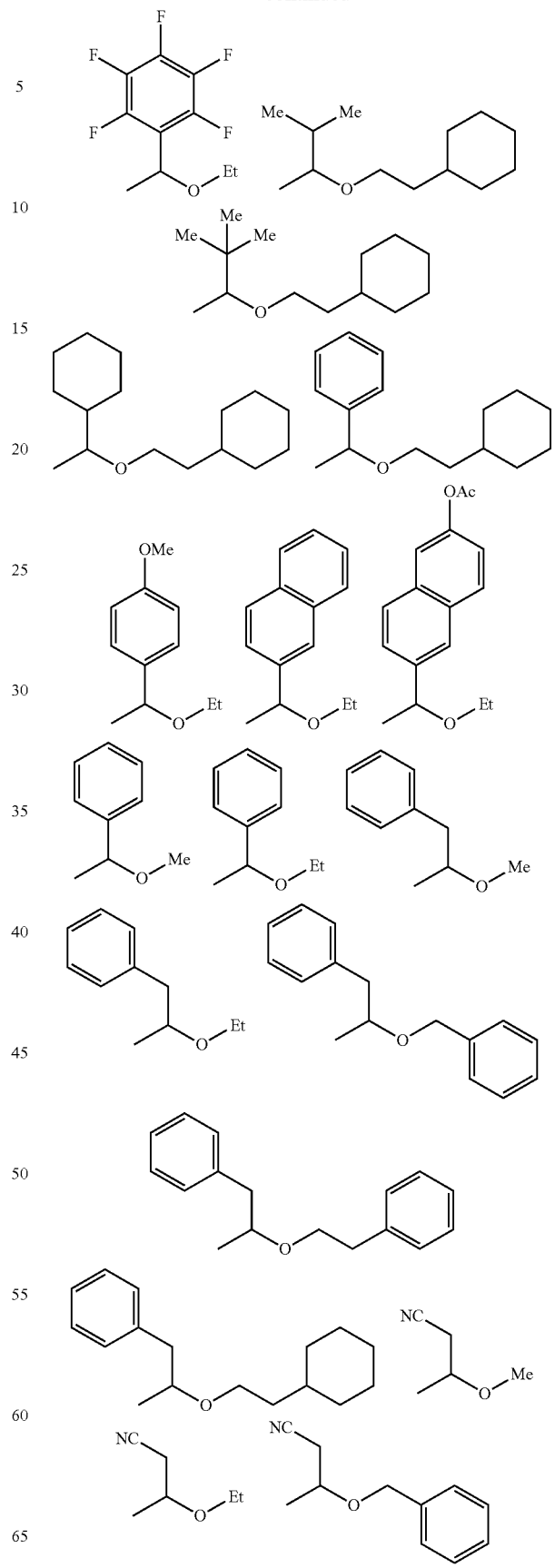

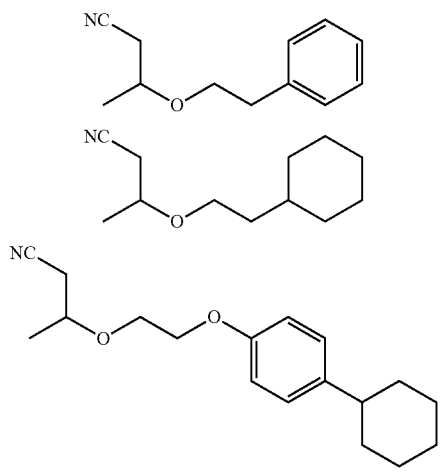
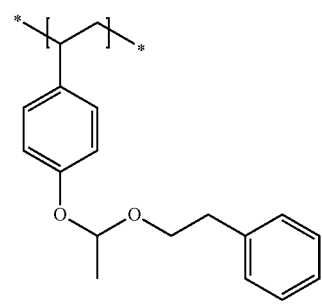
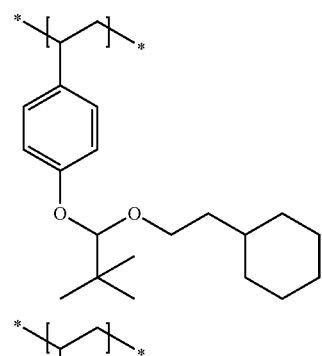
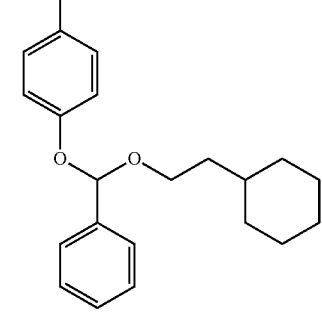
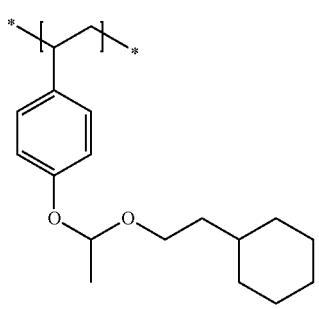
Specific examples of the repeating unit represented by formula (3) are illustrated below, but the present invention is not limited thereto.
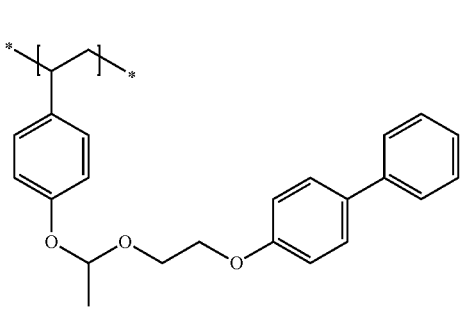

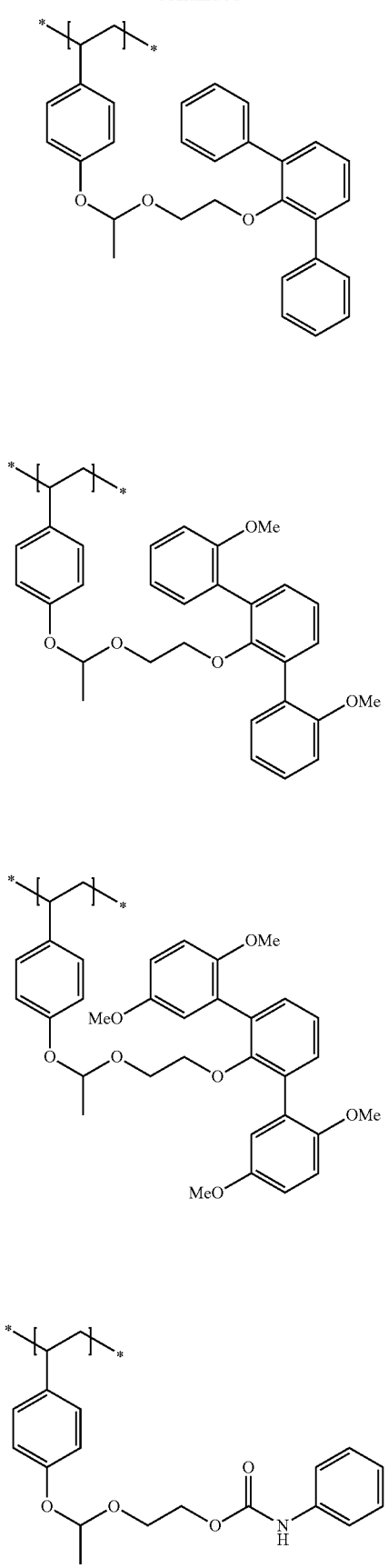
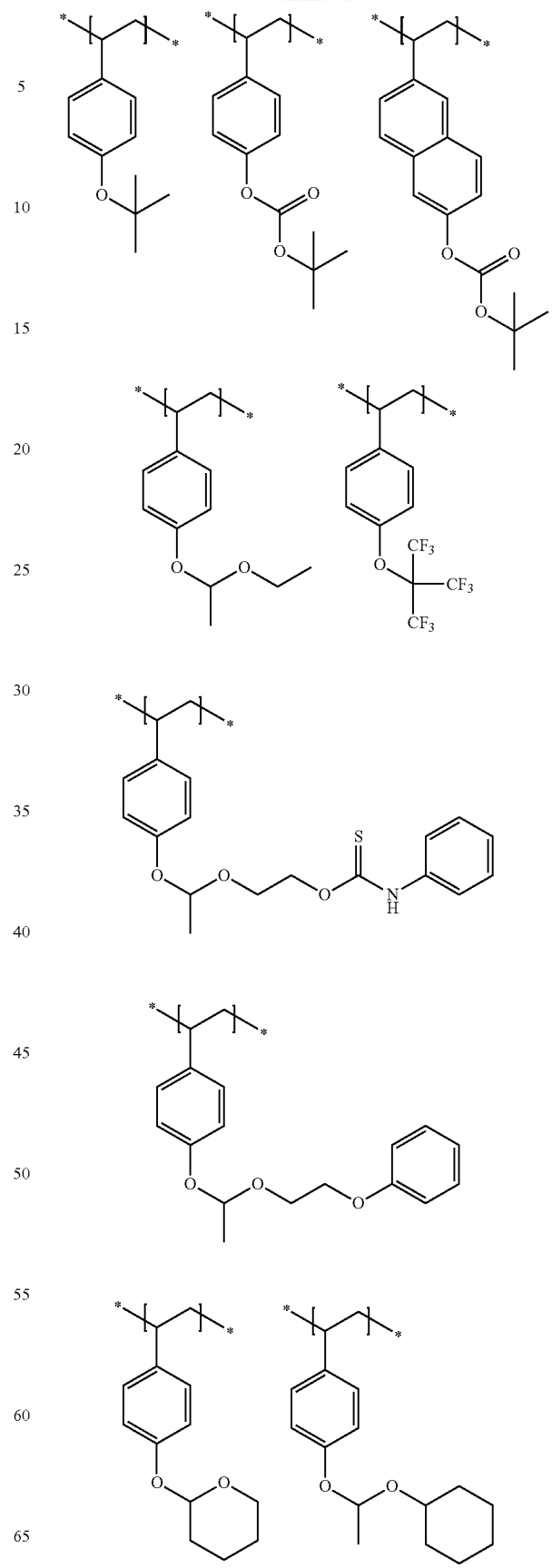

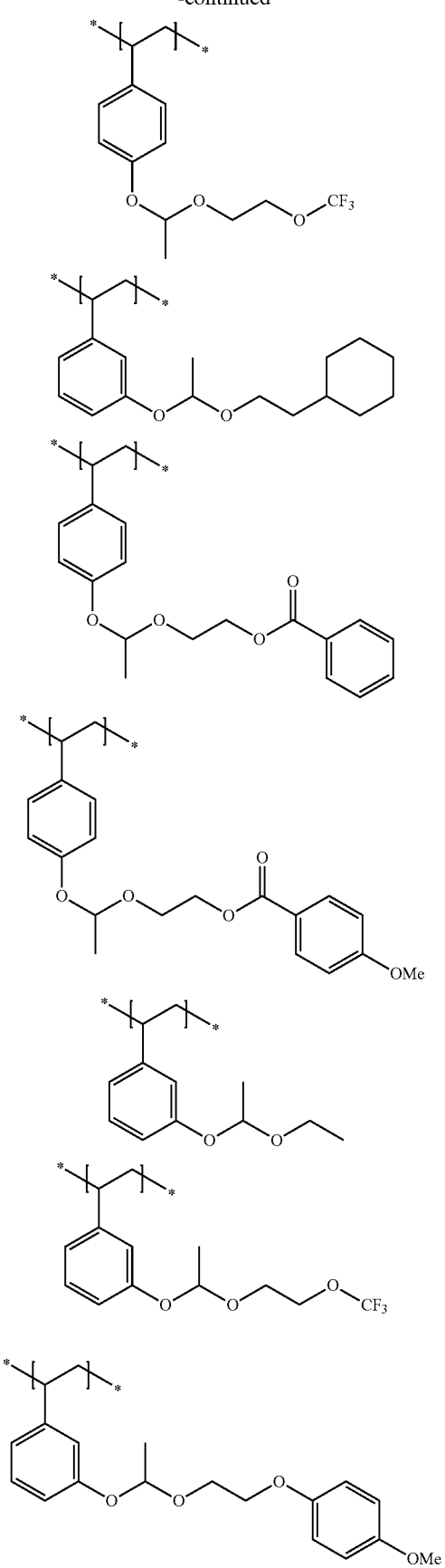
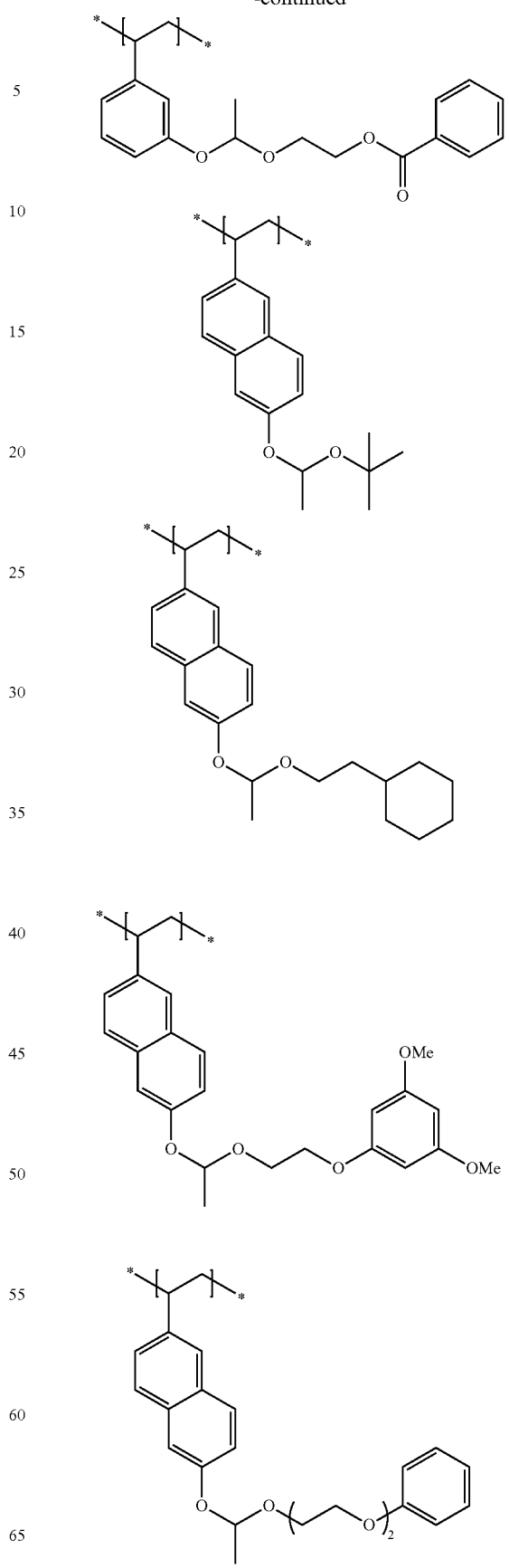

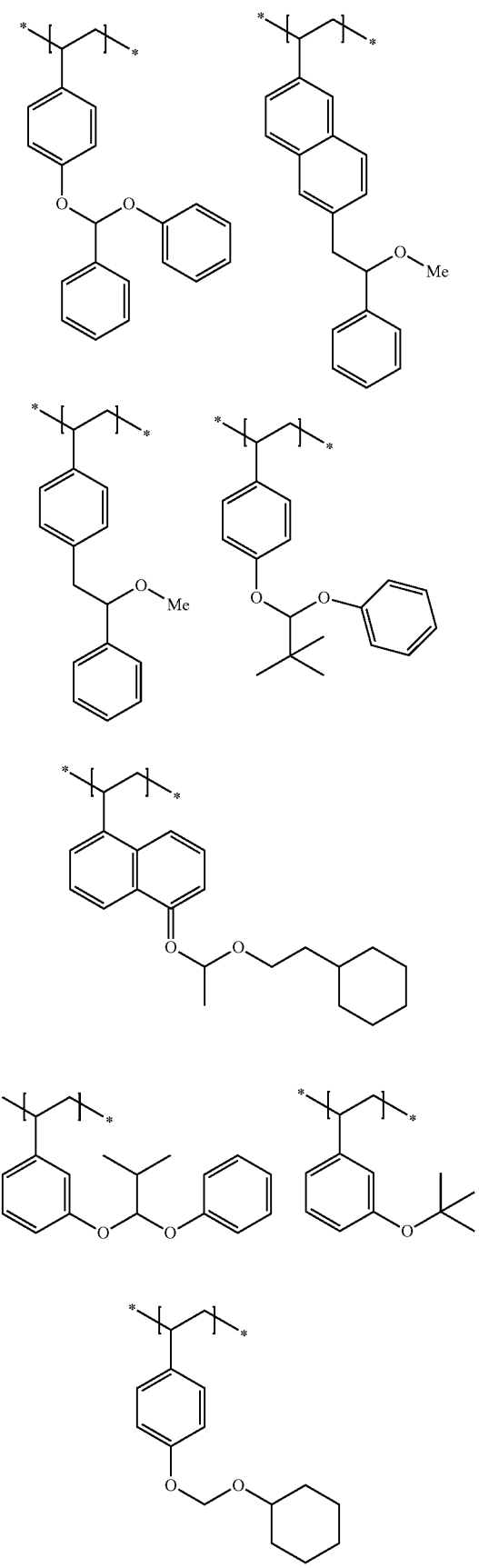
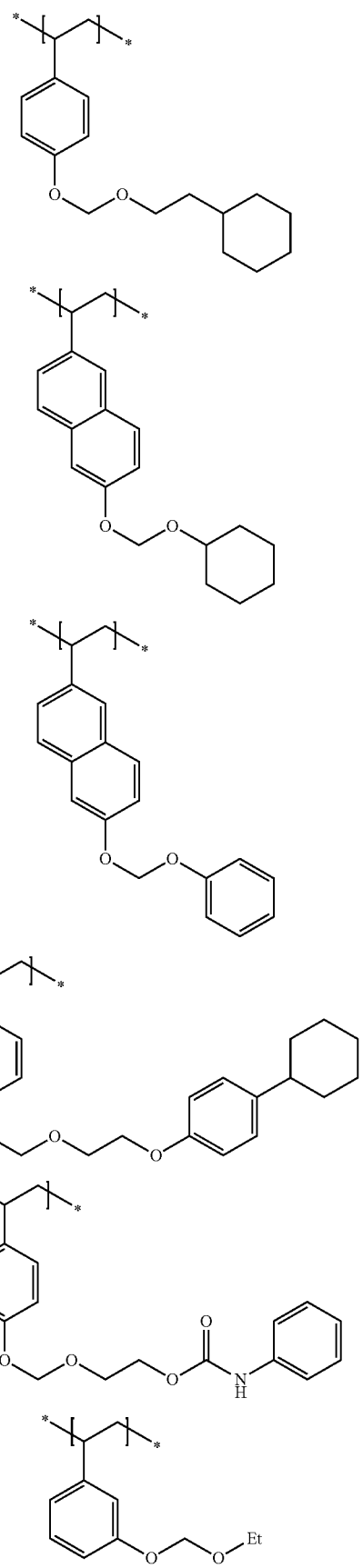

47
-continued
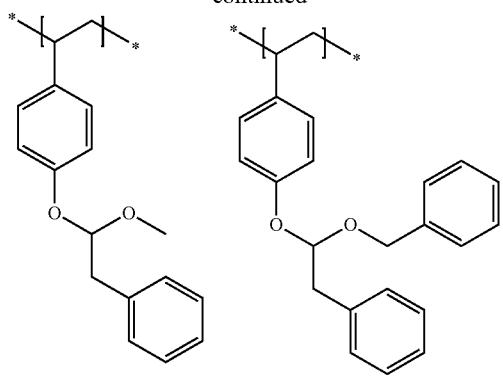
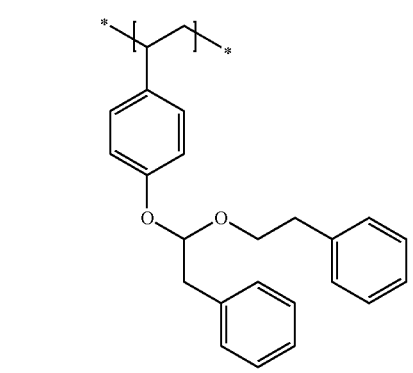
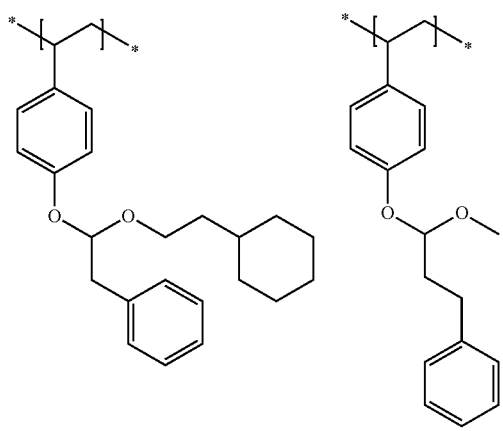
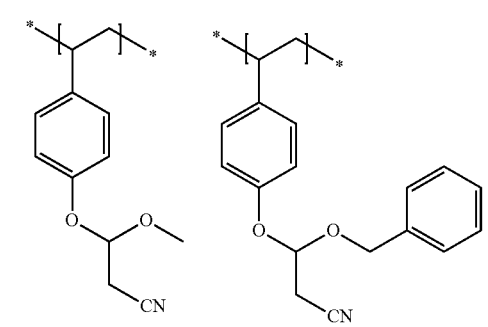
48
-continued
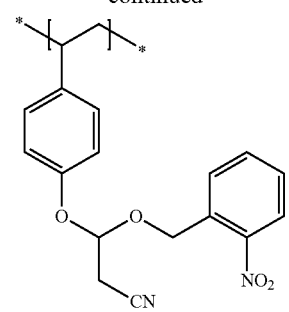
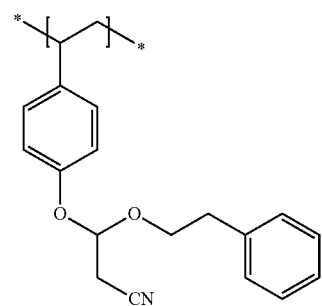
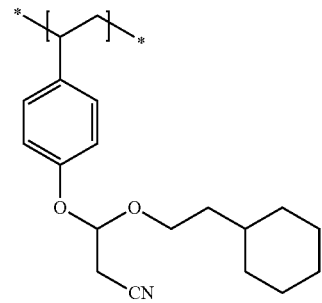
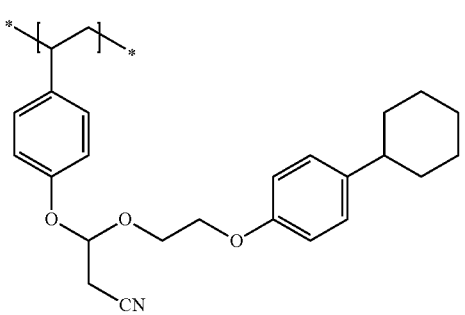
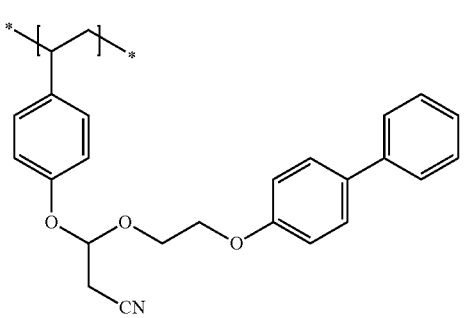

-continued

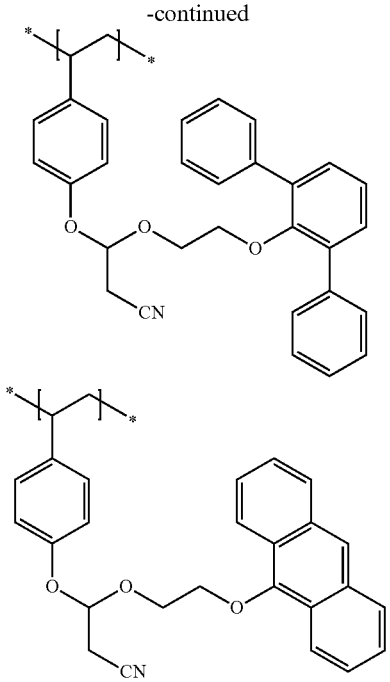

In formula (4), each of $R^{41}$ to $R^{43}$ is independently a hydrogen atom or a monovalent substituent, and these have the same meanings as $R^1$ to $R^3$ above. $L^5$ represents a single bond or a divalent linking group.

In the case where $L^5$ is a divalent linking group, examples thereof include an alkylene group, a cycloalkylene group, an arylene group, —O—, —$SO_2$—, —CO—, —N($R_N$)— and a combination of a plurality of these members. Here, $R_N$ represents an aryl group, an alkyl group or a cycloalkyl group.

The alkylene group as $L^5$ is preferably an alkylene group having a carbon number of 1 to 10, and examples thereof include a methylene group, an ethylene group, a propylene group, a butylene group, a hexylene group and an octylene group.

The cycloalkylene group as $L^5$ is preferably a cycloalkylene group having a carbon number of 5 to 10, and examples thereof include a cyclopentylene group and a cyclohexylene group.

The arylene group as $L^5$ is preferably an arylene group having a carbon number of 4 to 20, and examples thereof include a phenylene group and a naphthylene group.

The carbon number of the aryl group as $R_N$ is preferably from 4 to 20, more preferably from 6 to 14. Examples of this aryl group include a phenyl group and a naphthyl group.

The carbon number of the alkyl group as $R_N$ is preferably from 1 to 8. Examples of this alkyl group include a methyl group, an ethyl group, a propyl group, a butyl group, a hexyl group and an octyl group.

The carbon number of the cycloalkyl group as $R_N$ is preferably from 5 to 8. Examples of this cycloalkyl group include a cyclopentyl group and a cyclohexyl group.

Each of the groups of $L^5$ may further have a substituent, and specific examples of the substituent are the same as those of the substituent which the arylene group of $L^1$ may further have.

$Y^2$ represents a group capable of leaving by the action of an acid and specifically, is preferably a group represented by the following formula:

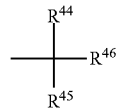

Each of $R^{44}$ to $R^{46}$ independently represents an alkyl group or a cycloalkyl group. Two members out of $R^{44}$ to $R^{46}$ may combine with each other to form a cycloalkyl group.

The alkyl group of $R^{44}$ to $R^{46}$ is preferably a linear or branched alkyl group having a carbon number of 1 to 4.

The cycloalkyl group of $R^{44}$ to $R^{46}$ is preferably a monocyclic cycloalkyl group having a carbon number of 3 to 8 or a polycyclic cycloalkyl group having a carbon number of 7 to 20.

The cycloalkyl group which may be formed by combining two members out of $R^{44}$ to $R^{46}$ with each other is preferably a monocyclic cycloalkyl group having a carbon number of 3 to 8 or a polycyclic cycloalkyl group having a carbon number of 7 to 20. Above all, a monocyclic cycloalkyl group having a carbon number of 5 to 6 is preferred. An embodiment where $R^{46}$ is a methyl group or an ethyl group and $R^{44}$ and $R^{45}$ are combined with each other to form the above-described cycloalkyl group, is more preferred.

Specific examples of the repeating unit represented by formula (4) are illustrated below, but the present invention is not limited thereto.

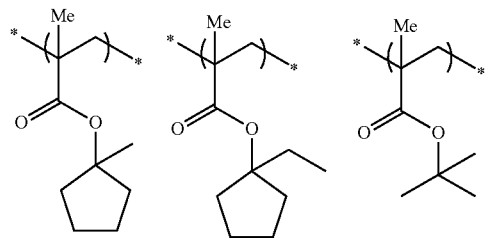

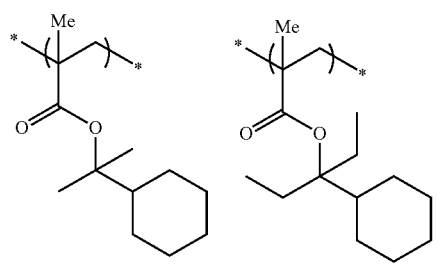

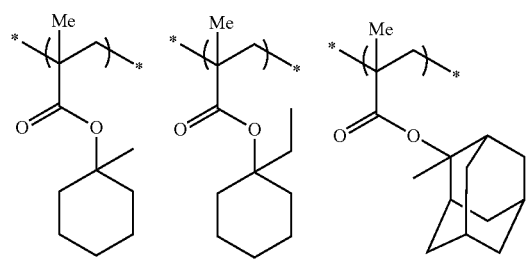

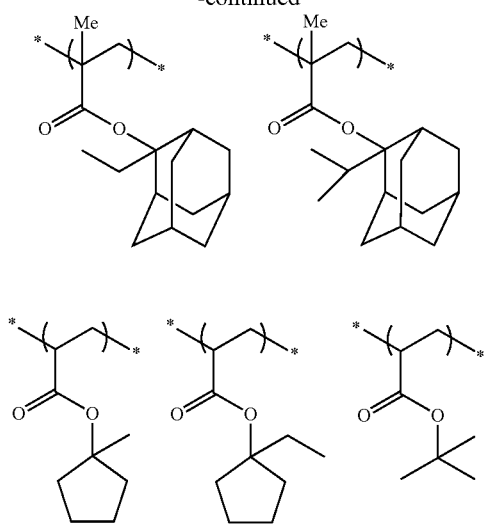
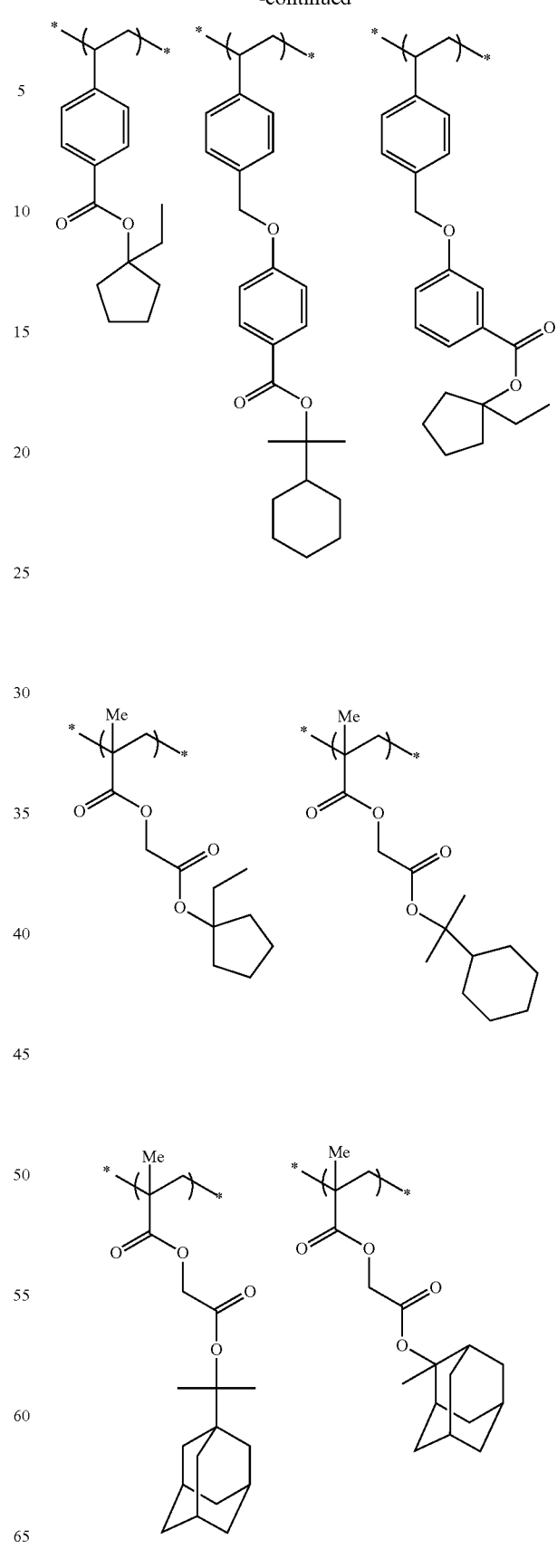

53
-continued
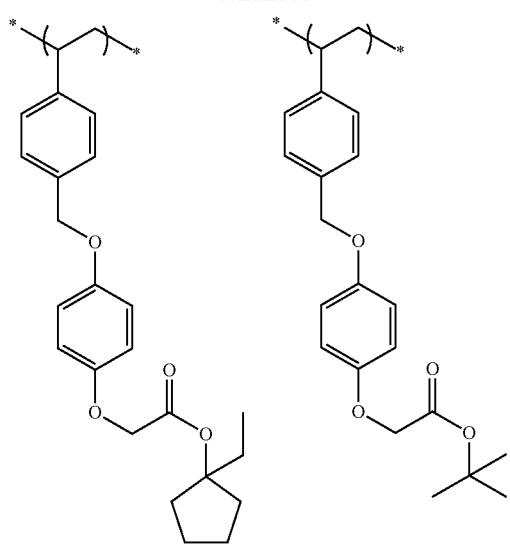
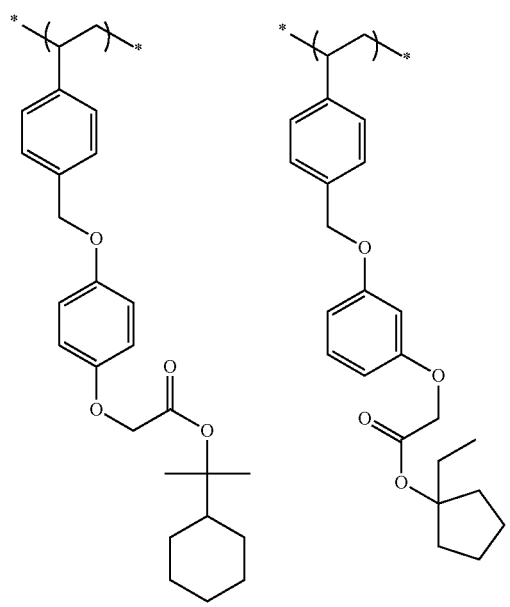
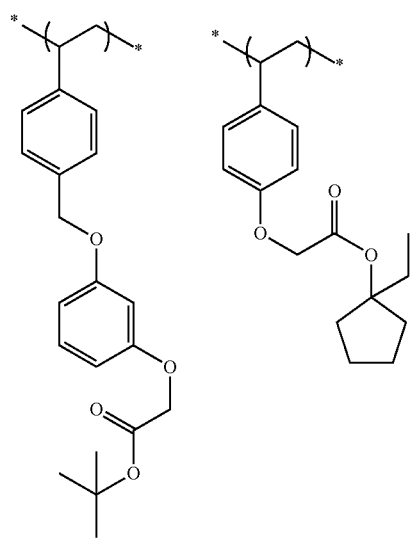
54
-continued
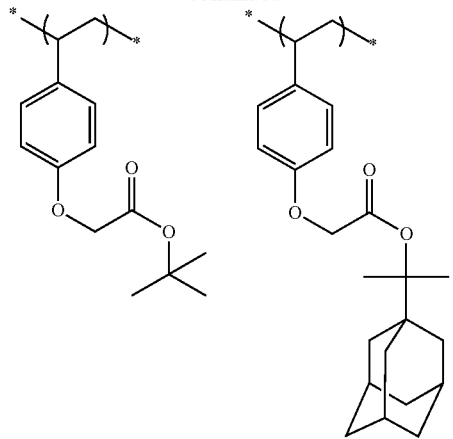
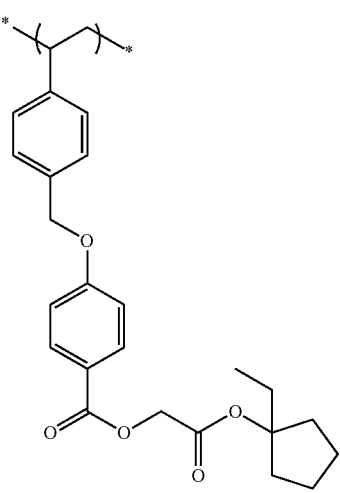

55
-continued
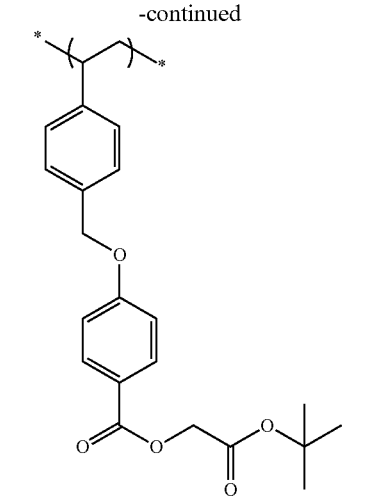
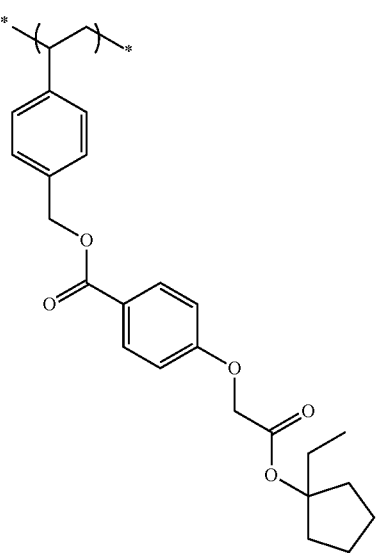
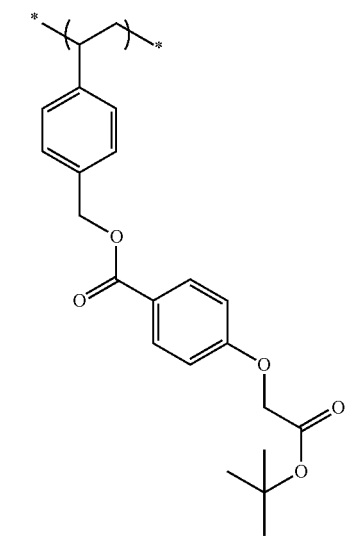
56
-continued
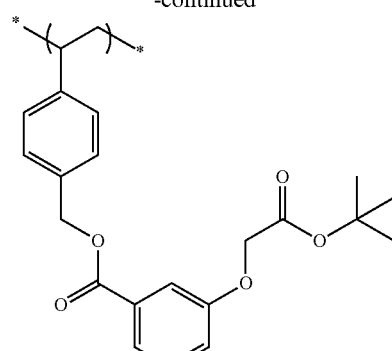
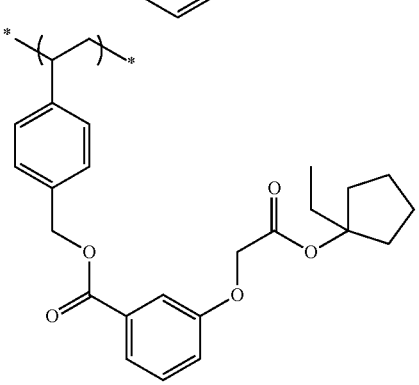
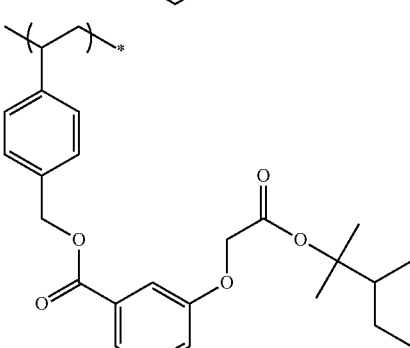
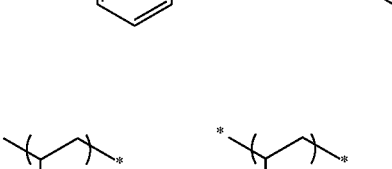
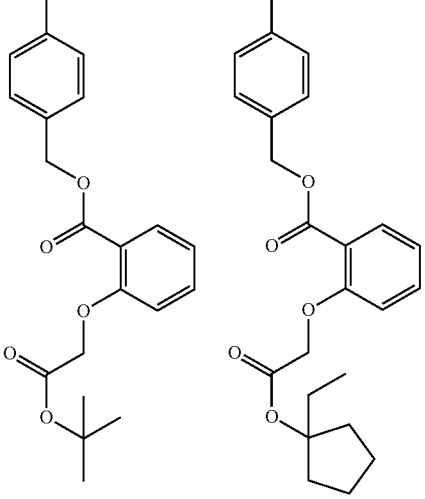

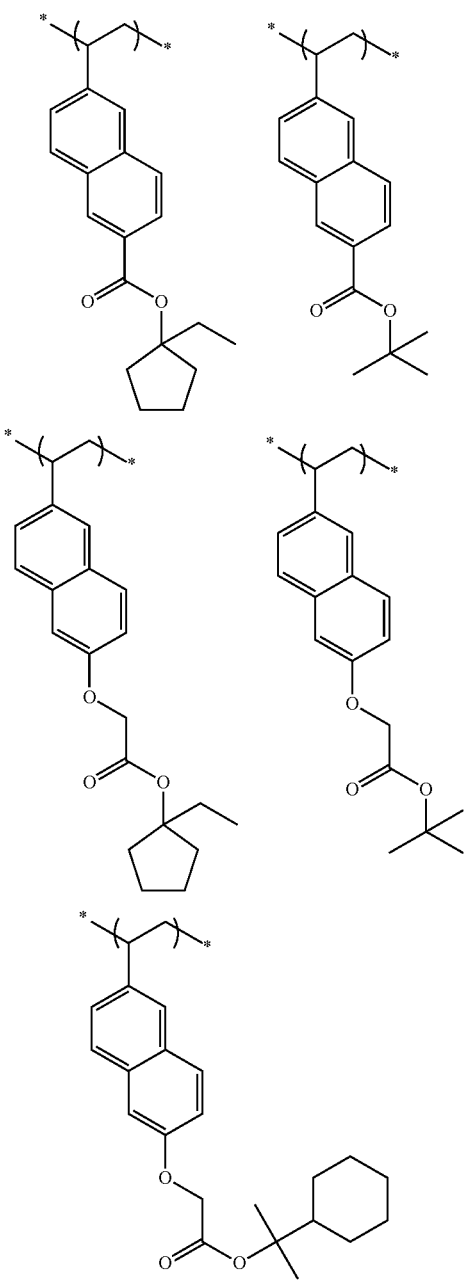

The resin (P) may further contain a repeating unit represented by formula (6) (hereinafter sometimes referred to as a "repeating unit (6)"):

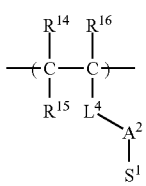

(6)

Each of $R^{14}$, $R^{15}$ and $R^{16}$ independently represents a hydrogen atom or a monovalent substituent and has the same meanings as $R^1$ to $R^3$. $L^4$ represents an arylene group and has the same meaning as $L^1$ above.

$A^2$ represents a single bond or a divalent linking group. In the case where $A^2$ is a divalent linking group, examples thereof include an alkylene group, a cycloalkylene group, an arylene group, —O—, —SO$_2$—, —CO—, —N(R)— and a combination of two or more of these members, and those having a total carbon number of 20 or less are preferred. Here, R represents an aryl group, an alkyl group or a cycloalkyl group.

The alkylene group of $A^2$ is preferably an alkylene group having a carbon number of 1 to 12, such as methylene group, ethylene group, propylene group, butylene group, hexylene group, octylene group and dodecanylene group.

The cycloalkylene group of $A^2$ is preferably a cycloalkylene group having a carbon number of 5 to 8, such as cyclopentylene group and cyclohexylene group.

The arylene group of $A^2$ is preferably an arylene group having a carbon number of 6 to 14, such as phenylene group and naphthylene group.

These alkylene group, cycloalkylene group and arylene group may further have a substituent. Examples of the substituent include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

$S^1$ represents a structural moiety capable of decomposing upon irradiation with an actinic ray or radiation to produce an acid in the side chain. $S^1$ is preferably a structural moiety capable of decomposing upon irradiation with an actinic ray or radiation to produce an acid anion in the side chain of the resin, more preferably a structural moiety possessed by a photo-initiator for cationic photopolymerization, a photo-initiator for radical photopolymerization, a photodecoloring agent for dyes, a photodiscoloring agent, or a compound known to generate an acid by the effect of light and used for microresist and the like. The structural moiety is still more preferably an ionic structural moiety.

$S^1$ is more preferably an ionic structural moiety containing a sulfonium or iodonium salt. More specifically, $S^1$ is preferably a group represented by the following formula (PZI) or (PZII):

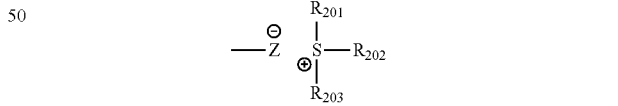

(PZI)

(PZII)

In formula (PZI), each of $R_{201}$ to $R_{203}$ independently represents an organic group.

The carbon number of the organic group as $R_{201}$ to $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. The group formed by combining two members out of $R_{201}$ to $R_{203}$ includes an alkylene group (e.g., butylene, pentylene). Use of a resin where two members out of $R_{201}$ to $R_{203}$ are combined to form a ring structure is preferred, because this is expected to enable preventing the exposure machine from contamination by a decomposition product during exposure.

$Z^-$ represents an acid anion generated resulting from decomposition upon irradiation with an actinic ray or radiation and is preferably a non-nucleophilic anion. Examples of the non-nucleophilic anion include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction, and this anion can suppress the decomposition with aging due to an intramolecular nucleophilic reaction. Thanks to this anion, the aging stability of the resin and in turn, the aging stability of the resist composition are enhanced.

Examples of the organic group of $R_{201}$ to $R_{203}$ include an aryl group, an alkyl group, a cycloalkyl group, a cycloalkenyl group and an indolyl group. Here, in the cycloalkyl group and cycloalkenyl group, at least one of carbon atoms constituting the ring may be carbonyl carbon.

At least one of three members $R_{201}$ to $R_{203}$ is preferably an aryl group, and it is more preferred that these members all are an aryl group.

The aryl group of $R_{201}$, $R_{202}$ and $R_{203}$ is preferably a phenyl group or a naphthyl group, more preferably a phenyl group.

The alkyl group, cycloalkyl group and cycloalkenyl group of $R_{201}$, $R_{202}$ and $R_{203}$ are preferably a linear or branched alkyl group having a carbon number of 1 to 10 (e.g., methyl, ethyl, propyl, butyl, pentyl), a cycloalkyl group having a carbon number of 3 to 10 (e.g., cyclopentyl, cyclohexyl, norbornyl), and a cycloalkenyl group having a carbon number of 3 to 10 (e.g., pentadienyl, cyclohexenyl).

The organic group as $R_{201}$, $R_{202}$ and $R_{203}$, such as aryl group, alkyl group, cycloalkyl group, cycloalkenyl group and indolyl group, may further have a substituent. Examples of the substituent include, but are not limited to, a nitro group, a halogen atom such as fluorine atom, a carboxyl group, a hydroxyl group, an amino group, a cyano group, an alkyl group (preferably having a carbon number of 1 to 15), an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an arylthio group (preferably having a carbon number of 6 to 14), a hydroxyalkyl group (preferably having a carbon number of 1 to 15), an alkylcarbonyl group (preferably having a carbon number of 2 to 15), a cycloalkylcarbonyl group (preferably having a carbon number of 4 to 15), an arylcarbonyl group (preferably having a carbon number of 7 to 14), a cycloalkenyloxy group (preferably having a carbon number of 3 to 15), and a cycloalkenylalkyl group (preferably having a carbon number of 4 to 20).

In the cycloalkyl group and cycloalkenyl group as the substituent which each of the groups of $R_{201}$, $R_{202}$ and $R_{203}$ may have, at least one of carbon atoms constituting the ring may be carbonyl carbon.

The substituent which each of the groups of $R_{201}$, $R_{202}$ and $R_{203}$ may have may further have a substituent, and examples of this further substituent are the same as examples of the substituent which each of the groups of $R_{201}$, $R_{202}$ and $R_{203}$ may have, but an alkyl group and a cycloalkyl group are preferred.

The preferred structure when at least one of $R_{201}$ to $R_{203}$ is not an aryl group includes cation structures such as compounds illustrated in paragraphs 0046 and 0047 of JP-A-2004-233661 and paragraphs 0040 to 0046 of JP-A-2003-35948, Compounds (I-1) to (I-70) illustrated in U.S. Patent Application Publication 2003/0224288A1, and Compounds (IA-1) to (IA-54) and (IB-1) to (IB-24) illustrated in U.S. Patent Application Publication 2003/0077540A 1.

In formula (PZII), each of $R_{204}$ and $R_{205}$ independently represents an aryl group, an alkyl group or a cycloalkyl group. These aryl, alkyl and cycloalkyl groups are the same as the groups described as the aryl, alkyl and cycloalkyl groups of $R_{201}$ to $R_{203}$ in the compound (PZI).

The aryl group of $R_{204}$ and $R_{205}$ may be an aryl group having a heterocyclic structure containing an oxygen atom, a nitrogen atom or a sulfur atom. Examples of the aryl group having a heterocyclic structure include a pyrrole residue structure (a group formed by removing one hydrogen atom from a pyrrole), a furan residue structure (a group formed by removing one hydrogen atom from a furan), a thiophene residue structure (a group formed by removing one hydrogen atom from a thiophene), an indole residue structure (a group formed by removing one hydrogen atom from an indole), a benzofuran residue structure (a group formed by removing one hydrogen atom from a benzofuran), and a benzothiophene residue structure (a group formed by removing one hydrogen atom from a benzothiophene).

The aryl group, alkyl group and cycloalkyl group of $R_{204}$ and $R_{205}$ may have a substituent. Examples of the substituent include those of the substituent which the aryl group, alkyl group and cycloalkyl group of $R_{201}$ to $R_{203}$ in formula (PZI) may have.

$Z^-$ represents an acid anion generated resulting from decomposition upon irradiation with an actinic ray or radiation and is preferably a non-nucleophilic anion, and examples thereof are the same as those for $Z^-$ in formula (PZI).

Specific preferred examples of $S^1$ are illustrated below, but the present invention is not limited thereto. Incidentally, the mark * indicates a bond to $A^2$.

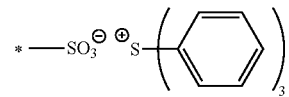

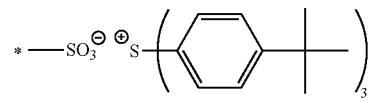

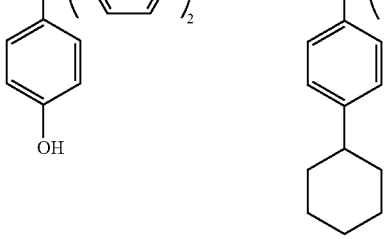

61
-continued
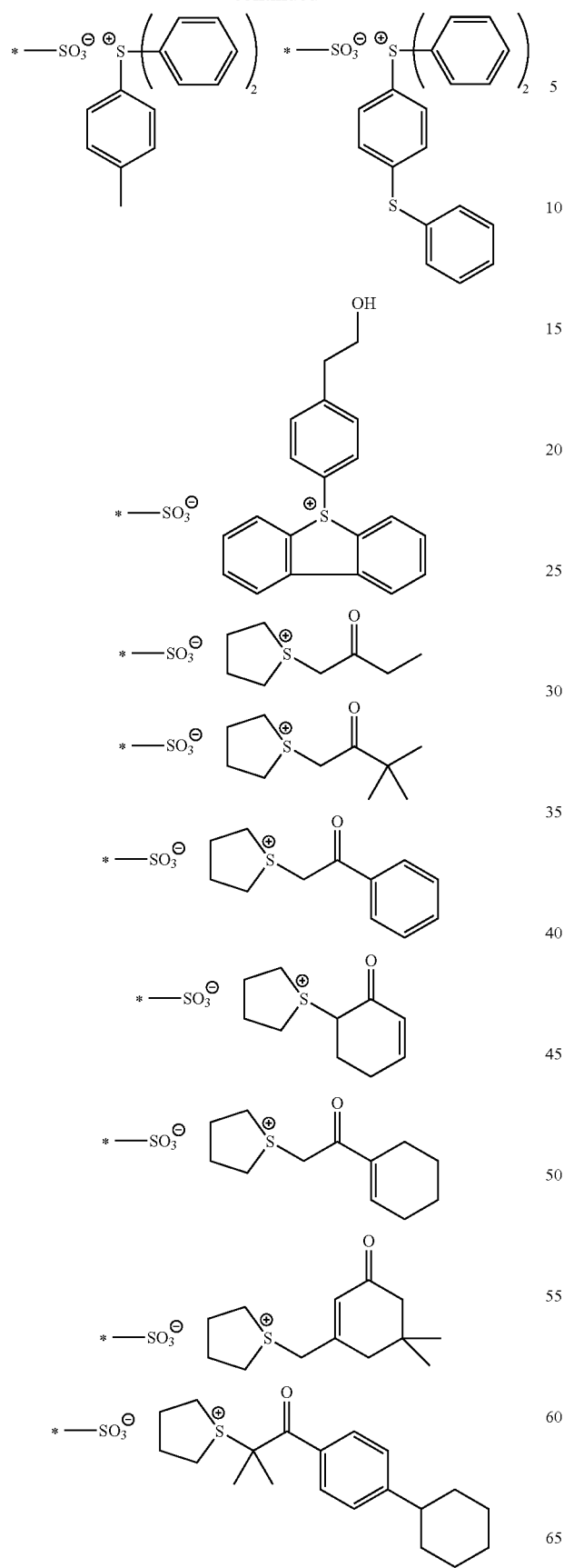
62
-continued
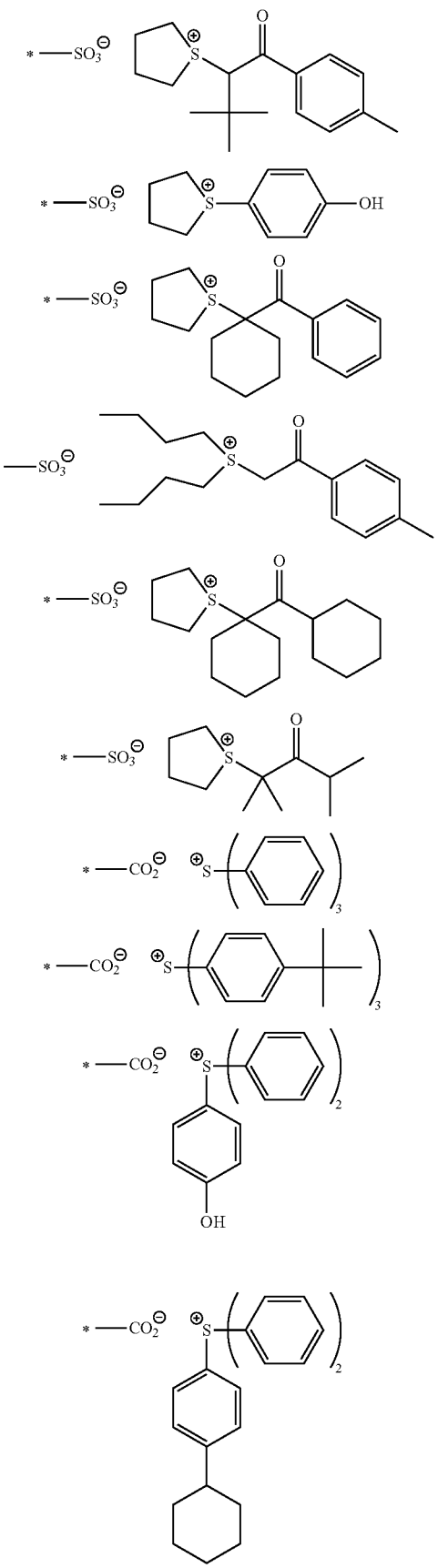

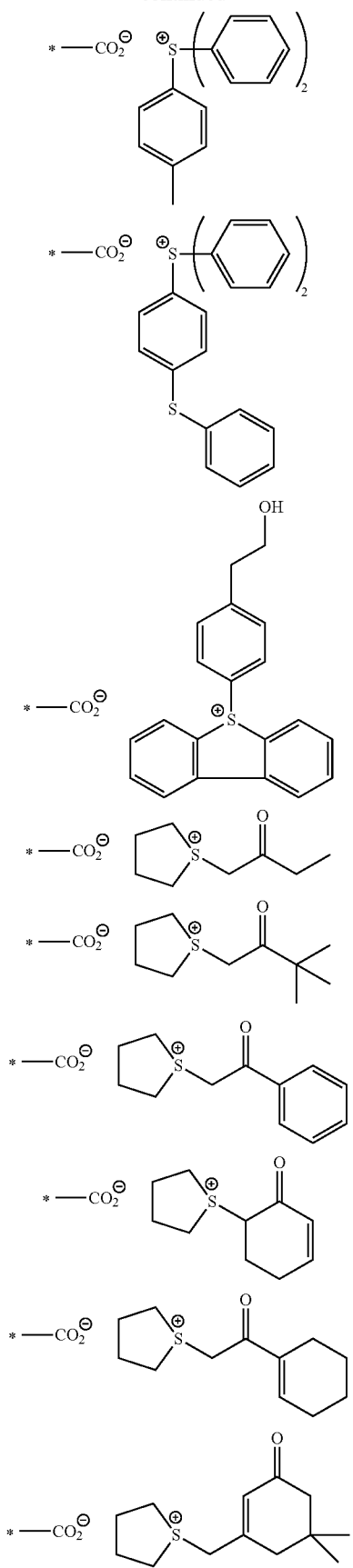
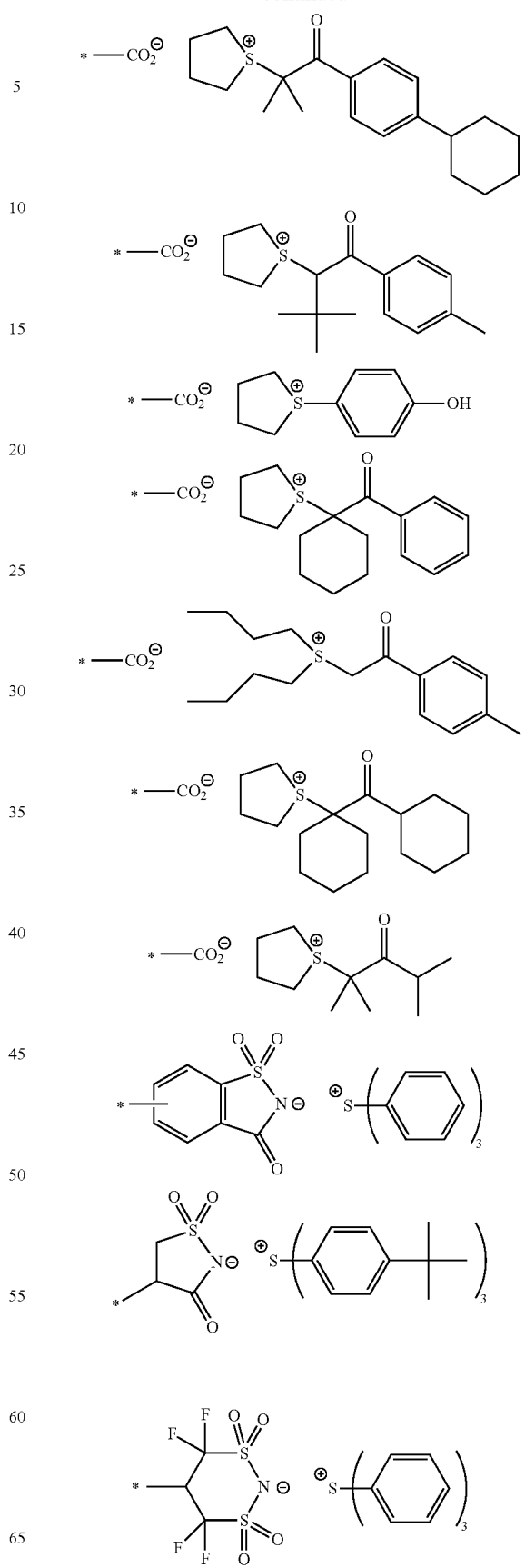

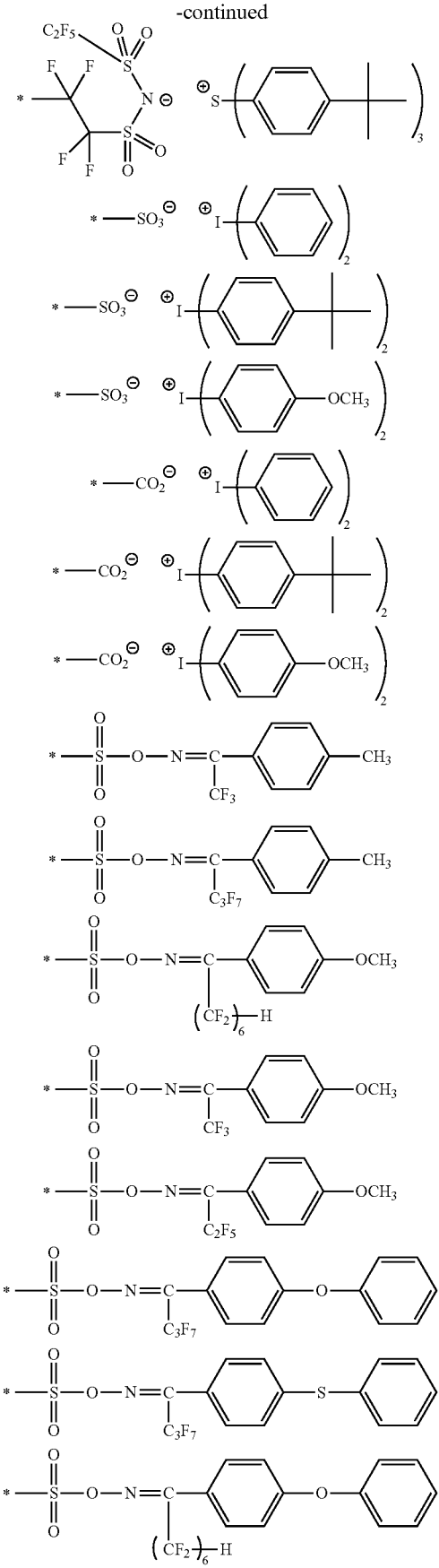
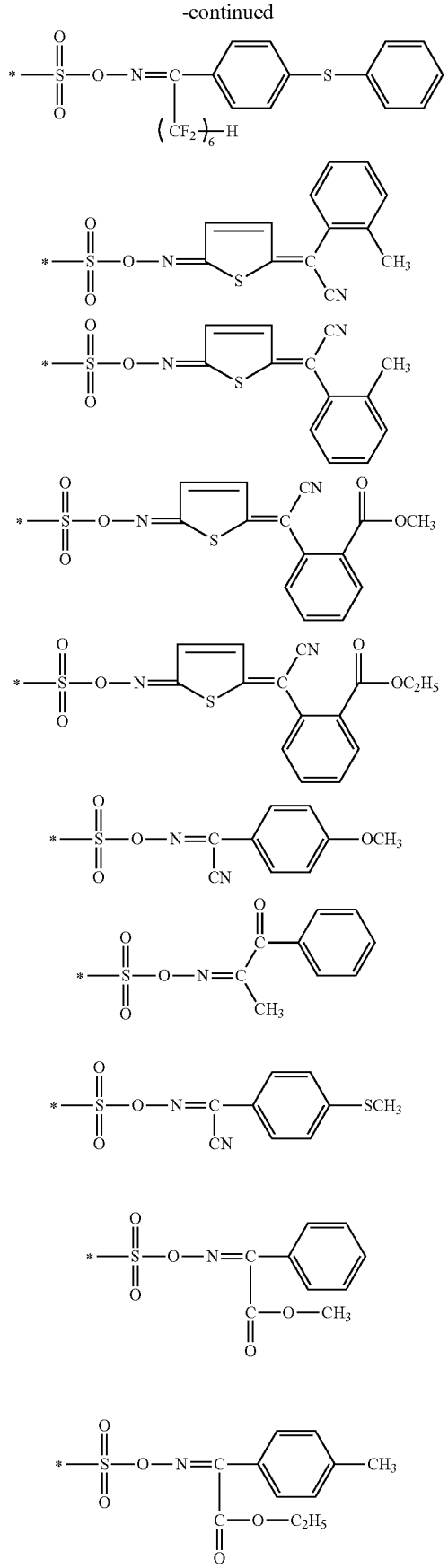

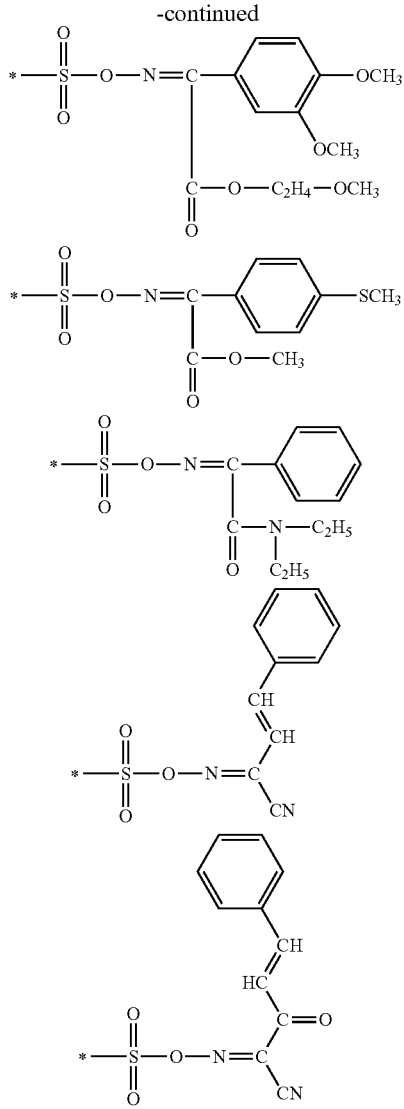

water to perform an anion exchange reaction, and subjecting the reaction product to separation and washing operations with water.

Furthermore, the repeating unit (6) can also be synthesized by introducing an acid anion moiety into the side chain by a polymer reaction and introducing an onium salt through salt exchange.

Specific examples of the repeating unit (6) are illustrated below, but the invention is not limited thereto.

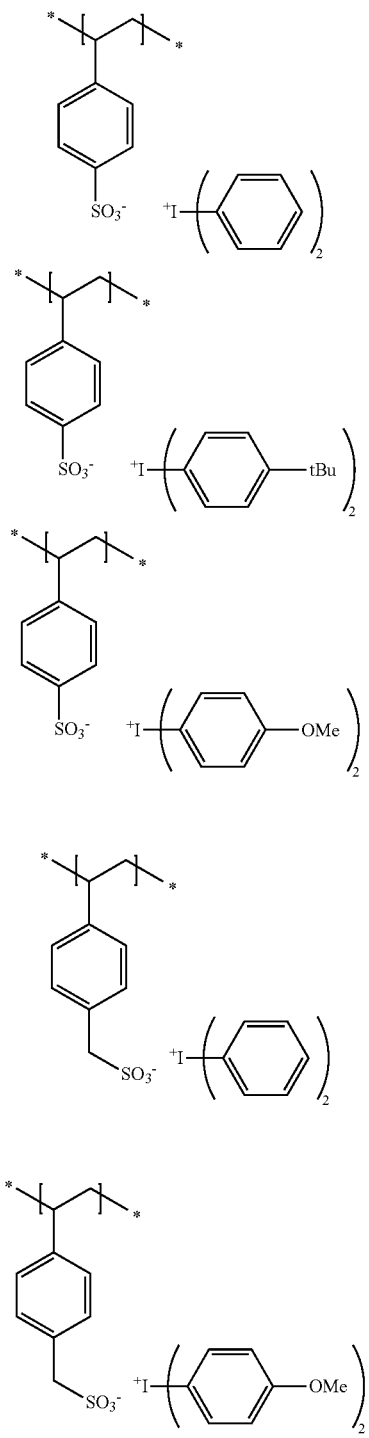

The synthesis method of the monomer corresponding to the repeating unit (6) is not particularly limited but, for example, in the case of an onium structure, the monomer may be synthesized by a method of exchanging an acid anion having a polymerizable unsaturated bond corresponding to the repeating unit with a halide of a known onium salt.

More specifically, a metal ion salt (e.g., sodium ion, potassium ion) or ammonium salt (e.g., ammonium, triethylammonium salt) of an acid having a polymerizable unsaturated bond corresponding to the repeating unit and an onium salt having a halogen ion (e.g., chloride ion, bromide ion, iodide ion) are stirred in the presence of water or methanol to perform an anion exchange reaction, and the reaction product is subjected to separation and washing operations with an organic solvent such as dichloromethane, chloroform, ethyl acetate, methyl isobutyl ketone and tetrahydroxyfuran, and water, whereby the objective monomer corresponding to the repeating unit (6) can be synthesized The monomer can also be synthesized by stirring the compounds above in the presence of an organic solvent separable from water, such as dichloromethane, chloroform, ethyl acetate, methyl isobutyl ketone and tetrahydroxyfuran, and 69
-continued
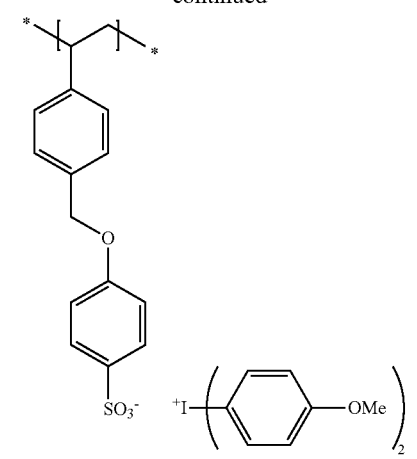
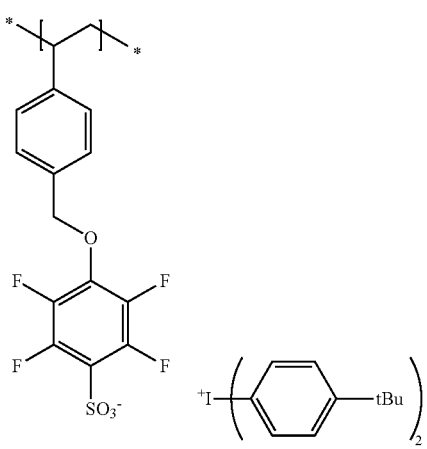
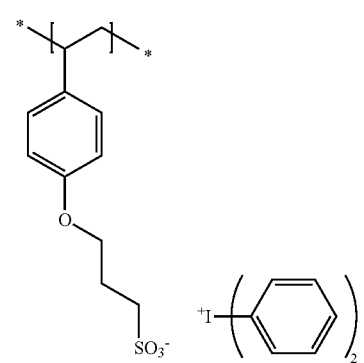
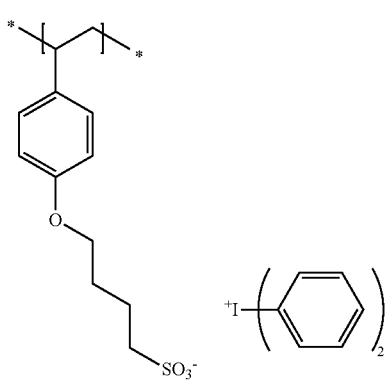
70
-continued
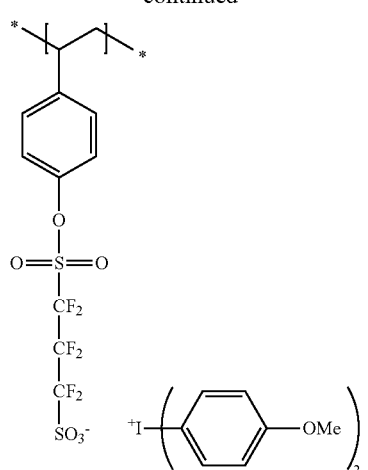
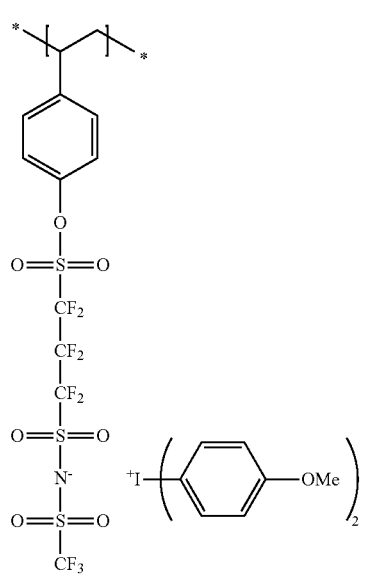
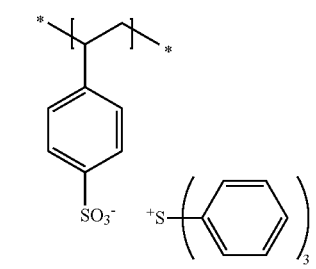
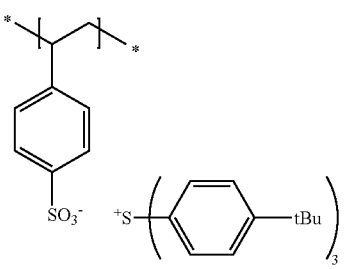

71
-continued
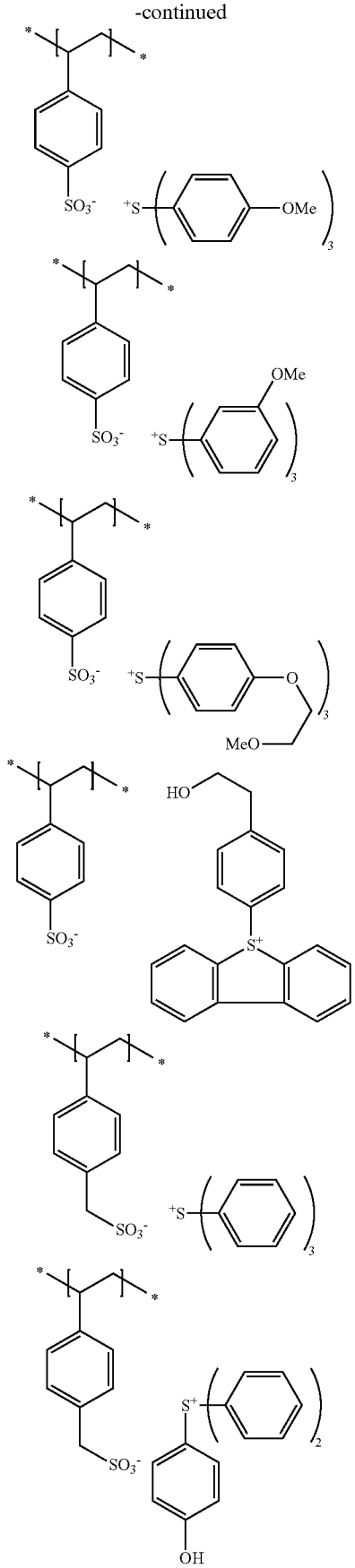
72
-continued
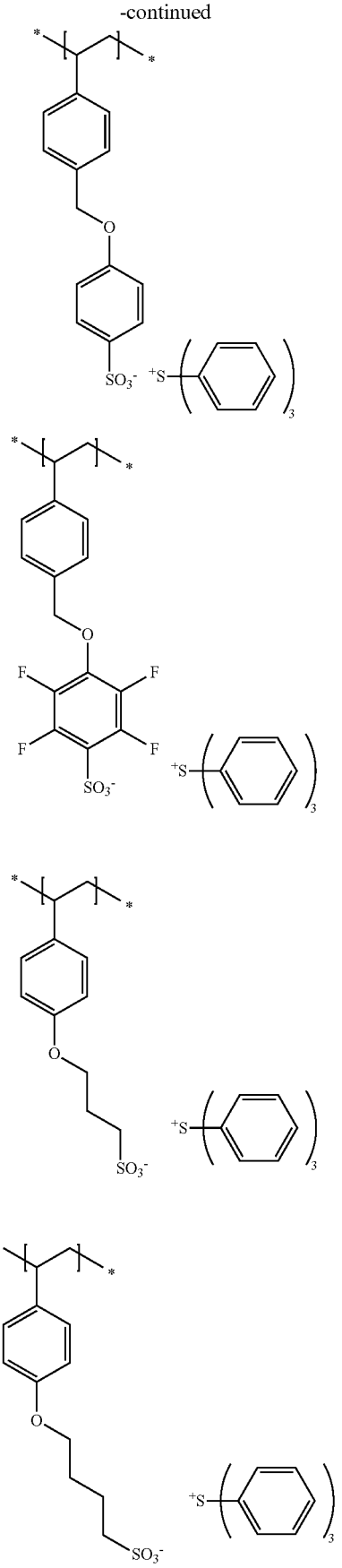

73
-continued
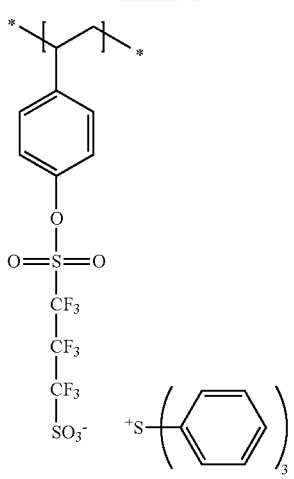
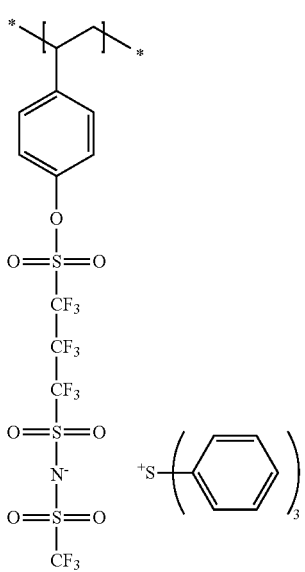
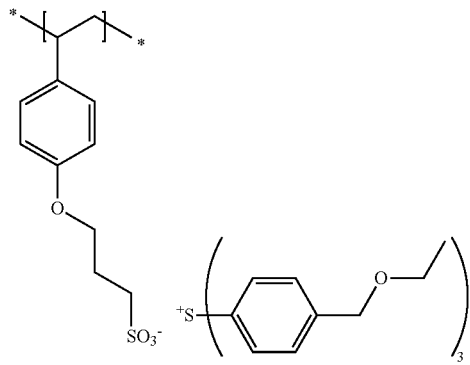
74
-continued
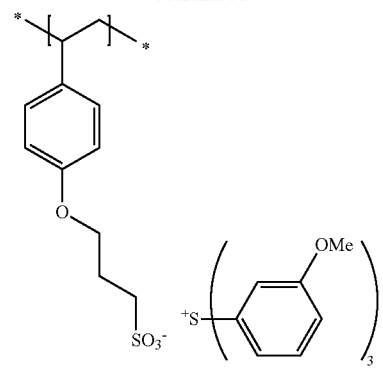
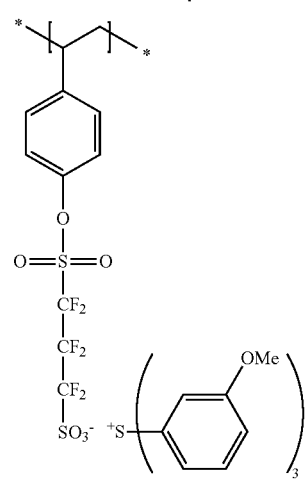
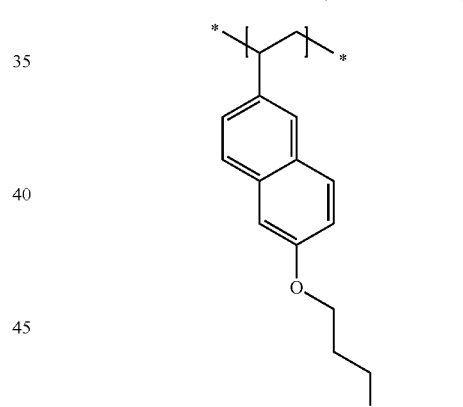
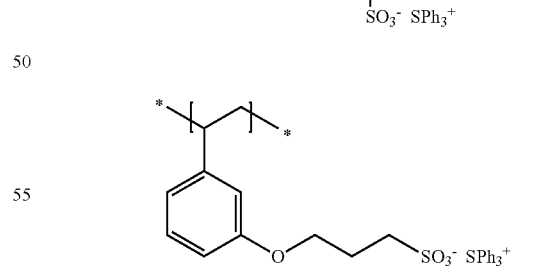
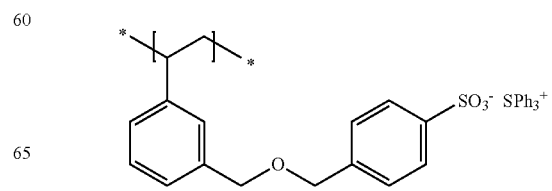

-continued

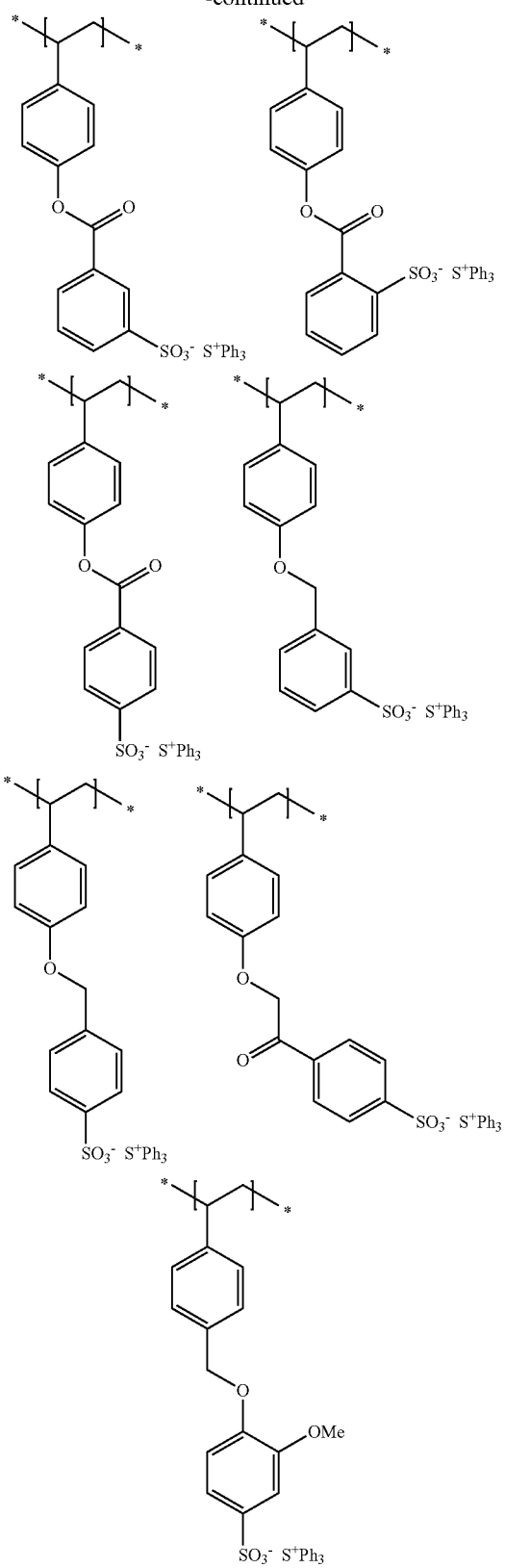

In the case where the resin (P) for use in the present invention contains at least either one of the repeating unit (3) and the repeating unit (4) but does not contain the repeating unit (6), the C Log P value of the resin (P) after $Y^1$ and $Y^2$ capable of leaving by the action of an acid in the repeating unit (3) and the repeating unit (4) are eliminated is preferably 2.6 or more, from the standpoint that the resin in the exposed area is not excessively increased in the solubility for an alkali developer.

In the case where the resin (P) for use in the present invention contains at least either one of the repeating unit (3) and the repeating unit (4) and contains the repeating unit (6), the C Log P value of the resin (P) after $Y^1$ and $Y^2$ capable of leaving by the action of an acid in the repeating unit (3) and the repeating unit (4) are eliminated and the structural moiety $S^1$ capable of decomposing upon irradiation with an actinic ray or radiation to generate an acid in the side chain is decomposed and generates an acid in the side chain, is preferably 2.6 or more.

The state of $Y^1$ and $Y^2$ being eliminated when at least either one of the repeating unit (3) and the repeating unit (4) is present, and the state of $S^1$ being decomposed to generate an acid when the repeating unit (6) is present at the same time, indicate a state where all possible chemical reactions in the resin (P) caused by exposure have proceeded, that is, an ideal state of the resin (P) after exposure. Therefore, the resin (P) after $Y^1$ and $Y^2$ are eliminated when at least either one of the repeating unit (3) and the repeating unit (4) is present, or after $S^1$ is decomposed to generate an acid when the repeating unit (6) is present at the same time, is hereinafter referred to as a "resin (P) after exposure".

The structure after $Y^1$ and $Y^2$ capable of leaving by the action of an acid are eliminated indicates a structure where $Y^1$ and $Y^2$ are substituted for by a hydrogen atom. For example, when the structure of the repeating unit (3) is (a-1) shown below, the structure after leaving of $Y^1$ is represented by the following (b-1).

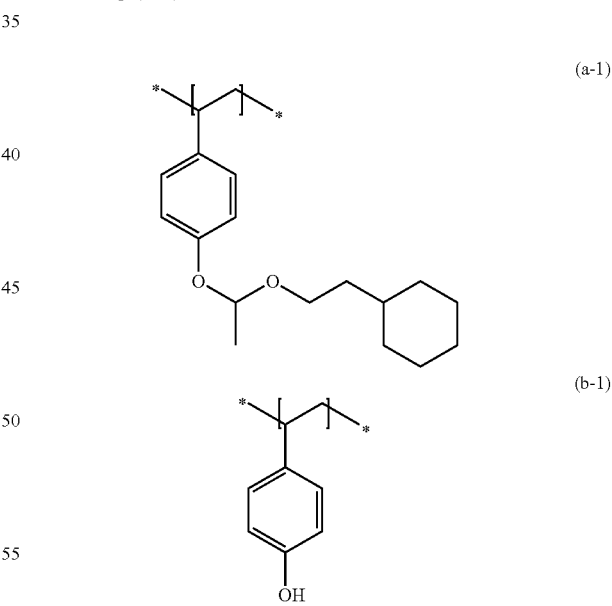

The structure after the structural moiety $S^1$ capable of decomposing upon irradiation with an actinic ray or radiation to generate an acid in the side chain is decomposed and generates an acid in the side chain indicates, for example, a structure of an onium salt being substituted for by a hydrogen ion when $S^1$ is an ionic structural moiety containing an onium salt. For example, when the structure of the repeating unit (6) is (a-2) shown below, the structure after decomposition of $S^1$ is represented by the following (b-2).

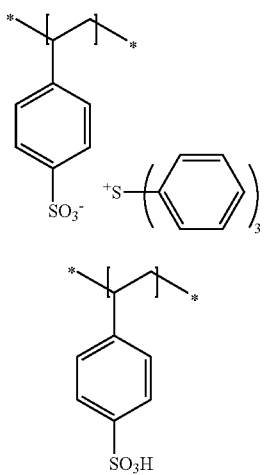

(a-2)

(b-2)

C Log P is the computer-calculated value of Log P which is the water-n-octanol partition coefficient P expressed by a common logarithm, and is used as an indicator showing the degree of hydrophilicity/hydrophobicity of a material. The C Log P of each polymerization unit of the resin (P) can be calculated using, for example, a software, Chem Draw Ultra ver. 8.0, produced by Cambridge Soft Corporation. For example, in the case of a polyhydroxystyrene resin, the computed value C Log P is the value of the following structure (a-3) and becomes C Log P=2.50 (rounded off to two decimal places), and in the case of a polymethacrylic acid resin, the computed value C Log P is the value of the following structure (a-4) and becomes C Log P=0.64 (rounded off to two decimal places). An arithmetic average value of numerals of respective polymerization units is defined as the C Log P value of the copolymerization composition.

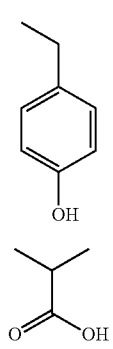

(a-3)

(a-4)

In the present invention, the relationship between the C Log P value of the resin (P) after exposure and the isolated line resolution of a resist composition using the resin (P) was fully examined, as a result, it has been revealed that, as shown in Table 2, when the C Log P value of the resin (P) after exposure is 2.6 or more, the isolated line resolution is improved. Accordingly, the C Log P value of the resin (P) after exposure is preferably 2.6 or more. The C Log P value of the resin (P) after exposure is not particularly limited in its upper limit, but if the C Log P value is excessively high, the alkali solubility of the resin and in turn, the resolution are reduced. The C Log P value of the resin (P) after exposure is preferably from 2.6 to 4.0, more preferably from 2.6 to 3.5.

The content of the repeating unit represented by formula (1) occupying in the resin (P) is preferably designed appropriately so that the C Log P value of the resin (P) after exposure becomes 2.6 or more, but in general, the content is preferably from 1 to 40 mol %, more preferably from 3 to 30 mol %, still more preferably from 5 to 20 mol %, based on all repeating units.

The content of the repeating unit represented by formula (2) occupying in the resin (P) is preferably from 10 to 90 mol %, more preferably from 20 to 85 mol %, still more preferably from 30 to 80 mol %, based on all repeating units.

In the case of containing the repeating unit represented by formula (3) in the resin (P) for use in the present invention, the content of the repeating unit represented by formula (3) occupying in the resin (P) is preferably from 1 to 60 mol %, more preferably from 3 to 50 mol %, still more preferably from 5 to 40 mol %, based on all repeating units.

In the case of containing the repeating unit represented by formula (4) in the resin (P) for use in the present invention, the content of the repeating unit represented by formula (4) occupying in the resin (P) is preferably from 1 to 60 mol %, more preferably from 3 to 50 mol %, still more preferably from 5 to 40 mol %, based on all repeating units.

In the case of containing the repeating unit represented by formula (3) and the repeating unit represented by formula (4) in the resin (P) for use in the present invention, the content of the repeating unit represented by formula (3) and the repeating unit represented by formula (4) occupying in the resin (P) is preferably from 1 to 60 mol %, more preferably from 3 to 50 mol %, still more preferably from 5 to 40 mol %, based on all repeating units.

In the case of containing the repeating unit represented by formula (6) in the resin (P) for use in the present invention, the content of the repeating unit represented by formula (6) occupying in the resin (P) is preferably from 0.5 to 80 mol %, more preferably from 1 to 60 mol %, still more preferably from 3 to 40 mol %, based on all repeating units.

The form of the resin (P) may be any of random type, block type, comb type and star type.

The resin (P) can be synthesized, for example, by radical polymerization or cationic or anionic polymerization of unsaturated monomers corresponding to respective repeating units. The resin may also be synthesized by polymerizing unsaturated monomers corresponding to precursors of respective repeating units and then performing a polymer reaction. In either case, living polymerization such as living anionic polymerization is preferably used, because the molecular weight distribution of the obtained resin becomes uniform.

The resin (P) is not particularly limited in its molecular weight, but the weight average molecular weight thereof is preferably from 1,000 to 100,000, more preferably from 1,500 to 70,000, still more preferably from 2,000 to 50,000. Here, the weight average molecular weight of the resin indicates a molecular weight in terms of polystyrene measured by GPC (solvent: THF).

The polydispersity (Mw/Mn) is preferably from 1.00 to 3.50, more preferably from 1.00 to 2.00, still more preferably from 1.00 to 1.30.

In order to more enhance the performance of the resin (P), repeating units derived from other polymerizable monomers may be further contained within the range not seriously impairing the dry etching resistance.

The content of repeating units derived from other polymerizable monomers occupying in the resin (P) is generally 50 mol % or less, preferably 30 mol % or less, based on all repeating units. Examples of other polymerizable monomers which can be used include a compound having at least one addition-polymerizable unsaturated bond selected from (meth)acrylic acid esters, (meth)acrylamides, allyl compounds, vinyl ethers, vinyl esters, styrenes and crotonic acid esters. In addition, other polymerizable monomers include maleic dialkyl esters, fumaric dialkyl esters, itaconic dialkyl esters, acrylonitrile, methacrylonitrile and maleonitrile.

Specifically, examples of the (meth)acrylic acid esters include methyl(meth)acrylate, ethyl(meth)acrylate, propyl (meth)acrylate, tert-butyl(meth)acrylate, amyl(meth)acrylate, cyclohexyl(meth)acrylate, ethylhexyl(meth)acrylate, octyl(meth)acrylate, tert-octyl(meth)acrylate, 2-chloroethyl (meth)acrylate, 2-hydroxyethyl(meth)acrylate, glycidyl (meth)acrylate, benzyl(meth)acrylate and phenyl(meth)acrylate.

Examples of the (meth)acrylamides include (meth)acrylamide, N-alkyl(meth)acrylamide (the alkyl group is an alkyl group having a carbon number of 1 to 10, such as methyl group, ethyl group, propyl group, butyl group, tert-butyl group, heptyl group, octyl group, cyclohexyl group, benzyl group, hydroxyethyl group and benzyl group), N-aryl(meth)acrylamide (the aryl group is, for example, a phenyl group, a tolyl group, a nitrophenyl group, a naphthyl group, a cyanophenyl group, a hydroxyphenyl group or a carboxyphenyl group), N,N-dialkyl(meth)acrylamide (the alkyl group is an alkyl group having a carbon number of 1 to 10, such as methyl group, ethyl group, butyl group, isobutyl group, ethylhexyl group and cyclohexyl group), N,N-aryl(meth)acrylamide (the aryl group is, for example, a phenyl group), N-methyl-N-phenylacrylamide, N-hydroxyethyl-N-methylacrylamide and N-2-acetamidoethyl-N-acetylacrylamide.

Examples of the allyl compounds include allyl esters (e.g., allyl acetate, allyl caproate, allyl caprylate, allyl laurate, allyl palmitate, allyl stearate, allyl benzoate, allyl acetoacetate, allyl lactate), and allyloxyethanol.

Examples of the vinyl ethers include an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), and a vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether).

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate and vinyl naphthoate.

Examples of the styrenes include styrene, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), an alkoxystyrene (e.g., methoxystyrene, 4-methoxy-3-methylstyrene, dimethoxystyrene), an alkylcarbonyloxystyrene (e.g., 4-acetoxystyrene, 4-cyclohexylcarbonyloxystyrene), an arylcarbonyloxystyrene (e.g., 4-phenylcarbonyloxystyrene), a halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), cyanostyrene and carboxystyrene.

Examples of the crotonic acid esters include an alkyl crotonate (e.g., butyl crotonate, hexyl crotonate, glycerin monocrotonate).

Examples of the itaconic dialkyl esters include dimethyl itaconate, diethyl itaconate and dibutyl itaconate.

Examples of the dialkyl esters of maleic acid or fumaric acid include dimethyl maleate and dibutyl fumarate. Other examples include maleic anhydride, maleimide, acrylonitrile, methacrylonitrile and maleylonitrile. Also, an addition-polymerizable unsaturated compound generally copolymerizable with the repeating unit for use in the present invention may be used without any particular limitation.

The resin (P) may further contain a repeating unit having a hydroxyl group or a cyano group, other than the above-described repeating unit (1), repeating unit (2), repeating unit (3), repeating unit (4) and repeating unit (6). Thanks to this repeating unit, the adherence to substrate and the affinity for developer can be enhanced. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group or a norbornane group. The alicyclic hydrocarbon structure substituted with a hydroxyl group or a cyano group is preferably a partial structure represented by the following formulae (VIIa) to (VIId):

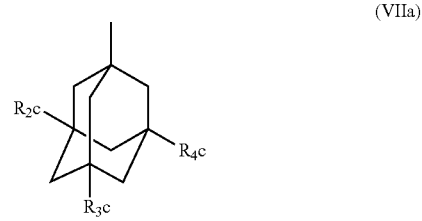

(VIIa)

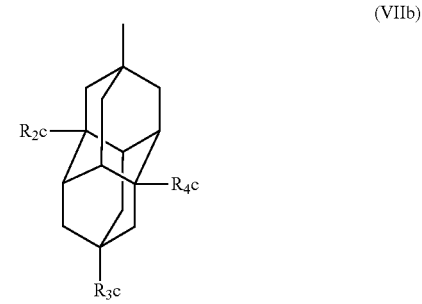

(VIIb)

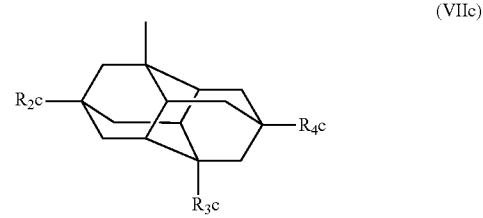

(VIIc)

-continued (VIId)

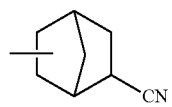

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_2c$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId):

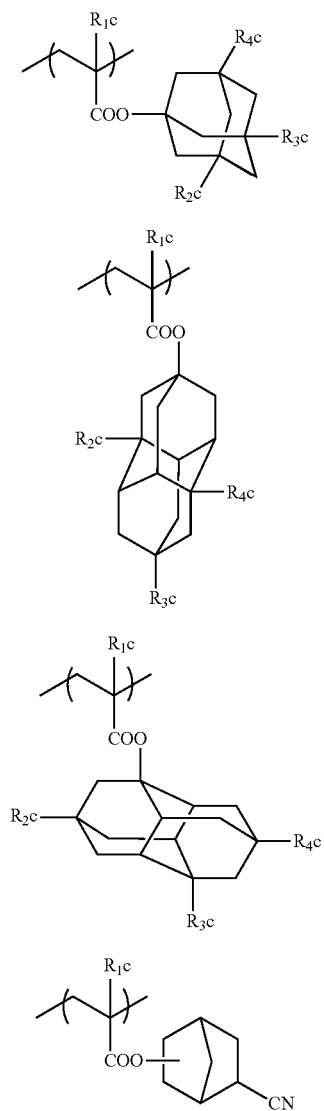

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

In the case where the resin (P) contains a repeating unit having a hydroxyl group or a cyano group, the content thereof is preferably from 0.5 to 80 mol %, more preferably from 1 to 60 mol %, still more preferably from 2 to 40 mol %, based on all repeating units in the resin (P).

Specific examples of the repeating unit having a hydroxyl group or a cyano group are illustrated below, but the present invention is not limited thereto.

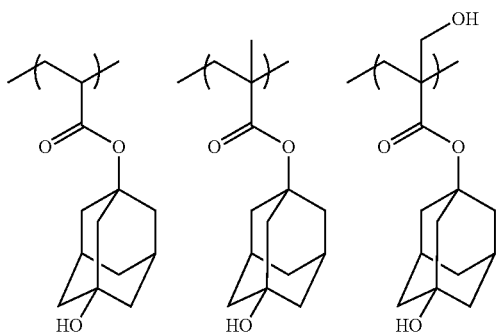

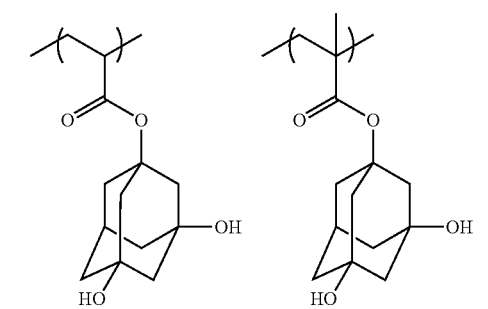

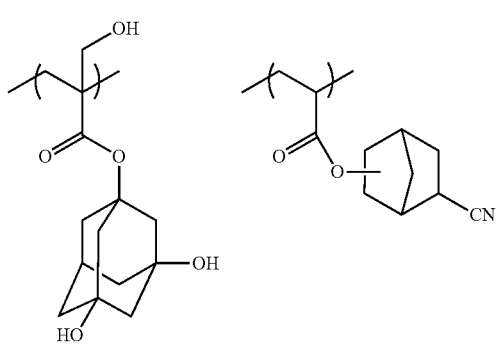

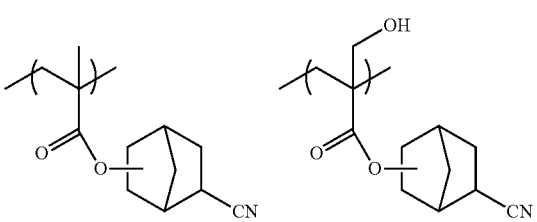

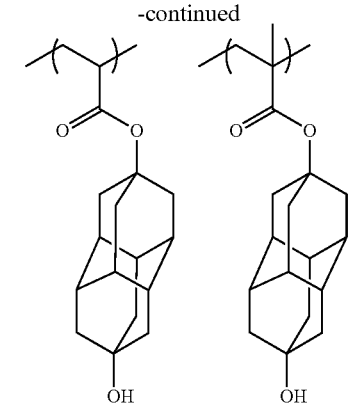

The resin (P) for use in the present invention may further contain a repeating unit having a polar group-free cyclic hydrocarbon structure and not exhibiting acid decomposability. Such a repeating unit includes a repeating unit represented by formula (VII):

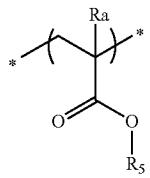
(VII)

In formula (VII), $R_5$ represents a hydrocarbon group having at least one cyclic hydrocarbon structure and having no polar group (e.g., hydroxyl group, cyano group).

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic hydrocarbon structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, a cycloalkenyl group having a carbon number of 3 to 12, such as cyclohexenyl group. and a phenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring assembly hydrocarbon group and a crosslinked cyclic hydrocarbon group. Examples of the ring assembly hydrocarbon group include a bicyclohexyl group, a perhydronaphthalenyl group, a biphenyl group and a 4-cyclohexylphenyl group. Examples of the crosslinked cyclic hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.0$^{2,6}$]decane ring and tricyclo[4.3.1.1$^{2,5}$] undecane ring, and a tetracyclic hydrocarbon ring such as tetracyclo[4.4.0.1$^{2,5}$.1$^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,0$^{2,6}$]decanyl group. Among these crosslinked cyclic hydrocarbon rings, a norbornyl group and an adamantyl group are more preferred.

These cyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a monovalent aliphatic hydrocarbon ring group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 1 to 4.

Specific examples of the repeating unit having a polar group-free cyclic hydrocarbon structure and not exhibiting acid decomposability are illustrated below, but the present invention is not limited thereto. In the formulae, Ra represents H, $CH_3$, $CH_2OH$ or $CF_3$.

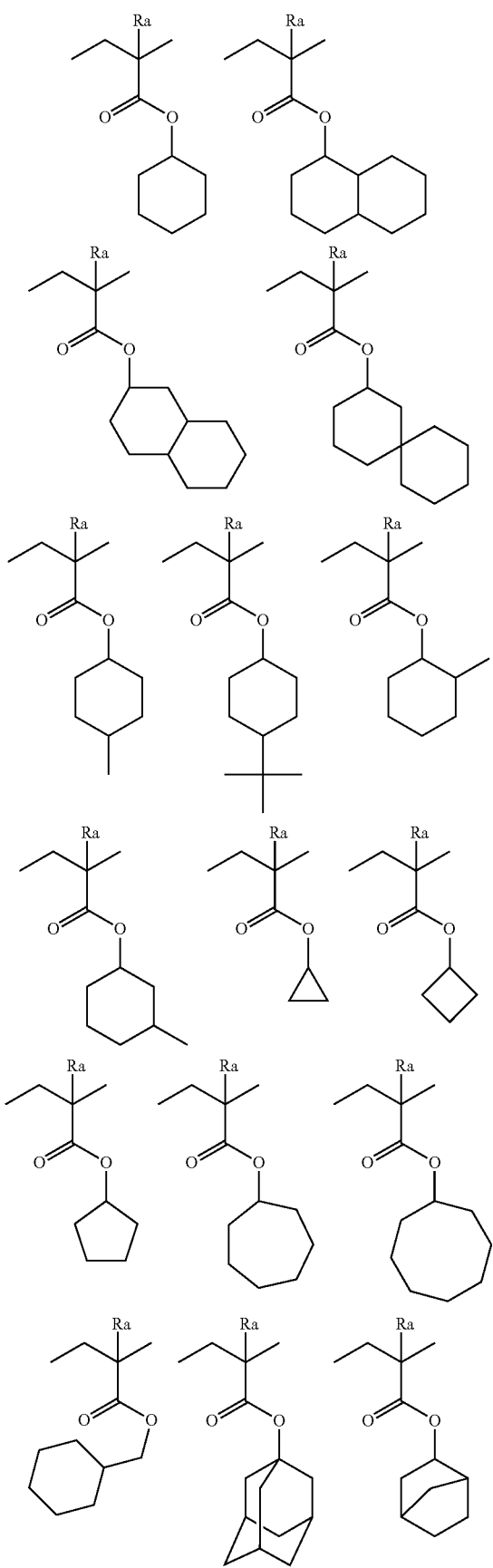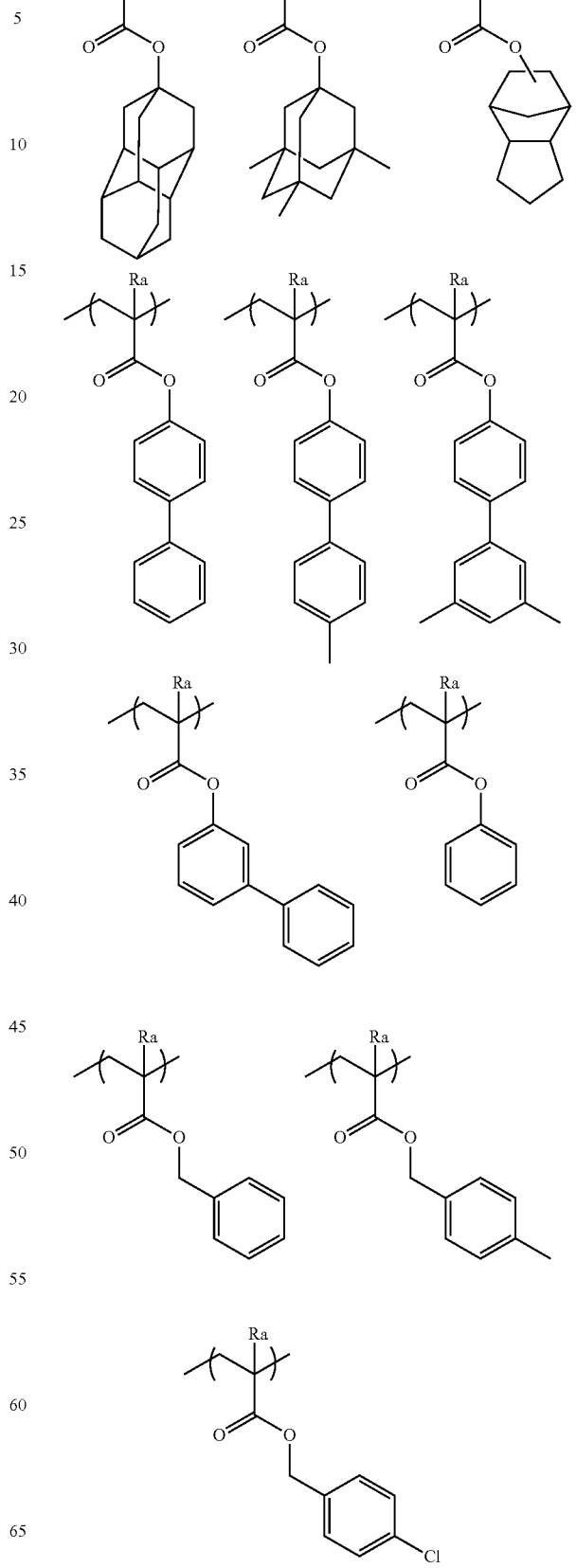

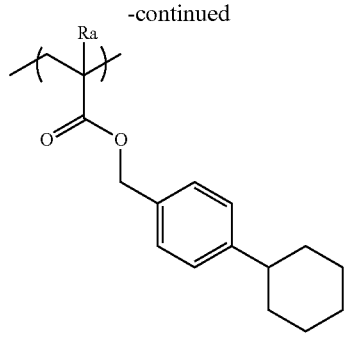

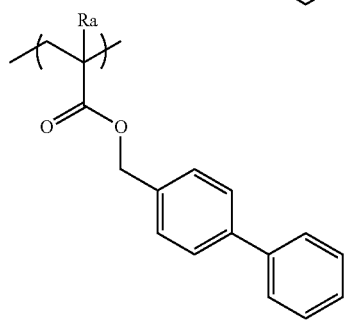

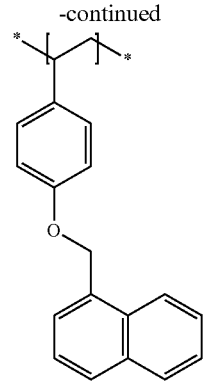

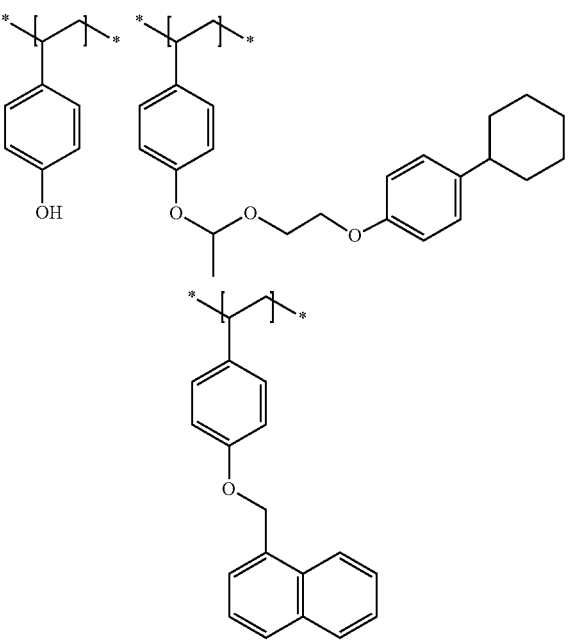

The resin (P) may or may not contain a repeating unit having a polar group-free cyclic hydrocarbon structure and not exhibiting acid decomposability, but in the case of adding this repeating unit, the content thereof is preferably from 1 to 40 mol %, more preferably from 3 to 20 mol %, based on all repeating units in the resin (P).

As for the resin (P) of the present invention, one kind of a resin may be used alone, or two or more kinds thereof may be used in combination.

The content of the resin (P) is preferably from 30 to 100 mass %, more preferably from 50 to 99.7 mass %, still more preferably from 70 to 99.5 mass %, based on the entire solid content of the composition.

Examples of the resin (P) include a resin containing one or more repeating units selected from specific examples of the repeating unit represented by formula (1), one or more repeating units selected from specific examples of the repeating unit represented by formula (2), and one or more repeating units selected from specific examples of at least either one of the repeating units represented by formulae (3) and (4). Other examples of the resin (P) include a resin containing, in addition to the repeating units above, one or more repeating units selected from specific examples of the repeating unit represented by formula (6).

Specific examples of the resin (P) are illustrated below, but the present invention is not limited thereto.

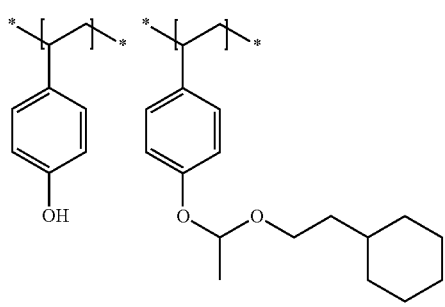

(A-1)

(A-4)
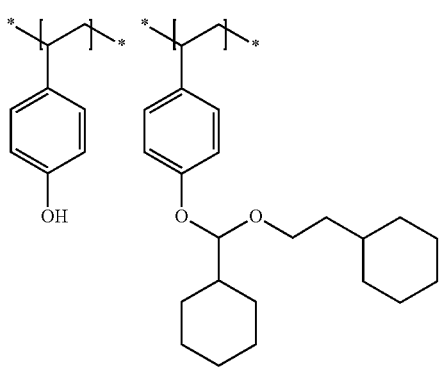
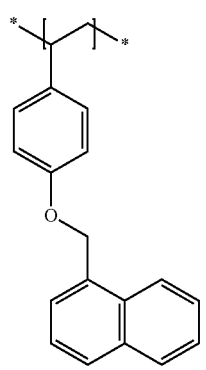
(A-5)
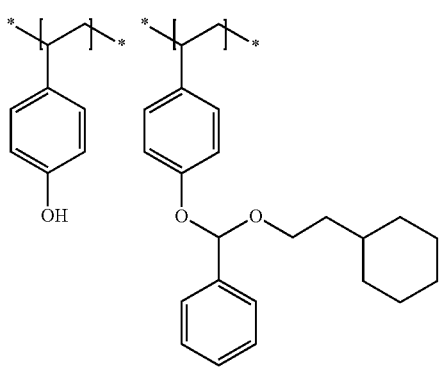
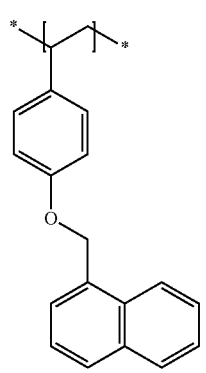
(A-6)
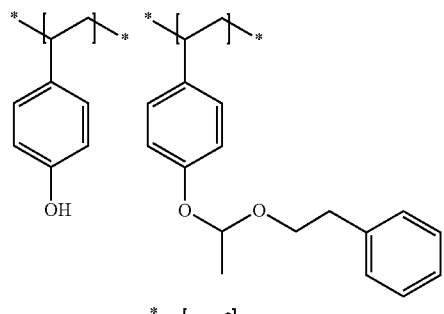
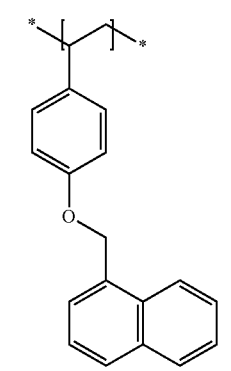
(A-7)
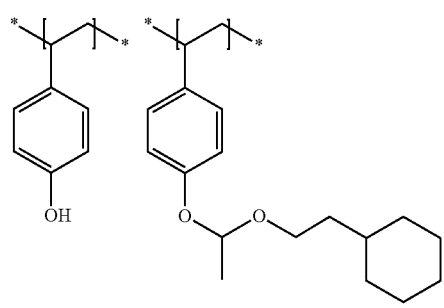
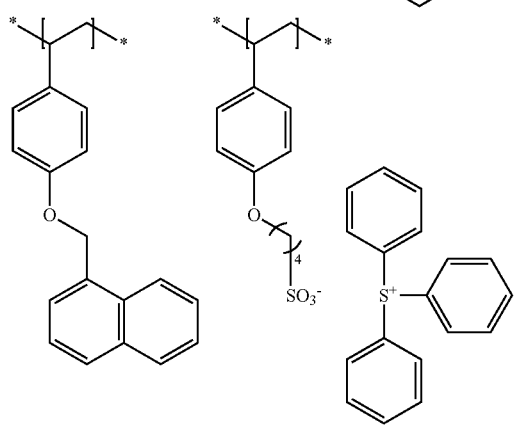
(A-8)
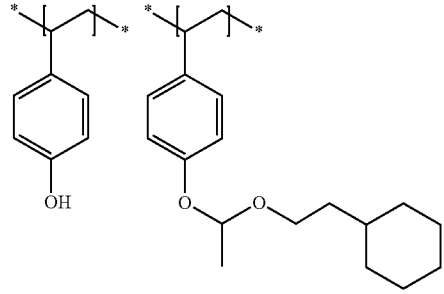

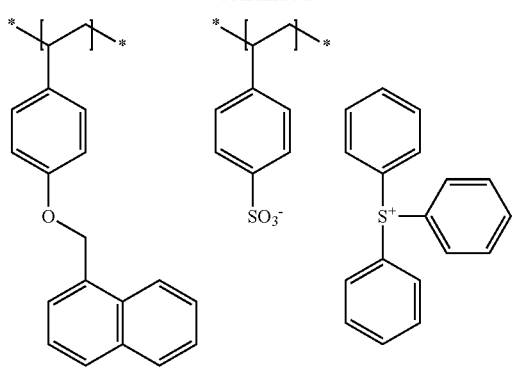
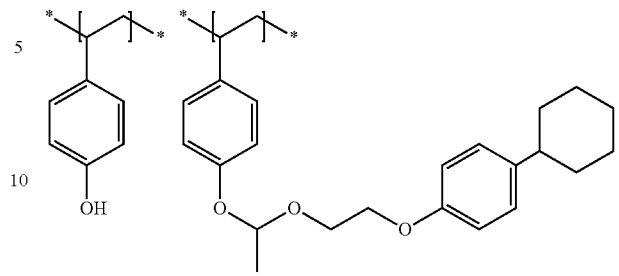
(A-11)
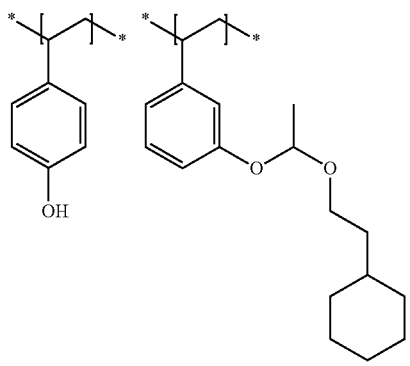
(A-9)
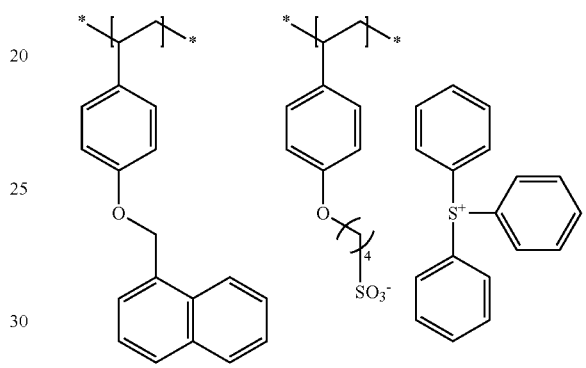
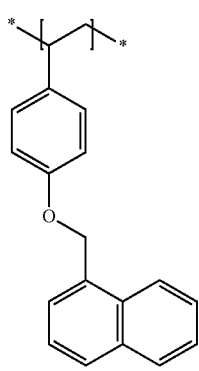
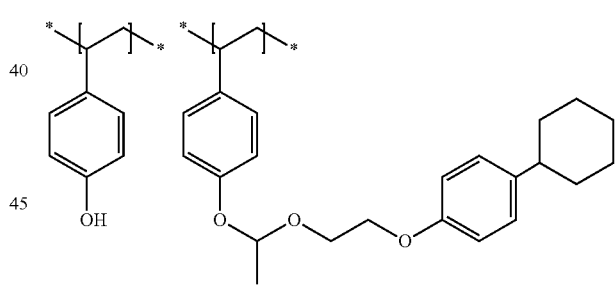
(A-12)
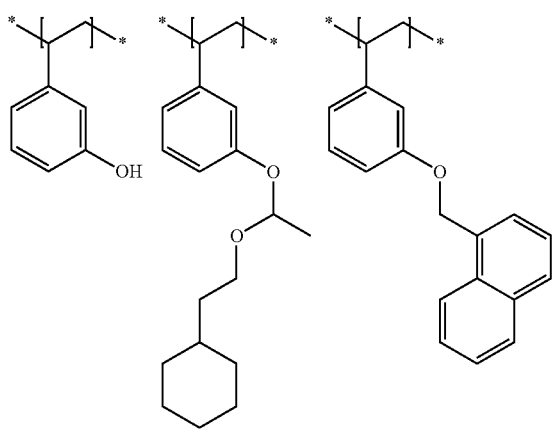
(A-10)
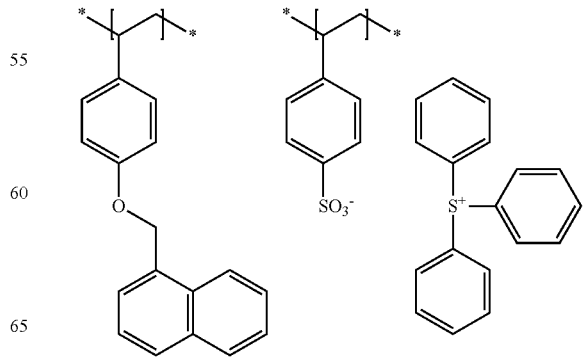

-continued
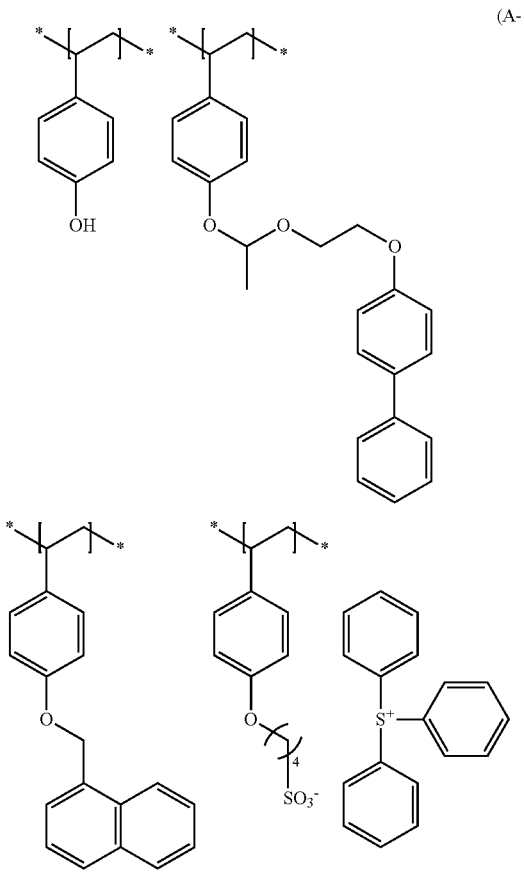
(A-13)
(A-14)
-continued
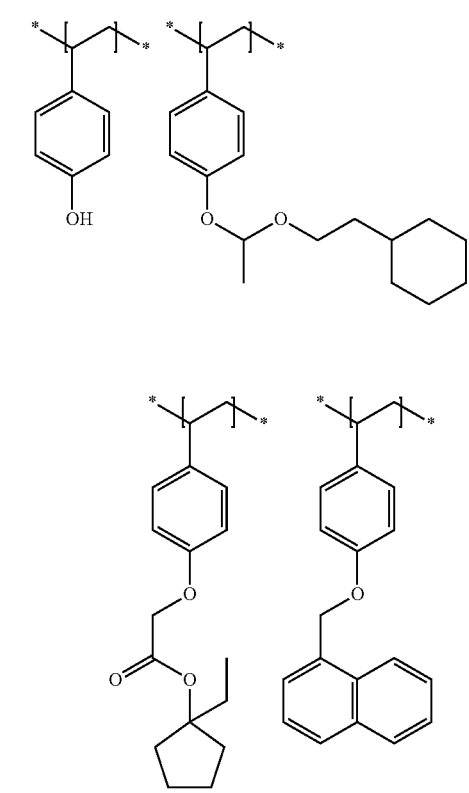
(A-15)
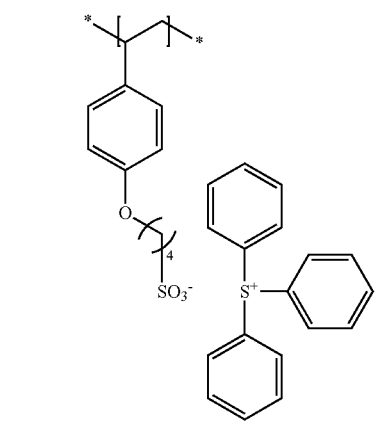
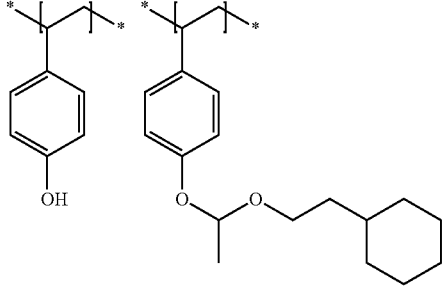
(A-16)

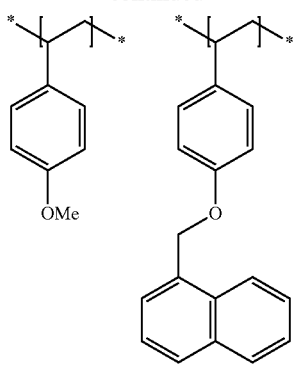
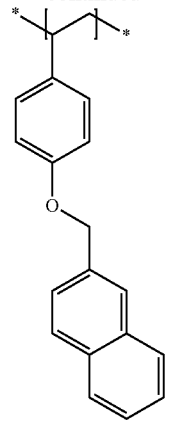
(A-17)
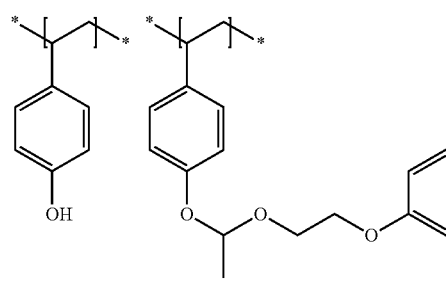
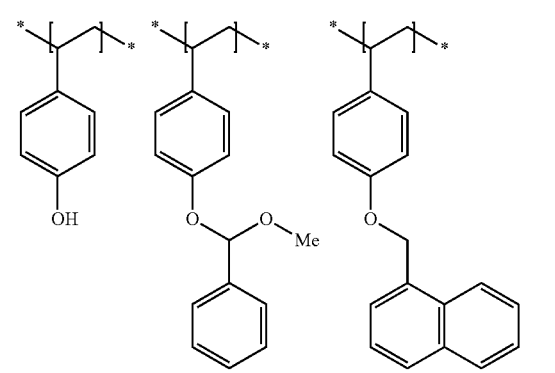
(A-19)
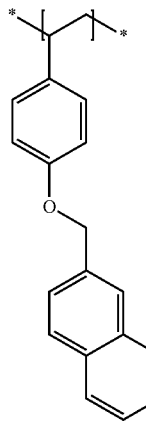
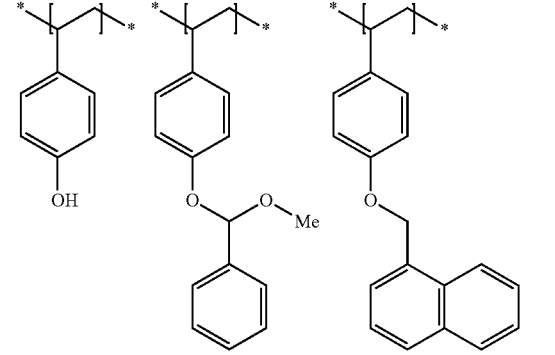
(A-20)
(A-18)
(A-21)

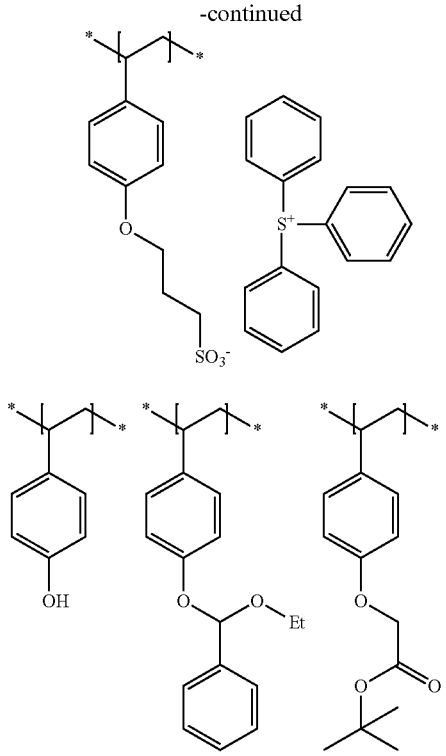
(A-22)
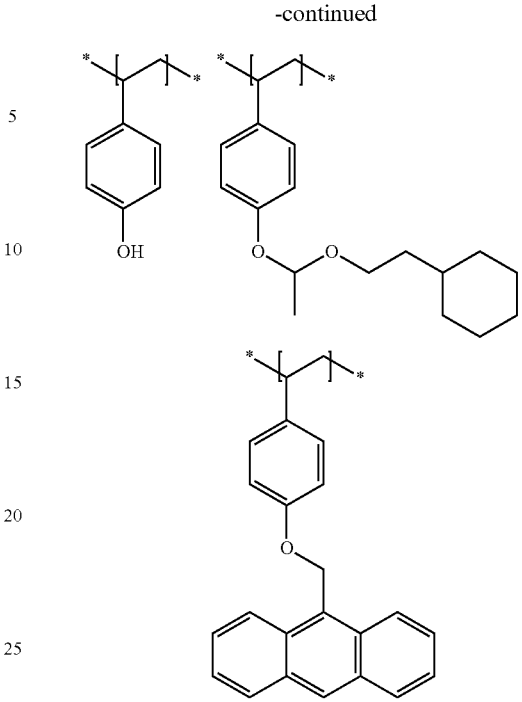
(A-24)
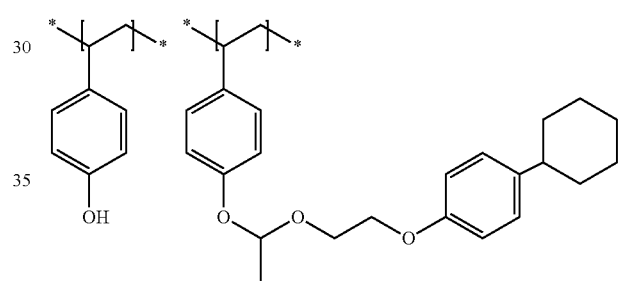
(A-25)
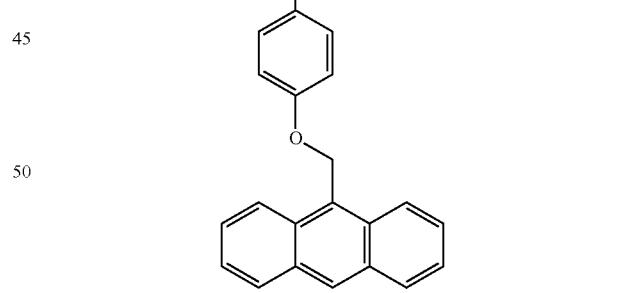
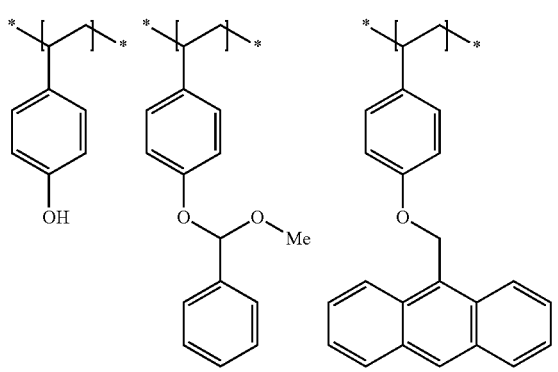
(A-23)
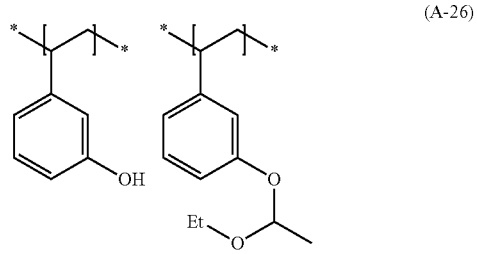
(A-26)

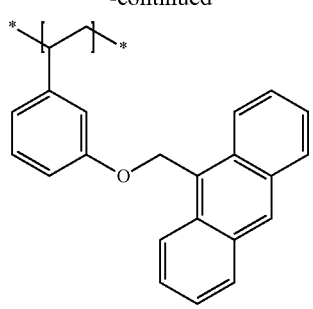
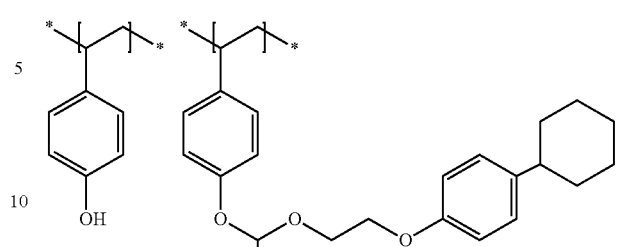
(A-29)
(A-27)
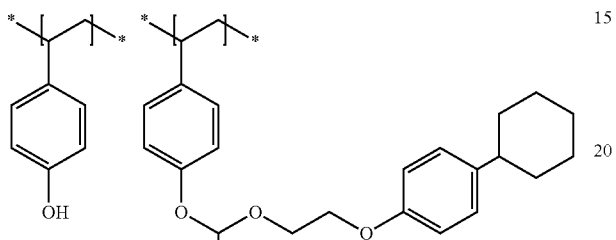
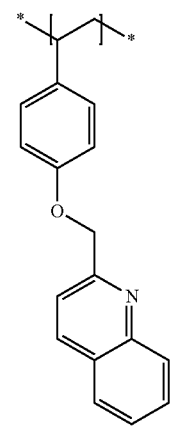
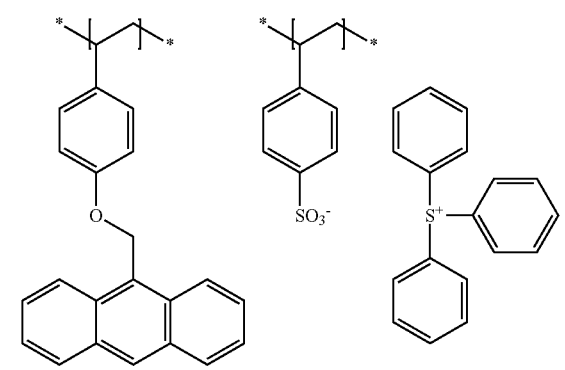
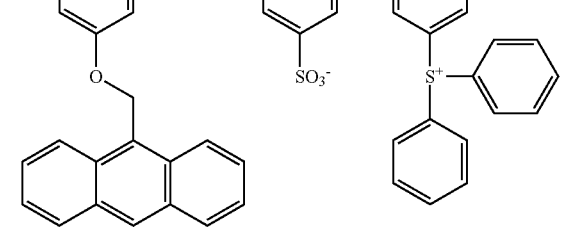
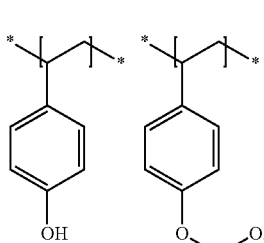
(A-30)
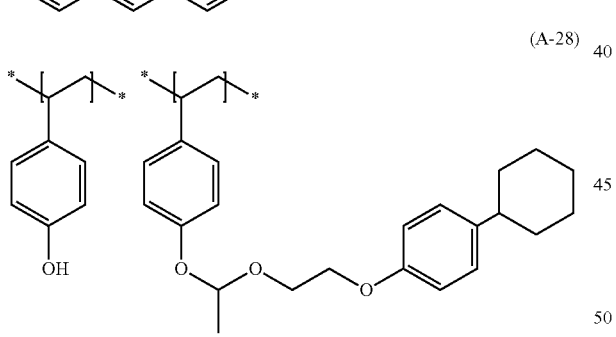
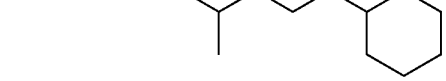
(A-28)
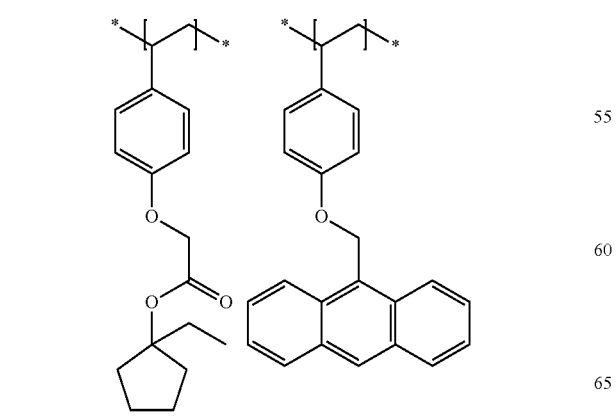
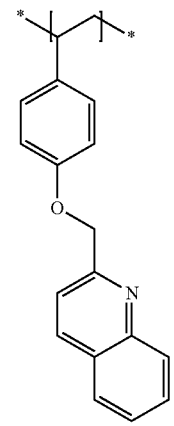

101 -continued
(A-31)
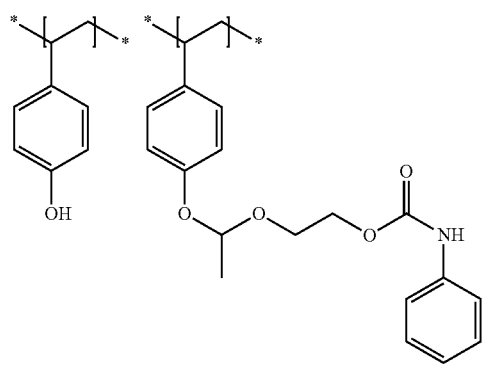
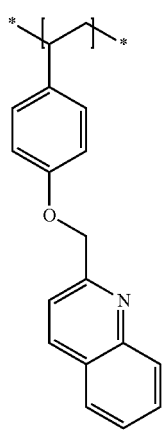
(A-32)
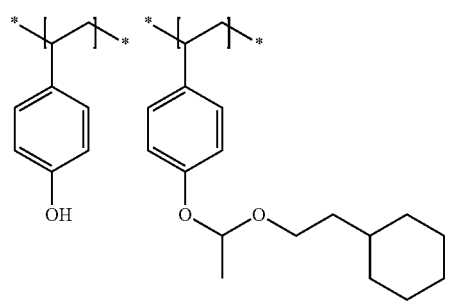
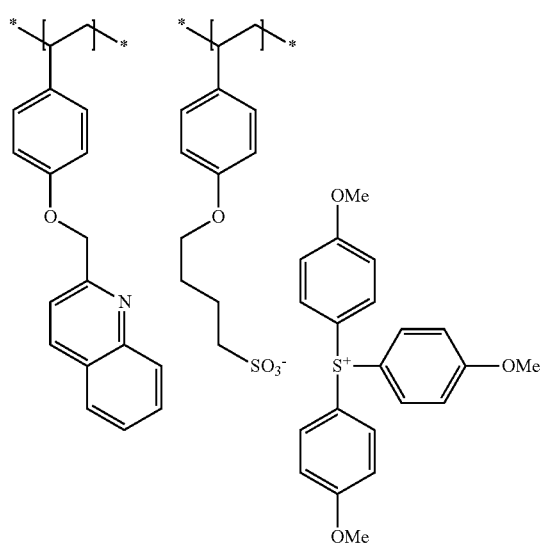
102 -continued
(A-33)
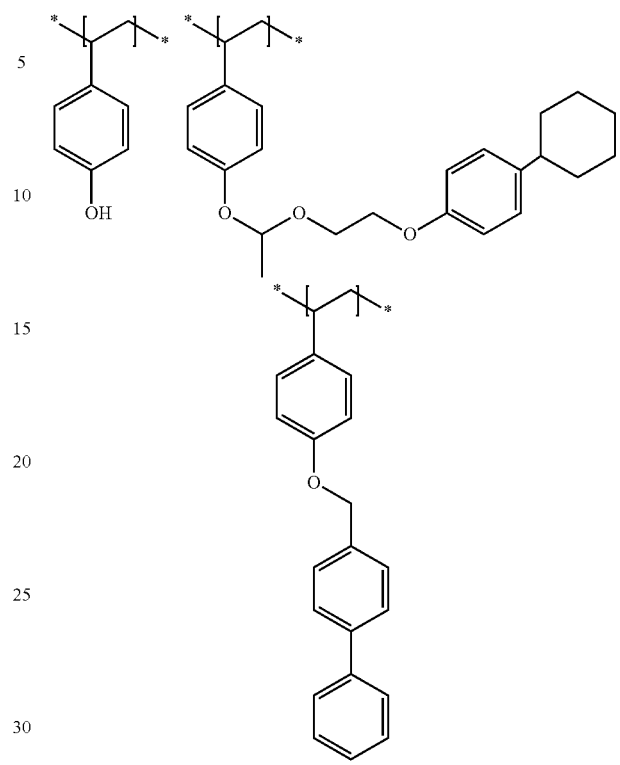
(A-34)
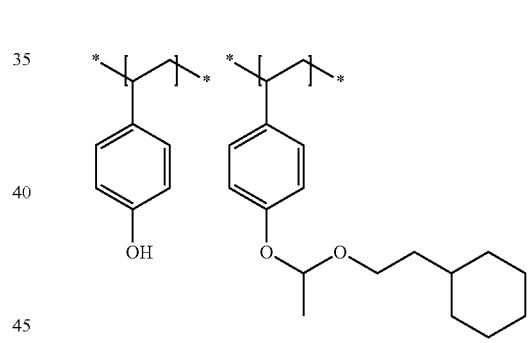
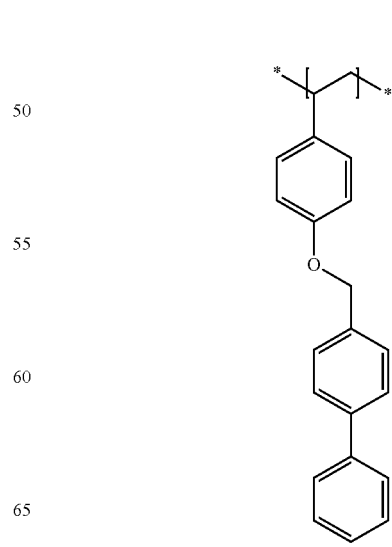

(A-35)
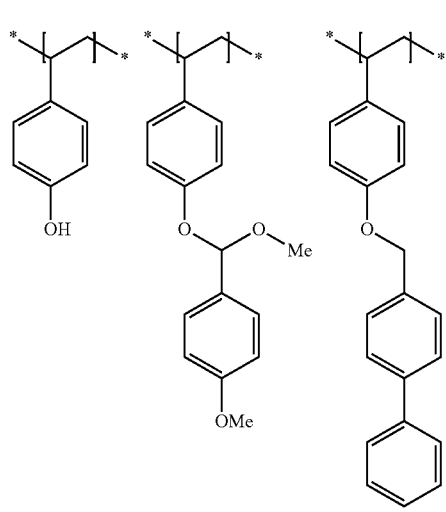
(A-37)
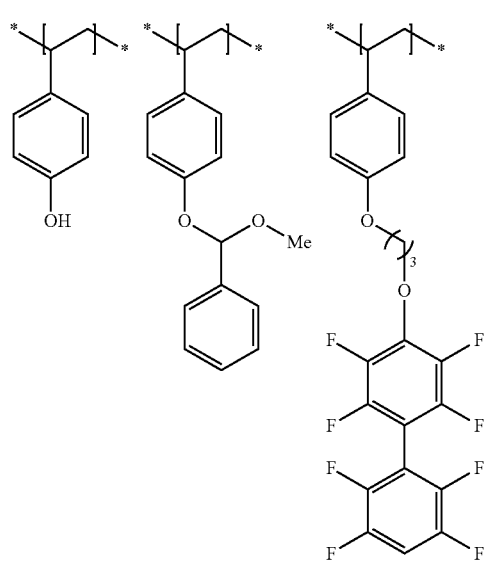
(A-36)
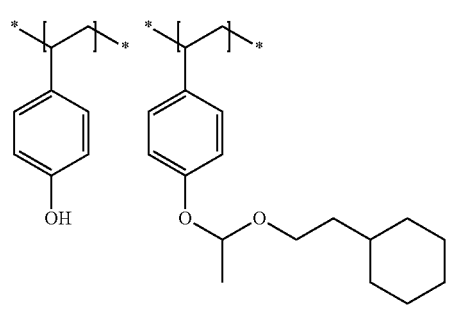
(A-38)
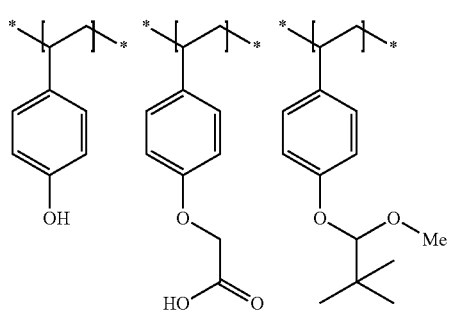
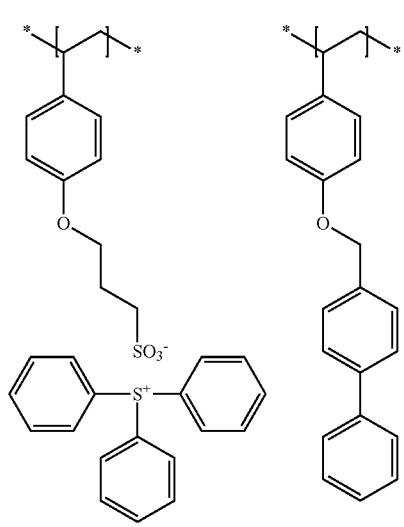
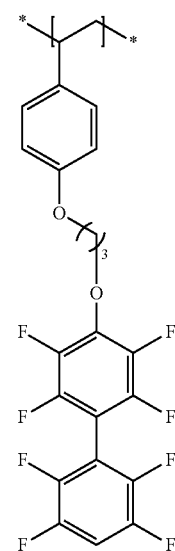

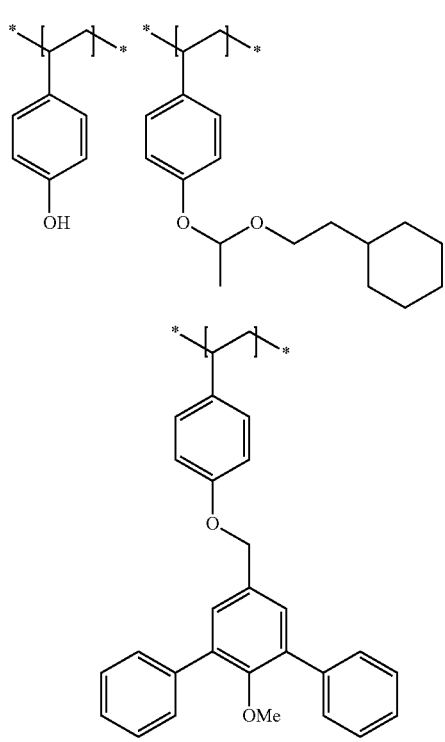
(A-39)
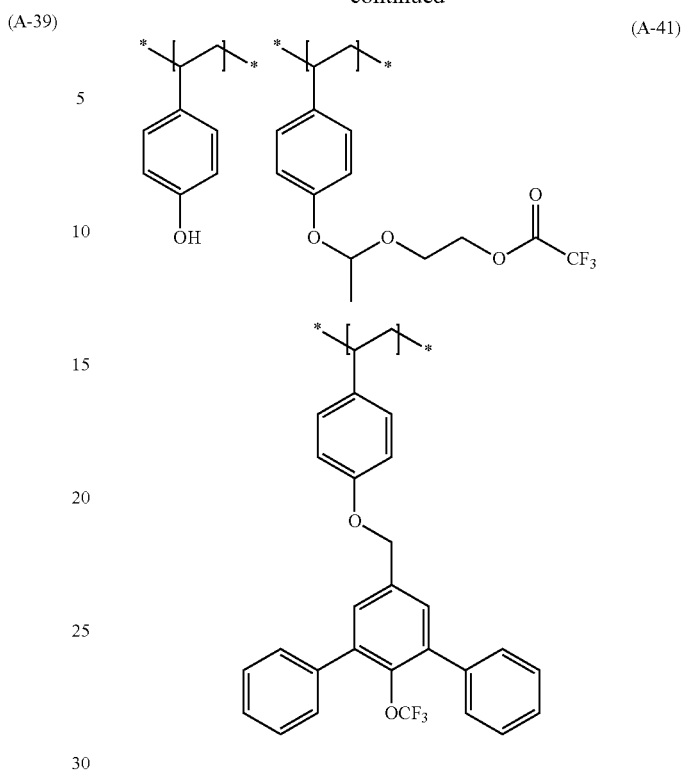
(A-41)
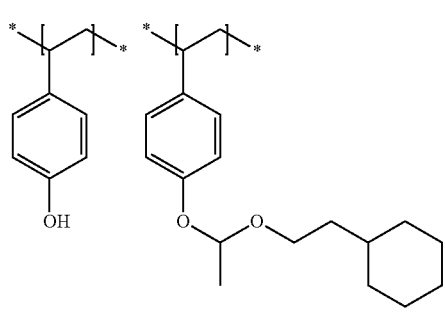
(A-40)
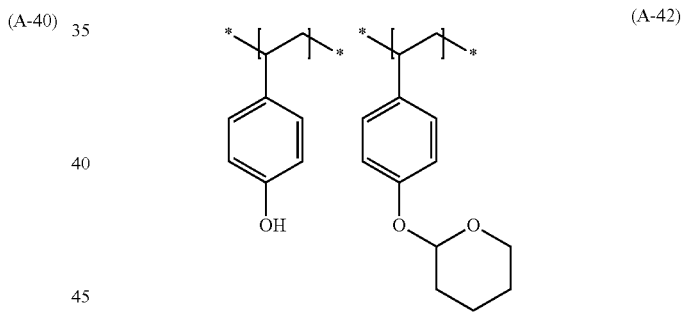
(A-42)
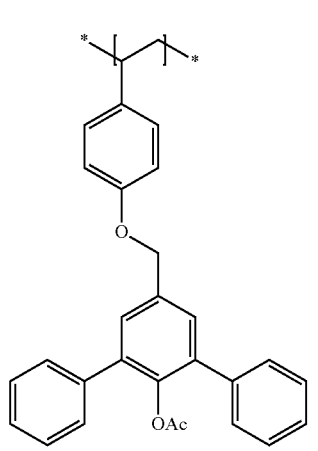
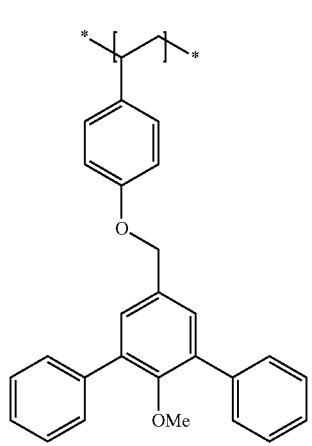

(A-43)
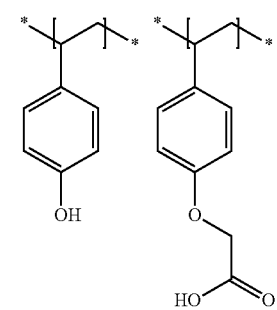
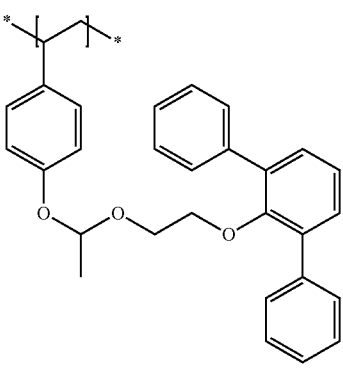
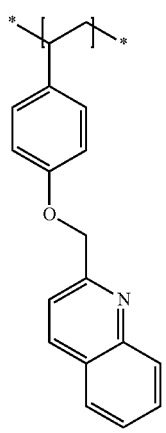
(A-44)
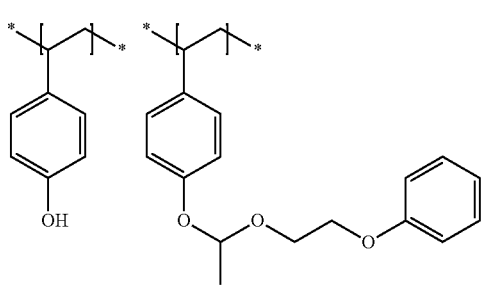
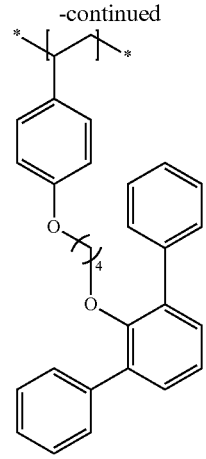
(A-45)
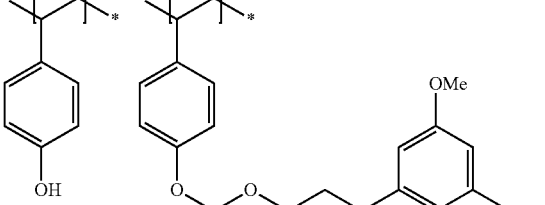
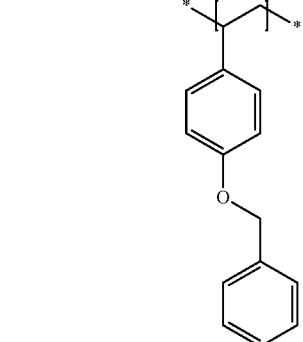
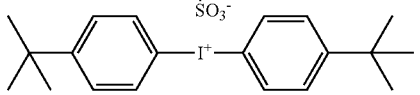

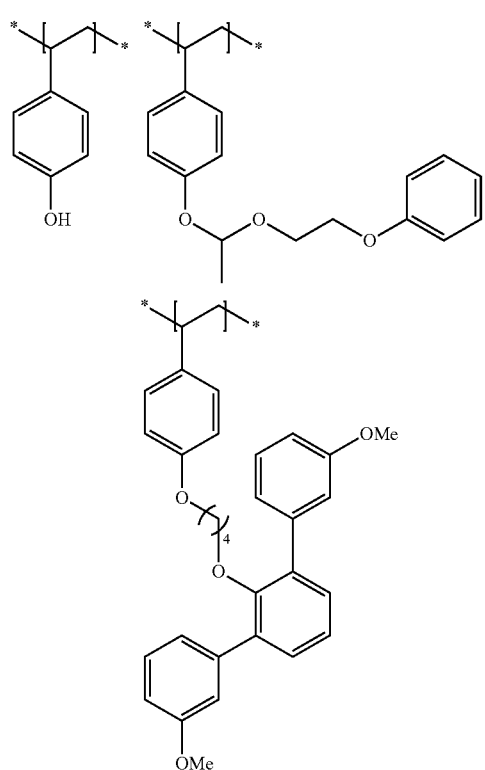
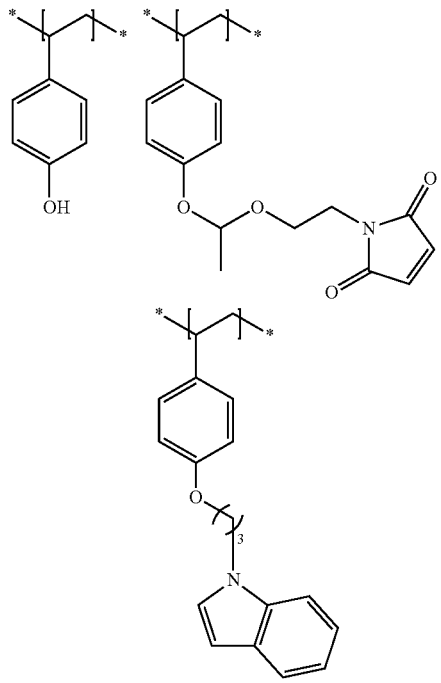
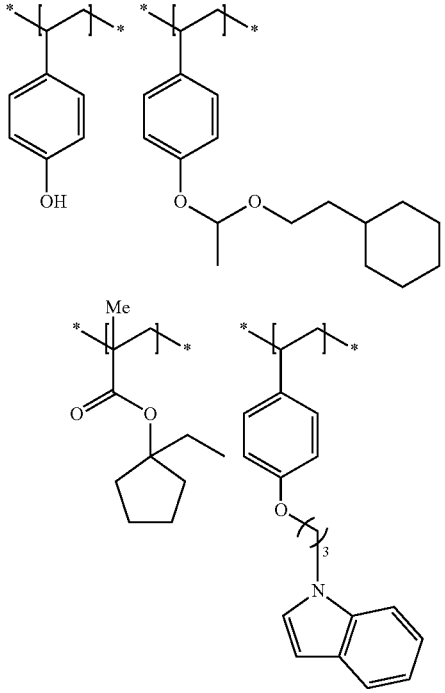
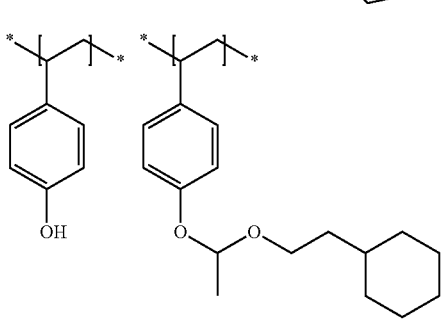

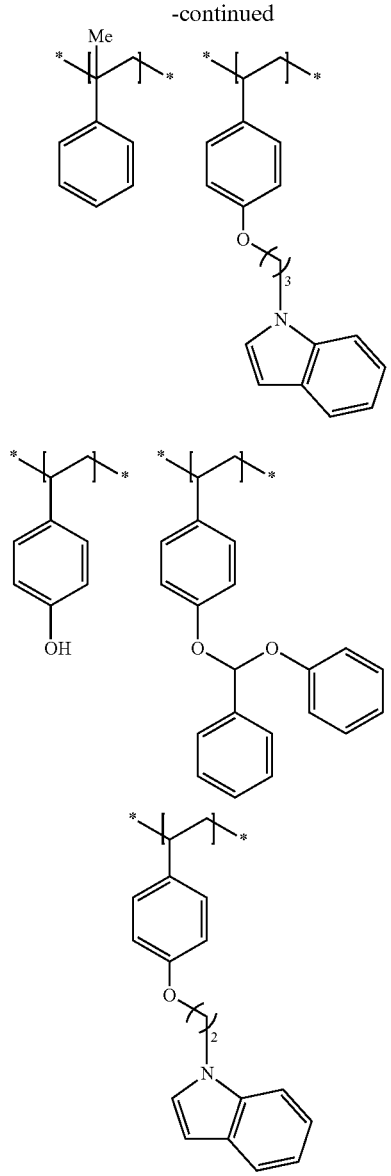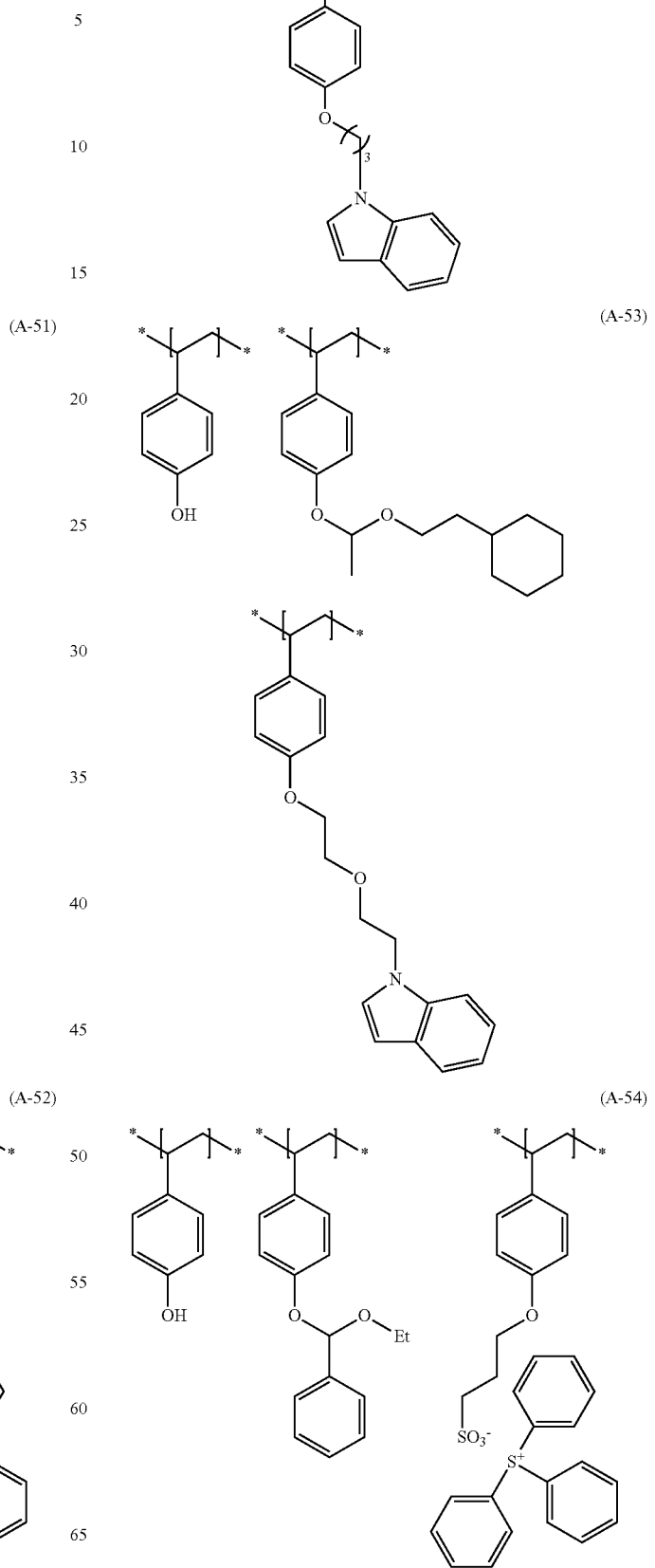

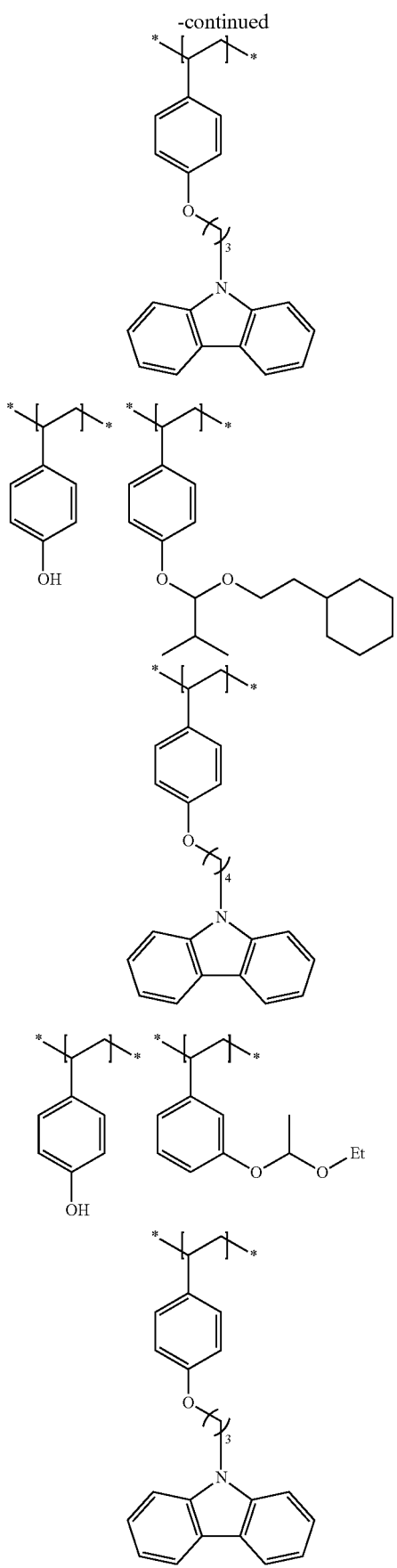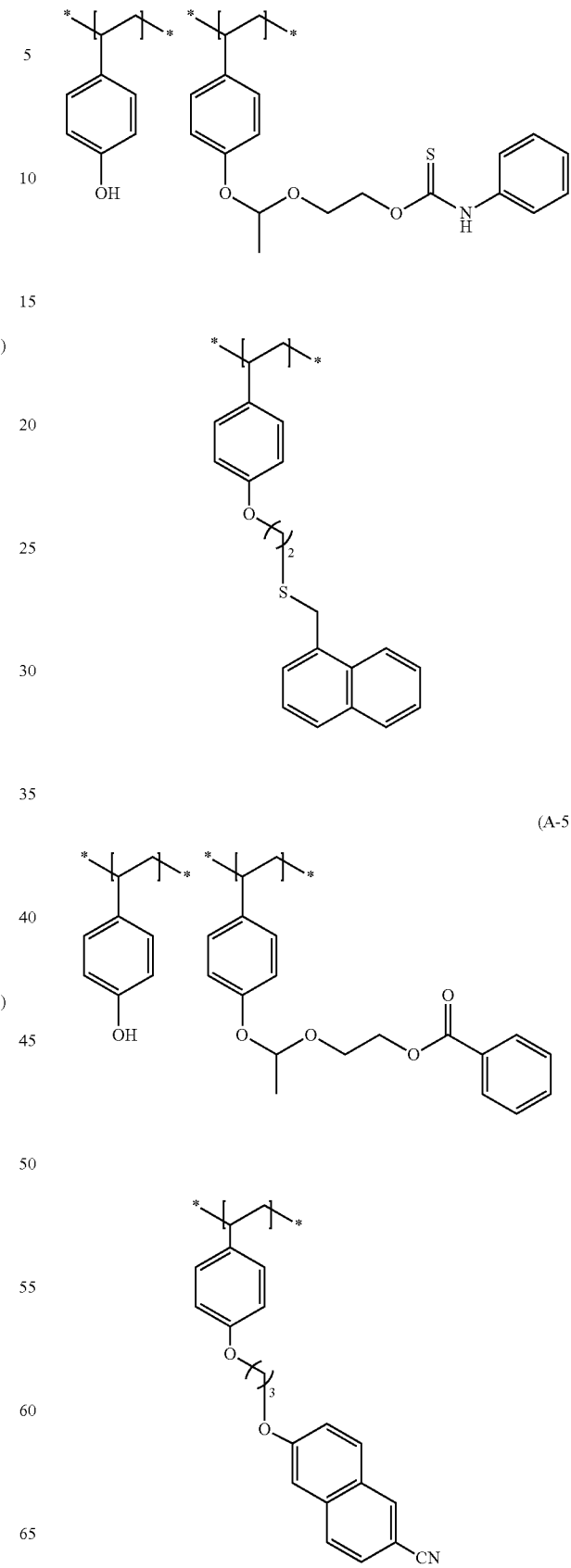

(A-59)
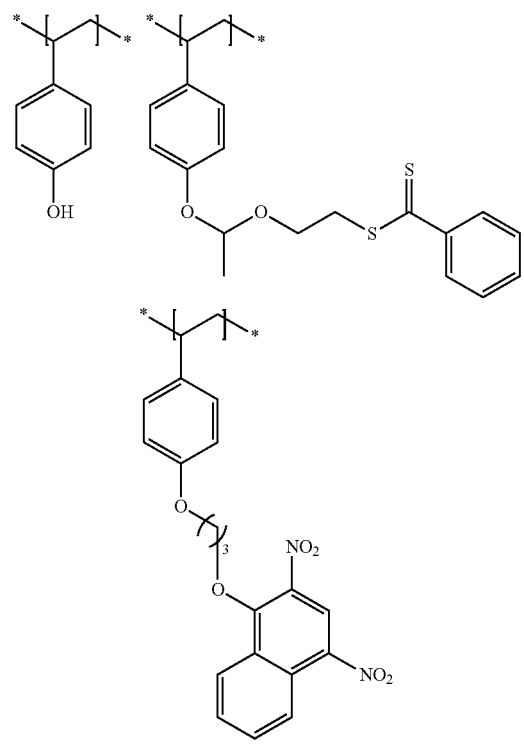
(A-60)
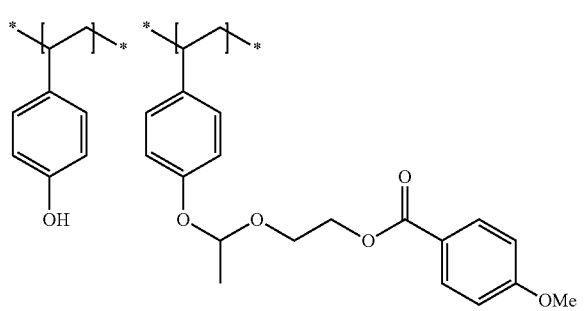
(A-61)
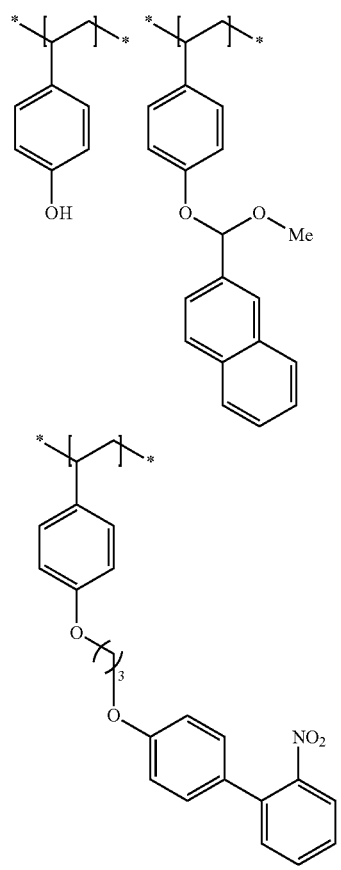
(A-62)
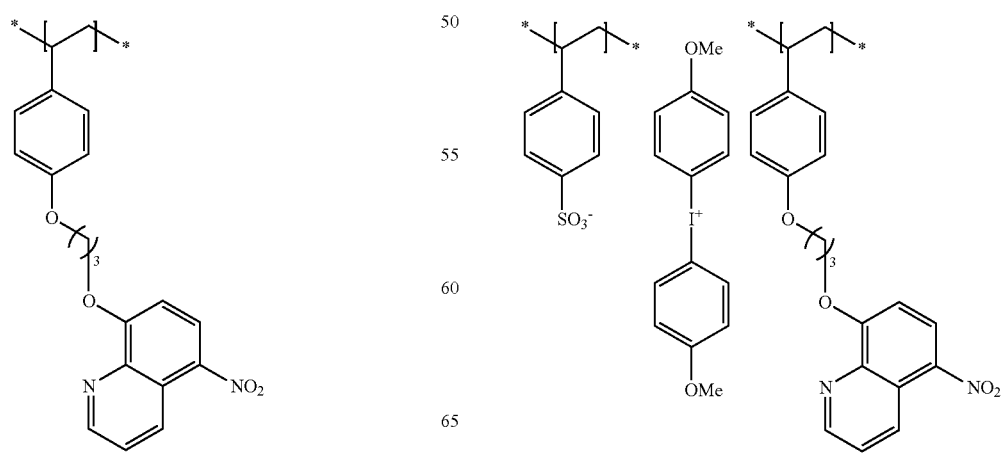

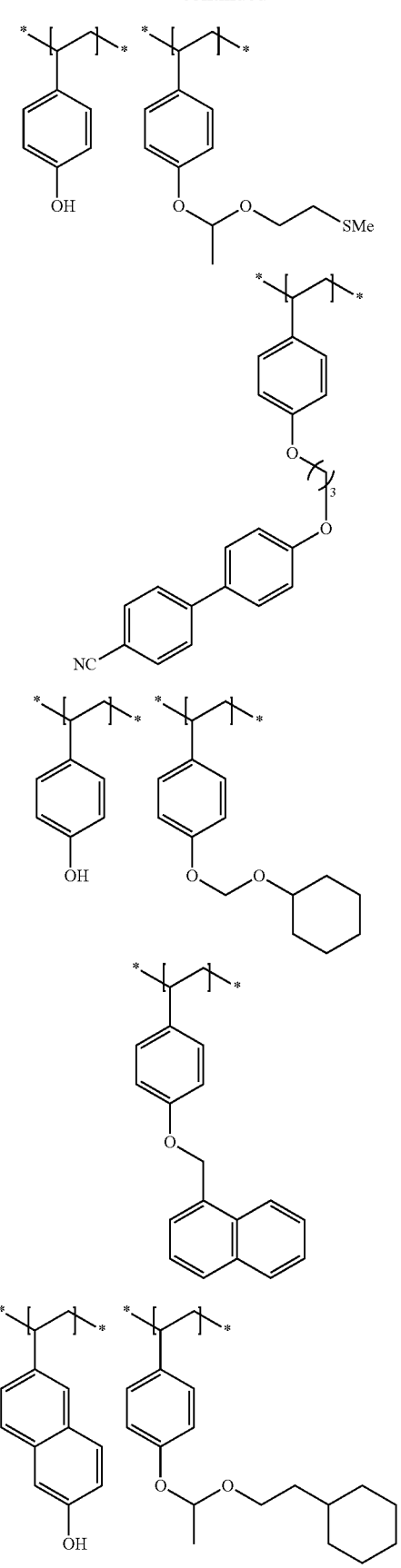
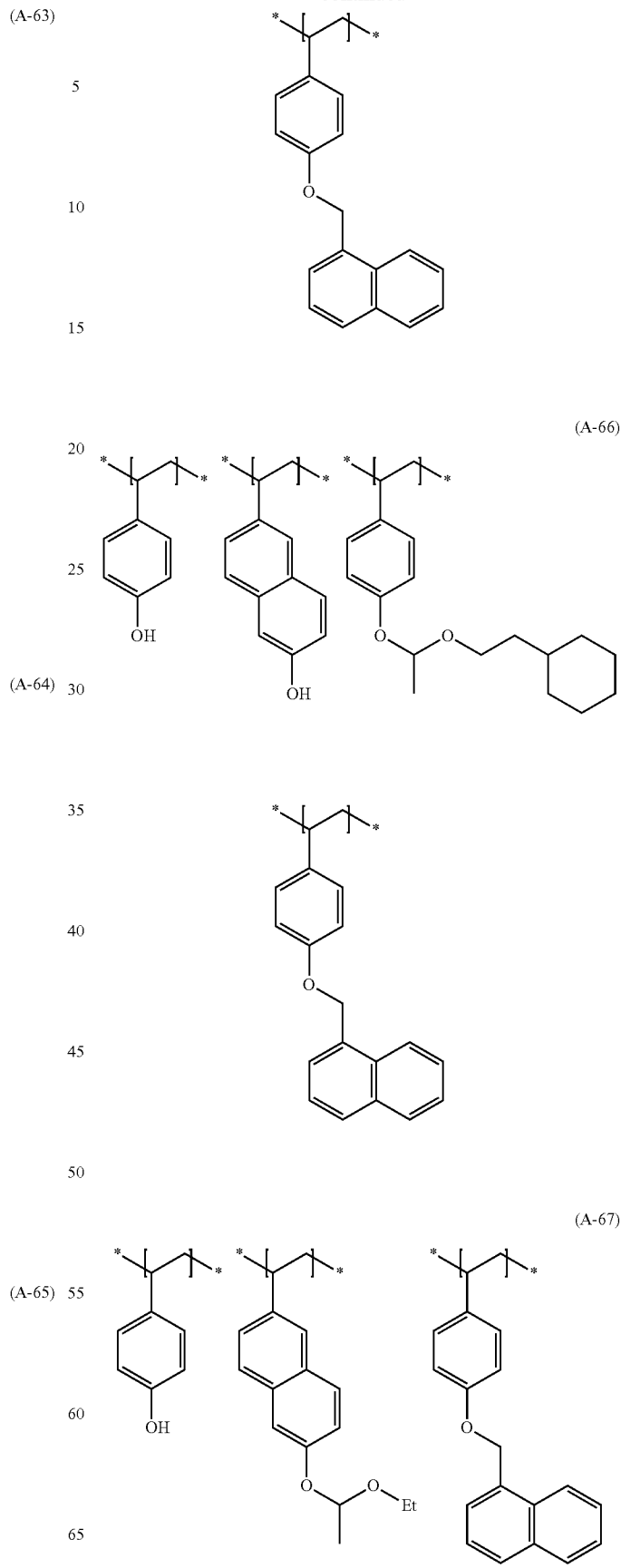

-continued
(A-68)
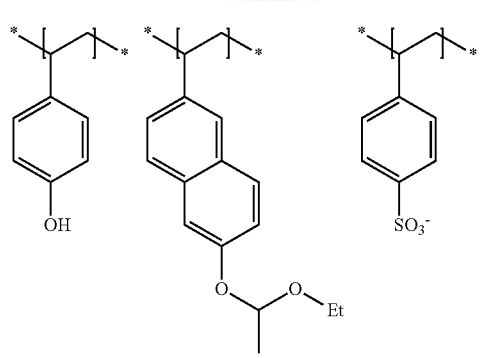
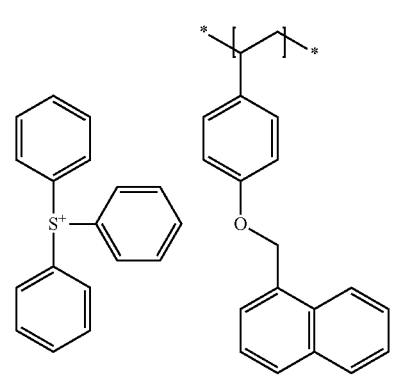
(A-69)
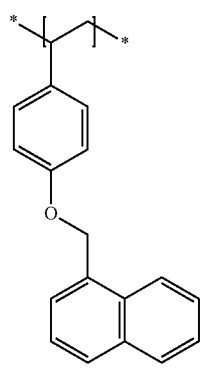
-continued
(A-70)
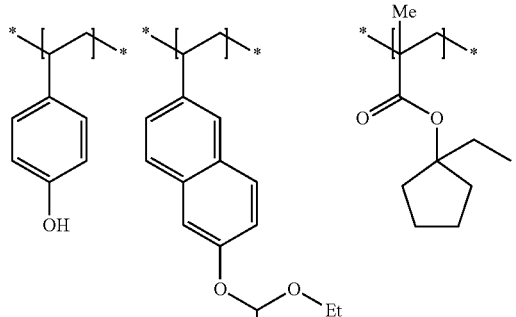
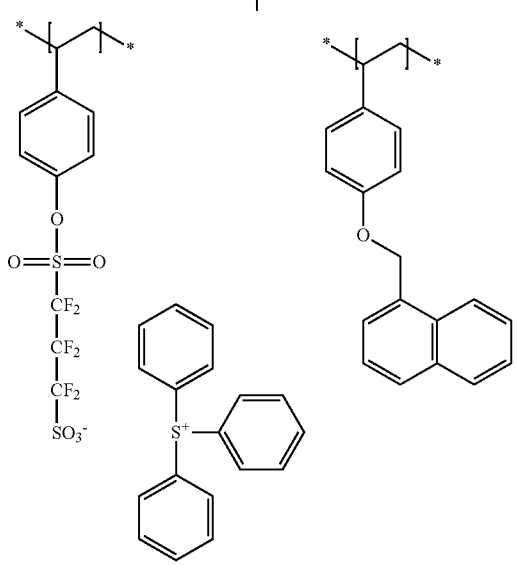
(A-71)
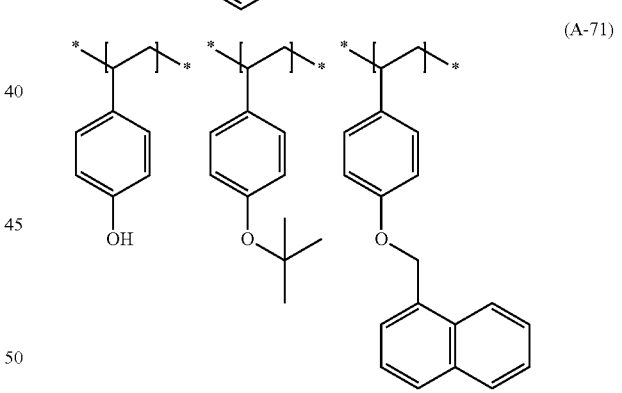
(A-72)
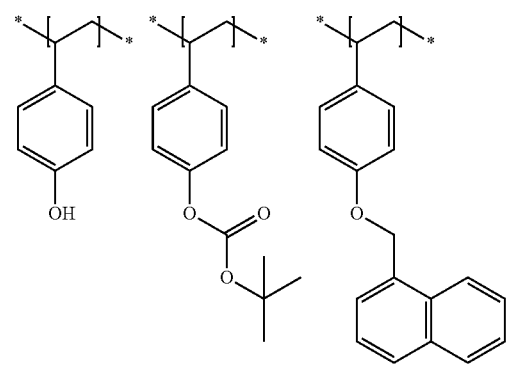

(A-73)
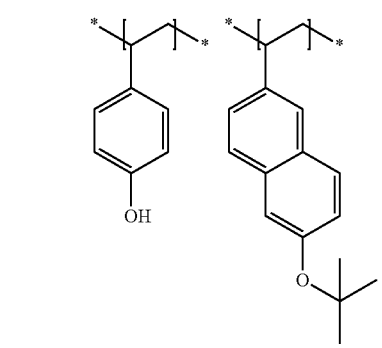
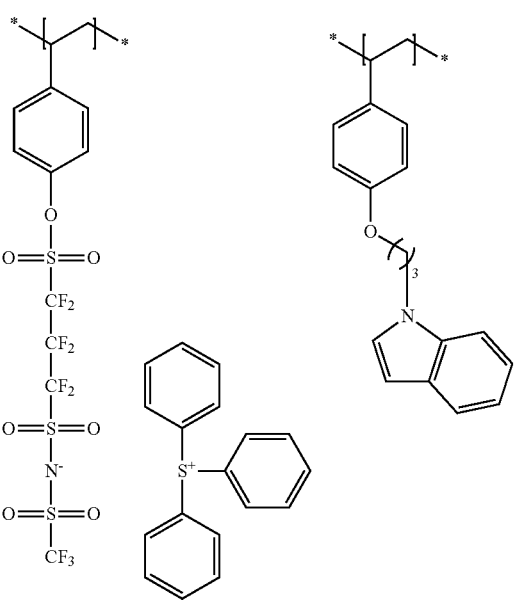
(A-74)
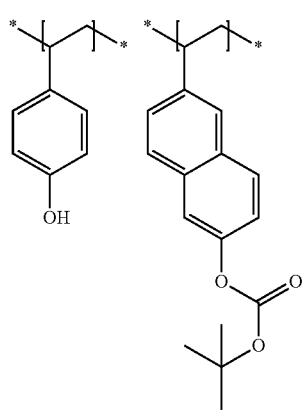
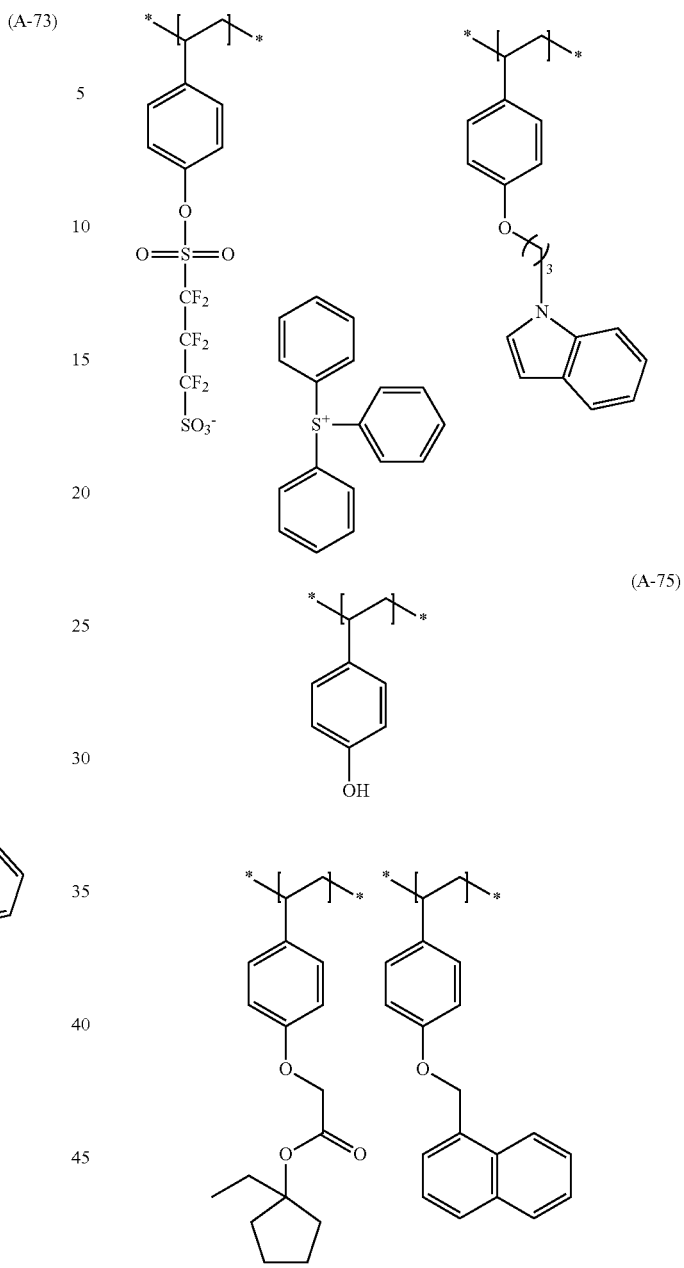
(A-75)
(A-76)
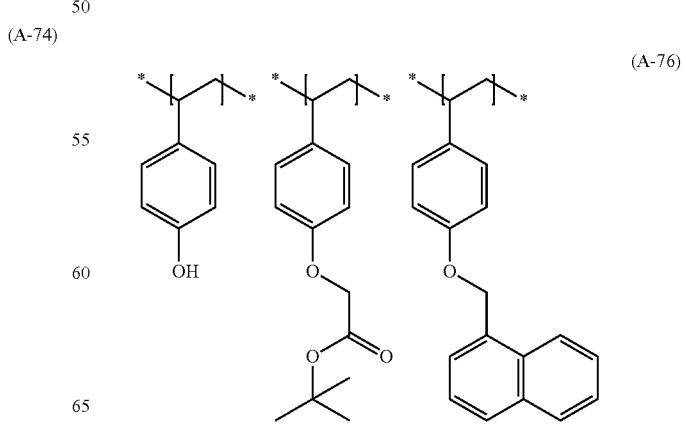

(A-77)
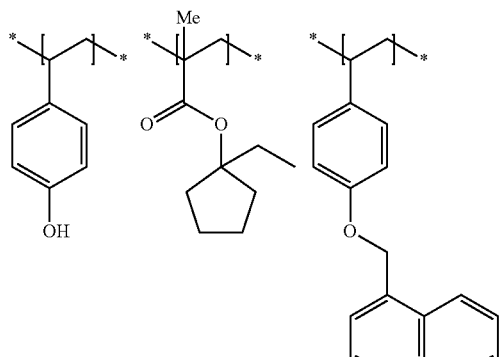
(A-78)
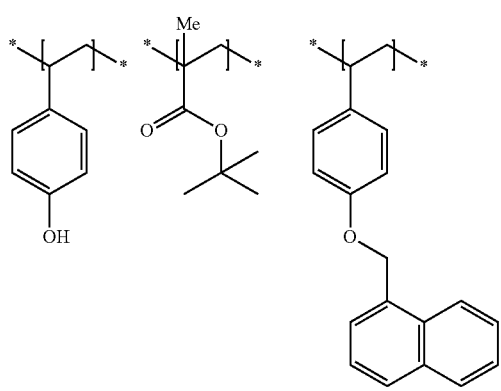
(A-79)
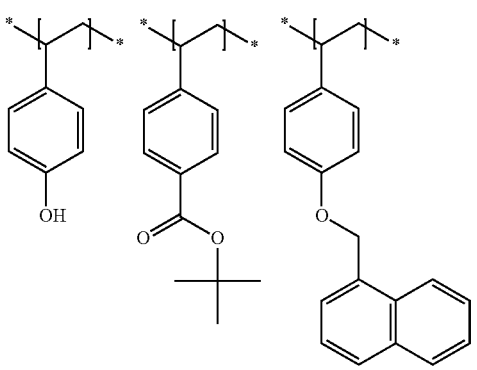
(A-80)
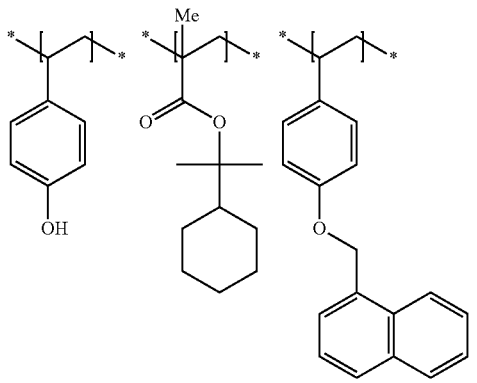
(A-81)
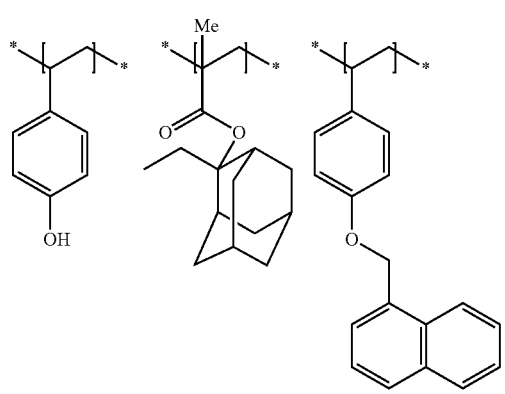
(A-82)
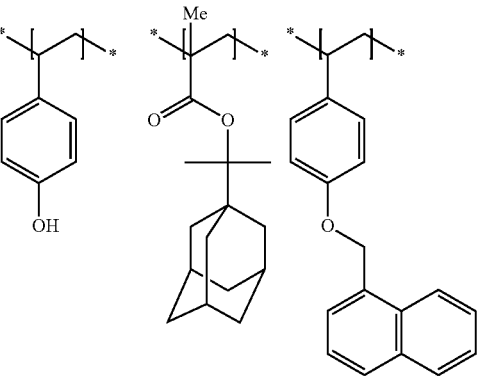
(A-83)
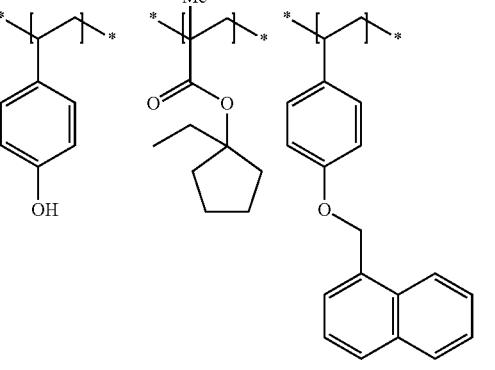

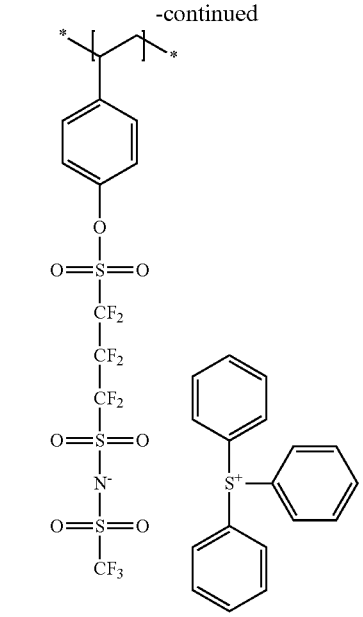
(A-84)
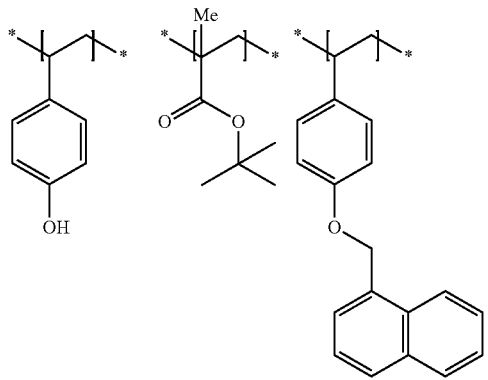
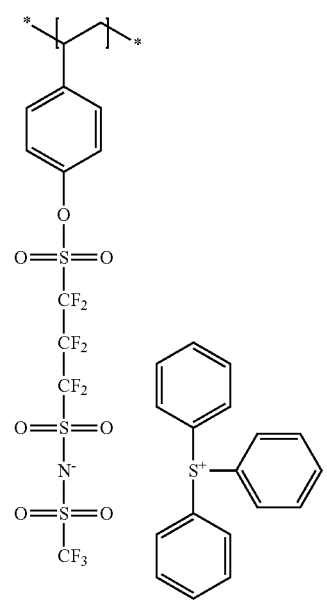
(A-85)
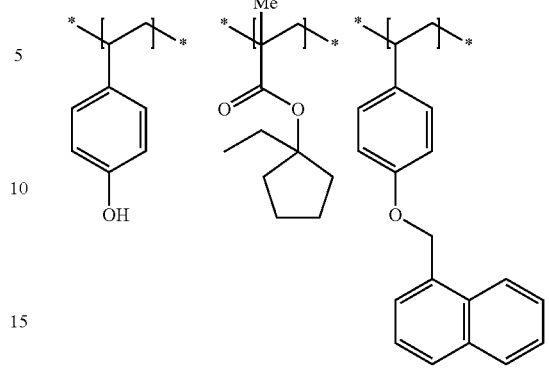
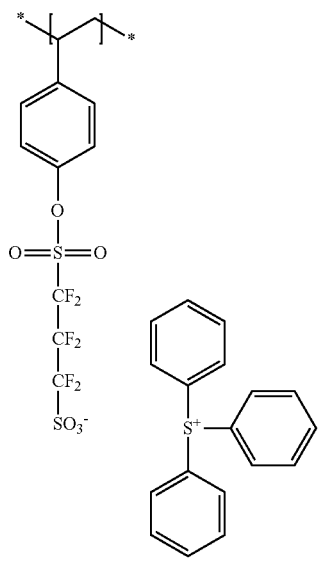
(A-86)
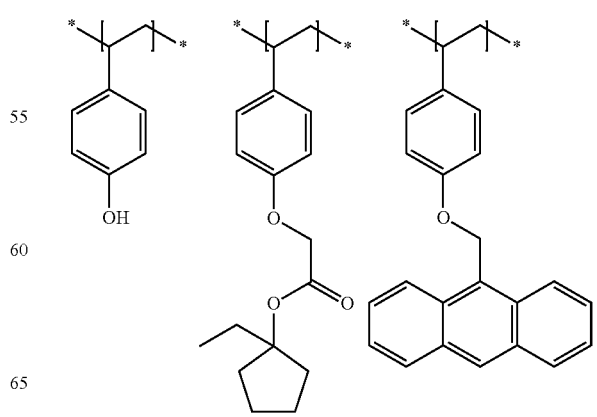

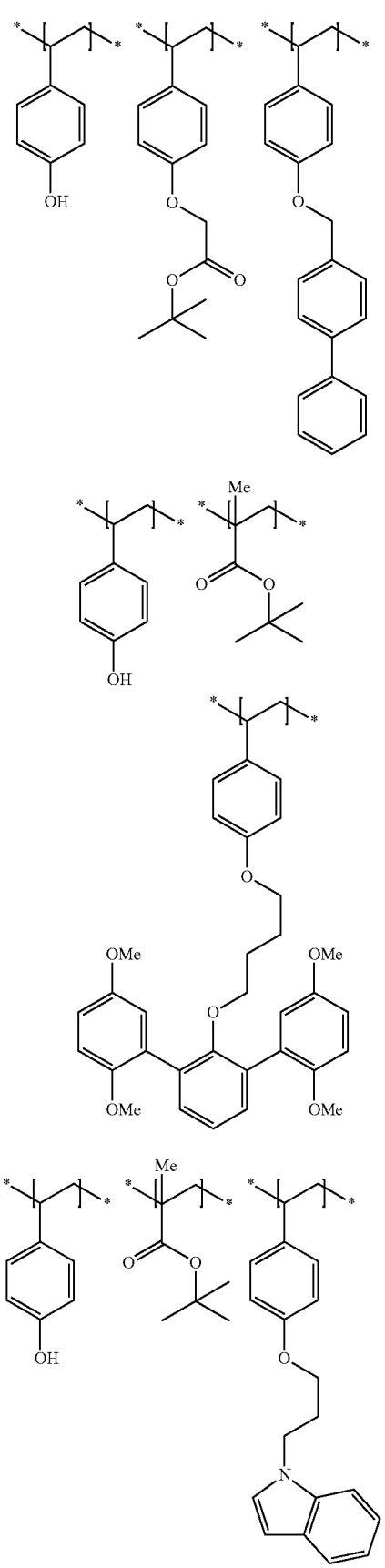
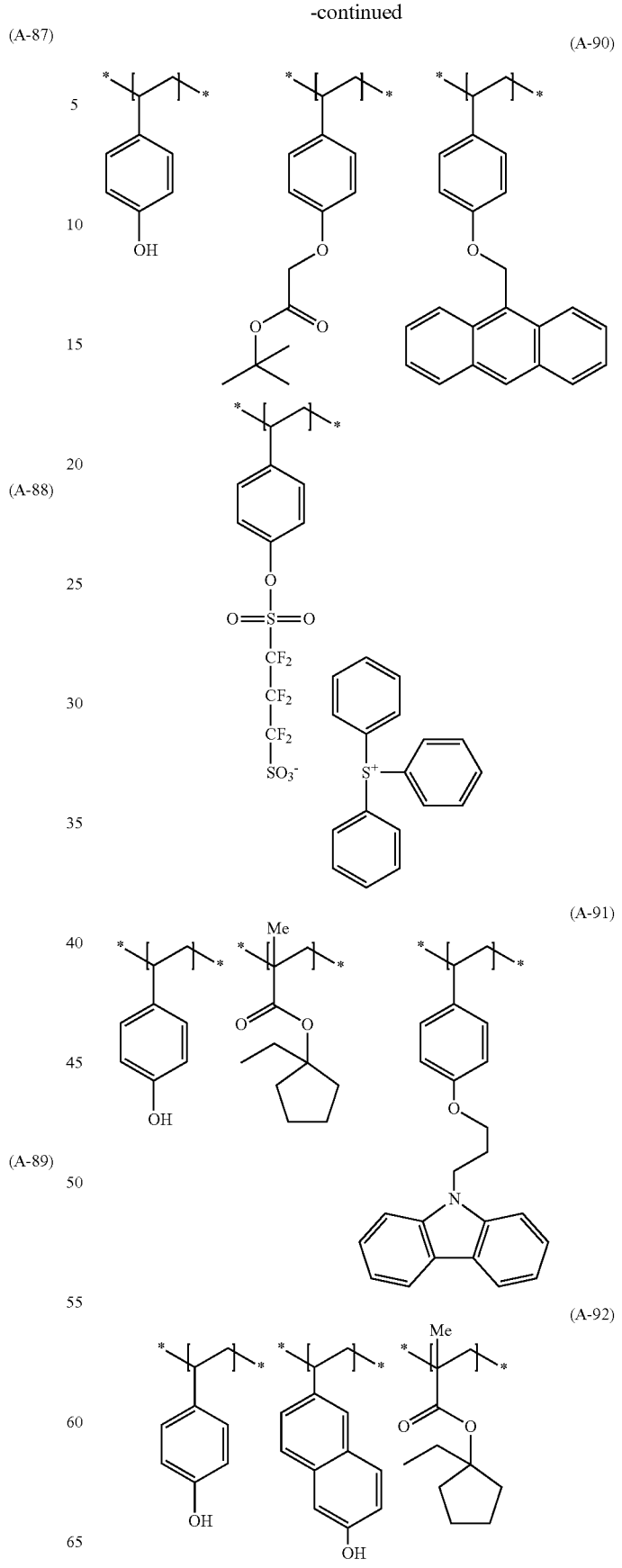

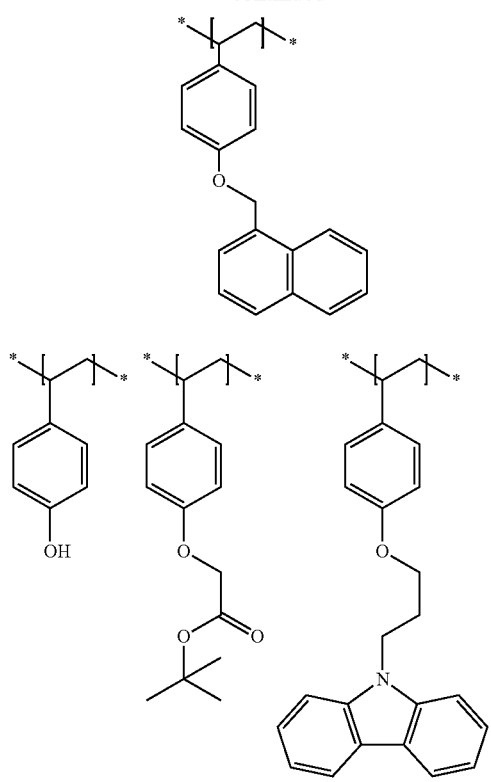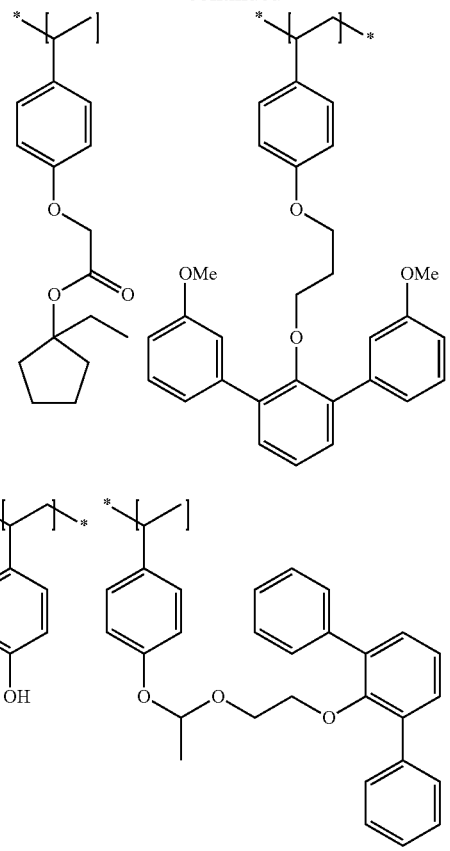

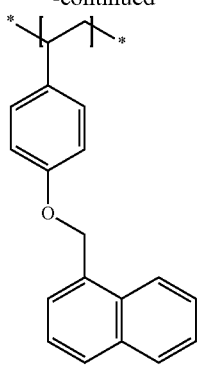
(A-98)
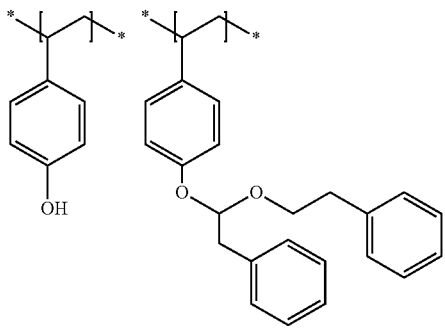
(A-100)
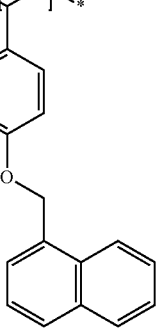
(A-99)
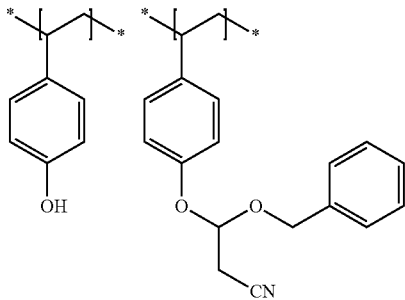
(A-101)
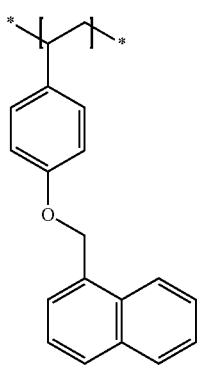
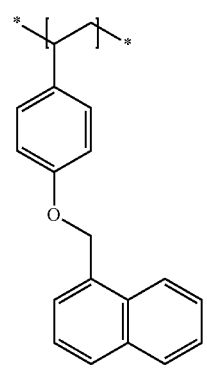

(A-102)
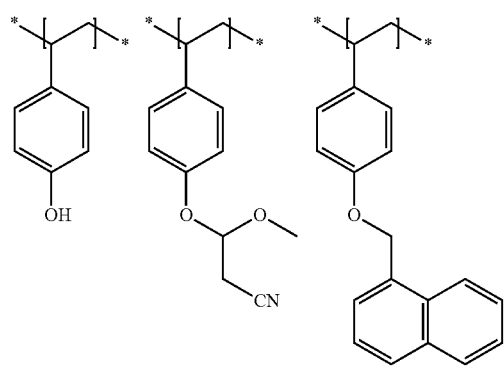
(A-103)
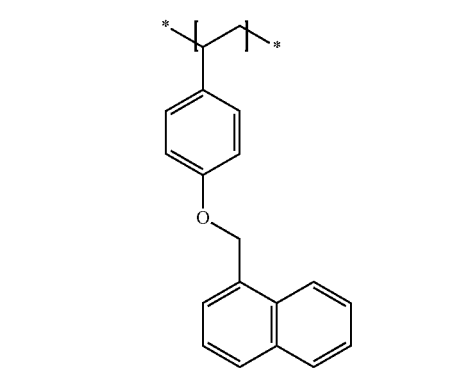
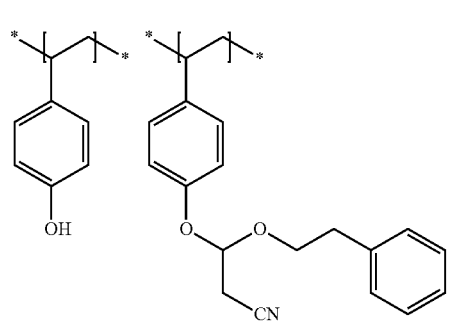
(A-104)
-continued
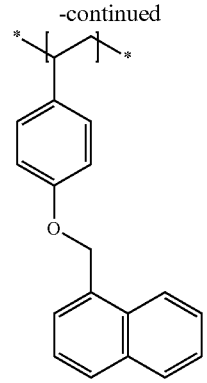
(A-105)
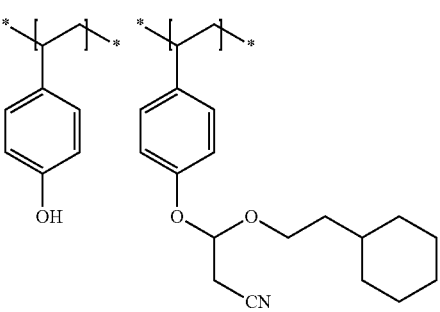
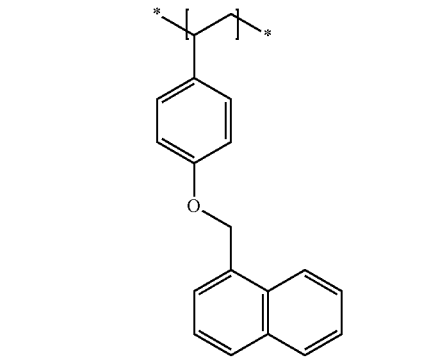
(A-106)
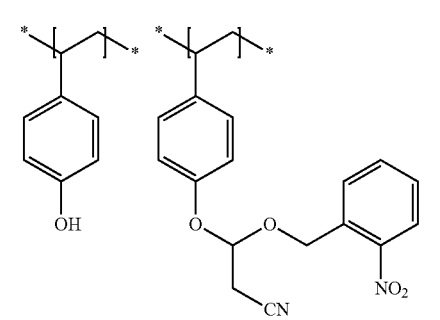
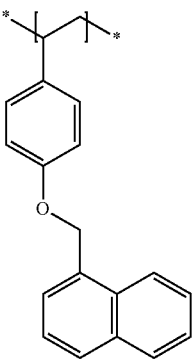

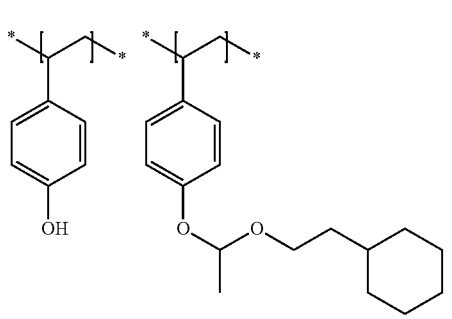
(A-107)
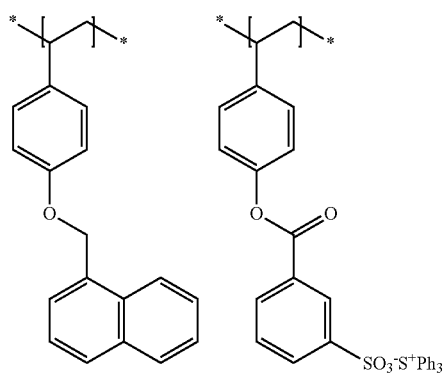
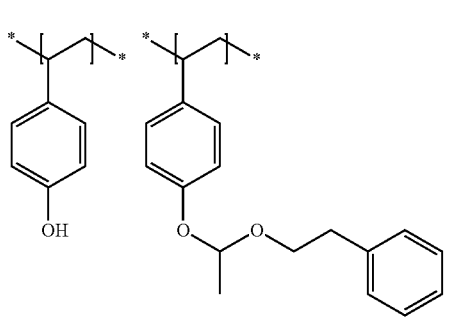
(A-108)
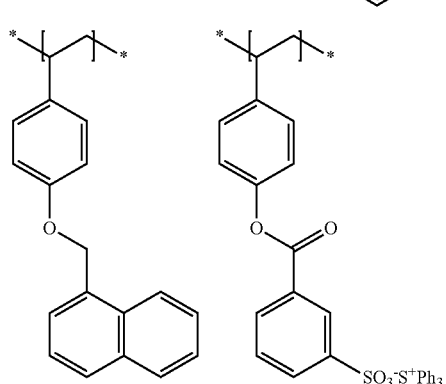
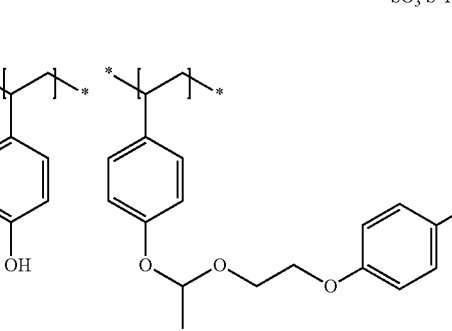
(A-109)
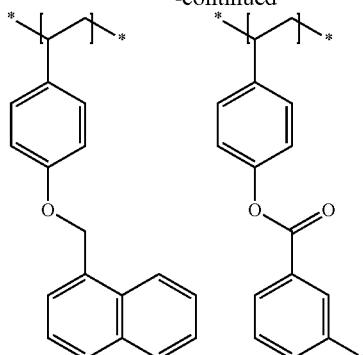
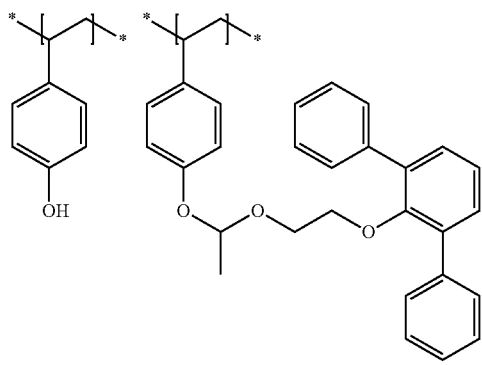
(A-110)
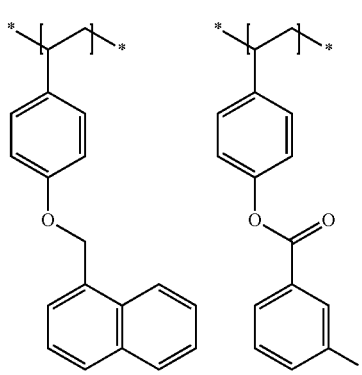
(A-111)
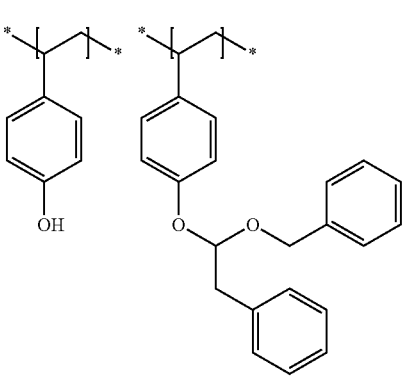

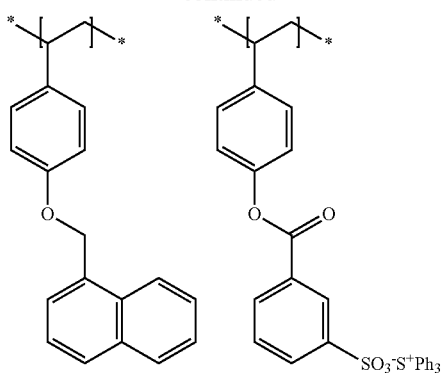
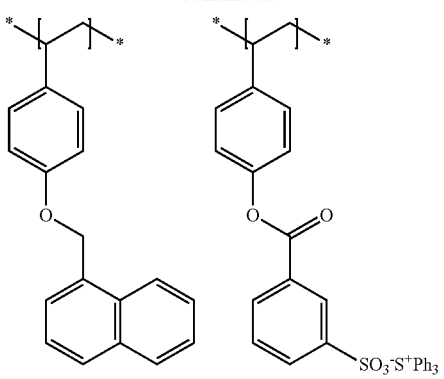
(A-112)
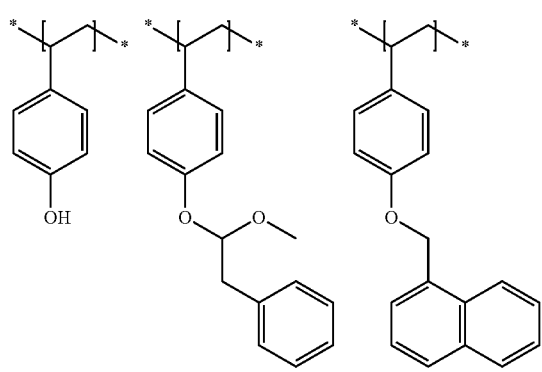
(A-114)
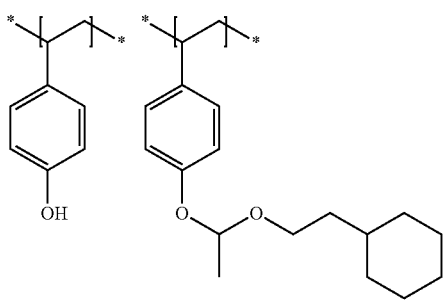
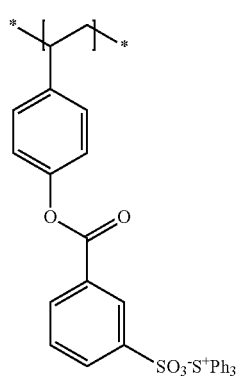
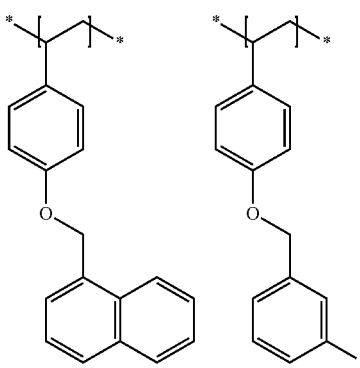
(A-113)
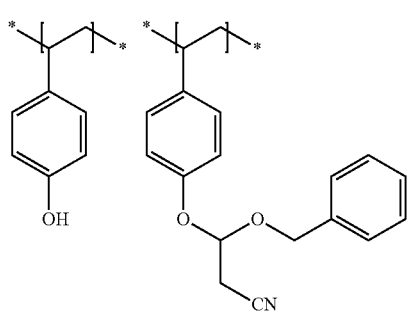
(A-115)

-continued

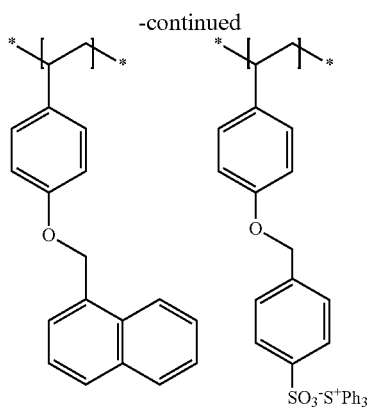

-continued

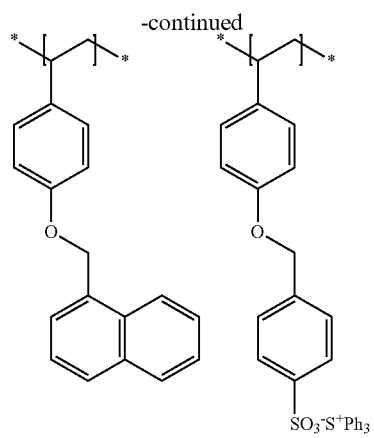

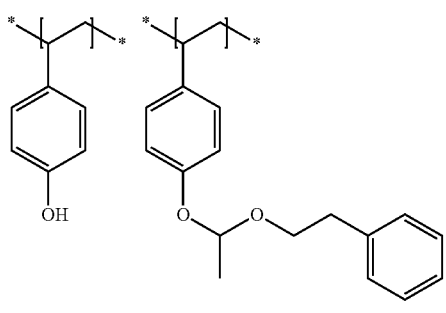
(A-116)

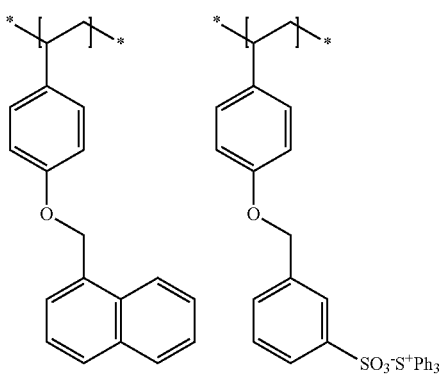

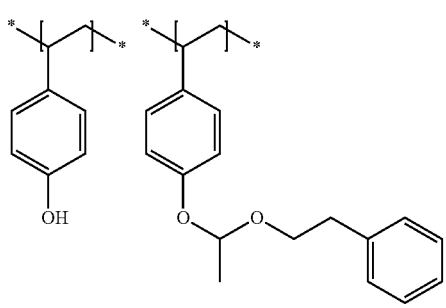
(A-117)

<Other Components>

The composition of the present invention may further contain, for example, a basic compound, an acid-decomposable resin, a photoacid generator, an organic solvent, a surfactant, an acid-decomposable dissolution inhibiting compound, a dye, a plasticizer, a photosensitizer, a compound for accelerating the dissolution in a developer, and a compound having a proton acceptor functional group.

[2] Basic Compound

The composition of the present invention may further contain a basic compound. When a basic compound is further contained, the change in performance with aging from exposure to heating can be more reduced. In turn, in-film diffusion of an acid generated upon exposure can be controlled.

The basic compound is preferably a nitrogen-containing organic compound. The usable compound is not particularly limited but, for example, compounds classified into the following (1) to (4) can be used.

(1) Compound Represented by the Following Formula (BS-1):

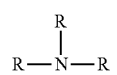
(BS-1)

In formula (BS-1), each R independently represents a hydrogen atom or an organic group, provided that at least one of three R's is an organic group. This organic group is a linear or branched alkyl group, a monocyclic or polycyclic cycloalkyl group, an aryl group or an aralkyl group.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples thereof include a phenyl group and a naphthyl group.

The carbon number of the aralkyl group as R is not particularly limited but is usually from 7 to 20, preferably from 7 to 11. Specific examples thereof include a benzyl group.

In the alkyl group, cycloalkyl group, aryl group and aralkyl group as R, a hydrogen atom may be replaced by a substituent. Examples of the substituent include an alkyl group, a cycloalkyl group, an aryl group, an aralkyl group, a hydroxy group, a carboxyl group, an alkoxy group, an aryloxy group, an alkylcarbonyloxy group and an alkyloxycarbonyl group.

In the compound represented by formula (BS-1), it is preferred that at least two of R's is an organic group.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline and 2,4,6-tri(tert-butyl)aniline.

The preferred basic compound represented by formula (BS-1) includes a compound where at least one R is an alkyl group substituted with a hydroxyl group. Specific examples thereof include triethanolamine and N,N-dihydroxyethylaniline.

The alkyl group as R may contain an oxygen atom in the alkyl chain, that is, an oxyalkylene chain may be formed. The oxyalkylene chain is preferably —$CH_2CH_2O$—. Specific examples thereof include tris(methoxyethoxyethyl)amine and compounds illustrated in U.S. Pat. No. 6,040,112, column 3, line 60 et seq.

(2) Compound Having a Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure [e.g., N-hydroxyethylpiperidine, bis(1,2,2,6,6-pentamethyl-4-piperidyl)sebacate], a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group contained in an amine compound has a phenoxy group at the terminal opposite the N atom. The phenoxy group may have a substituent such as alkyl group, alkoxy group, halogen atom, cyano group, nitro group, carboxyl group, carboxylic acid ester group, sulfonic acid ester group, aryl group, aralkyl group, acyloxy group and aryloxy group.

This compound preferably has at least one oxyalkylene chain between the phenoxy group and the nitrogen atom. The number of oxyalkylene chains in one molecule is preferably from 3 to 9, more preferably from 4 to 6. Among oxyalkylene chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt may also be appropriately used. The ammonium salt is preferably a hydroxide or a carboxylate. More specifically, a tetraalkylammonium hydroxide such as tetrabutylammonium hydroxide is preferred.

Other examples of the basic compound which can be used in the composition of the present invention include compounds synthesized in Examples of JP-A-2002-363146 and compounds described in paragraph 0108 of JP-A-2007-298569.

A photosensitive basic compound may also be used as the basic compound. Examples of the photosensitive basic compound which can be used include compounds described in JP-T-2003-524799 (the term "JP-T" as used herein means a "published Japanese translation of a PCT patent application") and J. Photopolym. Sci. & Tech., Vol. 8, pp. 543-553 (1995).

The molecular weight of the basic compound is preferably from 250 to 2,000, more preferably from 400 to 1,000.

One kind of these basic compounds may be used alone, or two or more kinds thereof may be used in combination.

In the case where the composition of the present invention further contains a basic compound, the content thereof is usually from 0.001 to 10 mass %, preferably from 0.01 to 5 mass %, based on the entire solid content of the composition.

The molar ratio of the later-described photoacid generator to the basic compound is preferably from 1.5 to 300. That is, the molar ratio is preferably 1.5 or more in terms of enhancing the sensitivity and resolution and preferably 300 or less from the standpoint of suppressing the reduction in resolution due to thickening of the pattern between after exposure and before heat treatment. This molar ratio is more preferably from 2.0 to 200, still more preferably from 2.5 to 150.

Incidentally, in the case where the resin (P) contains the repeating unit (6), the photoacid generator in the molar ratio above is based on the total amount of the repeating unit (6) and the later-described photoacid generator.

[3] Acid-Decomposable Resin

The composition of the present invention may contain, other than the resin (P), a resin capable of decomposing by the action of an acid to increase the solubility in an aqueous alkali solution, that is, an acid-decomposable resin.

The acid-decomposable resin typically has a group capable of decomposing by the action of an acid to produce an alkali-soluble group (hereinafter, sometimes referred to as an "acid-decomposable group"). This resin may have an acid-decomposable group in either one or both of the main chain and the side chain. The resin preferably has an acid-decomposable group in the side chain.

The acid-decomposable resin can be obtained, as disclosed in European Patent 254853, JP-A-2-25850, JP-A-3-223860, JP-A-4-251259 and the like, for example, by reacting an alkali-soluble resin with a precursor of a group capable of leaving by the action of an acid or by copolymerizing various monomers with an alkali-soluble resin monomer having bonded thereto a group capable of leaving by the action of an acid.

The acid-decomposable group is preferably a group where a hydrogen atom of an alkali-soluble group such as —COOH group and —OH group is replaced by a group capable of leaving by the action of an acid.

Specific examples and preferred examples of the acid-decomposable group are the same as those of "$OY^1$" of formula (3) and "$COOY^2$" of formula (4) in the resin (P).

The alkali-soluble resin is not particularly limited, but examples thereof include a resin containing a phenolic hydroxyl group, and a resin containing a carboxyl group-containing repeating unit such as (meth)acrylic acid and norbornenecarboxylic acid.

Preferred examples of the resin containing a phenolic hydroxyl group include an alkali-soluble resin having a hydroxystyrene structural unit, such as poly(o-hydroxystyrene), poly(m-hydroxystyrene), poly(p-hydroxystyrene), a copolymer thereof, hydrogenated poly(hydroxystyrene), poly(hydroxystyrenes) having a substituent represented by the following structures, styrene-hydroxystyrene copolymer, α-methylstyrene-hydroxystyrene copolymer and hydrogenated novolak resin.

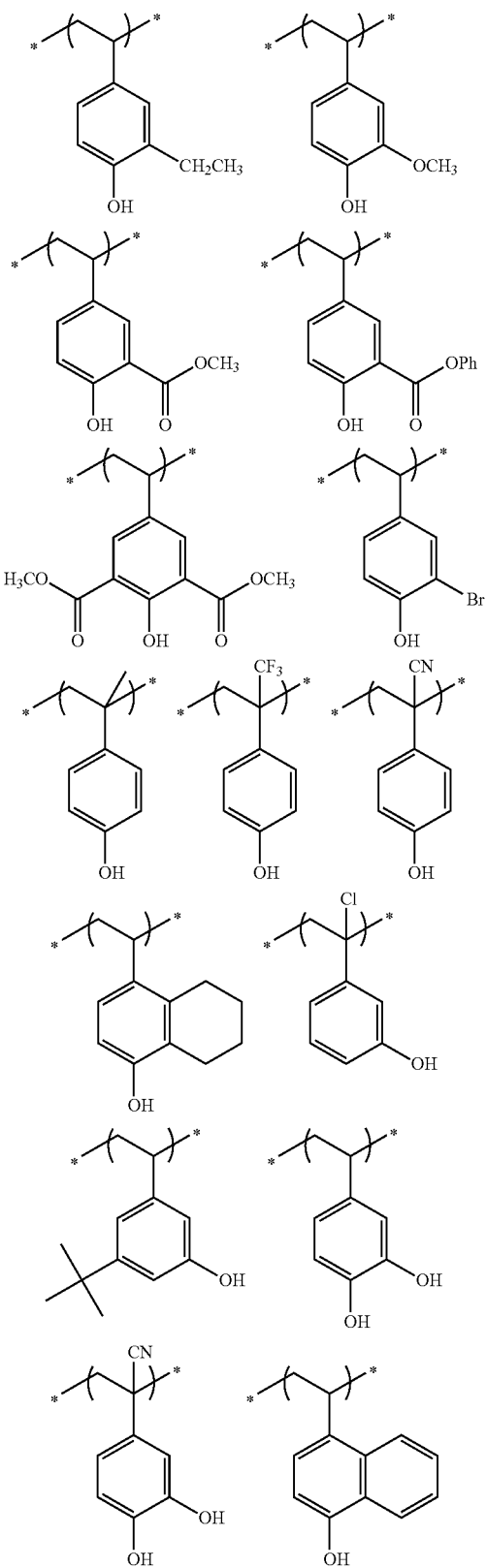

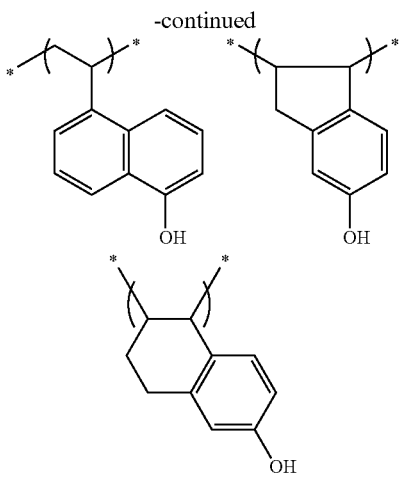

The alkali dissolution rate of the alkali-soluble resin is preferably 170 Å/sec or more, more preferably 330 Å/sec or more, as measured at 23° C. by using 2.38 mass % tetramethylammonium hydroxide (TMAH). More specifically, only the alkali-soluble resin is dissolved in a solvent such as propylene glycol monomethyl ether acetate (PGMEA) to prepare a composition having a solid content concentration of 4 mass %, the composition is coated on a silicon wafer to form a coating (film thickness: 100 nm), and the time (second) until the coating is completely dissolved in an aqueous TMAH solution is measured, whereby the above-described alkali dissolution rate can be obtained.

Examples of the monomer employable as a raw material of these resins include an alkylcarbonyloxystyrene (e.g., tert-butoxycarbonyloxystyrene), an alkoxystyrene (e.g., 1-alkoxyethoxystyrene, tert-butoxystyrene) and a (meth)acrylic acid tertiary alkyl ester (e.g., tert-butyl(meth)acrylate, 2-alkyl-2-adamantyl(meth)acrylate, dialkyl(1-adamantyl)methyl(meth)acrylate).

In the case where the composition of the present invention is irradiated with KrF excimer laser light, electron beam, X-ray or high-energy beam at a wavelength of 50 nm or less (e.g., EUV), the acid-decomposable resin preferably contains a repeating unit having an aromatic group. It is more preferred to contain hydroxystyrene as a repeating unit. Examples of this resin include a copolymer of hydroxystyrene and hydroxystyrene protected by a group capable of leaving by the action of an acid, and a copolymer of hydroxystyrene and (meth)acrylic acid tertiary alkyl ester.

In particular, the acid-decomposable resin is preferably a resin having a repeating unit represented by formula (3).

The acid-decomposable resin may contain a repeating unit derived from other polymerizable monomers. Examples of other polymerizable monomers include those described above as other polymerizable monomers which can be contained in the resin (P). The content of the repeating unit derived from other polymerizable monomers is generally 50 mol % or less, preferably 30 mol % or less, based on all repeating units.

The acid-decomposable resin may contain a repeating unit having an alkali-soluble group such as hydroxyl group, carboxy group and sulfonic acid group and in this case, the content of the repeating unit having an alkali-soluble group is preferably from 1 to 99 mol %, more preferably from 3 to 95 mol %, still more preferably from 5 to 90 mol %, based on all repeating units constituting the acid-decomposable resin.

The content of the repeating unit having an acid-decomposable group is preferably from 3 to 95 mol %, more preferably from 5 to 90 mol %, still more preferably from 10 to 85 mol %, based on all repeating units constituting the acid-decomposable resin.

The weight average molecular weight of the acid-decomposable resin is preferably 50,000 or less, more preferably from 1,000 to 20,000, still more preferably from 1,000 to 10,000, in terms of polystyrene by the GPC method (solvent: THF).

The polydispersity (Mw/Mn) of the acid-decomposable resin is preferably from 1.0 to 3.0, more preferably from 1.05 to 2.0, still more preferably from 1.1 to 1.7.

Two or more kinds of acid-decomposable resins may be used in combination.

Specific preferred examples of the acid-decomposable resin are illustrated below, but the present invention is not limited thereto.

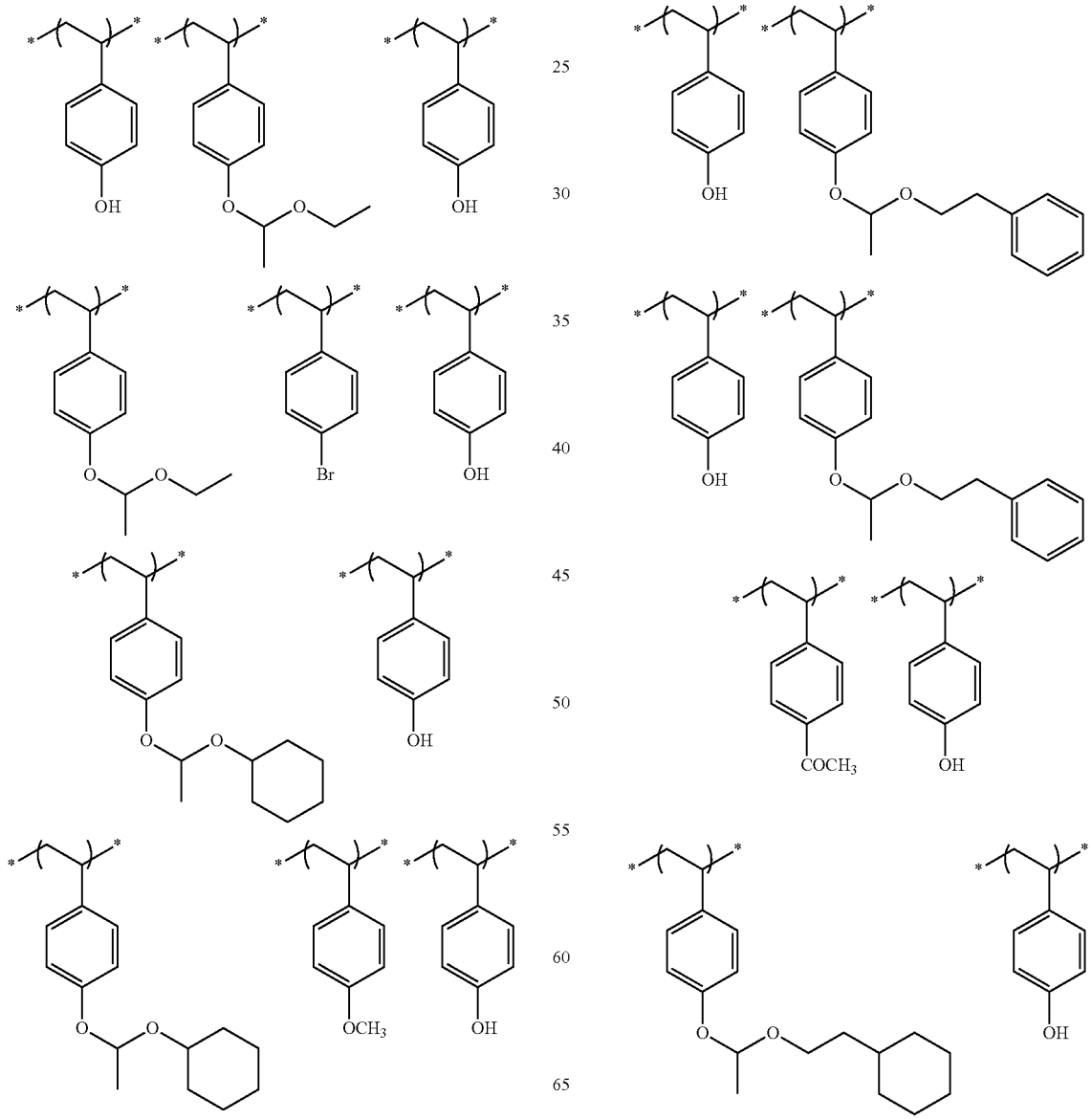

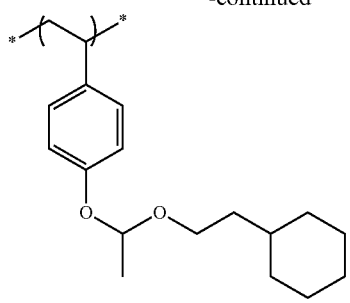
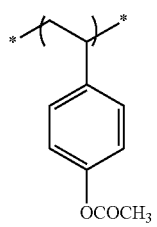
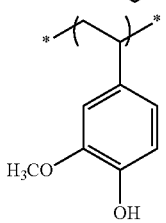
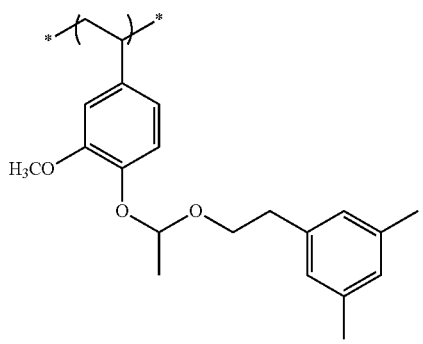
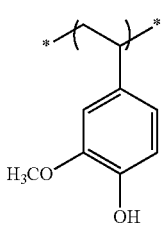
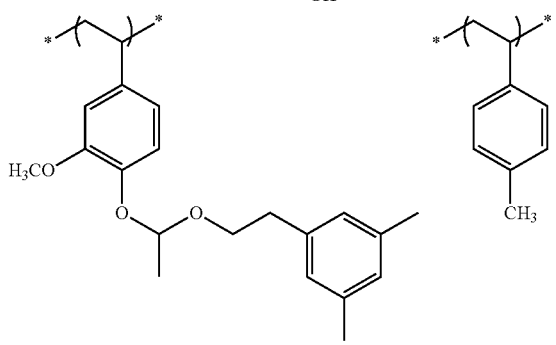
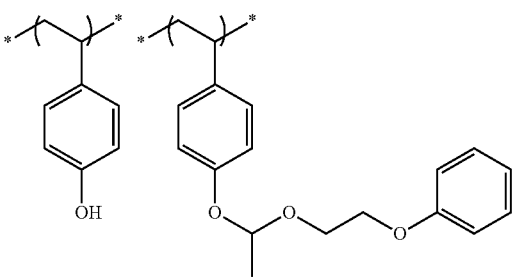
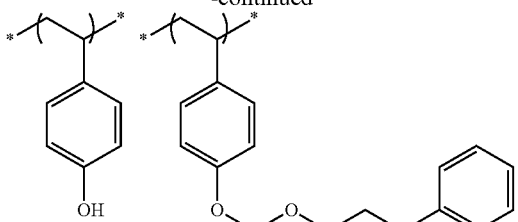
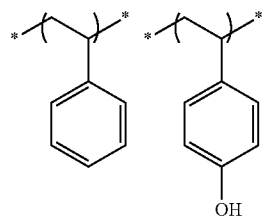
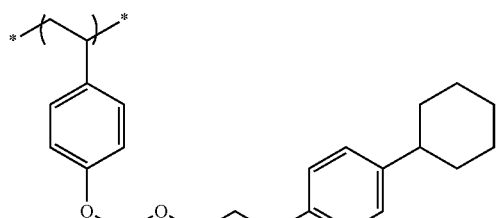
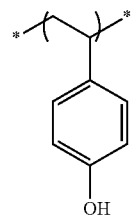
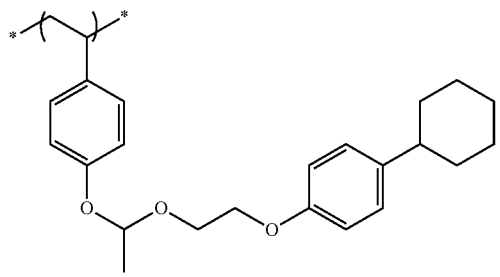
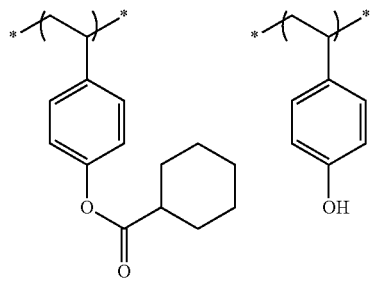

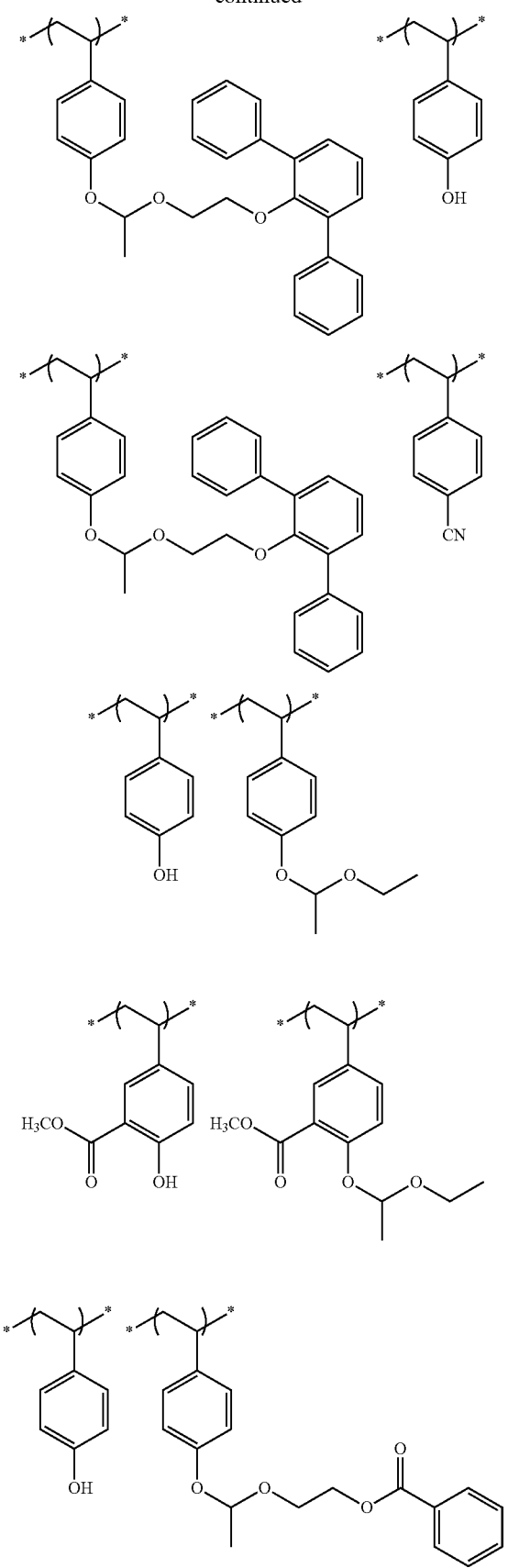
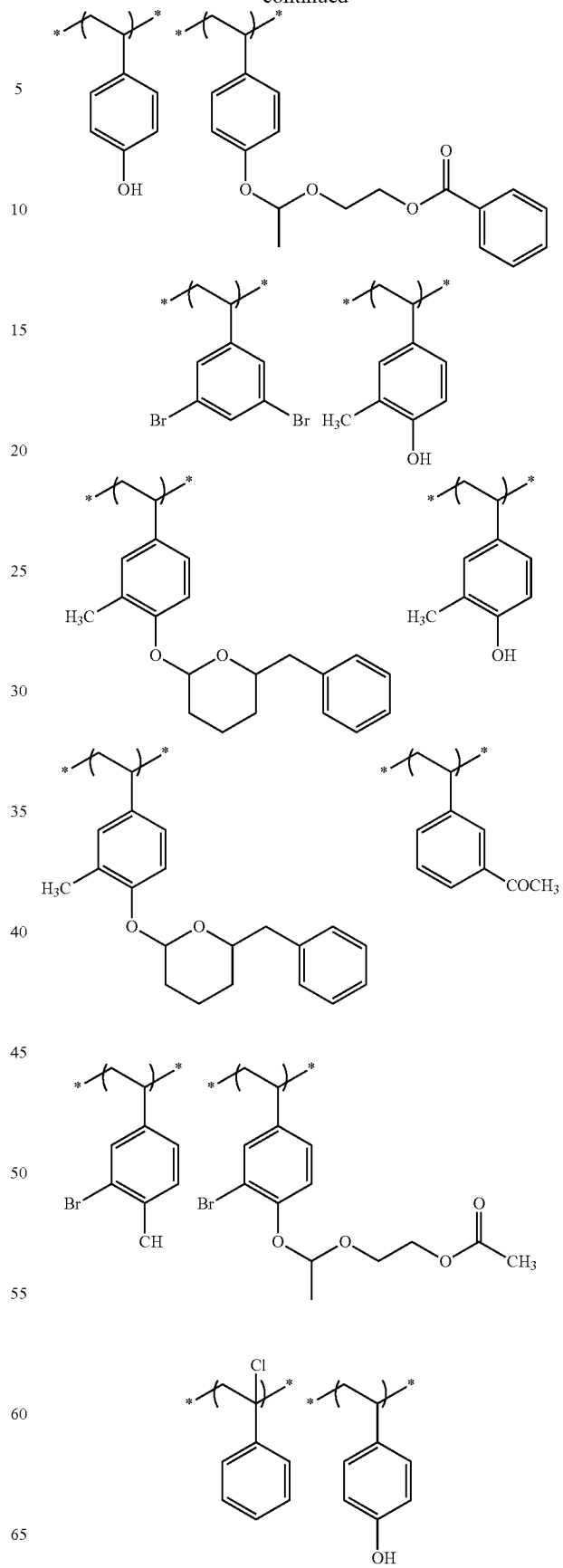

151

-continued

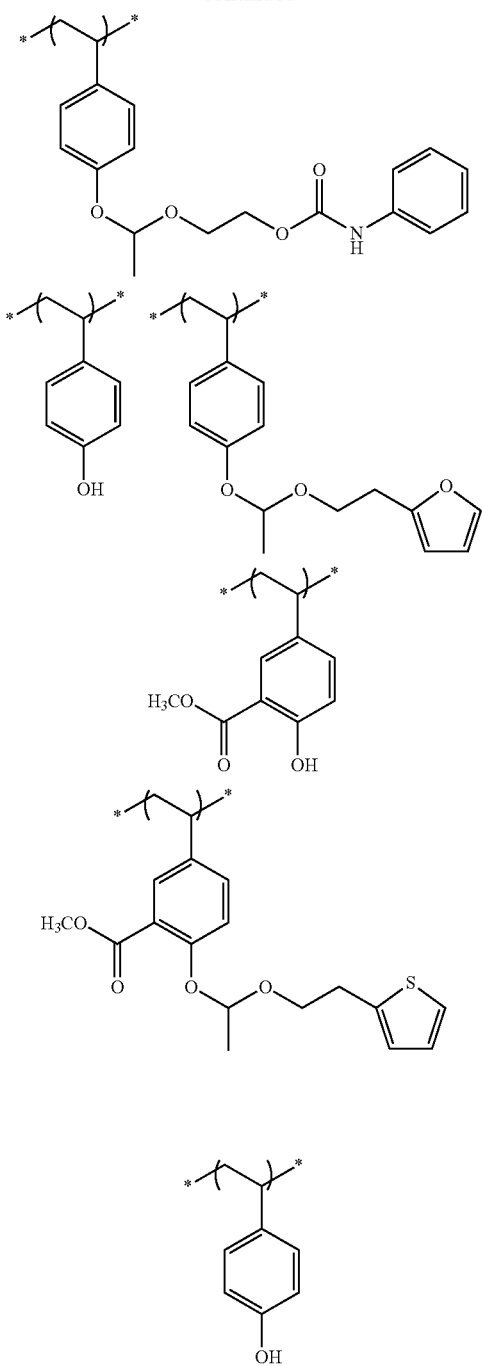

152

-continued

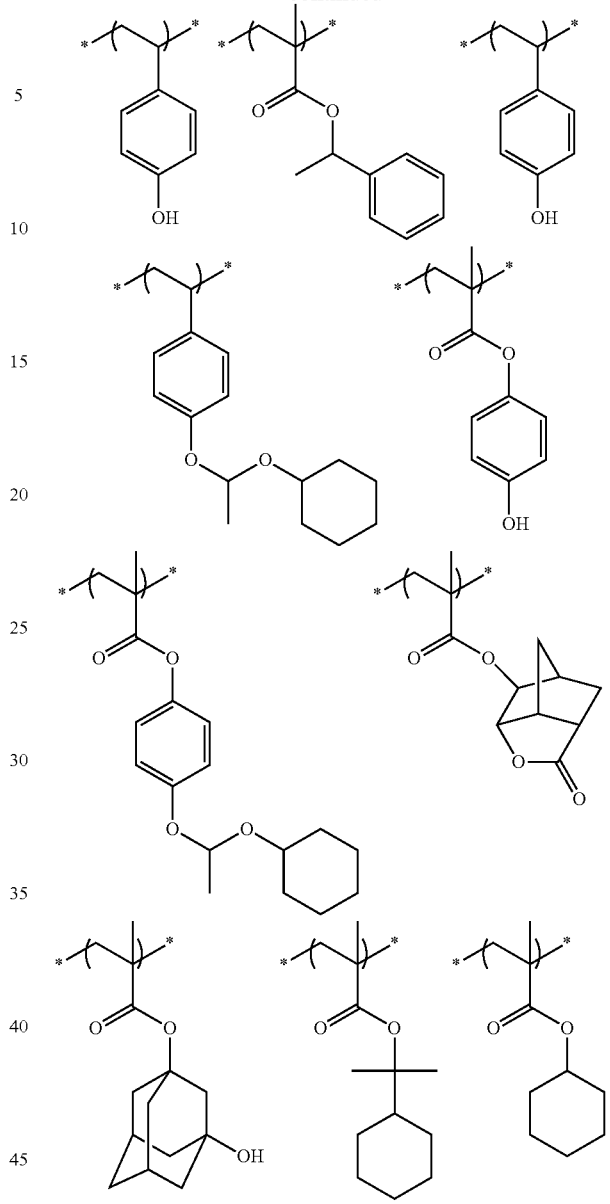

In the case where the composition of the present invention further contains a resin except for the resin (P), the content thereof is preferably from 0.5 to 80 mass %, more preferably from 5 to 50 mass %, still more preferably from 10 to 30 mass %, based on the entire solid content of the composition.

[4] Photoacid Generator

The photoacid generator is a compound capable of generating an acid upon irradiation with an actinic ray or radiation. As the photoacid generator, for example, a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, or a mixture thereof may be appropriately selected and used. Examples thereof include a sulfonium salt, an iodonium salt and a bis(alkylsulfonyl diazomethane).

Preferred examples of the photoacid generator include compounds represented by the following formulae (ZI), (ZII) and (ZIII):

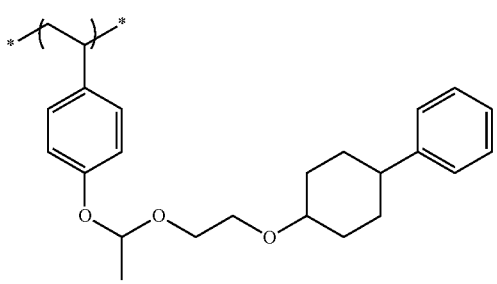

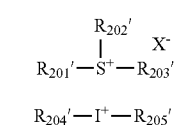
(ZI)

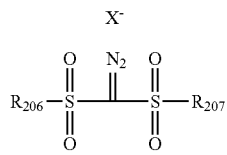
(ZII)

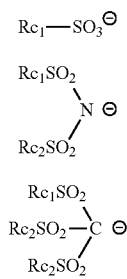
(ZIII)

In formula (ZI), each of $R_{201}'$, $R_{202}'$ and $R_{203}'$ independently represents an organic group. The carbon number of the organic group as $R_{201}'$, $R_{202}'$ and $R_{203}'$ is, for example, from 1 to 30, preferably from 1 to 20.

Two members out of $R_{201}'$ to $R_{203}'$ may combine with each other through a single bond or a linking group to form a ring. In this case, examples of the linking group include an ether bond, a thioether bond, an ester bond, an amide bond, a carbonyl group, a methylene group and an ethylene group. Examples of the group formed by combining two members out of $R_{201}'$ to $R_{203}'$ include an alkylene group such as butylene group and pentylene group.

Examples of the organic group of $R_{201}'$, $R_{202}'$ and $R_{203}'$ include the corresponding groups in the compounds (ZI-1), (ZI-2) and (ZI-3) described later.

$X^-$ represents a non-nucleophilic anion. Examples of $X^-$ include sulfonate anion, bis(alkylsulfonyl)amide anion, tris(alkylsulfonyl)methide anion, $BF_4^-$, $PF_6^-$ and $SbF_6^-$. $X^-$ is preferably an organic anion containing a carbon atom. Preferred examples of the organic anion include organic anions represented by the following formulae AN1 to AN3:

$$Rc_1-SO_3^{\ominus} \quad \text{AN1}$$

$$\begin{matrix} Rc_1SO_2 \\ \phantom{Rc_1SO_2}\diagdown \\ \phantom{Rc_1SO_2}\phantom{x}N^{\ominus} \\ \phantom{Rc_1SO_2}\diagup \\ Rc_2SO_2 \end{matrix} \quad \text{AN2}$$

$$\begin{matrix} Rc_1SO_2 \\ \phantom{Rc_1SO_2}\diagdown \\ Rc_2SO_2-C^{\ominus} \\ \phantom{Rc_1SO_2}\diagup \\ Rc_2SO_2 \end{matrix} \quad \text{AN3}$$

In formulae AN1 to AN3, each of $Rc_1$ to $Rc_3$ independently represents an organic group. This organic group includes an organic group having a carbon number of 1 to 30 and is preferably an alkyl group, an aryl group, or a group where a plurality of these groups are connected through a single bond or a linking group. Incidentally, examples of the linking group include —O—, —CO$_2$—, —S—, —SO$_3$— and —SO$_2$N(Rd$_1$)-, wherein $Rd_1$ represents a hydrogen atom or an alkyl group and may form a ring structure with the alkyl or aryl group to which $Rd_1$ is bonded.

The organic group of $Rc_1$ to $Rc_3$ may be an alkyl group substituted with a fluorine atom or a fluoroalkyl group at the 1-position, or a phenyl group substituted with a fluorine atom or a fluoroalkyl group. By virtue of having a fluorine atom or a fluoroalkyl group, the acidity of the acid generated upon irradiation with light can be increased and in turn, the sensitivity of the actinic ray-sensitive or radiation-sensitive resin composition can be enhanced. Incidentally, $Rc_1$ to $Rc_3$ may combine with another alkyl group, aryl group or the like to form a ring.

Preferred $X^-$ includes a sulfonate anion represented by the following formula (SA1) or (SA2).

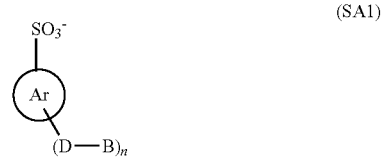
(SA1)

In formula (SA1), Ar represents an aromatic ring and may further have a substituent other than the sulfonate anion and the -(D-B) group, n represents an integer of 0 or more. n is preferably an integer of 1 to 4, more preferably 2 or 3, and most preferably 3.

D represents a single bond or a divalent linking group. Examples of the divalent linking group include an ether group, a thioether group, a carbonyl group, a sulfoxide group, a sulfone group, a sulfonic acid ester group, an ester group, and a group comprising a combination of two or more of these groups.

B represents a hydrocarbon group.

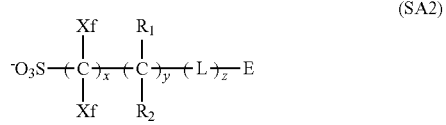
(SA2)

In formula (SA2), each Xf independently represents a fluorine atom or an alkyl group substituted with at least one fluorine atom.

Each of $R_1$ and $R_2$ independently represents a hydrogen atom, a fluorine atom or an alkyl group, and when a plurality of $R_1$'s or $R_2$'s are present, each $R_1$ or $R_2$ may be the same as or different from every other $R_1$ or $R_2$.

L represents a divalent linking group, and when a plurality of L's are present, each L may be the same as or different from every other L.

E represents a cyclic organic group.

x represents an integer of 1 to 20, y represents an integer of 0 to 10, and z represents an integer of 0 to 10.

The sulfonate anion represented by formula (SA1) is described in detail below.

In formula (SA1), Ar is preferably an aromatic ring having a carbon number of 6 to 30. Specifically, Ar is, for example, a benzene ring, a naphthalene ring, a pentalene ring, an indene ring, an azulene ring, a heptalene ring, an indacene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring, and from the standpoint of both improving the roughness and increasing the sensitivity, preferably a benzene ring, a naphthalene ring or an anthracene ring, more preferably a benzene ring.

In the case where Ar further has a substituent other than the sulfonate anion and -(D-B) group, examples of the substituent include a halogen atom such as fluorine atom, chlorine atom, bromine atom and iodine atom; a hydroxy group; a carboxy group; and a sulfonic acid group.

In formula (SA1), D is preferably a single bond, an ether group or an ester group. D is more preferably a single bond.

In formula (SA1), B is, for example, an alkyl group, an alkenyl group, an alkynyl group, an aryl group or a cycloalkyl group. B is preferably an alkyl group or a cycloalkyl group, more preferably a cycloalkyl group. The alkyl group, alkenyl group, alkynyl group, aryl group or cycloalkyl group as B may have a substituent.

The alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group and a 2-ethylhexyl group.

Examples of the alkenyl group as B include a vinyl group, a propenyl group and a hexenyl group.

Examples of the alkynyl group as B include a propenyl group and a hexynyl group.

Examples of the aryl group as B include a phenyl group and a p-tolyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group and a cyclooctyl group. Examples of the polycyclic cycloalkyl group include an adamantyl group, a norbornyl group, a bornyl group, a camphanyl group, a decahydronaphthyl group, a tricyclodecanyl group, a tetracyclodecanyl group, a camphoroyl group, a dicyclohexyl group, and a pinenyl group.

In the case where the alkyl group, alkenyl group, alkynyl group, aryl group or cycloalkyl group as B has a substituent, examples of this substituent include the followings. That is, examples of the substituent include a halogen atom such as fluorine atom, chlorine atom, bromine atom iodine atom; an alkoxy group such as methoxy group, ethoxy group and tert-butoxy group; an aryloxy group such as phenoxy group and p-tolyloxy group; an alkylthioxy group such as methylthioxy group, ethylthioxy group and tert-butylthioxy group; an arylthioxy group such as phenylthioxy group and p-tolylthioxy group; an alkoxycarbonyl group such as methoxycarbonyl, group, butoxycarbonyl group and phenoxycarbonyl group; an acetoxy group; a linear alkyl group such as methyl group, ethyl group, propyl group, butyl group, heptyl group, hexyl group, dodecyl group and 2-ethylhexyl group; a branched alkyl group; a cycloalkyl group such as cyclohexyl group; an alkenyl group such as vinyl group, propenyl group and hexenyl group; an acetylene group; an alkynyl group such as propynyl group and hexynyl group; an aryl group such as phenyl group and tolyl group; a hydroxy group; a carboxy group; a sulfonic acid group; and a carbonyl group. Among these, from the standpoint of both improving the roughness and increasing the sensitivity, a linear alkyl group and a branched alkyl group are preferred.

The sulfonate anion represented by formula (SA2) is described in detail below.

In formula (SA2), Xf is a fluorine atom or an alkyl group substituted with at least one fluorine atom. The alkyl group is preferably an alkyl group having a carbon number of 1 to 10, more preferably an alkyl group having a carbon number of 1 to 4. The alkyl group substituted with a fluorine atom is preferably a perfluoroalkyl group.

Xf is preferably a fluorine atom or a perfluoroalkyl group having a carbon number of 1 to 4. Specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and most preferably a fluorine atom.

In formula (SA2), each of $R_1$ and $R_2$ is independently a hydrogen atom, a fluorine atom or an alkyl group. The alkyl group may have a substituent (preferably a fluorine atom) and is preferably an alkyl group having a carbon number of 1 to 4. In particular, the alkyl group of $R_1$ and $R_2$ which may have a substituent is preferably a perfluoroalkyl group having a carbon number of 1 to 4. Specific examples of the alkyl group having a substituent of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$. Among these, $CF_3$ is preferred.

In formula (SA2), x is preferably 1 to 8, more preferably 1 to 4. y is preferably 0 to 4, more preferably 0. z is preferably 0 to 8, more preferably 0 to 4.

In formula (SA2), L represents a single bond or a divalent linking group. Examples of the divalent linking group include —COO—, —COO—, —CO—, —O—, —S—, —SO—, —SO₂—, an alkylene group, a cycloalkylene group, an alkenylene group, and a combination of two or more of these members, and a divalent linking group having a total carbon number of 20 or less is preferred. Among these, —COO—, —COO—, —CO—, —O—, —S—, —SO— and —SO₂— are preferred, and —COO—, —COO— and —SO₂— are more preferred.

In formula (SA2), E represents a cyclic organic group. Examples of E include a cyclic aliphatic group, an aryl group and a heterocyclic group.

The cyclic aliphatic group as E may have a monocyclic structure or a polycyclic structure. The cyclic aliphatic group having a monocyclic structure is preferably a monocyclic cycloalkyl group such as cyclopentyl group, cyclohexyl group and cyclooctyl group. The cyclic aliphatic group having a polycyclic structure is preferably a polycyclic cycloalkyl group such as norbornyl group, tricyclodecanyl group, tetracyclodecanyl group, tetracyclododecanyl group and adamantyl group. In particular, when a cyclic aliphatic group having a bulky structure of 6-membered or higher membered ring is employed as E, diffusion into the film can be suppressed in the PEB (post-exposure baking) step, and resolution and EL (exposure latitude) can be further enhanced.

Examples of the aryl group as E include a benzene ring, a naphthalene ring, a phenanthrene ring and an anthracene ring.

The heterocyclic group as E may or may not have aromaticity. The heteroatom contained in this group is preferably a nitrogen atom or an oxygen atom. Specific examples of the heterocyclic structure include a furan ring, a thiophene ring, a benzofuran ring, a benzothiophene ring, a dibenzofuran ring, a dibenzothiophene ring, a pyridine ring, a piperidine ring and a morpholine ring. Among these, a furan ring, a thiophene ring, a pyridine ring, a piperidine ring and a morpholine ring are preferred.

E may have a substituent. Examples of the substituent include an alkyl group (may be linear, branched or cyclic, preferably having a carbon number of 1 to 12), an aryl group (preferably having a carbon number of 6 to 14), a hydroxy group, an alkoxy group, an ester group, an amido group, a urethane group, a ureido group, a thioether group, a sulfonamido group and a sulfonic acid ester group.

A compound having a plurality of structures represented by formula (ZI) may be used as the photoacid generator. For example, the photoacid generator may be a compound having a structure where at least one of $R_{201}'$ to $R_{203}'$ in the compound represented by formula (ZI) is bonded to at least one of $R_{201}'$ to $R_{203}'$ in another compound represented by formula (ZI).

More preferred compounds as the component (ZI) include compounds (ZI-1) to (ZI-4) described below.

The compound (ZI-1) is a compound where at least one of $R_{201}'$ to $R_{203}'$ in formula (ZI) is an aryl group. In other words, the compound (ZI-1) is an arylsulfonium compound, that is, a compound having an arylsulfonium as the cation.

In the compound (ZI-1), all of $R_{201}'$ to $R_{203}'$ may be an aryl group or a part of $R_{201}'$ to $R_{203}'$ may be an aryl group with the remaining being an alkyl group. Incidentally, when the compound (ZI-1) contains a plurality of aryl groups, each aryl group may be the same as or different from every other aryl groups.

Examples of the compound (ZI-1) include a triarylsulfonium compound, a diarylalkylsulfonium compound and an aryldialkylsulfonium compound.

The aryl group in the compound (ZI-1) is preferably a phenyl group, a naphthyl group or a heteroaryl group such as indole residue structure and pyrrole residue structure, more preferably a phenyl group, a naphthyl group or an indole residue structure.

The alkyl group which is present, if desired, in the compound (ZI-1) is preferably a linear, branched or cyclo alkyl group having a carbon number of 1 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of these aryl group and alkyl group may have a substituent. Examples of the substituent include an alkyl group (preferably having a carbon number of 1 to 15), an aryl group (preferably having a carbon number of 6 to 14), an alkoxy group (preferably having a carbon number of 1 to 15), a halogen atom, a hydroxyl group and a phenylthio group.

The substituent is preferably a linear, branched or cyclic alkyl group having a carbon number of 1 to 12, or a linear, branched or cyclic alkoxy group having a carbon number of 1 to 12, more preferably an alkyl group having a carbon number of 1 to 6, or an alkoxy group having a carbon number of 1 to 6. The substituent may be substituted on any one of three members $R_{201}'$ to $R_{203}'$ or may be substituted on all of these three members. In the case where $R_{201}$ to $R_{203}$ are a phenyl group, the substituent is preferably substituted at the p-position of the aryl group.

An embodiment where one or two of $R_{201}'$, $R_{202}'$ and $R_{203}'$ are an aryl group which may have a substituent and the remaining groups are a linear, branched or cyclic alkyl group is also preferred. Specific examples of this structure include structures described in paragraphs 0141 to 0153 of JP-A-2004-210670.

At his time, the aryl group above is specifically the same as the aryl group as $R_{201}'$, $R_{202}'$ and $R_{203}'$ and is preferably a phenyl group or a naphthyl group. The aryl group preferably has any of a hydroxyl group, an alkoxy group and an alkyl group, as the substituent. The substituent is more preferably an alkoxy group having a carbon number of 1 to 12, still more preferably an alkoxy group having a carbon number of 1 to 6.

The linear, branched or cyclic alkyl group as the remaining group is preferably an alkyl group having a carbon number of 1 to 6. Such a group may further have a substituent. Also, in the case where two groups are present as the remaining group, these two groups may combine with each other to form a ring structure.

The compound (ZI-1) is, for example, a compound represented by the following formula (ZI-1A):

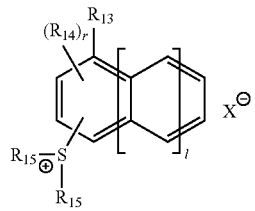

(ZI-1A)

In formula (ZI-1A), $R_{13}$ represents a hydrogen atom, a fluorine atom, a hydroxyl group, an alkyl group, a cycloalkyl group, an alkoxy group, a cycloalkyloxy group or an alkoxycarbonyl group.

$R_{14}$ represents, when a plurality of $R_{14}$'s are present, each independently represents, an alkyl group, a cycloalkyl group, an alkoxy group, an alkylsulfonyl group or a cycloalkylsulfonyl group.

Each $R_{15}$ independently represents an alkyl group or a cycloalkyl group, and two $R_{15}$'s may combine with each other to form a ring structure.

l represents an integer of 0 to 2.

r represents an integer of 0 to 8.

$X^-$ represents a non-nucleophilic anion, and examples thereof are the same as those for $X^-$ in formula (ZI).

The alkyl group of $R_{13}$, $R_{14}$ and $R_{15}$ may be a linear alkyl group or a branched alkyl group. This alkyl group is preferably an alkyl group having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these, a methyl group, an ethyl group, an n-butyl group and a tert-butyl group are preferred.

The cycloalkyl group of $R_{13}$, $R_{14}$ and $R_{15}$ include a cyclic or polycyclic cycloalkyl group (preferably a cycloalkyl group having a carbon number of 3 to 20), and examples thereof include a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group and a cyclooctadienyl group. Among these, a cyclopropyl group, a cyclopentyl group, a cyclohexyl group, a cycloheptyl group and a cyclooctyl are preferred.

Examples of the alkyl group moiety in the alkoxy group of $R_{13}$ or $R_{14}$ include those enumerated above as the alkyl group of $R_{13}$, $R_{14}$ or $R_{15}$. The alkoxy group is preferably a methoxy group, an ethoxy group, an n-propoxy group or an n-butoxy group.

Examples of the cycloalkyl group moiety in the cycloalkyloxy group of $R_{13}$ include those enumerated above as the cycloalkyl group of $R_{13}$, $R_{14}$ or $R_{15}$. The cycloalkyloxy group is preferably a cyclopentyloxy group or a cyclohexyloxy group.

Examples of the alkoxy group moiety in the alkoxycarbonyl group of $R_{13}$ include those enumerated above as the alkoxy group of $R_{13}$ or $R_{14}$. The alkoxycarbonyl group is preferably a methoxycarbonyl group, an ethoxycarbonyl group or an n-butoxycarbonyl group.

Examples of the alkyl group moiety in the alkylsulfonyl group of $R_{14}$ include those enumerated above as the alkyl group of $R_{13}$, $R_{14}$ or $R_{15}$. Examples of the cycloalkyl group moiety in the cycloalkylsulfonyl group of $R_{14}$ include those enumerated above as the cycloalkyl group of $R_{13}$, $R_{14}$ or $R_{15}$. The alkylsulfonyl or cycloalkylsulfonyl group is preferably a methanesulfonyl group, an ethanesulfonyl group, an n-propanesulfonyl group, an n-butanesulfonyl group, a cyclopentanesulfonyl group or a cyclohexanesulfonyl group.

l is preferably 0 or 1, more preferably 1. r is preferably 0 to 2.

Each of the groups of $R_{13}$, $R_{14}$ and $R_{15}$ may further have a substituent. Examples of the substituent include a halogen atom such as fluorine atom, a hydroxy group, a carboxy group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group and a cycloalkyloxycarbonyloxy group.

The alkoxy group may be linear or branched. The alkoxy group includes, for example, an alkoxy group having a carbon number of 1 to 20, such as methoxy group, ethoxy group, n-propoxy group, i-propoxy group, n-butoxy group, 2-methylpropoxy group, 1-methylpropoxy group and tert-butoxy group.

The cycloalkyloxy group includes, for example, a cycloalkyloxy group having a carbon number of 3 to 20, such as cyclopentyloxy group and cyclohexyloxy group.

The alkoxyalkyl group may be linear or branched. The alkoxyalkyl group includes, for example, an alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

The cycloalkyloxyalkyl group includes, for example, a cycloalkyloxyalkyl group having a carbon number of 4 to 21, such as cyclopentyloxyethyl group, cyclopentyloxypentyl group, cyclohexyloxyethyl group and cyclohexyloxypentyl group.

The alkoxycarbonyl group may be linear or branched. The alkoxycarbonyl group includes, for example, an alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group and tert-butoxycarbonyl group The cycloalkyloxycarbonyl includes, for example, a cycloalkyloxycarbonyl group having a carbon number of 4 to 21, such as cyclopentyloxycarbonyl group and cyclohexyloxycarbonyl group.

The alkoxycarbonyloxy group may be linear or branched. The alkoxycarbonyloxy group includes, for example, an alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group and tert-butoxycarbonyloxy group The cycloalkyloxycarbonyloxy group includes, for example, a cycloalkyloxycarbonyloxy group having a carbon number of 4 to 21, such as cyclopentyloxycarbonyloxy group and cyclohexyloxycarbonyloxy group.

The ring structure which may be formed by combining two $R_{15}$'s with each other is preferably a structure capable of forming a 5- or 6-membered ring, preferably a 5-membered ring (that is, a tetrahydrothiophene ring), together with the S atom in formula (ZI-1A).

The ring structure may further have a substituent. Examples of the substituent include a hydroxy group, a carboxy group, a cyano group, a nitro group, an alkyl group, a cycloalkyl group, an alkoxy group, an alkoxyalkyl group, an alkoxycarbonyl group and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these groups).

$R_{15}$ is preferably a methyl group, an ethyl group, or a divalent group capable of forming a tetrahydrothiophene ring structure together with the sulfur atom when two $R_{15}$'s are combined with each other.

The alkyl group, cycloalkyl group, alkoxy group and alkoxycarbonyl group of $R_{13}$ and the alkyl group, cycloalkyl group, alkoxy group, alkylsulfonyl group and cycloalkylsulfonyl group of $R_{14}$ may further have a substituent. The substituent is preferably a hydroxy group, an alkoxy group, an alkoxycarbonyl group or a halogen atom (particularly a fluorine atom).

Specific preferred examples of the cation in the compound represented by formula (ZI-1A) are illustrated below.

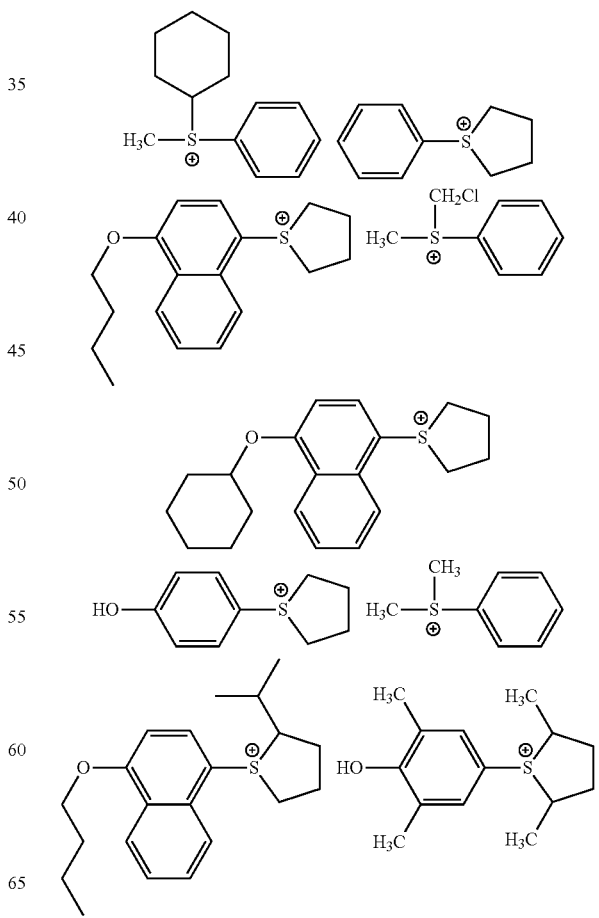

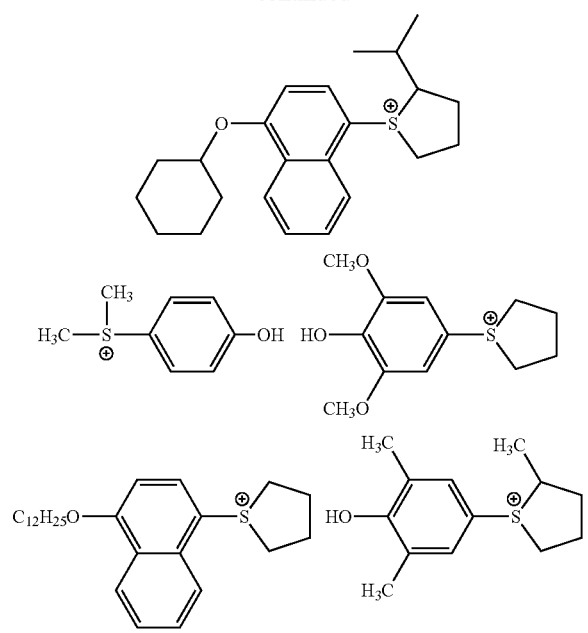
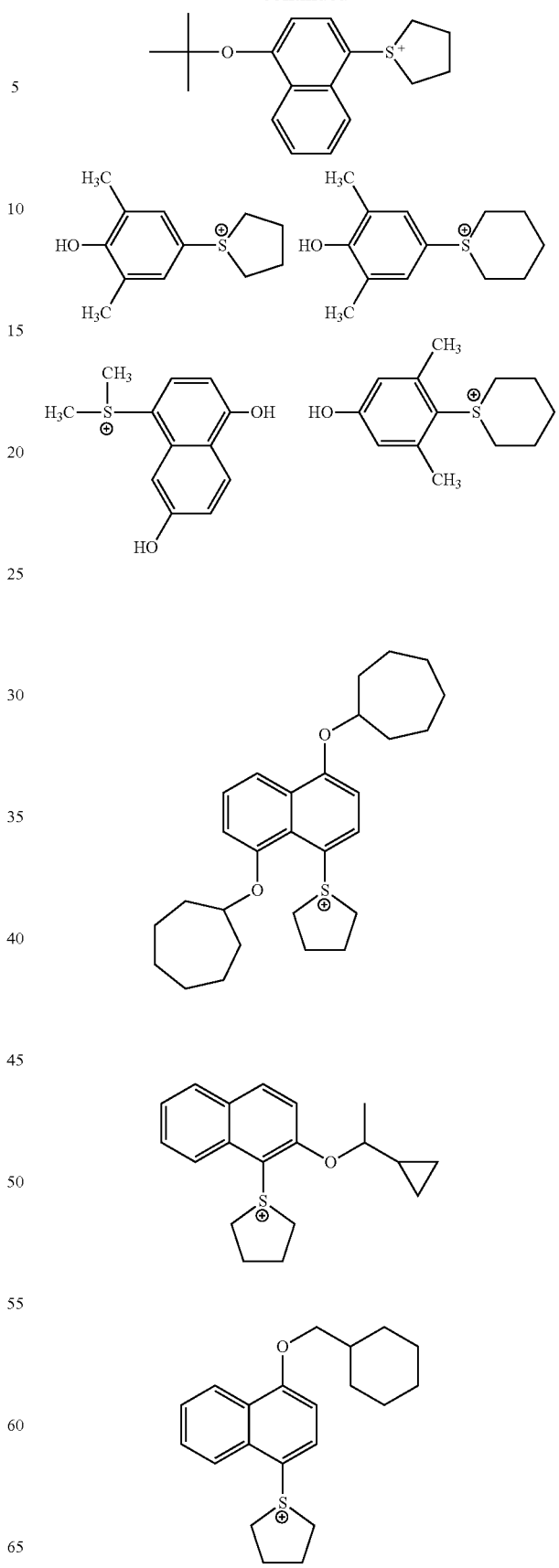

163
-continued
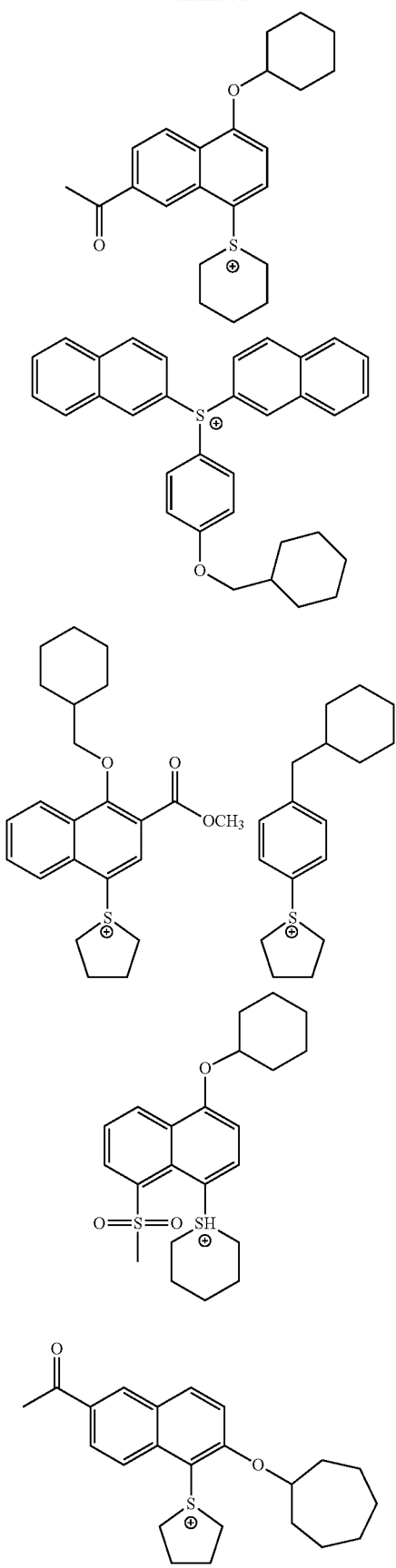
164
-continued
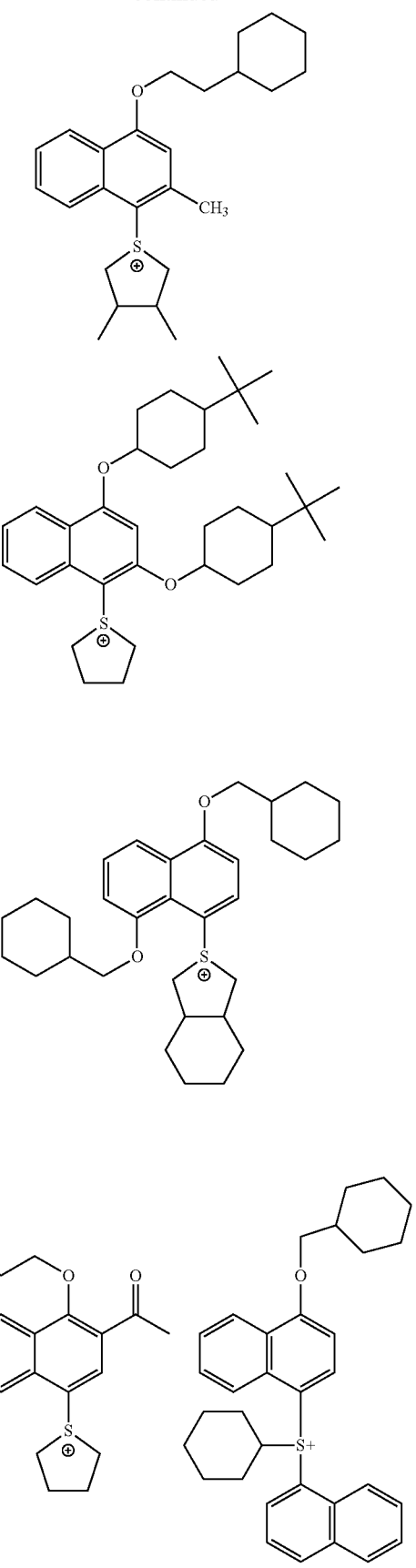

-continued

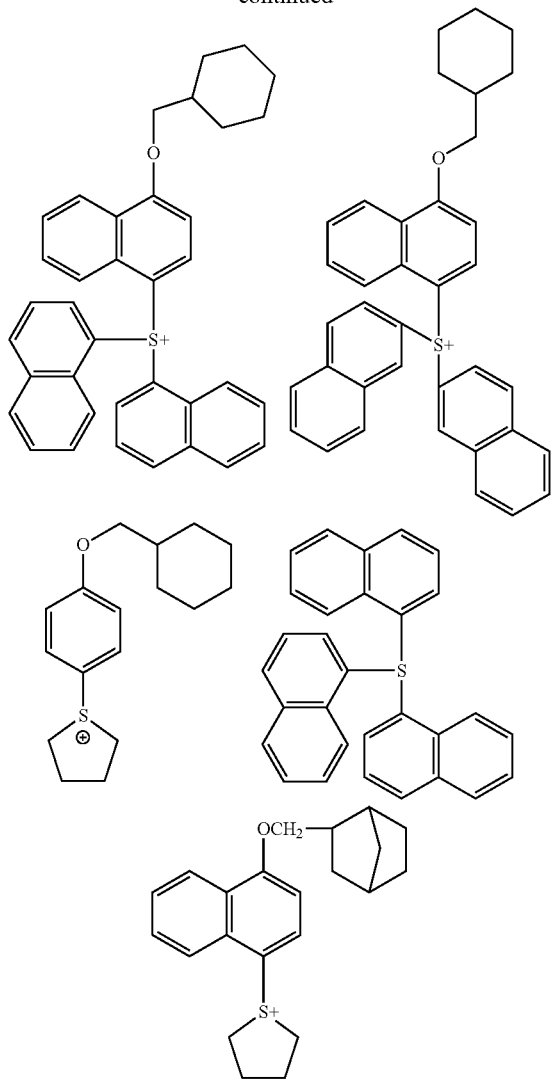

The compound (ZI-2) is described below.

The compound (ZI-2) is a compound where each of $R_{201}'$ to $R_{203}'$ in formula (ZI) independently represents an aromatic ring-free organic group. The aromatic ring as used herein includes an aromatic ring containing a heteroatom.

The aromatic ring-free organic group as $R_{201}'$ to $R_{203}'$ has a carbon number of, for example, from 1 to 30, preferably from 1 to 20.

Each of $R_{201}'$ to $R_{203}'$ independently represents preferably an alkyl group, a cycloalkyl group, a 2-oxoalkyl group, an alkoxycarbonylmethyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group and cycloalkyl group as $R_{201}'$ to $R_{203}'$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The 2-oxoalkyl group as $R_{201}'$ to $R_{203}'$ may be linear, branched or cyclic and is preferably a group having >C=O at the 2-position of the above-described alkyl group.

Preferred examples of the alkoxy group in the alkoxycarbonylmethyl group as $R_{201}'$ to $R_{203}'$ include an alkoxy group having a carbon number of 1 to 5 (e.g., methoxy group, ethoxy group, propoxy group, butoxy group, pentoxy group).

Each of $R_{201}'$ to $R_{203}'$ may be further substituted, for example, with a halogen atom, an alkoxy group (for example, having a carbon number of 1 to 5), a hydroxyl group, a cyano group and/or a nitro group.

Two members out of $R_{201}'$ to $R_{203}'$ may combine with each other to form a ring structure. This ring structure may contain an oxygen atom, a sulfur atom, an ester bond, an amido bond and/or a carbonyl group in the ring. Examples of the group formed by combining two members out of $R_{201}'$ to $R_{203}'$ include an alkylene group (e.g., butylenes group, pentylene group).

The ring structure includes an aromatic or non-aromatic hydrocarbon ring, an aromatic or non-aromatic heterocyclic ring, and a polycyclic condensed ring formed by combining two or more of these rings. The ring structure may be a 3- to 10-membered ring and is preferably a 4- to 8-membered ring, more preferably a 5- or 6-membered ring.

The compound (ZI-3) is described below.

The compound (ZI-3) is a compound represented by the following formula (ZI-3), and this is a compound having a phenacylsulfonium salt structure.

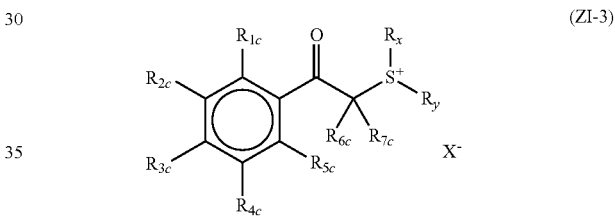

(ZI-3)

In the formula, each of $R_{1c}$ to $R_{5c}$ independently represents a hydrogen atom, an alkyl group, an alkoxy group or a halogen atom. The carbon number of the alkyl group and alkoxy group is preferably from 1 to 6.

Each of $R_{6c}$ and $R_{7c}$ represents a hydrogen atom or an alkyl group. The carbon number of the alkyl group is preferably from 1 to 6.

Each of $R_x$ and $R_y$ independently represents an alkyl group, a 2-oxoalkyl group, an alkoxycarbonyl methyl group, an allyl group or a vinyl group. The carbon number of these atomic groups is preferably from 1 to 6.

Any two or more members out of $R_{1c}$ to $R_{7c}$ may combine with each other to form a ring structure. Also, $R_x$ and $R_y$ may combine to form a ring structure. These ring structures may contain an oxygen atom, a sulfur atom, an ester bond and/or an amide bond.

$X^-$ in formula (ZI-3) has the same meaning as $X^-$ in formula (ZI).

Specific examples of the compound (ZI-3) include compounds illustrated in paragraphs 0046 and 0047 of JP-A-2004-233661 and paragraphs 0040 to 0046 of JP-A-2003-35948.

The compound (ZI-4) is described below.

The compound (ZI-4) is a compound having a cation represented by the following formula (ZI-4). This compound (ZI-4) is effective to suppress outgassing.

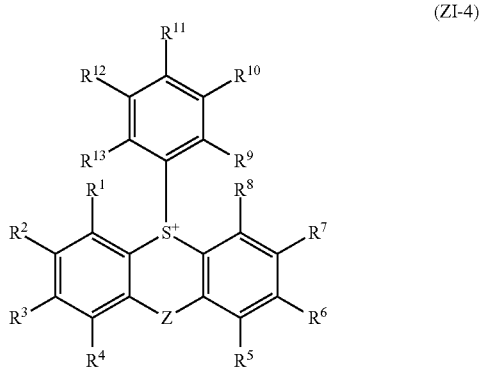

(ZI-4)

In formula (ZI-4), each of $R^1$ to $R^{13}$ independently represents a hydrogen atom or a substituent, and at least one of $R^1$ to $R^{13}$ is preferably a substituent containing an alcoholic hydroxyl group. The term "alcoholic hydroxyl group" as used herein means a hydroxyl group bonded to a carbon atom of an alkyl group.

Z represents a single bond or a divalent linking group.

In the case where $R^1$ to $R^{13}$ are a substituent containing an alcoholic hydroxyl group, each of $R^1$ to $R^{13}$ is preferably a group represented by —(W—Y), wherein Y is an alkyl group substituted with a hydroxyl group and W is a single bond or a divalent linking group.

Preferred examples of the alkyl group represented by Y include an ethyl group, a propyl group and an isopropyl group. In particular, Y preferably contains a structure represented by —$CH_2CH_2OH$.

The divalent linking group represented by W is not particularly limited but is preferably a single bond or a divalent group formed by substituting a single bond for an arbitrary hydrogen atom of an alkoxyl group, an acyloxy group, an acylamino group, an alkyl- or aryl-sulfonylamino group, an alkylthio group, an alkylsulfonyl group, an acyl group, an alkoxycarbonyl group or a carbamoyl group, more preferably a single bond or a divalent group formed by substituting a single bond for an arbitrary hydrogen atom of an acyloxy group, an alkylsulfonyl group, an acyl group or an alkoxycarbonyl group.

In the case where $R^1$ to $R^{13}$ are a substituent containing an alcoholic hydroxyl group, the number of carbons contained therein is preferably from 2 to 10, more preferably from 2 to 6, still more preferably from 2 to 4.

The alcoholic hydroxyl group-containing substituent as $R^1$ to $R^{13}$ may have two or more alcoholic hydroxyl groups. The number of alcoholic hydroxyl groups in the alcoholic hydroxyl group-containing substituent as $R^1$ to $R^{13}$ is from 1 to 6, preferably from 1 to 3, more preferably 1.

The number of alcoholic hydroxyl groups in the compound represented by formula (ZI-4) is, in total of all of $R^1$ to $R^{13}$, from 1 to 10, preferably from 1 to 6, more preferably from 1 to 3.

In the case where $R^1$ to $R^{13}$ are free of an alcoholic hydroxyl group, examples of the substituent as $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxyl group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group [—$B(OH)_2$], a phosphato group [—$OPO(OH)_2$], a sulfato group (—$OSO_3H$), and other known substituents.

In the case where $R^1$ to $R^{13}$ are free of an alcoholic hydroxyl group, each of $R^1$ to $R^{13}$ is preferably a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or aryl-sulfonylamino group, an alkylthio group, an arylthio group, a sulfamoyl group, an alkyl- or aryl-sulfonyl group, an aryloxycarbonyl group, an alkoxycarbonyl group, a carbamoyl group, an imido group, a silyl group or a ureido group.

In the case where $R^1$ to $R^{13}$ are free of an alcoholic hydroxyl group, each of $R^1$ to $R^{13}$ is more preferably a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or aryl-sulfonylamino group, an alkylthio group, a sulfamoyl group, an alkyl- or aryl-sulfonyl group, an alkoxycarbonyl group or a carbamoyl group.

In the case where $R^1$ to $R^{13}$ are free of an alcoholic hydroxyl group, each of $R^1$ to $R^{13}$ is still more preferably a hydrogen atom, an alkyl group, a cycloalkyl group, a halogen atom or an alkoxy group.

Two adjacent members out of $R^1$ to $R^{13}$ may combine with each other to form a ring. This ring includes an aromatic or non-aromatic hydrocarbon ring and a heterocyclic ring. These rings may further combine to form a condensed ring.

The compound (ZI-4) preferably has a structure where at least one of $R^1$ to $R^{13}$ contains an alcoholic hydroxyl group, more preferably a structure where at least one of $R^9$ to $R^{13}$ contains an alcoholic hydroxyl group.

Z represents, as described above, a single bond or a divalent linking group. Examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, an aminocarbonylamino group and an aminosulfonylamino group.

The divalent linking group may have a substituent. Examples of the substituent thereof are the same as those enumerated for $R^1$ to $R^{13}$.

Z is preferably a single bond or a non-electron-withdrawing bond or group such as alkylene group, arylene group, ether group, thioether group, amino group, —CH=CH—, aminocarbonylamino group and aminosulfonylamino group, more preferably a single bond, an ether group or a thioether group, still more preferably a single bond.

Formulae (ZII) and (ZIII) are described below.

In formulae (ZII) and (ZIII), each of $R_{204}'$, $R_{205}'$, $R_{206}$ and $R_{207}$ independently represents an aryl group, an alkyl group or a cycloalkyl group. These aryl group, alkyl group and cycloalkyl group may have a substituent.

Preferred examples of the aryl group as $R_{204}'$, $R_{205}'$, $R_{206}$ and $R_{207}$ are the same as those enumerated for $R_{201}'$ to $R_{203}'$ in compound (ZI-1).

Preferred examples of the alkyl group and cycloalkyl group as $R_{204}'$, $R_{205}'$, $R_{206}$ and $R_{207}$ include linear, branched or cyclo-alkyl groups enumerated for $R_{201}'$ to $R_{203}'$ in compound (ZI-2).

The aryl group, alkyl group and cycloalkyl group of $R_{204}'$, $R_{205}'$, $R_{206}$ and $R_{207}$ may have a substituent. Examples of the substituent which the aryl group, alkyl group and cycloalkyl group of $R_{204}'$, $R_{205}'$, $R_{206}$ and $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group and a phenylthio group.

$X^-$ in formula (ZII) has the same meaning as $X^-$ in formula (ZI).

Other preferred examples of the photoacid generator include compounds represented by the following formulae (ZIV), (ZV) and (ZVI).

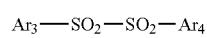

ZIV

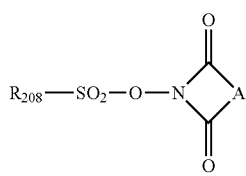

ZV

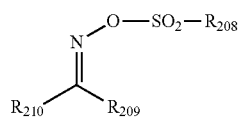

ZVI

In formulae (ZIV) to (ZVI), each of $Ar_3$ and $Ar_4$ independently represents a substituted or unsubstituted aryl group.

Each $R_{208}$ in formulae (ZV) and (ZVI) independently represents an alkyl group, a cycloalkyl group or an aryl group. These alkyl group, cycloalkyl group and aryl group may or may not be substituted.

Such a group is preferably substituted with a fluorine atom. In this case, the strength of the acid generated from the photoacid generator can be enhanced.

Each of $R_{209}$ and $R_{210}$ independently represents an alkyl group, a cycloalkyl group, an aryl group or an electron-withdrawing group. These alkyl group, cycloalkyl group, aryl group and electron-withdrawing group may or may not be substituted. Examples of the substituent which the alkyl group, cycloalkyl group, aryl group and electron-withdrawing group may have include a halogen atom, an alkoxy group (for example, having a carbon number of 1 to 5), a hydroxyl group, a cyano group and a nitro group.

$R_{209}$ is preferably a substituted or unsubstituted aryl group.

$R_{210}$ is preferably an electron-withdrawing group. The electron-withdrawing group is preferably a cyano group or a fluoroalkyl group.

A represents an alkylene group, an alkenylene group or an arylene group. These alkylene group, alkenylene group and arylene group may have a substituent.

Specific examples of the aryl group of $Ar_3$, $Ar_4$, $R_{208}$, $R_{209}$ and $R_{210}$ are the same as specific examples of the aryl group as $R_{201}'$, $R_{202}'$ and $R_{203}'$ in formula (ZI-1).

Specific examples of the alkyl group and cycloalkyl group of $R_{208}$, $R_{209}$ and $R_{210}$ are the same as specific examples of the alkyl group and cycloalkyl group as $R_{201}'$, $R_{202}'$ and $R_{203}'$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

A compound having a plurality of structures represented by formula (ZVI) is also preferred as the photoacid generator. Examples of such a compound include a compound having a structure where $R_{209}$ or $R_{210}$ in the compound represented by formula (ZVI) is bonded to $R_{209}$ or $R_{210}$ in another compound represented by formula (ZVI).

As the photoacid generator, the compounds represented by formulae (ZI) to (ZIII) are preferred, the compound represented by formula (ZI) is more preferred, and the compound (ZI-1) to (ZI-3) are still more preferred.

Specific examples of the photoacid generator are illustrated below, but the scope of the present invention is not limited thereto.

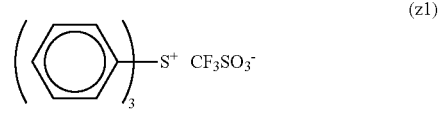

(z1)

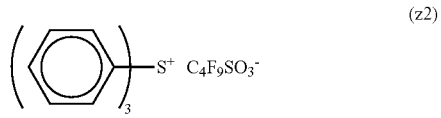

(z2)

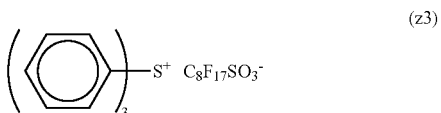

(z3)

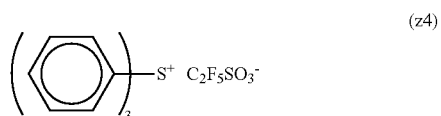

(z4)

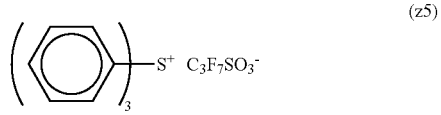

(z5)

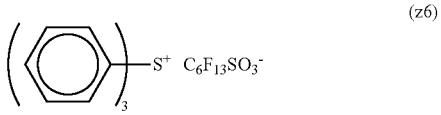

(z6)

-continued
(z7) 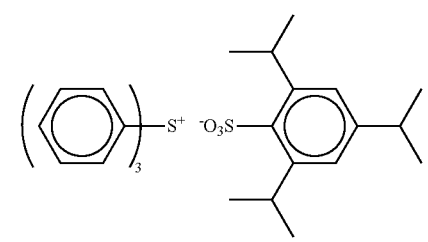
(z8) 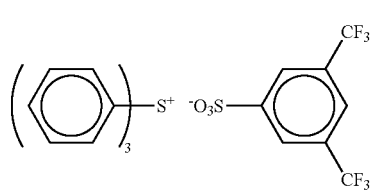
(z9) 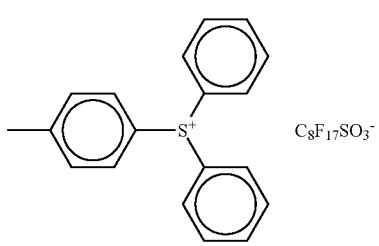
(z10) 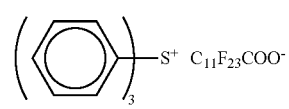
(z11) 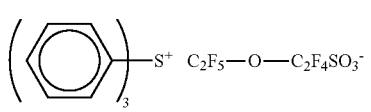
(z12) 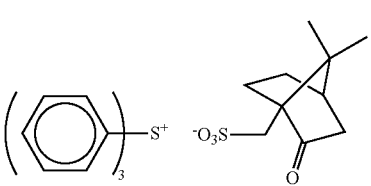
(z13) 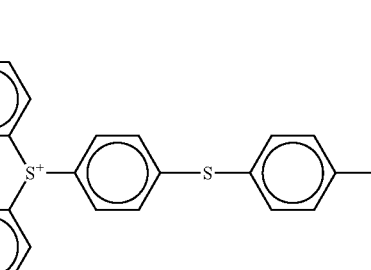
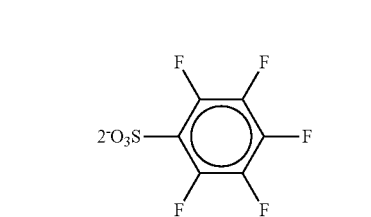
-continued
(z14) 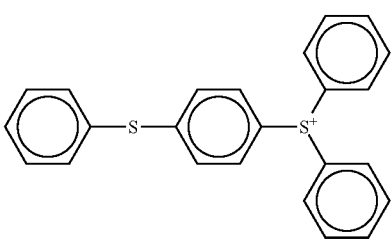
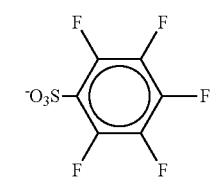
(z15) 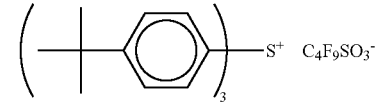
(z16) 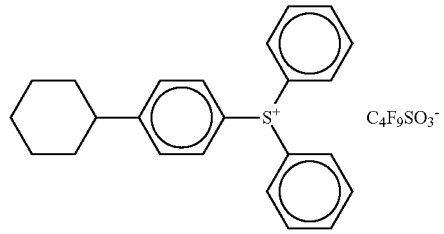
(z17) 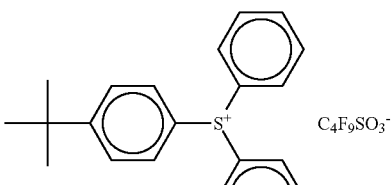
(z18) 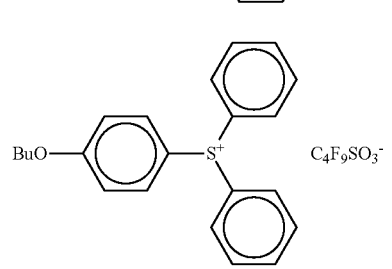
(z19) 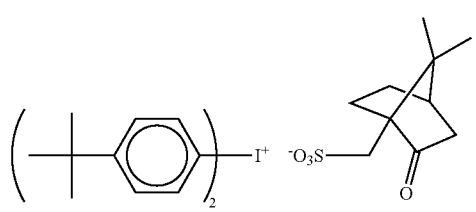
(z20) 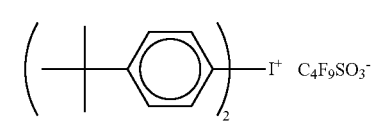

(z21)
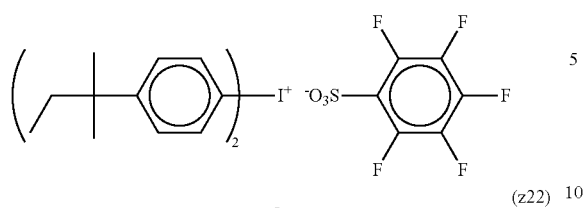
(z22)
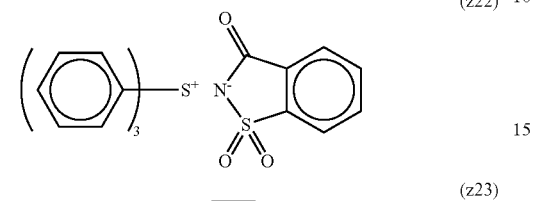
(z23)
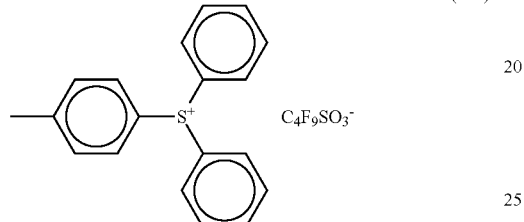
(z24)
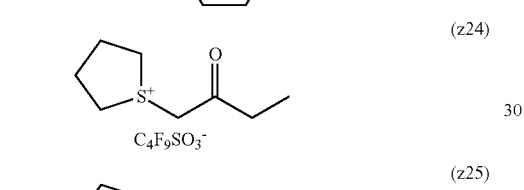
(z25)
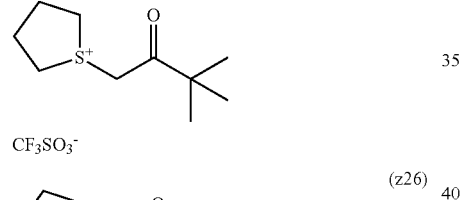
(z26)
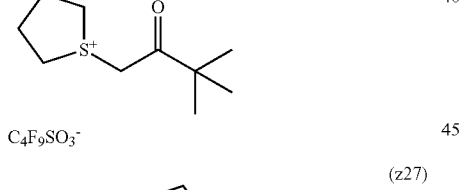
(z27)
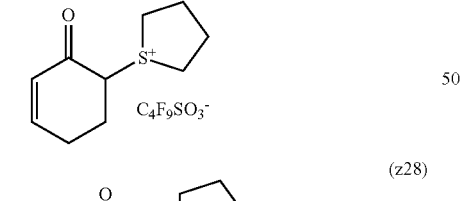
(z28)
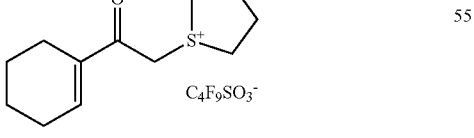
(z29)
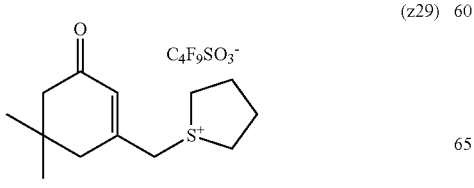
(z30)
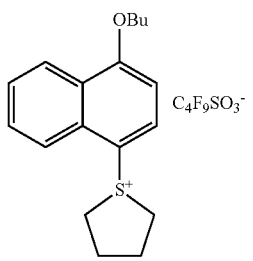
(z31)
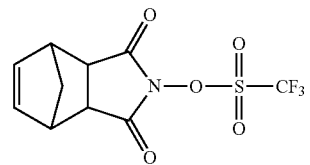
(z32)
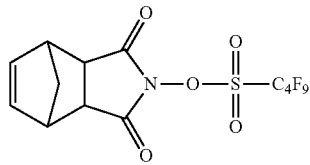
(z33)
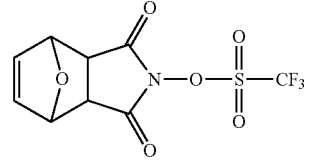
(z34)
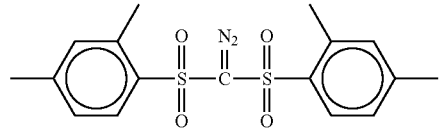
(z35)
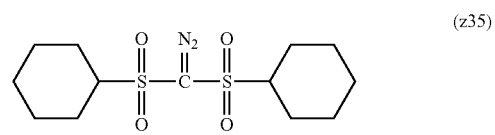
(z36)
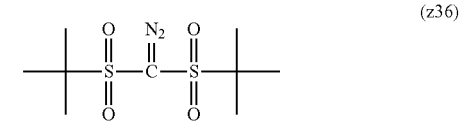
(z37)
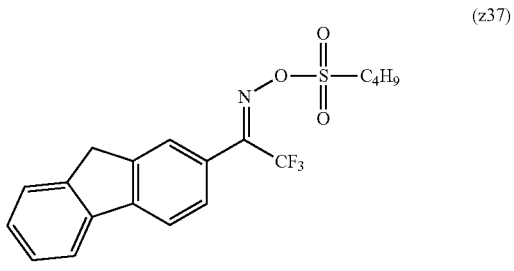

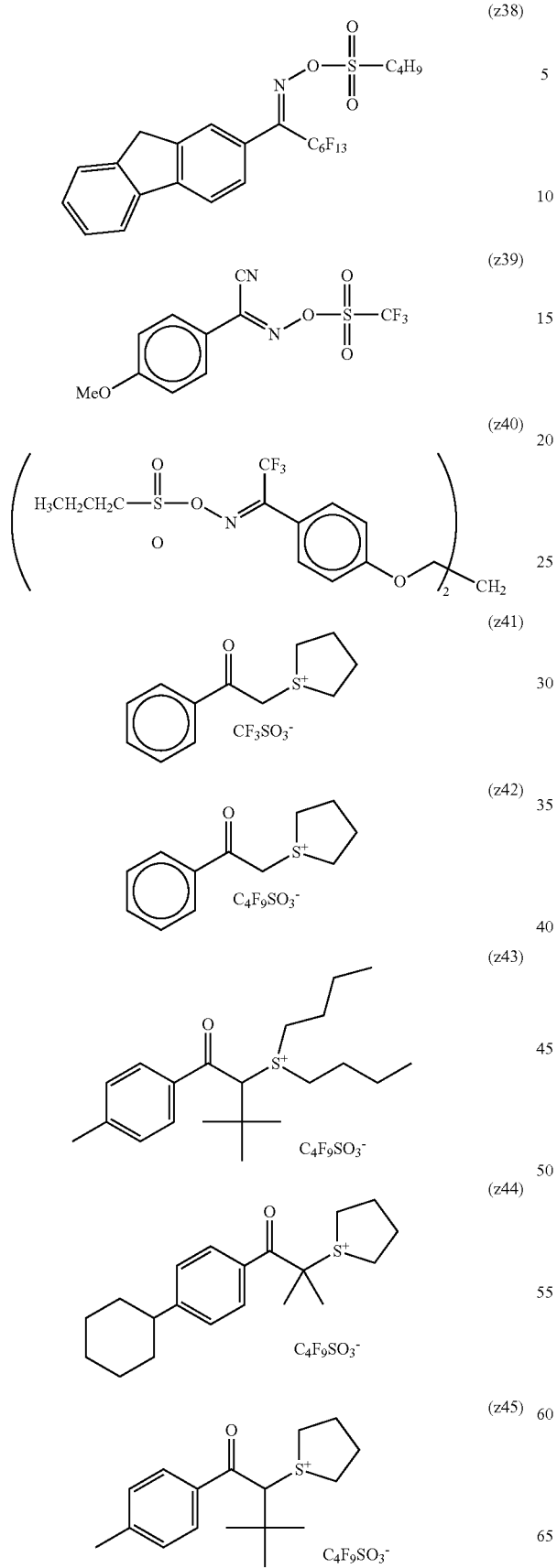
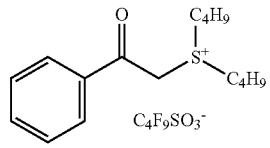
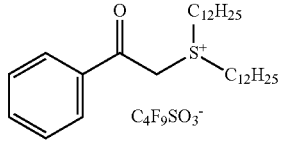
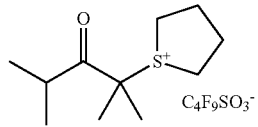
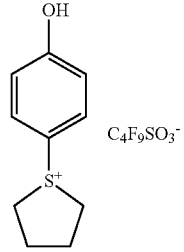
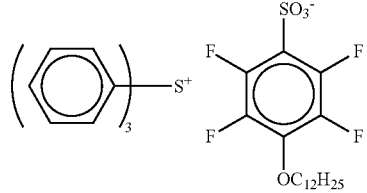
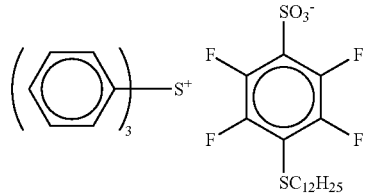
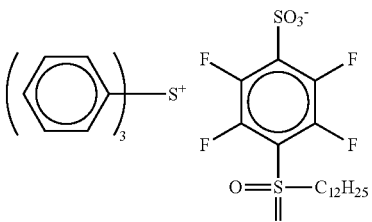
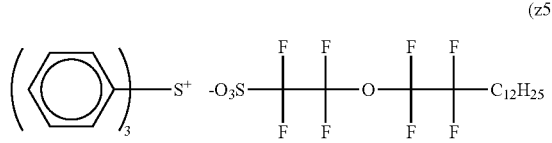
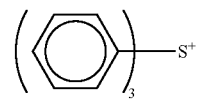

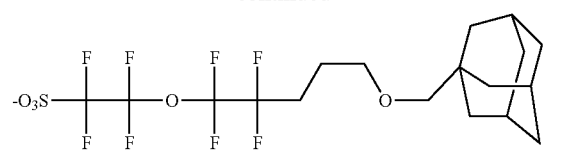
(z55)
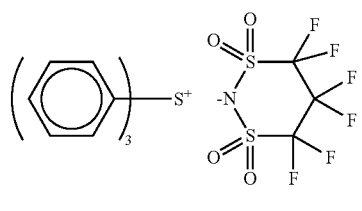
(z56)
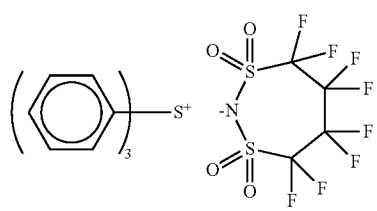
(z57)
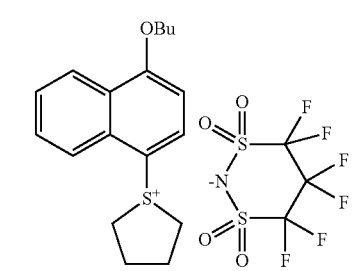
(z58)
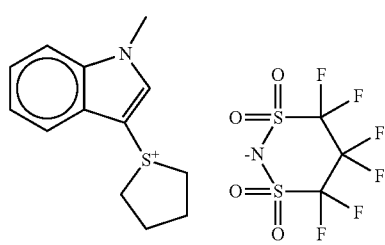
(z59)
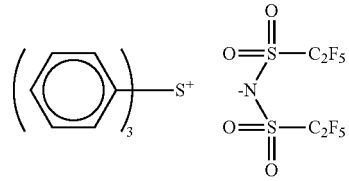
(z60)
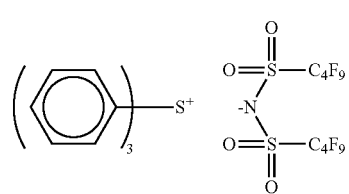
(z61)
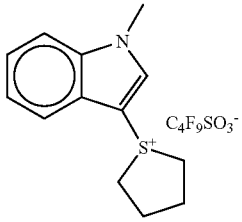
(z62)
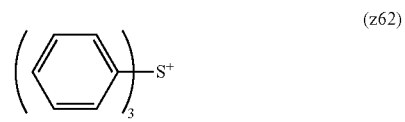
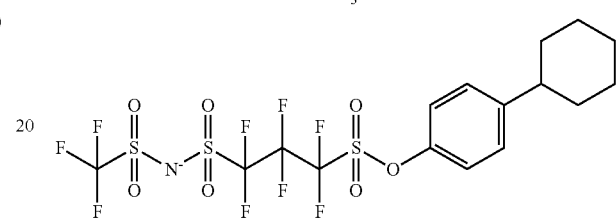
(z63)
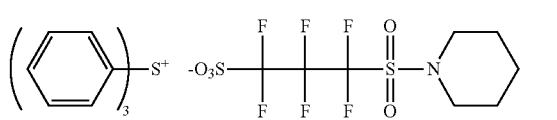
(z64)
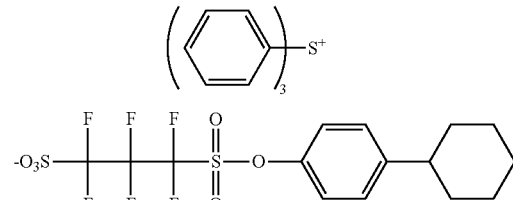
(z65)
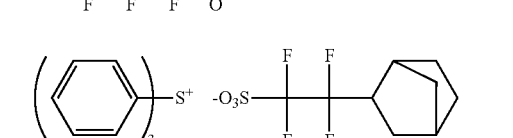
(z66)
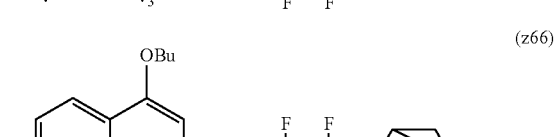
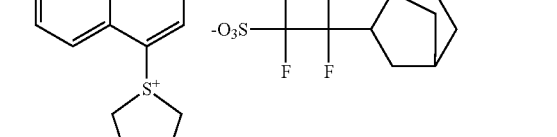
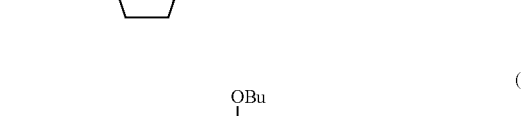
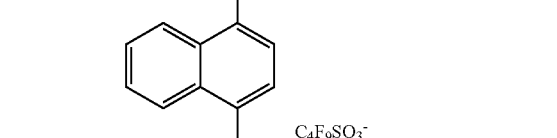
(z67)
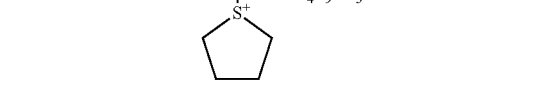

(z68)
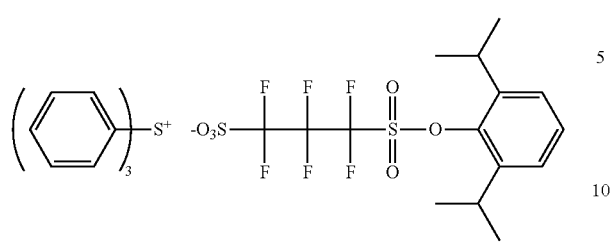
(z69)
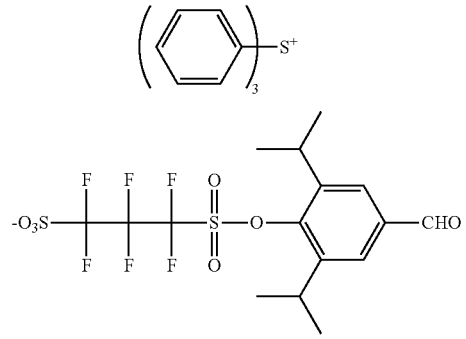
(z70)
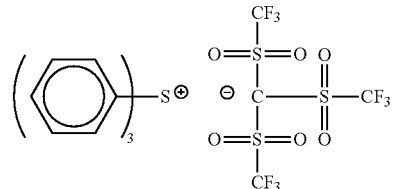
(z71)
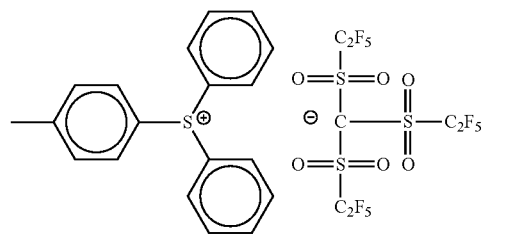
(z72)
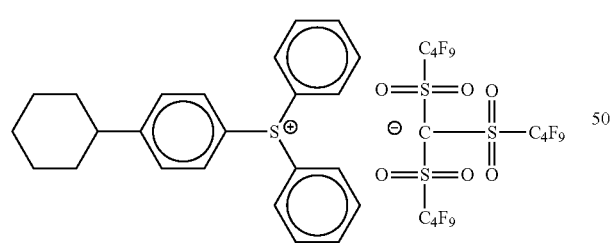
(z73)
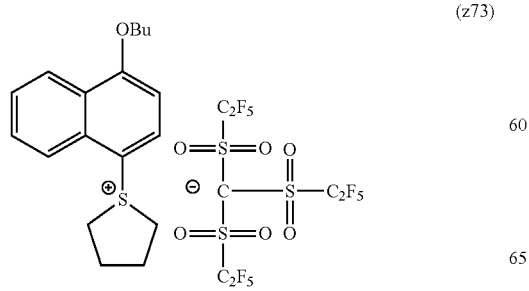
(z74)
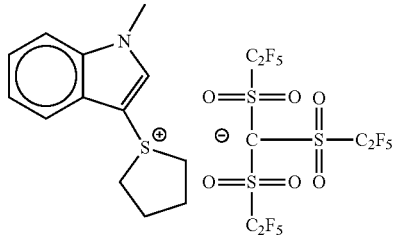
(z75)
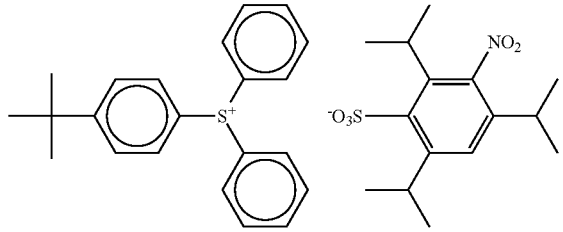
(z76)
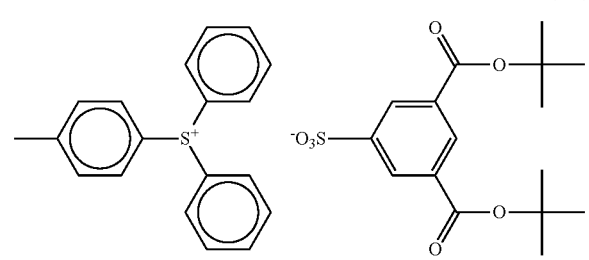
(z77)
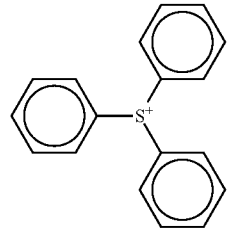
(z78)
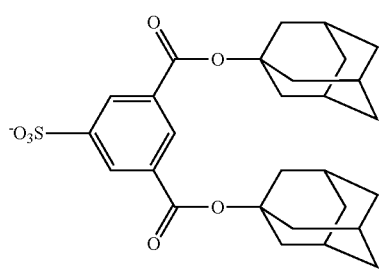

-continued
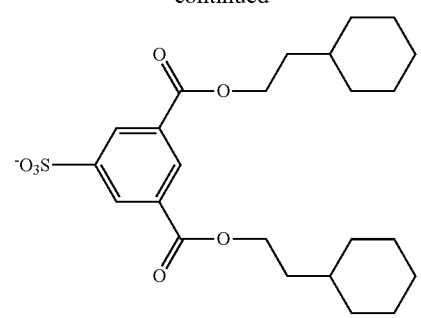
(z79)
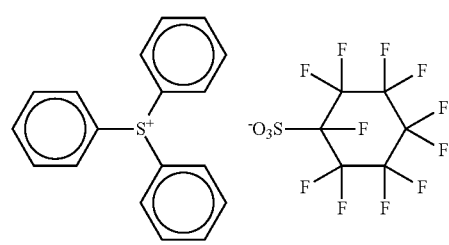
(z80)
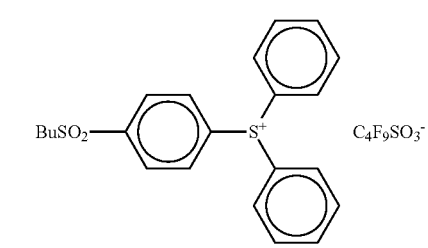
(z81)
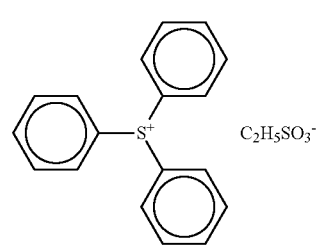
(z82)
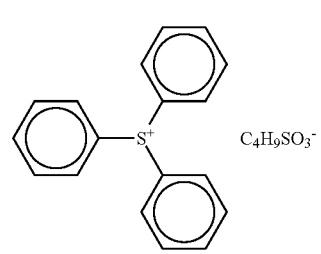
(z83)
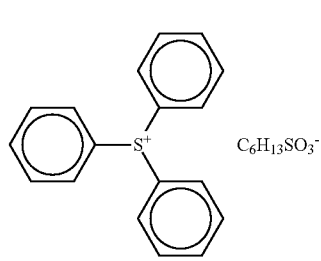
-continued
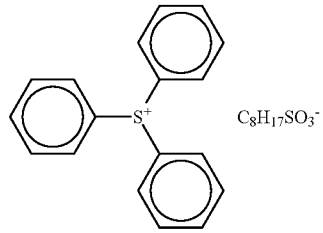
(z84)
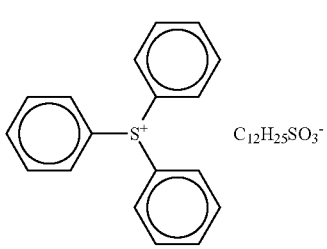
(z85)
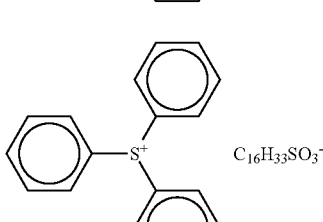
(z86)
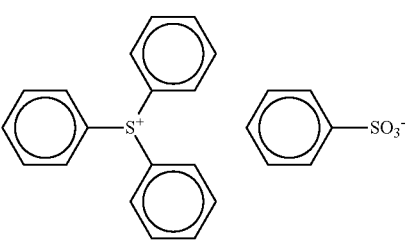
(z87)
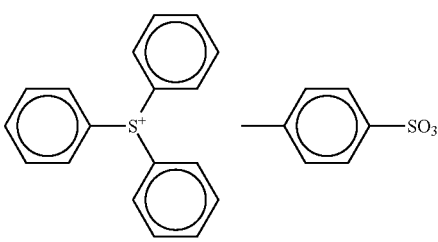
(z88)
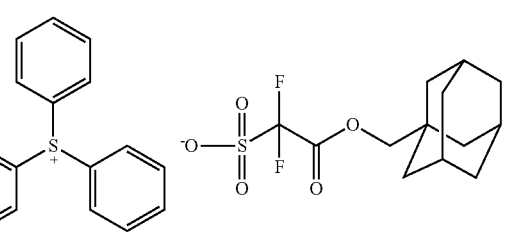
(z89)

-continued
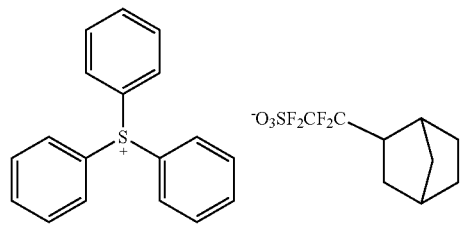 (z90)
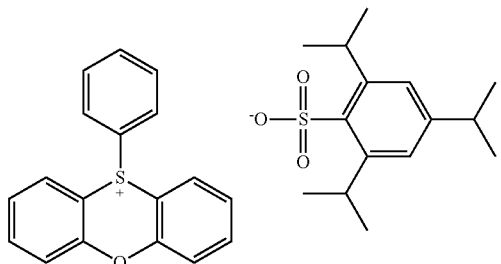 (z95)
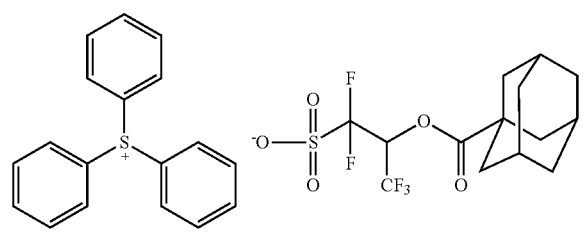 (z91)
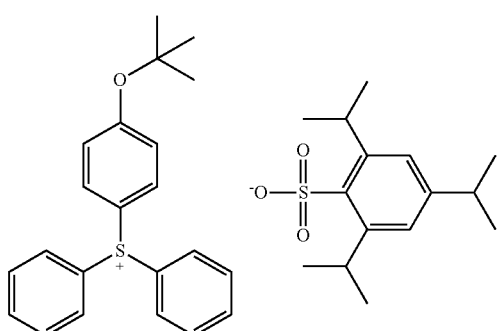 (z96)
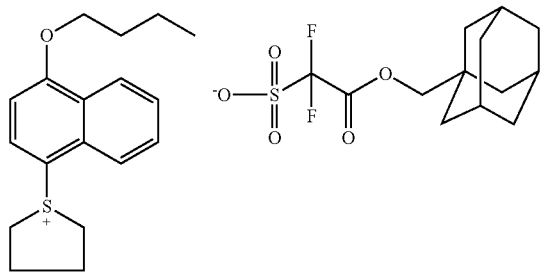 (z92)
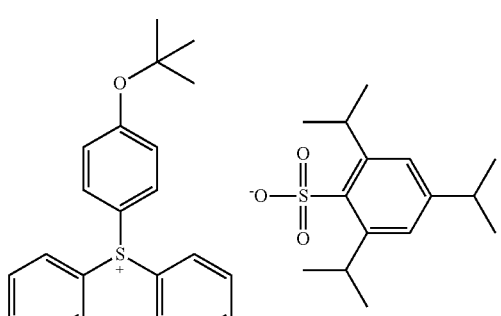 (z97)
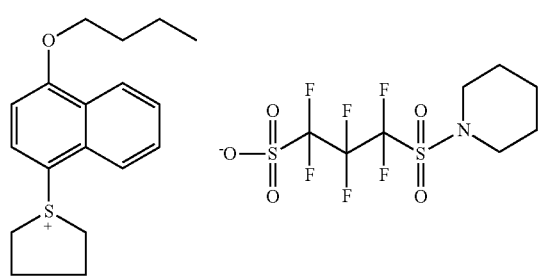 (z93)
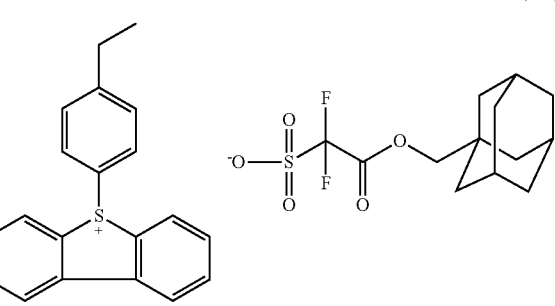 (z98)
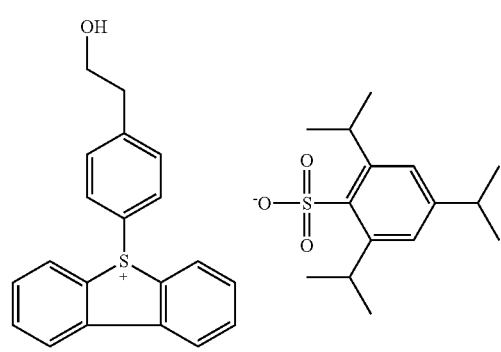 (z94)
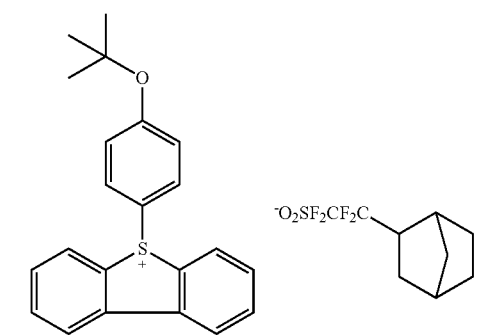 (z99)

(z100)
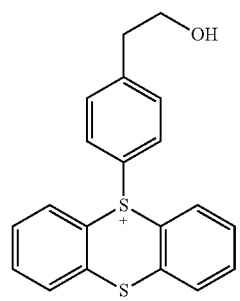
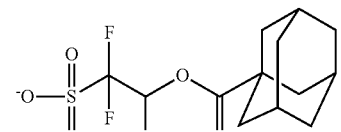
(z101)
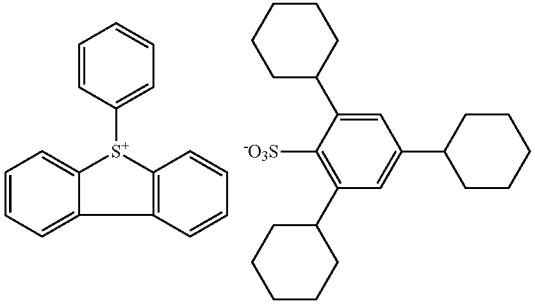
(z104)
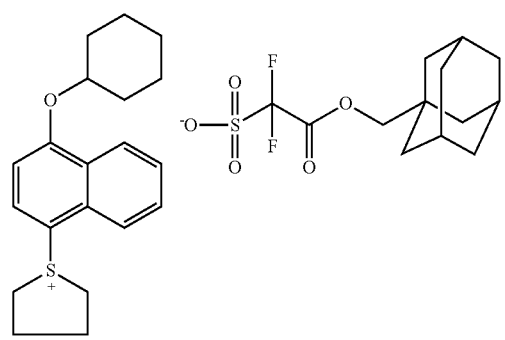
(z105)
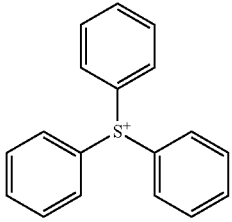
(z102)
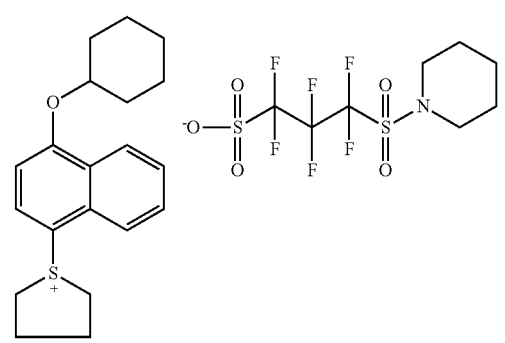
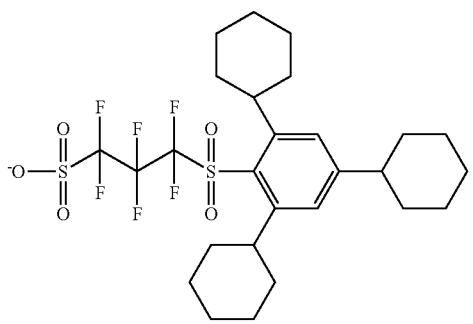
(z103)
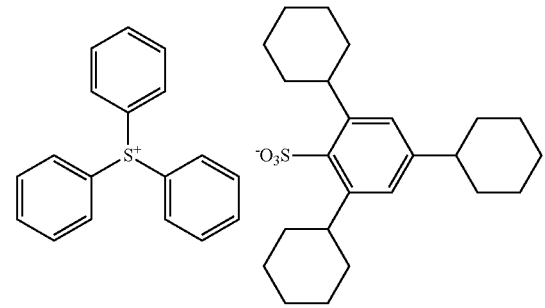
(Z106)
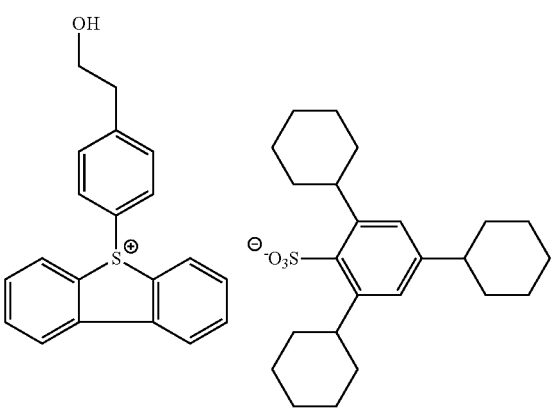

(Z107)

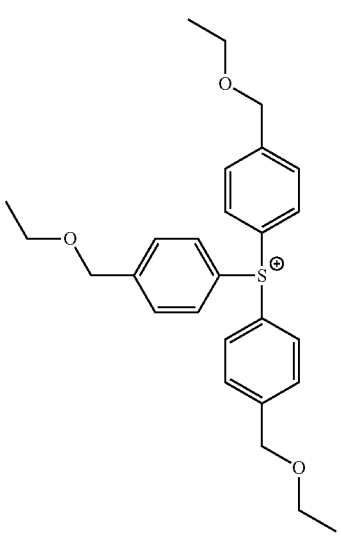

(Z108)

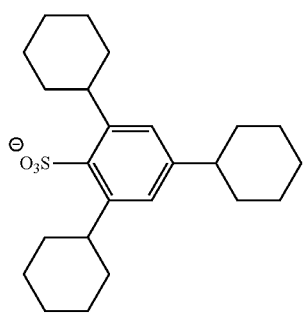

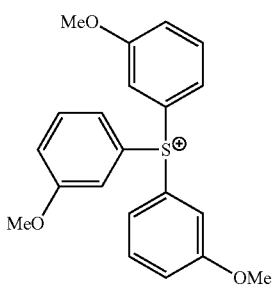

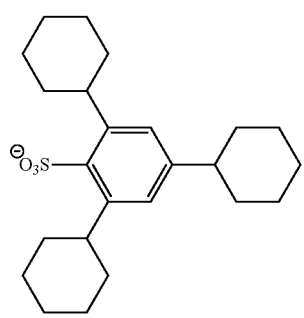

(Z109)

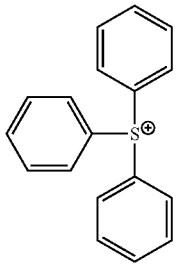

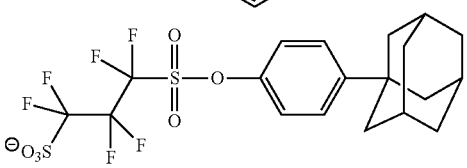

One kind of a photoacid generator may be used alone, or two or more kinds of photoacid generators may be used in combination. In using two or more kinds of photoacid generators in combination, compounds capable of generating two kinds of organic acids differing in the number of all atoms excluding hydrogen atom by 2 or more are preferably combined.

In the case where the composition of the present invention further contains a photoacid generator, the content thereof is preferably from 0.1 to 40 mass %, more preferably from 0.5 to 30 mass %, still more preferably from 1 to 20 mass %, based on the entire solid content of the composition.

[5] Solvent

The composition of the present invention preferably contains a solvent.

The solvent which can be used at the preparation of the composition is not particularly limited as long as it can dissolve respective components, but examples thereof include an alkylene glycol monoalkyl ether carboxylate (e.g., propylene glycol monomethyl ether acetate (PGMEA, another name: 1-methoxy-2-acetoxypropane)), an alkylene glycol monoalkyl ether (e.g., propylene glycol monomethyl ether (PGME, another name: 1-methoxy-2-propanol)), an alkyl lactate (e.g., ethyl lactate, methyl lactate), a cyclic lactone (e.g., γ-butyrolactone; preferably having a carbon number of 4 to 10), a chain or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxycarboxylate (e.g., ethyl ethoxypropionate). Other usable solvents include solvents described in paragraph [0244] et seq. of U.S. Patent Application Publication No. 2008/0248425A1.

Among the solvents described above, an alkylene glycol monoalkyl ether carboxylate, an alkylene glycol monoalkyl ether and ethyl lactate are preferred.

One of these solvents may be used alone, or two or more thereof may be mixed and used. In the case of mixing and using two or more kinds of solvents, a solvent containing a hydroxyl group and a solvent containing no hydroxyl group are preferably mixed. The mass ratio between the solvent containing a hydroxyl group and the solvent containing no hydroxyl group is usually from 1/99 to 99/1, preferably from 10/90 to 90/10, more preferably from 20/80 to 60/40.

The solvent containing a hydroxyl group is preferably an alkylene glycol monoalkyl ether or an alkyl lactate, and the solvent containing no hydroxyl group is preferably an alkylene glycol monoalkyl ether carboxylate. Use of a solvent in which the propylene glycol monomethyl ether accounts for 50 mass % or more of the solvent is particularly preferred.

The amount of the solvent used is set such that the total solid content concentration of the composition becomes preferably from 0.1 to 10 mass %, more preferably from 2.0 to 6.0 mass %, still more preferably from 3.0 to 5.0 mass %.

[6] Surfactant

The composition of the present invention may further contain a surfactant. The surfactant is preferably a fluorine-containing and/or silicon-containing surfactant.

Examples of the surfactant above include Megaface F176 and Megaface R08 produced by Dainippon Ink & Chemicals, Inc.; PF656 and PF6320 produced by OMNOVA; Troysol S-366 produced by Troy Chemical; Florad FC430 produced by Sumitomo 3M Inc.; and polysiloxane polymer KP-341 produced by Shin-Etsu Chemical Co., Ltd.

A surfactant other than the fluorine-containing and/or silicon-containing surfactant may also be used. Specific examples thereof include polyoxyethylene alkyl ethers and polyoxyethylene alkylaryl ethers.

In addition, known surfactants may be appropriately used. Examples of the surfactant which can be used include surfactants described in paragraph [0273] et seq. of U.S. Patent Application Publication No. 2008/0248425A1.

One kind of a surfactant may be used alone, or two or more kinds of surfactants may be used in combination.

In the case where the composition of the present invention further contains a surfactant, the content thereof is preferably from 0.0001 to 2 mass %, more preferably from 0.001 to 1 mass %, based on the entire solid content of the composition.

[7] Dissolution Inhibiting Compound

The composition of the present invention may further contain a dissolution inhibiting compound having a molecular weight of 3,000 or less and being capable of decomposing by the action of an acid to increase the solubility in an alkali developer (hereinafter, sometimes referred to as a "dissolution inhibiting compound").

In order not to reduce the transparency at 220 nm or less, the dissolution inhibiting compound is preferably an alicyclic or aliphatic compound containing an acid-decomposable group, such as acid-decomposable group-containing cholic acid derivative described in *Proceeding of SPIE*, 2724, 355 (1996). Examples of the acid-decomposable group are the same as those of "OY$^1$" of formula (3) and "COOY$^2$" of formula (4) in the resin (P).

In the case where the composition of the present invention is exposed to KrF excimer laser or irradiated with an electron beam, the dissolution inhibiting compound is preferably a compound containing a structure where a phenolic hydroxyl group of a phenol compound is substituted with an acid-decomposable group. The phenol compound is preferably a compound containing from 1 to 9 phenol structures, more preferably from 2 to 6 phenol structures.

The molecular weight of the dissolution inhibiting compound is 3,000 or less, preferably from 300 to 3,000, more preferably from 500 to 2,500.

In the case where the composition of the present invention contains a dissolution inhibiting compound, the amount added thereof is preferably from 0.0001 to 20 mass %, more preferably from 0.5 to 10 mass %, based on the entire solid content of the composition.

Specific examples of the dissolution inhibiting compound are illustrated below, but the present invention is not limited thereto.

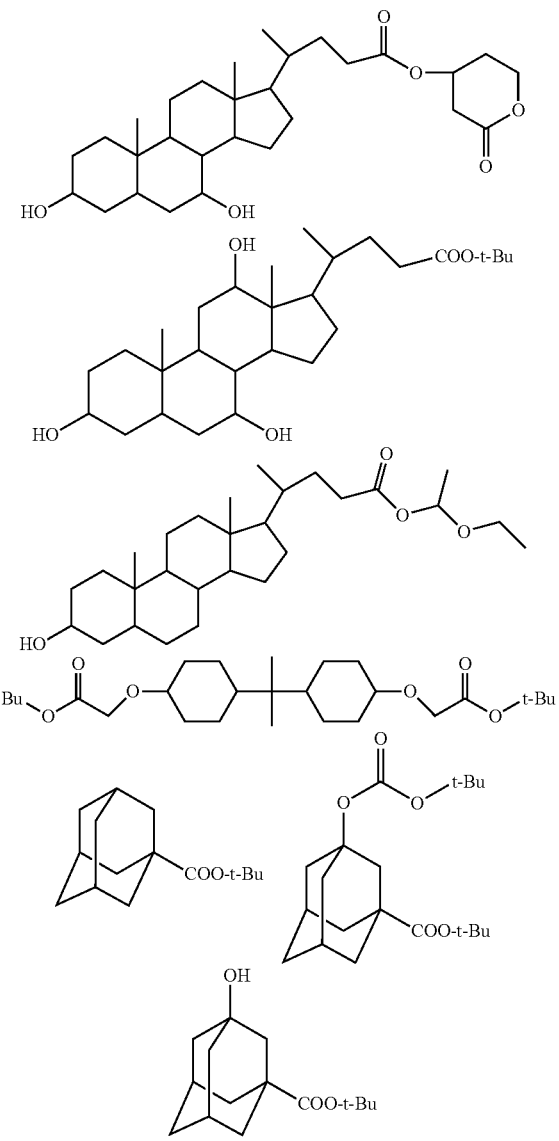

[8] Other Additives

The composition of the present invention may further contain, for example, a dye, a plasticizer, a photosensitizer, a light absorber and a compound for accelerating dissolution in a developer (hereinafter, sometimes referred to as a "dissolution accelerating compound"), if desired. Also, a compound having a proton acceptor functional group described, for example, in JP-A-2006-208781 and JP-A-2007-286574 can also be suitably used.

The dissolution accelerating compound is a low molecular compound having a molecular weight of 1,000 or less and having two or more phenolic hydroxyl groups or one or more carboxy groups. In the case of having a carboxyl group, the dissolution accelerating compound is preferably an alicyclic or aliphatic compound.

The amount of the dissolution accelerating compound added is preferably from 0 to 50 mass %, more preferably from 5 to 30 mass %, based on the mass of the resin (P). From the standpoint of suppressing the development scum and preventing the deformation of pattern at the development, the amount added is preferably 50 mass % or less.

The dissolution accelerating compound can be easily synthesized by referring to the methods described, for example, in JP-A-4-122938, JP-A-2-28531, U.S. Pat. No. 4,916,210 and European Patent 219294.

[9] Pattern Forming Method

The composition of the present invention is typically used as follows. That is, the composition of the present invention is typically coated on a support such as substrate to form a film. The thickness of the film is preferably from 0.02 to 0.1 μm. The method for coating the composition on a substrate is preferably spin coating, and the spinning speed is preferably from 1,000 to 3,000 rpm.

For example, the composition is coated on such a substrate (e.g., silicon/silicon dioxide-coated substrate, silicon nitride and chromium-deposited quartz substrate) as used in the production of a precision integrated circuit device, by an appropriate coating method such as spinner or coater. Thereafter, the coating is dried to obtain an actinic ray-sensitive or radiation-sensitive film (hereinafter, sometimes referred to as a "resist film"). Incidentally, a known antireflection film may be previously provided by coating.

Subsequently, the resist film is irradiated with an actinic ray or radiation (preferably an electron beam, an X-ray or EUV light), then preferably baked (usually at 80 to 150° C., preferably at 90 to 130° C.), and developed, whereby a good pattern can be obtained. Using the thus-formed pattern as a mask, an etching treatment, ion injection or the like is performed to prepare, for example, a semiconductor fine circuit or an imprint mold structure.

For details of the process when preparing an imprint mold by using the composition of the present invention, please refer to, for example, Japanese Patent 4,109,085, JP-A-2008-162101 and Yoshihiko Hirai (compiler), *Nanoimprint no Kiso to Gijutsu Kaihatsu/Oyo Tenkai-Nanoimprint no Kiban Gijutsu to Saishin no Gijutsu Tenkai* (*Basic and Technology Expansion/Application Development of Nanoimprint-Substrate Technology of Nanoimprint and Latest Technology Expansion*), Frontier Shuppan. Also, for details of the production method of a mold structure suitable particularly for the production of an information recording medium, please refer to, for example, Japanese Patent 4,109,085 and JP-A-2008-162101.

In the development step, an alkali developer is usually used. As for the developing method, a known method such as puddle forming, dipping and dynamic dispensing is appropriately used. As for the alkali developer, various aqueous alkali solutions are applicable, but a tetramethylammonium hydroxide alkaline aqueous solution is usually used. In the alkali developer, alcohols and a surfactant may be added each in an appropriate amount.

The concentration of the alkali developer is usually from 0.1 to 20 mass %. The pH of the alkali developer is usually 10.0 to 15.0.

In the pattern forming method of the present invention, the resist film may be formed on a mask blank.

The mask blank as used herein is a material for producing a photomask used in the production process of a semiconductor and is usually obtained by providing a light-shielding film on a transparent substrate (preferably a glass substrate). The method for forming a light-shielding film on a transparent substrate is not particularly limited, but the material constituting the light-shielding material is chemically deposited on a transparent substrate, whereby the light-shielding film can be formed.

The material constituting the light-shielding film is mainly composed of a metal such as tantalum, chromium, molybdenum, titanium, zirconium, tin, gallium and aluminum, and an oxide, a nitride or an oxide-nitride of such a metal element is suitably used. Specific examples thereof include chromium oxide, chromium nitride, chromium, tantalum oxide, tantalum nitride, tantalum, molybdenum silicide oxide, molybdenum silicide nitride, molybdenum silicide oxide nitride and molybdenum.

The light-shielding film may be composed of a single layer but preferably has a multilayer structure where a plurality of materials are coated one on another. In the case of a multilayer structure, the thickness of the film per one layer is not particularly limited but is preferably from 5 to 100 nm, more preferably from 10 to 80 nm. The thickness of the entire light-shielding film is not particularly limited but is preferably from 5 to 200 nm, more preferably from 10 to 150 nm.

A resist film is formed on such a mask blank, then exposed and developed, whereby a photomask can be obtained.

EXAMPLES

The present invention is described in greater detail below, but the contents of the present invention are not limited thereto.

Synthesis Example 1

Synthesis of Resin (P-1)

30 g of poly(p-hydroxystyrene) (VP8000) produced by Nippon Soda Co., Ltd. was dissolved in 120 mL of dimethylsulfoxide (DMSO), and 2.21 g of 1-chloromethylnaphthalene, 34.51 g of potassium carbonate and 0.56 g of sodium iodide were added thereto. The mixture was stirred at 70° C. for 4 hours, and the reaction solution was returned to room temperature. Thereafter, 100 mL of ethyl acetate and 100 mL of distilled water were added thereto, and 130 g of an aqueous 23% acetic acid solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and dissolved in 120 g of propylene glycol monomethyl ether acetate (PGMEA). Hereinafter, this solution is sometimes referred to as Solution p-1.

Subsequently, 5.78 g of 2-cyclohexylethyl vinyl ether as the vinyl ether compound and 1.45 g of 2% camphorsulfonic acid (PGMEA solution) were added to Solution p-1, and the mixture was stirred at room temperature for 4 hours. After 1.05 g of 6% triethylamine (PGMEA solution) was added and the mixture was stirred for a while, the reaction solution was transferred to a separating funnel containing 165 mL of ethyl acetate, and the organic layer was washed with 200 mL of distilled water three times. The organic layer was concentrated by an evaporator to remove ethyl acetate, and this reaction solution was added dropwise in 2 L of hexane. A part of the obtained precipitate was sampled for NMR measurement, and the remaining was dissolved in 70 g of PGMEA. From the obtained solution, the low boiling point solvent was removed by an evaporator to obtain 105.6 g of a PGMEA solution (32.7 mass %) of Resin (P-1).

With respect to Resin (P-1) obtained, the compositional ratio (molar ratio) of Resin (P-1) was calculated by $^1$H-NMR measurement. Also, the weight average molecular weight (Mw: in terms of polystyrene), number average molecular weight (Mn: in terms of polystyrene) and polydispersity (Mw/Mn, hereinafter sometimes referred to as "PDI") of Resin (P-1) were calculated by GPC (solvent: THF) measurement. These results are shown in the chemical formula below.

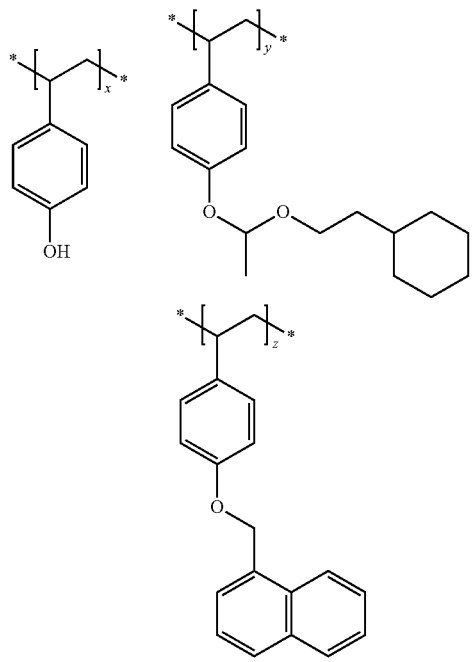

(P-1)

x/y/z = 80/15/5
Mw = 11500, PDI = 1.07

Synthesis Example 2

Synthesis of Resin (P-2)

In the same manner as in Synthesis Example 1 except for changing 5.78 g of 2-cyclohexylethyl vinyl ether to 6.15 g of 2-(4-cyclohexylphenoxy)ethyl vinyl ether in Synthesis Example 1, 102.3 g of a PGMEA solution (30.4 mass %) of Resin (P-2) was obtained.

Synthesis Example 3

Synthesis of Resin (P-3)

In the same manner as in Synthesis Example 1 except for changing 2.21 g of 1-chloromethylnaphthalene to 4.28 g of 2-(chloromethyl)quinoline hydrochloride and changing the amount added of 2-cyclohexylethyl vinyl ether from 5.78 g to 4.24 g in Synthesis Example 1, 102.7 g of a PGMEA solution (31.2 mass %) of Resin (P-3) was obtained.

Synthesis Example 4

Synthesis of Resin (P-4)

To a 300 mL-volume Kjeldahl flask, 50 g of benzaldehyde dimethyl acetal and 27.08 g of acetyl chloride were added, and the mixture was stirred at 45° C. for 3 hours. After the reaction, the low boiling point residue was removed under reduced pressure to obtain 49.8 g of α-chlorobenzyl methyl ether.

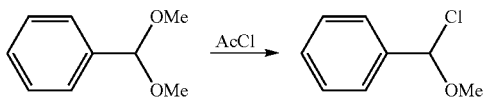

30 g of poly(p-hydroxystyrene) (VP8000) produced by Nippon Soda Co., Ltd. was dissolved in 120 mL of dimethylsulfoxide (DMSO), and 3.04 g of 4-chloromethylbiphenyl, 34.51 g of potassium carbonate and 0.56 g of sodium iodide were added thereto. The mixture was stirred at 70° C. for 4 hours, and the reaction solution was returned to room temperature. Subsequently, 8.21 g of α-chlorobenzyl methyl ether was added dropwise thereto and after stirring at room temperature for 4 hours, 100 mL of ethyl acetate and 100 mL of distilled water were added thereto. Thereafter, 130 g of an aqueous 21 mass % ammonium chloride solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated to about 150 mL and added dropwise in 2 L of hexane. A part of the obtained precipitate was sampled for NMR measurement, and the remaining was dissolved in 70 g of PGMEA. From the obtained solution, the low boiling point solvent was removed by an evaporator to obtain 100.1 g of a PGMEA solution (33.8 mass %) of Resin (P-4).

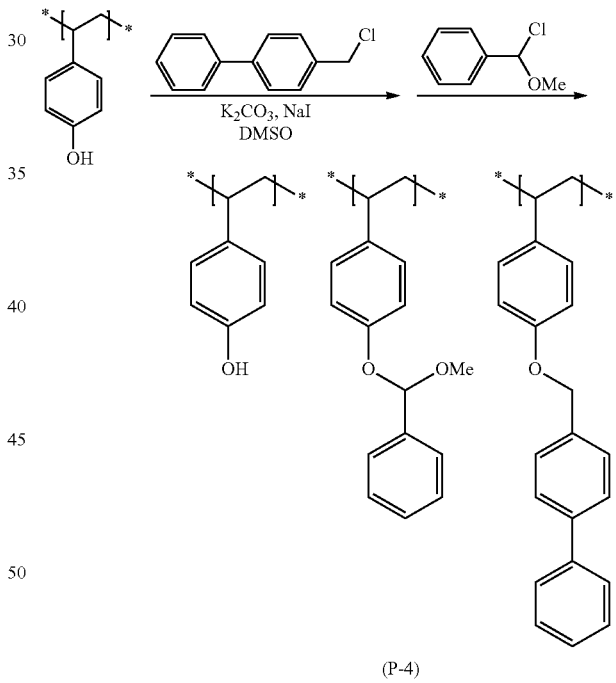

(P-4)

Synthesis Example 5

Synthesis of Resin (P-5)

In the same manner as in Synthesis Example 1 except for changing polyp-hydroxystyrene) (VP8000) to poly(p-hydroxystyrene) (VP2500) produced by Nippon Soda Co., Ltd. and changing 2.21 g of 1-chloromethylnaphthalene to 4.53 g of 9-(chloromethyl)anthracene in Synthesis Example 1, 99.4 g of a PGMEA solution (30.2 mass %) of Resin (P-5) was obtained.

Synthesis Example 6

Synthesis of Resin (P-6)

9.58 g of potassium hydroxide (KOH) and 20.00 g of indole were added to 110.58 g of 1,3-dibromopropane and 450 mL of N,N-dimethylformamide (DMF), and the mixture was stirred at 70° C. for 8 hours. After cooling to room temperature, 1 L of distilled water was added to the reaction solution, and the resulting solution was extracted with 1 L of ethyl acetate. The organic layer was washed with 500 mL of distilled water five times, then concentrated and purified by column chromatography to obtain 27.24 g of N-(3-bromopropyl)-indole. Compounds (p-9) and (p-10) having a bromopropyl group shown below were also synthesized in the same manner.

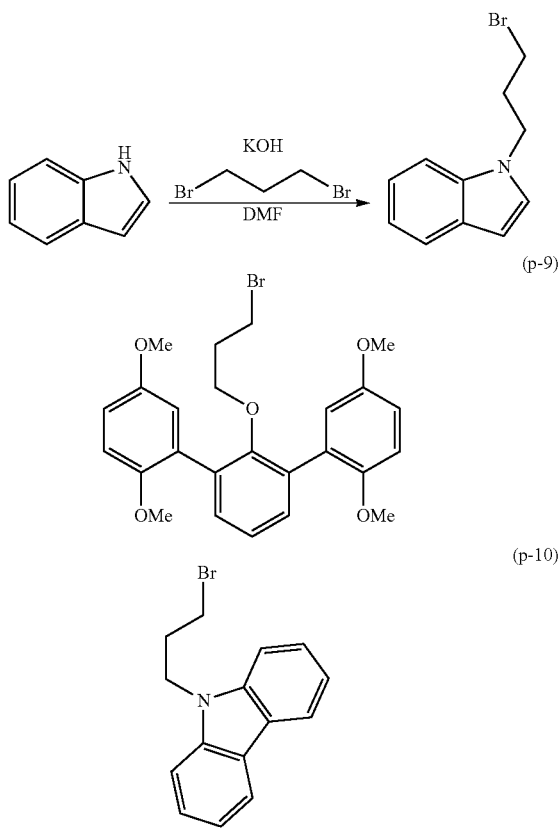

Thereafter, in the same manner as in Synthesis Example 1 except for changing poly(p-hydroxystyrene) (VP8000) to poly(p-hydroxystyrene) (VP2500), changing 2.21 g of 1-chloromethylnaphthalene to 7.73 g of N-(3-bromopropyl)-indole, and changing 5.78 g of 2-cyclohexylethyl vinyl ether to 4.68 g of ethyl vinyl ether in Synthesis Example 1, 100.6 g of a PGMEA solution (31.5 mass %) of Resin (P-6) was obtained.

Synthesis Example 7

Synthesis of Resin (P-7)

30 g of poly(p-hydroxystyrene) (VP2500) produced by Nippon Soda Co., Ltd. was dissolved in 150 mL of DMSO, and 4.41 g of 1-chloromethylnaphthalene, 34.51 g of potassium carbonate and 0.56 g of sodium iodide were added thereto. The mixture was stirred at 70° C. for 4 hours, and the reaction solution was returned to room temperature. Subsequently, 6.65 g of α-chlorobenzyl methyl ether was added dropwise thereto and after stirring at room temperature for 3 hours, 3.40 g of butanesultone was added dropwise. The reaction solution was further stirred at room temperature for 4 hours, and 100 mL of ethyl acetate and 100 mL of distilled water were added thereto. Thereafter, 130 g of an aqueous 21 mass % ammonium chloride solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated to about 150 mL and added dropwise in 2 L of hexane. The obtained precipitate was dissolved in a methanol:THF mixed solution, and 7.50 g of triphenylsulfonium bromide was added thereto. The mixture was stirred at room temperature for 2 hours, and the reaction solution was concentrated under reduced pressure, diluted with 300 mL of ethyl acetate, and washed with 300 mL of distilled water five times. The organic layer was concentrated and dissolved in 70 g of PGMEA, and the low boiling point solvent was then removed by an evaporator to obtain 108.2 g of a PGMEA solution (32.5 mass %) of Resin (P-7).

Synthesis Example 8

Synthesis of Resin (P-8)

500 mL of tetrahydrofuran (THF) was added to 250 g of magnesium ethyl bromide (a 39 mass % diethyl ether solution) under cooling in an ice bath, and 51.31 g of cyclopentanone was added dropwise. The mixture was stirred at room temperature for 2 hours, and an aqueous saturated ammonium chloride solution was added while cooling in an ice bath. Thereafter, THF was removed under reduced pressure, and the reaction product was diluted with ethyl acetate and then washed with distilled water three times. The organic layer was concentrated, and 19.3 g of 1-ethylcyclopentanol was obtained by distillation under reduced pressure.

Subsequently, a mixed solution containing 14.00 g of 1-ethylcyclopentanol, 220 mL of N-methylpyrrolidone (NMP) and 28.00 g of 1,8-diazabicylco[5,4,0]undec-7-ene (DBU) was cooled in an ice bath, and 61.87 g of bromoacetyl bromide was added dropwise. The mixture was stirred at room temperature for 5 hours, and the reaction solution was cooled in an ice bath. The reaction was then stopped by adding dropwise distilled water, and the reaction solution was diluted with 800 mL of ethyl acetate and washed with 500 mL of distilled water four times. The organic layer was concentrated and purified by column chromatography to obtain 25.43 g of (1-ethyl)cyclopentyl bromoacetate. Also, tert-butyl bromoacetate was obtained in the same manner as above except for changing 1-ethylcyclopentanol to tert-butanol.

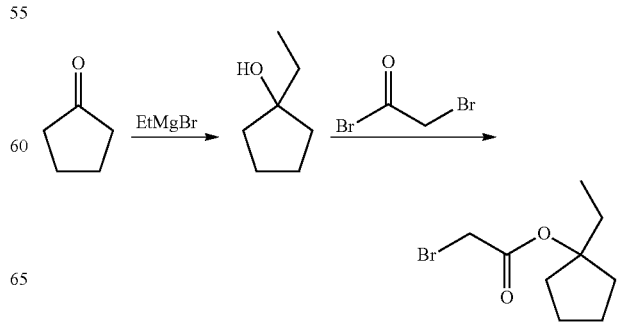

-continued

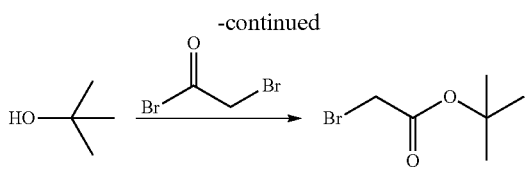

30 g of poly(p-hydroxystyrene) (VP2500) produced by Nippon Soda Co., Ltd. was dissolved in 120 mL of DMSO, and 5.73 g of 1-chloromethylnaphthalene, 34.51 g of potassium carbonate and 0.56 g of sodium iodide were added thereto. The mixture was stirred at 70° C. for 4 hours, and the reaction solution was cooled to 50° C. Subsequently, 7.04 g of (1-ethyl)cyclopentyl bromoacetate was added, and the mixture was stirred for 4 hours. The reaction solution was returned to room temperature, and 100 mL of ethyl acetate and 100 mL of distilled water were added thereto. Thereafter, 130 g of an aqueous 23 mass % acetic acid solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and dissolved in 120 g of PGMEA.

To the PGMEA solution above, 5.01 g of 2-cyclohexylethyl vinyl ether and 1.45 g of 2 mass % camphorsulfonic acid (PGMEA solution) was added, and the mixture was stirred at room temperature for 4 hours. After 1.05 g of 6 mass % triethylamine (PGMEA solution) was added and the mixture was stirred for a while, the reaction solution was transferred to a separating funnel containing 165 mL of ethyl acetate, and the organic layer was washed with 200 mL of distilled water three times. The organic layer was concentrated by an evaporator to remove ethyl acetate, and this reaction solution was added dropwise in 2 L of hexane. A part of the obtained precipitate was sampled for NMR measurement, and the remaining was dissolved in 70 g of PGMEA. From the obtained solution, the low boiling point solvent was removed by an evaporator to obtain 109.6 g of a PGMEA solution (34.0 mass %) of Resin (P-8).

Synthesis Example 9

Synthesis of Resin (P-9)

30 g of poly(p-hydroxystyrene) (VP8000) produced by Nippon Soda Co., Ltd. was dissolved in 120 mL of dimethylsulfoxide (DMSO), and 9.36 g of (1-ethyl)cyclopentyl bromoacetate, 9.70 g of Compound (p-9) above, 34.51 g of potassium carbonate and 0.89 g of sodium iodide were added thereto. The mixture was stirred at 70° C. for 4 hours, and the reaction solution was returned to room temperature. Thereafter, 100 mL of ethyl acetate and 100 mL of distilled water were added thereto, and 130 g of an aqueous 23 mass % acetic acid solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated to about 150 mL and added dropwise in 2 L of hexane. A part of the obtained precipitate was sampled for NMR measurement, and the remaining was dissolved in 70 g of PGMEA. From the obtained solution, the low boiling point solvent was removed by an evaporator to obtain 102.1 g of a PGMEA solution (34.6 mass %) of Resin (P-9).

Synthesis Example 10

Synthesis of Resin (P-10)

In the same manner as in Synthesis Example 9 except for changing 9.36 g of (1-ethyl)cyclopentyl bromoacetate and 9.70 g of Compound (p-9) to 8.73 g of the tert-butyl bromoacetate above and 5.73 g of Compound (p-10) above in Synthesis Example 9, 102.3 g of a PGMEA solution (33.5 mass %) of Resin (P-10) was obtained.

Synthesis Example 11

Synthesis of Resin (P-11)

Under a nitrogen stream, 4.68 g of 1-methoxy-2-propanol was heated to 80° C. While stirring this solution, a mixed solution containing 3.89 g of Monomer (M-1) shown below, 1.44 g of Monomer (M-2) shown below, 2.12 g of Monomer (M-3) shown below, 1.19 g of Monomer (M-4) shown below, 18.70 g of 1-methoxy-2-propanol, and 1.38 g of dimethyl 2,2'-azobisisobutyrate [V-601, produced by Wako Pure Chemical Industries, Ltd.] was added dropwise over 2 hours. After the completion of dropwise addition, the reaction solution was further stirred at 80° C. for 4 hours, then cooled and subjected to reprecipitation with a large amount of hexane/ethyl acetate and vacuum drying, whereby 5.42 g of Resin (P-11) of the present invention was obtained.

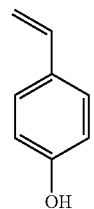

(M-1)

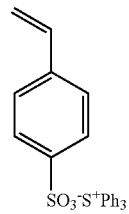

(M-2)

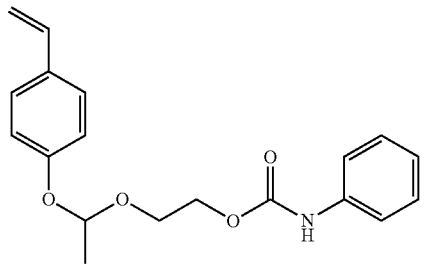

(M-3)

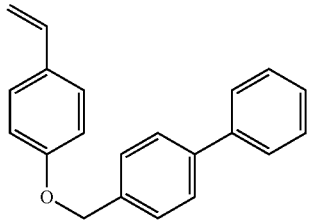

(M-4)

Synthesis Examples 12 to 15

Synthesis of Resins (P-12) to (P-15)

Resins (P-12) to (P-15) were synthesized in the same manner as in Synthesis Example 11. The monomers, the charge amount (g) thereof, the polymerization concentration (mass %), the charge amount (g) of polymerization initiator, and the yield (g) of the obtained resin are shown in Table 1 below.

TABLE 1

| Resin | Monomer 1 | | Monomer 2 | | Monomer 3 | | Monomer 4 | | Charge Amount of V-601 (g) | Polymerization Concentration (%) | Yield of Resin (g) |
|---|---|---|---|---|---|---|---|---|---|---|---|
| P-12 | M-1 | 10.00 | M-5 | 3.37 | M-6 | 3.61 | — | — | 3.19 | 30 | 10.69 |
| P-13 | M-1 | 10.00 | M-5 | 3.44 | M-6 | 2.31 | — | — | 3.07 | 30 | 10.54 |
| P-14 | M-1 | 10.00 | M-7 | 4.96 | M-6 | 2.10 | M-8 | 5.45 | 3.71 | 30 | 13.37 |
| P-15 | M-1 | 10.00 | M-7 | 3.59 | M-6 | 2.30 | M-8 | 5.97 | 3.77 | 30 | 12.30 |

Monomers used in the synthesis of Resins (P-12) to (P-15) are shown below.

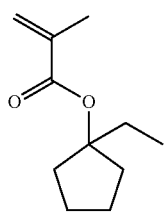

(M-5)

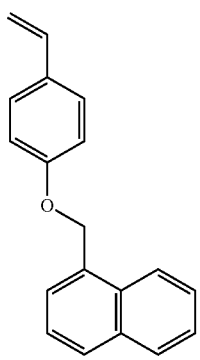

(M-6)

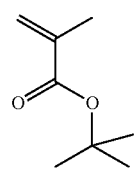

(M-7)

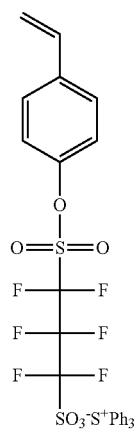

(M-8)

Synthesis Examples 16 to 21

Synthesis of Resins (P-16) to (P-21)

Resins (P-16) to (P-21) were synthesized in the same manner as in Synthesis Example 1 except for changing the kind/amount of the reagent added as shown in Table 2 below.

TABLE 2

| | Poly(p-hydroxystyrene) | 1-Chloromethyl-naphthalene | Vinyl Ether Compound |
|---|---|---|---|
| Resin (P-16) | VP-8000 (30 g) | 1.32 g | 2-cyclohexylethyl vinyl ether (8.36 g) |
| Resin (P-17) | VP-2500 (30 g) | 1.76 g | 2-cyclohexylethyl vinyl ether (10.40 g) |
| Resin (P-18) | VP-8000 (30 g) | 1.32 g | VE-1 (8.14 g) |
| Resin (P-19) | VP-2500 (30 g) | 1.76 g | VE-2 (14.22 g) |
| Resin (P-20) | VP-8000 (30 g) | 1.32 g | VE-3 (8.40 g) |
| Resin (P-21) | VP-8000 (30 g) | 1.32 g | VE-4 (8.38 g) |

Vinyl ether compounds used in the synthesis of Resins (P-18) to (P-21) are shown below.

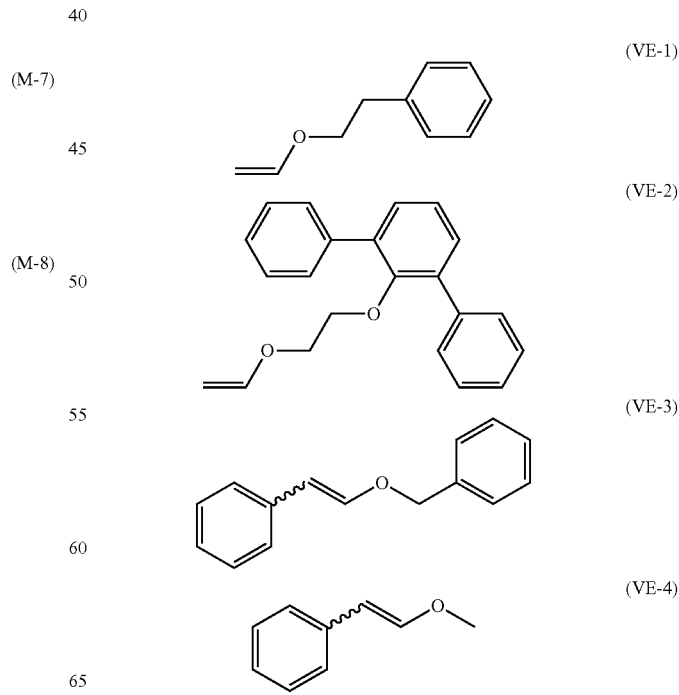

Synthesis Example 22

Synthesis of Resin (P-22)

4.95 g of p-toluenesulfonic acid monohydrate was added to 30.0 g of 3,3-dimethoxypropionitrile, 67.63 g of benzyl alcohol and 100 ml of toluene, and the mixture was stirred at 110° C. for 8 hours. The reaction solution was returned to room temperature, and 5.26 g of triethylamine was added. After stirring for 5 minutes, the reaction solution was transferred to a separating funnel and washed with 200 ml of an aqueous 1 mass % potassium carbonate solution once and then with 200 ml of distilled solution three times. Toluene and the unreacted raw materials were removed by distillation under reduced pressure to obtain 60.6 g of 3,3-dibenzyloxypropionitrile. Thereto, 21.36 g of acetyl chloride was added, and the mixture was stirred at 45° C. for 6 hours. The reaction solution was returned to room temperature, and unreacted acetyl chloride was removed by distillation under reduced pressure. The reaction solution was analyzed by $^1$H-NMR, as a result, the concentration of 3-chloro-3-benzyloxypropionitrile in the reaction solution was 54.2 mass %.

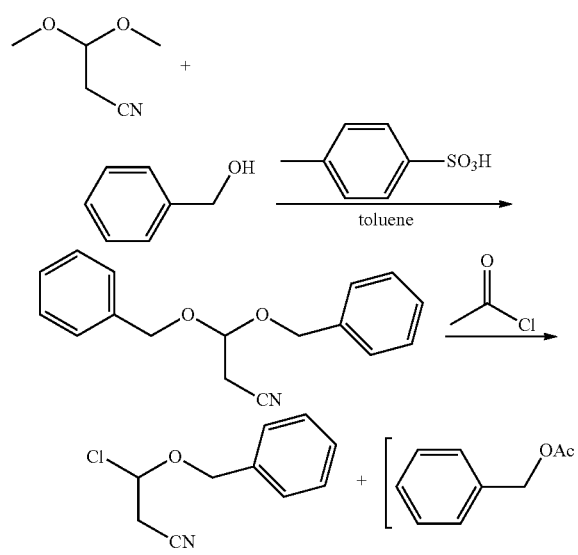

30 g of poly(p-hydroxystyrene) (VP8000) produced by Nippon Soda Co., Ltd. was dissolved in 120 mL of dimethylsulfoxide (DMSO), and 2.21 g of 1-chloromethylnaphthalene, 34.51 g of potassium carbonate and 0.56 g of sodium iodide were added thereto. The mixture was stirred at 70° C. for 4 hours, and the reaction solution was returned to room temperature. Thereafter, 100 mL of ethyl acetate and 100 mL of distilled water were added thereto, and 130 g of an aqueous 23% acetic acid solution was little by little added to the reaction solution while stirring the reaction solution in ice water. The reaction solution was transferred to a separating funnel, and 100 mL of ethyl acetate and 100 mL of distilled water were further added. After stirring, the aqueous layer was removed, and the organic layer was washed with 200 mL of distilled water five times. The organic layer was then concentrated and dissolved in 120 g of tetrahydrofuran (THF). Thereto, 26.53 g of triethylamine was added, and the reaction solution was cooled to 0° C. Furthermore, 23.43 g of the 3-chloro-3-benzyloxypropionitrile solution above was added dropwise, and the reaction solution was returned to room temperature and then stirred for 4 hours. After adding 200 ml of distilled water to the reaction solution, THF was removed by an evaporator, and 200 mL of ethyl acetate was added to the residue. The reaction solution was transferred to a separating funnel, and the aqueous layer was removed. The organic layer was washed with 200 ml of distilled water three times, concentrated to about 150 mL by an evaporator and added dropwise in 2 L of hexane. A part of the obtained precipitate was sampled for NMR measurement, and the remaining was dissolved in 75 g of PGMEA. From the obtained solution, the low boiling point solvent was removed by an evaporator to obtain 105.2 g of a PGMEA solution (29.6 mass %) of Resin (P-22).

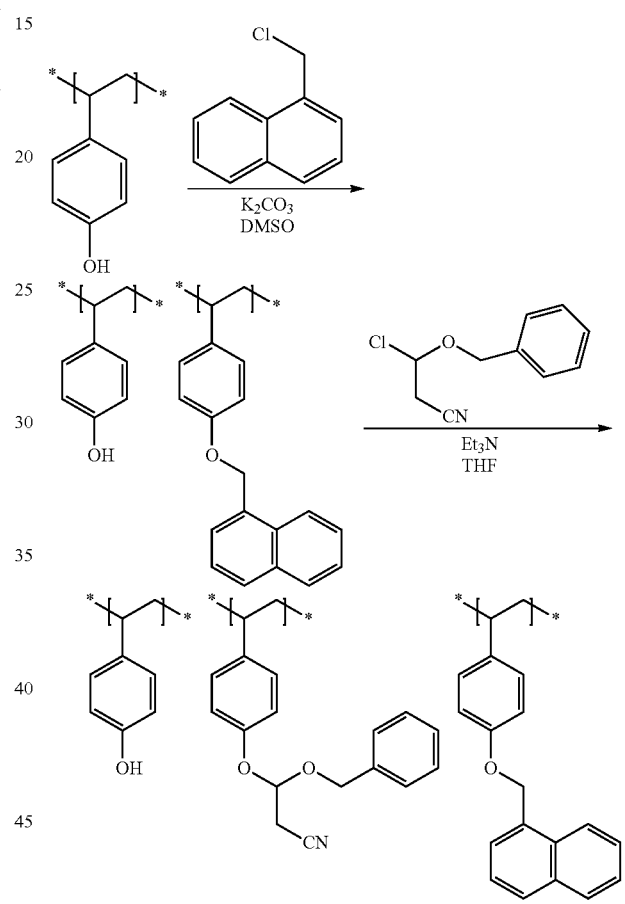

The structure, the compositional ratio, the weight average molecular weight and the polydispersity of each of Resins (P-1) to (P-22) are shown below.

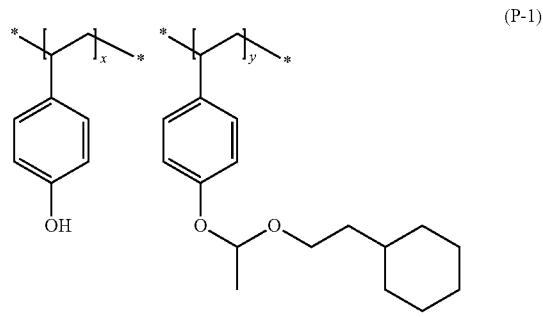

(P-1)

-continued
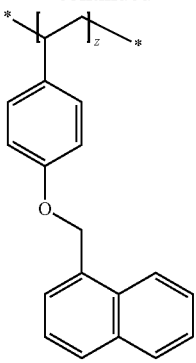
x/y/z = 80/15/5
Mw = 11500, PDI = 1.07
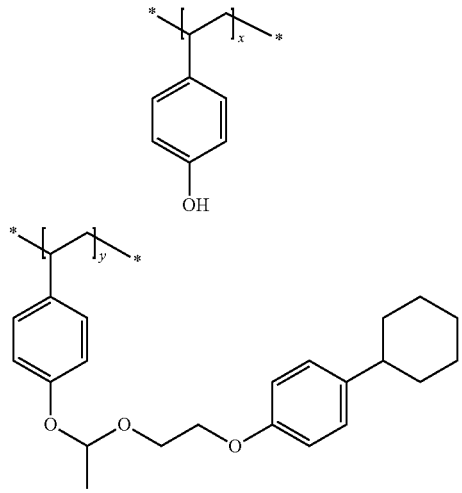
x/y/z = 85/10/5
Mw = 11800, PDI = 1.07
(P-2)
(P-3)
-continued
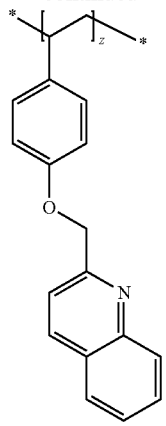
x/y/z = 81/11/8
Mw = 12100, PDI = 1.07
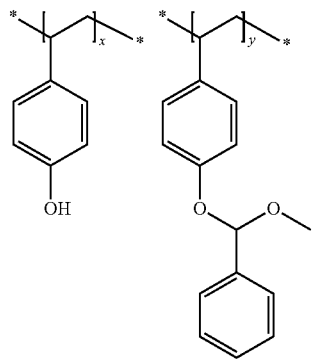
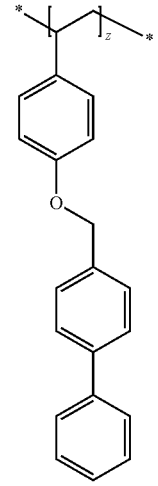
x/y/z = 75/19/6
Mw = 12500, PDI = 1.07
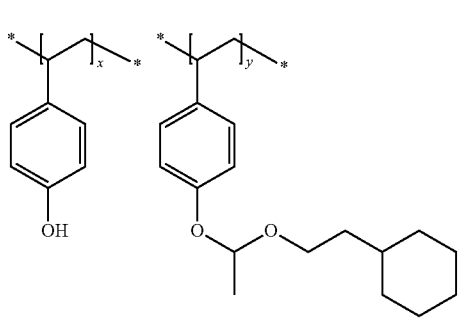
(P-4)
(P-5)

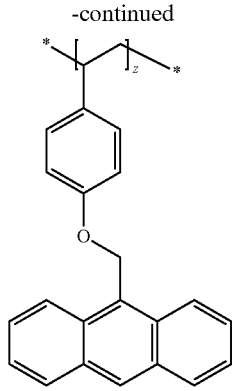
x/y/z = 78/14/8
Mw = 4400, PDI = 1.15
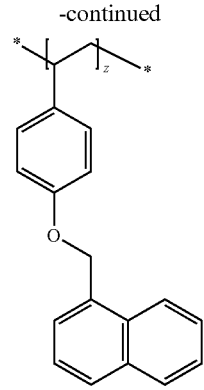
w/x/y/z = 8/66/16/10
Mw = 5300, PDI = 1.17
(P-6)
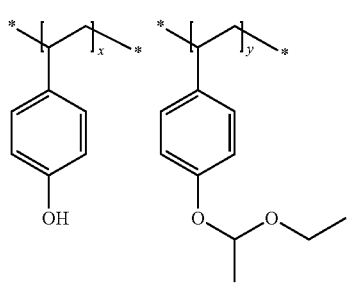
(P-8)
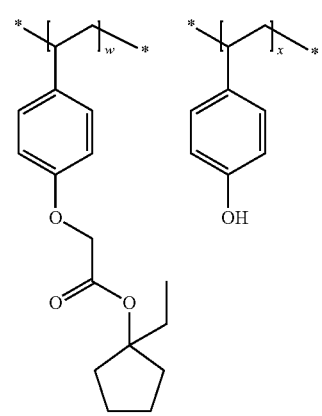
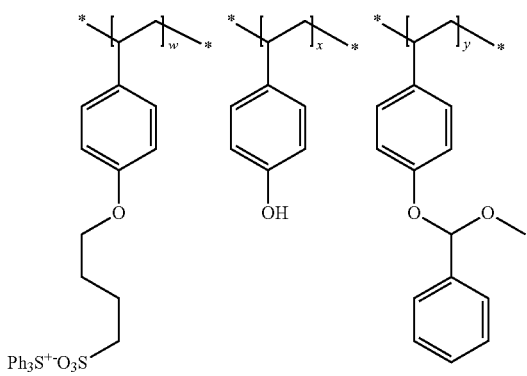
x/y/z = 65/24/11
Mw = 4200, PDI = 1.16
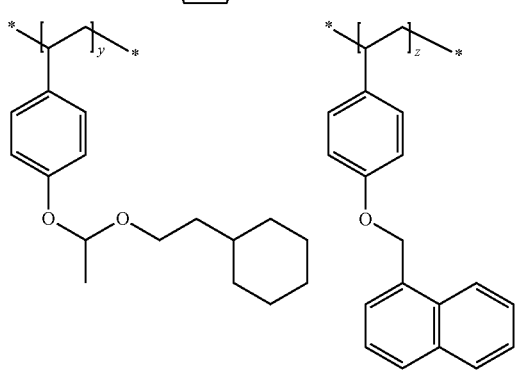
w/x/y/z = 10/65/12/13
Mw = 4800, PDI = 1.16
(P-7)
(P-9)
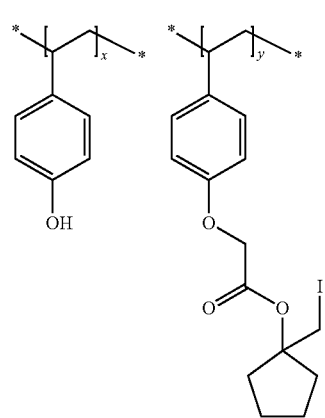

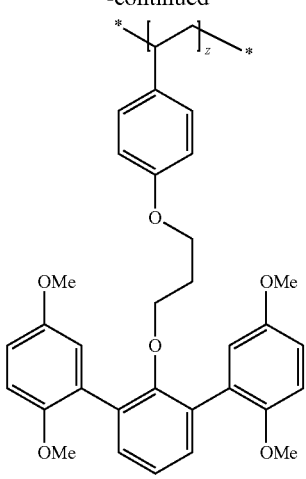
x/y/z = 81/14/5
Mw = 12400, PDI = 1.08
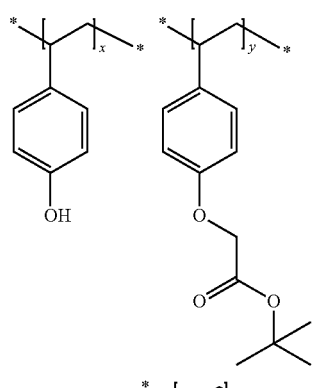
x/y/z = 79/16/5
Mw = 11400, PDI = 1.08
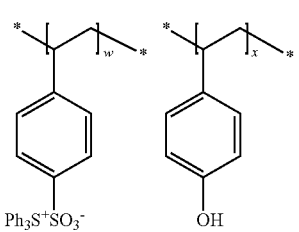
(p-11)
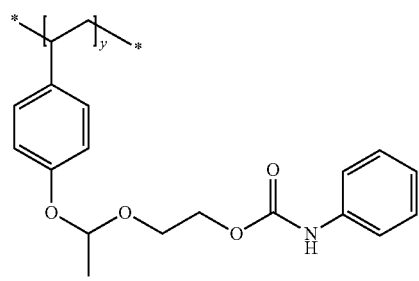
(P-10)
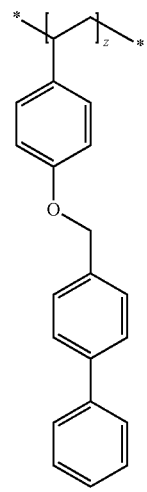
w/x/y/z = 9/65/16/10
Mw = 6700, PDI = 1.62
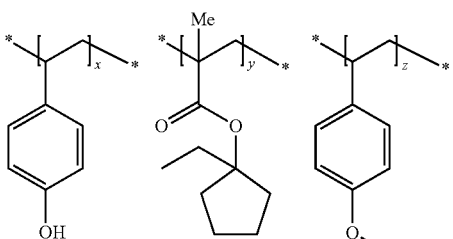
(P-12)
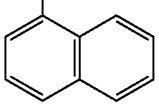
x/y/z = 67/19/14
Mw = 8700,
PDI = 1.39

(P-13)
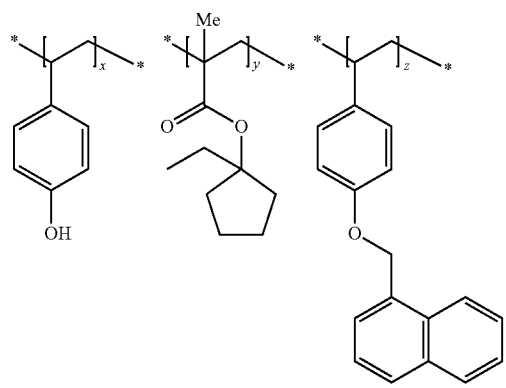
x/y/z = 70/20/10
Mw = 7600, PDI = 1.42
(P-14)
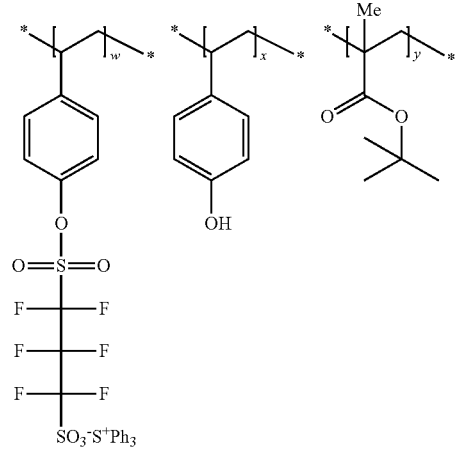
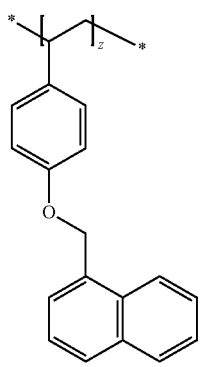
w/x/y/z = 9/53/30/8
Mw = 9100, PDI = 1.49
(P-15)
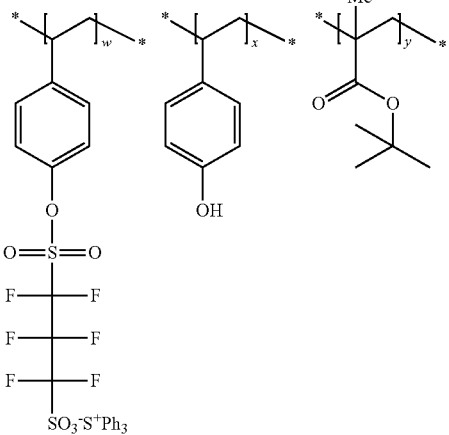
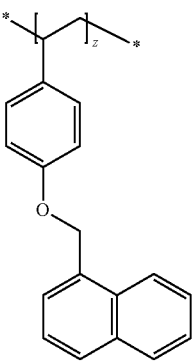
w/x/y/z = 10/57/24/9
Mw = 8700, PDI = 1.55
(P-16)
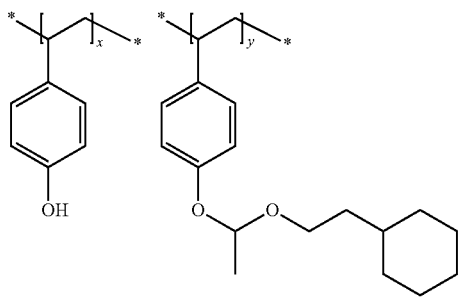
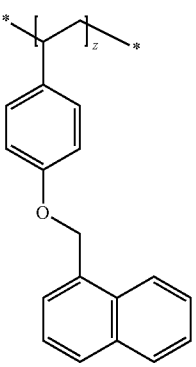
x/y/z = 77/20/3
Mw = 12800, PDI = 1.08

(P-17)
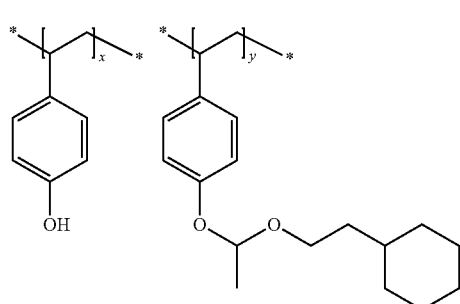
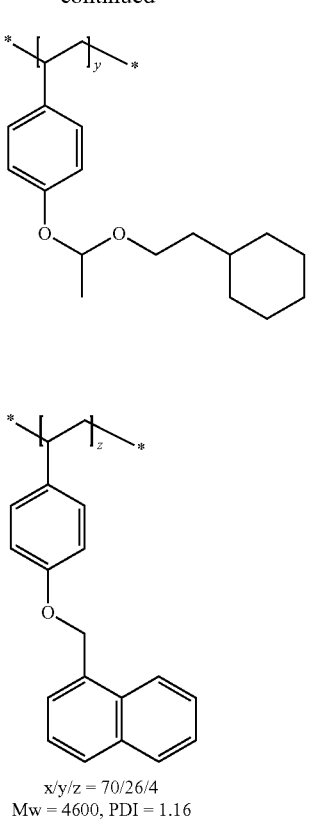
x/y/z = 70/26/4
Mw = 4600, PDI = 1.16
(P-18)
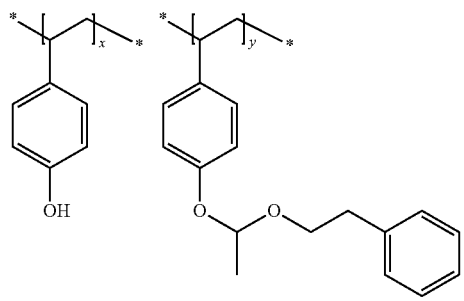
x/y/z = 76/21/3
Mw = 12600, PDI = 1.08
(P-19)
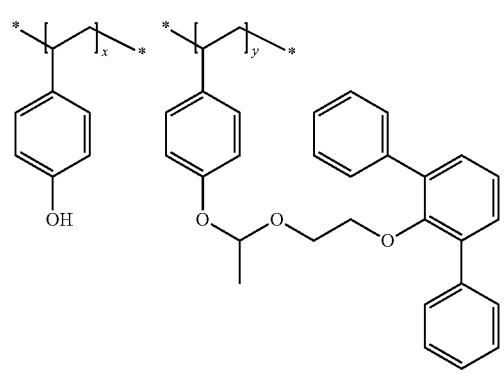
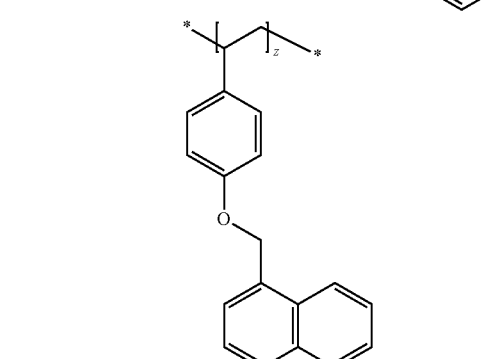
x/y/z = 78/18/4
Mw = 4600, PDI = 1.17
(P-20)
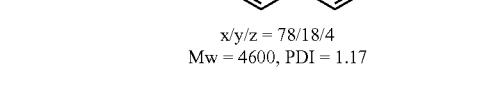
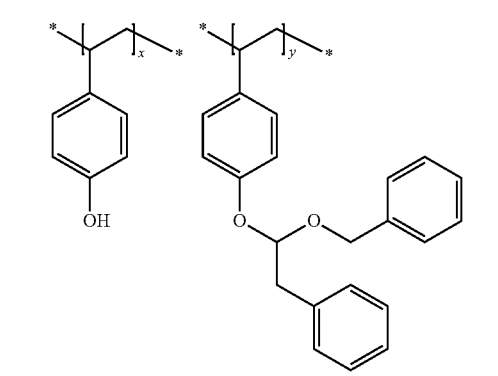
x/y/z = 83/14/3
Mw = 12100, PDI = 1.07

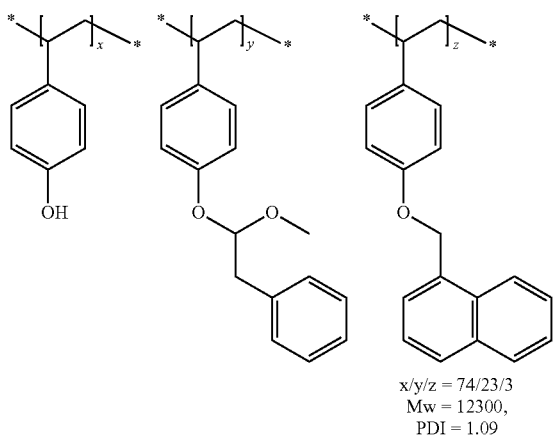

(P-21)

x/y/z = 74/23/3
Mw = 12300,
PDI = 1.09

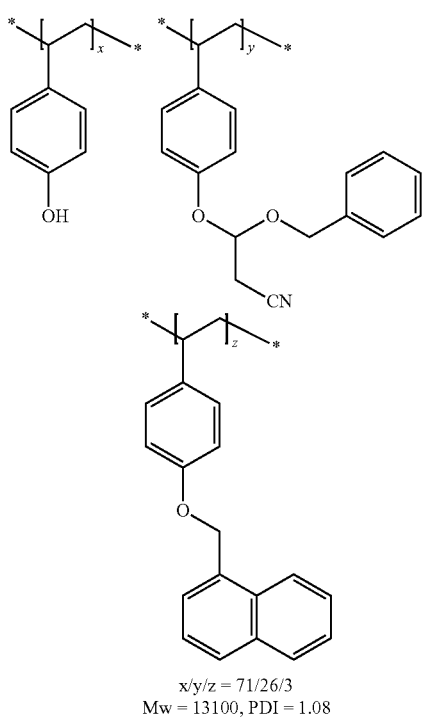

(P-22)

x/y/z = 71/26/3
Mw = 13100, PDI = 1.08

Comparative Synthesis Example 1

Synthesis of Resin (R-1)

Resin (R-1) shown below was obtained in accordance with the method described in JP-A-2009-86354.

Comparative Synthesis Example 2

Synthesis of Resin (R-2)

30 g of poly(p-hydroxystyrene) (VP2500) produced by Nippon Soda Co., Ltd. was dissolved in 120 mL of PGMEA, and 11.56 g of 2-cyclohexylethyl vinyl ether and 1.45 g of 2% camphorsulfonic acid (PGMEA solution) were added. The mixture was stirred at room temperature for 4 hours, and 1.05 g of 6% triethylamine (PGMEA solution) was added thereto. The mixture was stirred for a while, and the reaction solution was then transferred to a separating funnel containing 165 mL of ethyl acetate. The organic layer was washed with 200 mL of distilled water three times and then concentrated by an evaporator, and ethyl acetate was removed to obtain 128.2 g of a PGMEA solution (27.7%) of Resin (R-2).

Comparative Synthesis Example 3

Synthesis of Resin (R-3)

10 g of poly(p-hydroxystyrene) (VP8000) produced by Nippon Soda Co., Ltd. was dissolved in 60 mL of PGMEA, and 8.67 g of triethylamine was added thereto. The reaction solution was cooled in an ice bath, and a solution obtained by dissolving 0.80 g of 2-naphthoyl chloride in 10 mL of PGMEA was added dropwise. After stirring the reaction solution at room temperature for 4 hours, the reaction was stopped by adding distilled water. The reaction product was diluted with 100 mL of ethyl acetate and washed with 100 mL of distilled water five times, and 10 mL of PGMEA was added to the organic layer. Thereafter, ethyl acetate was removed by an evaporator.

To the reaction solution above, 1.68 g of ethyl vinyl ether and 0.48 g of 2% camphorsulfonic acid (PGMEA solution) were added, and the mixture was stirred at room temperature for 4 hours. Thereafter, 0.35 g of 6% triethylamine (PGMEA solution) was added and after stirring for a while, and the reaction solution was transferred to a separating funnel containing 55 mL of ethyl acetate. The organic layer was washed with 50 mL of distilled water three times and then concentrated by an evaporator, and ethyl acetate was removed. This reaction solution was added dropwise in 800 mL of hexane. A part of the obtained precipitate was sampled for NMR measurement, and the remaining was dissolved in 25 g of PGMEA. From the obtained solution, the low boiling point solvent was removed by an evaporator to obtain 36.1 g of a PGMEA solution (28.9%) of Resin (R-3).

The structure, the compositional ratio, the weight average molecular weight and the polydispersity of each of Resins (R-1) to (R-3) are shown below.

(R-1)

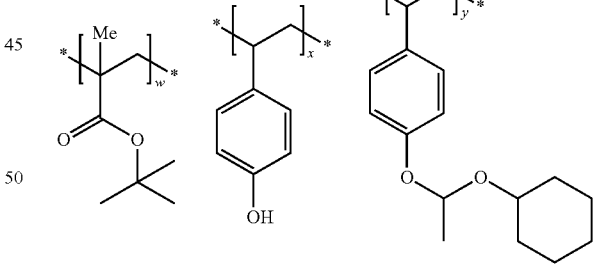

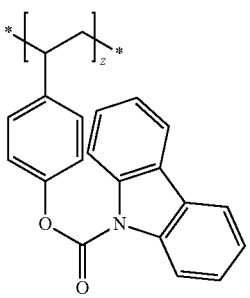

w/x/y/z = 30/59/5/6
Mw = 17000, PDI = 1.38

215
-continued
(R-2)
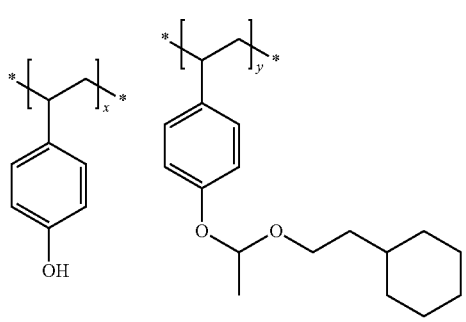
x/y = 70/30
Mw = 4300, PDI = 1.15
(R-3)
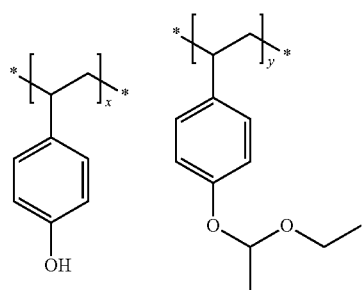
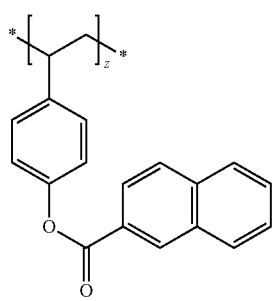
x/y/z = 68/27/5
Mw = 12100, PDI = 1.08
[Photoacid Generator]
As the photoacid generator, the compounds shown by the following formulae were used.
PAG-1
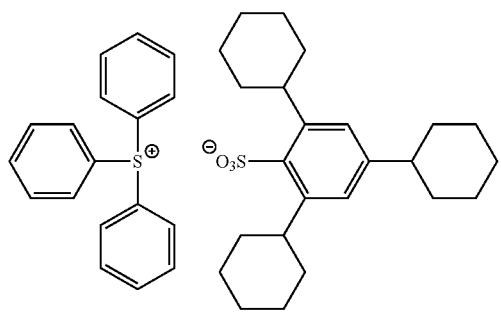
216
-continued
PAG-2
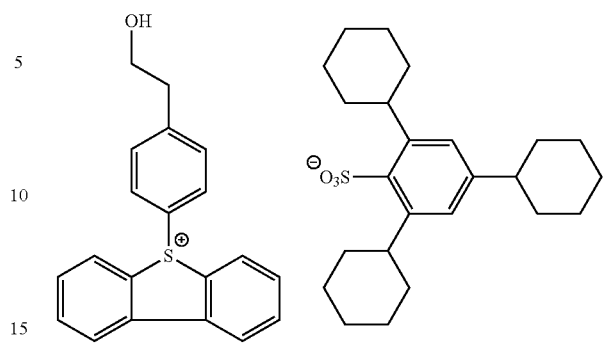
PAG-3
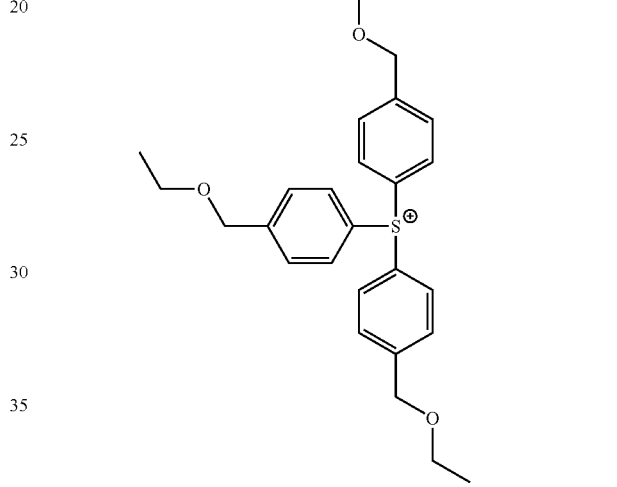
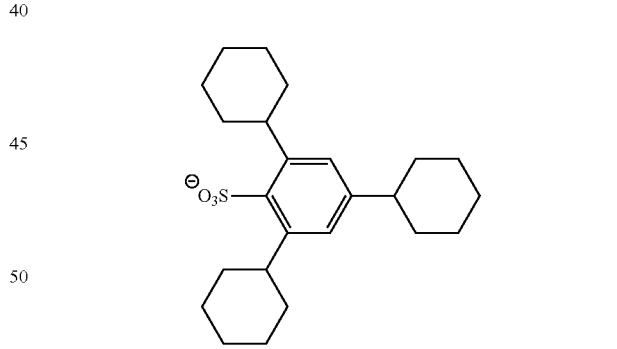
PAG-4
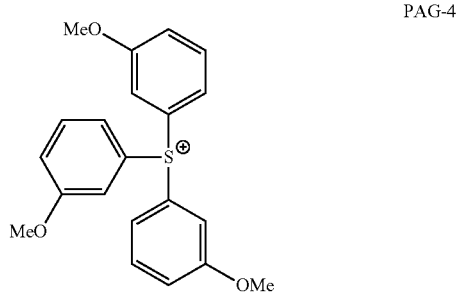

-continued

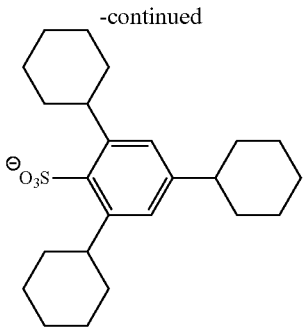

PAG-5

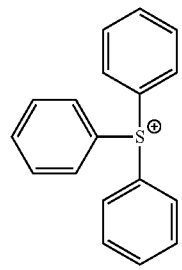

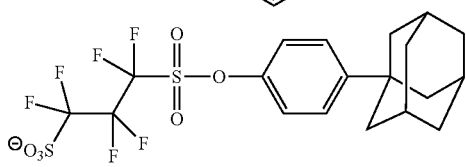

PAG-6

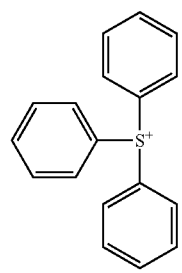

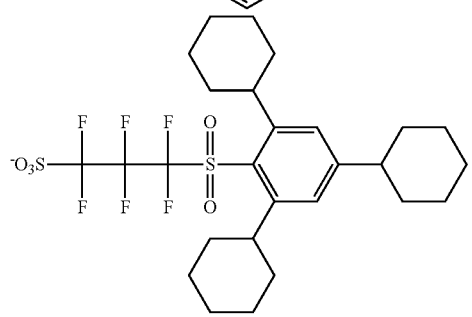

Synthesis Example

PAG-1

(Synthesis of Tricyclohexylbenzene)

6.83 g of aluminum chloride was added to 20.0 g of benzene, and the mixture was stirred under cooling at 3° C. Subsequently, 40.4 g of cyclohexyl chloride was slowly added dropwise and after the dropwise addition, the reaction solution was stirred at room temperature for 5 hours and then poured in ice water. The organic layer was extracted with ethyl acetate, and the obtained organic layer was distilled off under reduced pressure at 40° C., further distilled off under reduced pressure at 170° C., then cooled to room temperature and recrystallized by charging 50 ml of acetone thereinto. The precipitated crystals were collected by filtration to obtain 14 g of tricyclohexylbenzene.

(Synthesis of Sodium Tricyclohexylbenzenesulfonate)

30 g of tricyclohexylbenzene was dissolved in 50 ml of methylene chloride, and the solution was stirred under cooling at 3° C. Thereto, 15.2 g of chlorosulfonic acid was slowly added dropwise and after the dropwise addition, the reaction solution was stirred at room temperature for 5 hours. Subsequently, 10 g of ice was charged, and 40 g of an aqueous 50% sodium hydroxide solution was charged. Furthermore, 20 g of ethanol was added, and the mixture was stirred at 50° C. for 1 hour. Insoluble matters were removed by filtration, and the residue was distilled off under reduced pressure at 40° C. The precipitated crystals were collected by filtration and then washed with hexane to obtain 30 g of sodium 1,3,5-tricyclohexylbenzenesulfonate.

(Synthesis of PAG-1)

4.0 g of triphenylsulfonium bromide was dissolved in 20 ml of methanol, and 5.0 g of sodium 1,3,5-tricyclohexylbenzenesulfonate dissolved in 20 ml of methanol was added. After stirring at room temperature for 2 hours and adding 50 ml of ion-exchanged water, the reaction solution was extracted with chloroform, and the obtained organic layer was washed with water and then distilled off under reduced pressure at 40° C. The obtained crystal was recrystallized from a methanol/ethyl acetate solvent to obtain 5.0 g of Compound PAG-1.

$^1$H-NMR (400 MHz, CDCl$_3$) δ=7.85 (d, 6H), 7.68 (t, 3H), 7.59 (t. 6H), 6.97 (s, 2H), 4.36-4.27 (m, 2H), 2.48-2.38 (m, 1H), 1.97-1.16 (m, 30H).

PAG-2 to PAG-6 were synthesized in the same manner.

[Basic Compound]

As the basic compound, the compounds shown by the following formulae were used.

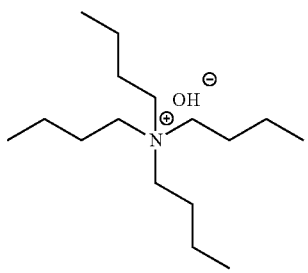

BASE-1

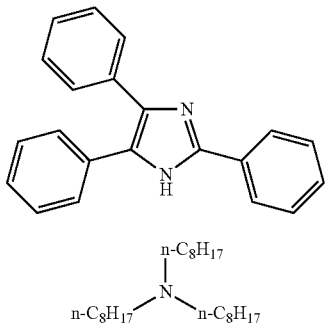

BASE-2

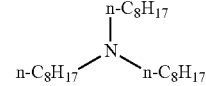

BASE-3

[Surfactant and Solvent]

As the surfactant, the followings were used.
W-1: Megaface F176 (produced by Dainippon Ink & Chemicals, Inc., fluorine-containing)
W-2: Megaface R08 (produced by Dainippon Ink & Chemicals, Inc., fluorine- and silicon-containing)
W-3: PF6320 (produced by OMNOVA, fluorine-containing)

As the solvent, the followings were used.
S1: Propylene glycol monomethyl ether acetate (PGMEA)
S2: Propylene glycol monomethyl ether (PGME)

Examples 1 to 23 and Comparative Examples 1 to 3

The components shown in Table 2 below were dissolved in the solvent shown in Table 2, and this solution was filtered through a polytetrafluoroethylene filter having a pore size of 0.1 μm, whereby positive resist solutions having the entire solid content concentration shown in Table 2 were prepared. Incidentally, the concentration of each component shown in Table 2 is the mass concentration based on the mass of the entire solid content.

<Evaluation of Resist>

The prepared positive resist solution was uniformly coated by a spin coater on a silicon substrate subjected to a hexamethyldisilazane treatment, and then heated and dried using a hot plate at 130° C. over 90 seconds, whereby a resist film having a thickness of 100 nm was formed.

This resist film was irradiated with electron beams by using an electron beam irradiation apparatus (HL750, manufactured by Hitachi Ltd.; accelerating voltage: 50 keV) and immediately after the irradiation, heated on a hot plate at 120° C. for 90 seconds. Thereafter, the resist film was developed using an aqueous tetramethylammonium hydroxide solution with a concentration of 2.38 mass % at 23° C. for 60 seconds, rinsed with pure water for 30 seconds and dried. In this way, a line-and-space pattern (line:space=1:1) and an isolated line pattern (line:space=1:>100) were formed. In the following, the line-and-space pattern is sometimes simply referred to as L&S, and the isolated line pattern is sometimes simply referred to as IL.

[Sensitivity]

The cross-sectional profile of each pattern obtained was observed using a scanning electron microscope (S4800, manufactured by Hitachi Ltd.). In both cases of L&S pattern and IL pattern, the minimum irradiation energy when resolving a line width of 100 nm was defined as the sensitivity ($\mu C/cm^2$).

[Resolution]

The limiting resolution (the minimum line width when a line and a space were separately resolved) at the irradiation dose giving the above-described sensitivity was defined as the resolution (nm).

[Residual Film Ratio (Dry Etching Resistance)]

A positive resist film having a thickness of 100 nm was formed on a wafer treated with hexamethyldisilazane, and this film was subjected to plasma etching at 23° C. for 30 seconds by using a mixed gas of $CF_4$ (10 mL/min), $O_2$ (20 mL/min) and Ar (1,000 mL/min). The thickness of the resist film after plasma etching was measured, and the film thickness after etching was divided by the film thickness before etching and then multiplied by 100 to obtain the residual film ratio (%). A large residual film ratio indicates higher dry etching resistance.

TABLE 2

| Example | Resin (P) (mass %) | Photoacid Generator (mass %) | Basic Compound (mass %) | Solvent (mass ratio) | Surfactant (mass %) | Entire Solid Content Concentration (mass %) | CLogP Value of Resin (P) after Exposure | Sensitivity (L&S) ($\mu C/cm^2$) | Sensitivity (IL) ($\mu C/cm^2$) | Resolution (L&S) (nm) | Resolution (IL) (nm) | Residual Film Ratio (%) |
|---|---|---|---|---|---|---|---|---|---|---|---|---|
| Example 1 | P-1 (93.95) | PAG-1 (5.5) | BASE-1 (0.5) | S1/S2 (80/20) | W-1 (0.05) | 4.0 | 2.68 | 20.1 | 9.7 | 50 | 50 | 95.1 |
| Example 2 | P-1 (93.65) | PAG-2 (5.8) | BASE-1 (0.5) | S1/S2 (80/20) | W-1 (0.05) | 4.0 | 2.68 | 20.3 | 9.2 | 50 | 50 | 95.3 |
| Example 3 | P-1 (92.75) | PAG-3 (6.7) | BASE-1 (0.5) | S1/S2 (80/20) | W-2 (0.05) | 4.0 | 2.68 | 20.5 | 9.4 | 37.5 | 50 | 95.8 |
| Example 4 | P-1 (93.25) | PAG-4 (6.2) | BASE-1 (0.5) | S1/S2 (80/20) | W-1 (0.05) | 4.0 | 2.68 | 20.5 | 9.5 | 37.5 | 37.5 | 95.4 |
| Example 5 | P-1 (92.68) | PAG-3 (6.7) | BASE-2 (0.57) | S1/S2 (80/20) | W-1 (0.05) | 4.0 | 2.68 | 20.1 | 9.4 | 50 | 50 | 95.7 |
| Example 6 | P-1 (92.57) | PAG-3 (6.7) | BASE-3 (0.68) | S1/S2 (80/20) | W-1 (0.05) | 4.0 | 2.68 | 19.8 | 9.2 | 50 | 50 | 95.7 |
| Example 7 | P-2 (93.25) | PAG-4 (6.2) | BASE-1 (0.5) | S1/S2 (80/20) | W-1 (0.05) | 4.0 | 2.68 | 21.1 | 10.0 | 37.5 | 50 | 98.3 |
| Example 8 | P-3 (92.75) | PAG-3 (6.7) | BASE-1 (0.5) | S1/S2 (80/20) | W-2 (0.05) | 4.0 | 2.68 | 20.8 | 9.6 | 50 | 50 | 96.4 |
| Example 9 | P-4 (93.25) | PAG-4 (6.2) | BASE-1 (0.5) | S1/S2 (80/20) | W-1 (0.05) | 4.0 | 2.76 | 20.1 | 9.1 | 37.5 | 50 | 97.1 |
| Example 10 | P-5 (93.25) | PAG-4 (6.2) | BASE-1 (0.5) | S1/S2 (80/20) | W-2 (0.05) | 4.0 | 2.88 | 21.0 | 9.8 | 37.5 | 37.5 | 96.6 |
| Example 11 | P-6 (92.75) | PAG-3 (6.7) | BASE-1 (0.5) | S1/S2 (80/20) | W-1 (0.05) | 4.0 | 2.86 | 21.2 | 10.1 | 50 | 50 | 96.8 |
| Example 12 | P-7 (99.45) | — (0) | BASE-1 (0.5) | S1/S2 (80/20) | W-1 (0.05) | 4.0 | 2.74 | 20.5 | 9.5 | 37.5 | 50 | 96.7 |
| Example 13 | P-8 (92.95) | PAG-5 (6.5) | BASE-1 (0.5) | S1/S2 (80/20) | W-1 (0.05) | 4.0 | 2.95 | 19.2 | 8.6 | 50 | 50 | 95.3 |
| Example 14 | P-9 (92.05) | PAG-6 (7.4) | BASE-1 (0.5) | S1/S2 (80/20) | W-1 (0.05) | 4.0 | 2.70 | 18.8 | 8.1 | 50 | 50 | 96.7 |
| Example 15 | P-10 (92.05) | PAG-6 (7.4) | BASE-1 (0.5) | S1/S2 (80/20) | W-1 (0.05) | 4.0 | 2.72 | 21.1 | 10.2 | 50 | 50 | 95.5 |

TABLE 2-continued

| Example | Resin (P) (mass %) | Photoacid Generator (mass %) | Basic Compound (mass %) | Solvent (mass ratio) | Surfactant (mass %) | Entire Solid Content Concentration (mass %) | CLogP Value of Resin (P) after Exposure | Sensitivity (L&S) ($\mu C/cm^2$) | Sensitivity (IL) ($\mu C/cm^2$) | Resolution (L&S) (nm) | Resolution (IL) (nm) | Residual Film Ratio (%) |
|---|---|---|---|---|---|---|---|---|---|---|---|---|
| Example 16 | P-11 (99.5) | — (0) | BASE-1 (0.5) | S1/S2 (80/20) | — | 4.0 | 2.74 | 19.1 | 9.0 | 37.5 | 37.5 | 96.5 |
| Example 17 | P-12 (92.05) | PAG-6 (7.4) | BASE-1 (0.5) | S1/S2 (80/20) | W-1 (0.05) | 4.0 | 2.64 | 19.6 | 9.4 | 37.5 | 50 | 96.1 |
| Example 18 | P-13 (92.05) | PAG-6 (7.4) | BASE-1 (0.5) | S1/S2 (80/20) | W-1 (0.05) | 4.0 | 2.48 | 19.9 | 9.6 | 50 | 50 | 95.2 |
| Example 19 | P-14 (99.45) | — (0) | BASE-1 (0.5) | S1/S2 (80/20) | W-1 (0.05) | 4.0 | 2.44 | 17.8 | 8.2 | 50 | 50 | 95.4 |
| Example 20 | P-15 (99.45) | — (0) | BASE-1 (0.5) | S1/S2 (80/20) | W-1 (0.05) | 4.0 | 2.61 | 17.6 | 8.1 | 37.5 | 37.5 | 95.4 |
| Example 21 | P-11 (97.25) | PAG-4 (2.0) | BASE-1 (0.7) | S1/S2 (80/20) | W-1 (0.05) | 4.0 | 2.74 | 18.1 | 8.8 | 37.5 | 50 | 97.0 |
| Example 22 | P-5 (46.65) P-6 (46.60) | PAG-4 (6.2) | BASE-1 (0.5) | S1/S2 (80/20) | W-1 (0.05) | 4.0 | 2.87 | 21.3 | 10.0 | 50 | 50 | 96.6 |
| Example 23 | P-1 (93.00) | PAG-3 (3.35) PAG-4 (3.1) | BASE-1 (0.5) | S1/S2 (80/20) | W-1 (0.05) | 4.0 | 2.68 | 19.7 | 9.5 | 50 | 50 | 95.6 |
| Comparative Example 1 | R-1 (92.95) | PAG-5 (6.5) | BASE-1 (0.5) | S1/S2 (80/20) | W-1 (0.05) | 4.0 | 2.21 | 19.8 | 9.4 | 62.5 | 75 | 94.1 |
| Comparative Example 2 | R-2 (92.75) | PAG-3 (6.7) | BASE-1 (0.5) | S1/S2 (80/20) | W-1 (0.05) | 4.0 | 2.50 | 20.3 | 9.9 | 62.5 | 62.5 | 92.3 |
| Comparative Example 3 | R-3 (92.75) | PAG-3 (6.7) | BASE-1 (0.5) | S1/S2 (80/20) | W-1 (0.05) | 4.0 | 2.74 | 20.1 | 9.8 | 50 | 62.5 | 95.2 |

In the above, the C log P value of the resin (P) after exposure of Example 22 is the arithmetic average value of C log P values after exposure of Resin (P-5) and Resin (P-6).

As seen from Table 1, the compositions of Examples 1 to 23 were excellent in the resolution when forming an IL pattern as compared with the compositions of Comparative Examples 1 to 3. Furthermore, the compositions of Examples 1 to 23 were excellent also in the plasma etching resistance and the resolution when forming an L&S pattern.

Examples 24 to 33 and Comparative Examples 4 to 6

For confirming the performance of the resist film on a mask blank, preparation of a positive resist solution, formation of a resist film and evaluation of the resist were performed in the same manner as in Examples 1 to 23 except for changing the silicon substrate treated with hexamethyldisilazane to a glass substrate on which a chromium oxide film (light-shielding film) of 100 nm in thickness was provided by chemical deposition, changing the heating conditions after the coating of the resist solution from 130° C. and 90 seconds to 130° C. and 600 seconds, and changing the heating conditions after the irradiation of electron beams from 120° C. and 90 seconds to 120° C. and 600 seconds. The results are shown in Table 3.

TABLE 3

| Example | Resin (P) (mass %) | Photoacid Generator (mass %) | Basic Compound (mass %) | Solvent (mass ratio) | Surfactant (mass %) | Entire Solid Content Concentration (mass %) | CLogP Value of Resin (P) after Exposure | Sensitivity (L&S) ($\mu C/cm^2$) | Sensitivity (IL) ($\mu C/cm^2$) | Resolution (L&S) (nm) | Resolution (IL) (nm) | Residual Film Ratio (%) |
|---|---|---|---|---|---|---|---|---|---|---|---|---|
| Example 24 | P-16 (88.17) | PAG-4 (11.00) | BASE-1 (0.82) | S1/S2 (80/20) | W-3 (0.01) | 4.0 | 2.61 | 39.4 | 14.9 | 50 | 50 | 96.3 |
| Example 25 | P-16 (92.84) | PAG-1 (6.46) | BASE-1 (0.69) | S1/S2 (80/20) | W-3 (0.01) | 4.0 | 2.61 | 40.2 | 15.1 | 50 | 50 | 96.6 |
| Example 26 | P-17 (92.84) | PAG-1 (6.46) | BASE-1 (0.69) | S1/S2 (80/20) | W-3 (0.01) | 4.0 | 2.64 | 38.7 | 14.6 | 50 | 37.5 | 95.5 |
| Example 27 | P-17 (88.17) | PAG-4 (11.00) | BASE-1 (0.82) | S1/S2 (80/20) | W-3 (0.01) | 4.0 | 2.64 | 39.0 | 14.7 | 37.5 | 50 | 95.2 |
| Example 28 | P-16 (88.18) | PAG-4 (11.00) | BASE-1 (0.82) | S1/S2 (80/20) | — (0) | 4.0 | 2.61 | 39.6 | 14.8 | 50 | 50 | 96.7 |
| Example 29 | P-18 (88.17) | PAG-4 (11.00) | BASE-1 (0.82) | S1/S2 (80/20) | W-3 (0.01) | 4.0 | 2.61 | 40.5 | 15.2 | 50 | 50 | 97.8 |
| Example 30 | P-19 (88.17) | PAG-4 (11.00) | BASE-1 (0.82) | S1/S2 (80/20) | W-3 (0.01) | 4.0 | 2.64 | 37.9 | 14.2 | 37.5 | 50 | 99.1 |
| Example 31 | P-20 (88.17) | PAG-4 (11.00) | BASE-1 (0.82) | S1/S2 (80/20) | W-3 (0.01) | 4.0 | 2.61 | 39.1 | 14.7 | 50 | 50 | 98.3 |
| Example 32 | P-21 (92.84) | PAG-1 (6.46) | BASE-1 (0.69) | S1/S2 (80/20) | W-3 (0.01) | 4.0 | 2.61 | 41.0 | 15.2 | 50 | 50 | 97.6 |

TABLE 3-continued

| Example | Resin (P) (mass %) | Photoacid Generator (mass %) | Basic Compound (mass %) | Solvent (mass ratio) | Surfactant (mass %) | Entire Solid Content Concentration (mass %) | CLogP Value of Resin (P) after Exposure | Sensitivity (L&S) ($\mu C/cm^2$) | Sensitivity (IL) ($\mu C/cm^2$) | Resolution (L&S) (nm) | Resolution (IL) (nm) | Residual Film Ratio (%) |
|---|---|---|---|---|---|---|---|---|---|---|---|---|
| Example 33 | P-22 (92.84) | PAG-1 (6.46) | BASE-1 (0.69) | S1/S2 (80/20) | W-3 (0.01) | 4.0 | 2.61 | 38.3 | 14.9 | 37.5 | 50 | 97.2 |
| Comparative Example 4 | R-1 (88.17) | PAG-4 (11.00) | BASE-1 (0.82) | S1/S2 (80/20) | W-3 (0.01) | 4.0 | 2.21 | 41.1 | 16.2 | 62.5 | 75 | 94.9 |
| Comparative Example 5 | R-2 (88.17) | PAG-4 (11.00) | BASE-1 (0.82) | S1/S2 (80/20) | W-3 (0.01) | 4.0 | 2.50 | 39.2 | 19.6 | 50 | 62.5 | 92.2 |
| Comparative Example 6 | R-3 (88.17) | PAG-4 (11.00) | BASE-1 (0.82) | S1/S2 (80/20) | W-3 (0.01) | 4.0 | 2.74 | 38.2 | 18.8 | 62.5 | 62.5 | 94.8 |

As seen from Table 3, the compositions of Examples 24 to 33 were excellent in the resolution when forming an IL pattern as compared with the compositions of Comparative Examples 4 to 6. Furthermore, the compositions of Examples 24 to 33 were excellent also in the plasma etching resistance and the resolution when forming an L&S pattern.

INDUSTRIAL APPLICABILITY

According to the present invention, an actinic ray-sensitive or radiation-sensitive resin composition capable of forming a pattern simultaneously satisfying high sensitivity, high resolution and good dry etching resistance even in the formation of an isolated pattern, a resist film using the composition, and a pattern forming method can be provided.

The entire disclosure of Japanese Patent Application No. 2010-19677 filed on Jan. 29, 2010, Japanese Patent Application No. 2010-190109 filed on Aug. 26, 2010, from which the benefit of foreign priority has been claimed in the present application, is incorporated herein by reference, as if fully set forth.

The invention claimed is:

1. An actinic ray-sensitive or radiation-sensitive resin composition comprising (P) a resin having a repeating unit represented by the following formula (1):

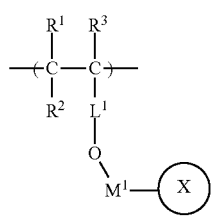

wherein each of $R^1$ to $R^3$ independently represents a hydrogen atom or a monovalent substituent,
$L^1$ represents an arylene group,
$M^1$ represents an alkylene group, a cycloalkylene group, an alkenylene group, —O—, —S— or a group comprising a combination of two or more of these members,
$M^1$ is a group incapable of decomposing by the action of acid,
X represents a group containing a plurality of aromatic rings, and the plurality of aromatic rings are condensed to form a polycyclic structure or connected to each other through a single bond.

2. The actinic ray-sensitive or radiation-sensitive resin composition according to claim 1, wherein the resin (P) further contains a repeating unit represented by the following formula (2) and at least either one of a repeating unit represented by the following formula (3) and a repeating unit represented by the following formula (4):

$$\begin{array}{c} R^4 \;\; R^6 \\ | \;\;\; | \\ -(C-C)- \\ | \;\;\; | \\ R^5 \;\; L^2-OH \end{array} \quad (2)$$

$$\begin{array}{c} R^7 \;\; R^9 \\ | \;\;\; | \\ -(C-C)- \\ | \;\;\; | \\ R^8 \;\; L^3-OY^1 \end{array} \quad (3)$$

$$\begin{array}{c} R^{41} \;\; R^{43} \\ | \;\;\; | \\ -(C-C)- \\ | \;\;\; | \\ R^{42} \;\; L^5 \\ \;\;\;\;\;\;\;\; | \\ \;\;\;\;\;\;\; O{=}C{-}OY^2 \end{array} \quad (4)$$

wherein each of $R^4$ to $R^9$ and $R^{41}$ to $R^{43}$ independently represents a hydrogen atom or a monovalent substituent,
each of $L^2$ and $L^3$ independently represents an arylene group,
$L^5$ represents a single bond or a divalent linking group, and
each of $Y^1$ and $Y^2$ represents a group capable of leaving by the action of an acid.

3. The actinic ray-sensitive or radiation-sensitive resin composition according to claim 2, wherein the resin (P) contains a repeating unit represented by formula (3) and at the same time, $Y^1$ is a group represented by the following formula (5):

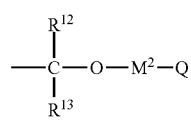

wherein each of $R^{12}$ and $R^{13}$ independently represents a hydrogen atom, an alkyl group, a cycloalkyl group, an aryl group, an aralkyl group, or a combination of two or more thereof,
$M^2$ represents a single bond or a divalent linking group, Q represents an alkyl group, an alicyclic group which may contain a heteroatom, or an aromatic ring group which may contain a heteroatom, and at least two members of $R^{12}$, $R^{13}$, $M^2$ and Q may combine with each other to form a ring.

4. The actinic ray-sensitive or radiation-sensitive resin composition according to claim 2, wherein the C Log P value of the resin (P) after leaving of $Y^1$ and $Y^2$ is 2.6 or more.

5. The actinic ray-sensitive or radiation-sensitive resin composition according to claim 2, wherein the resin (P) further contains a repeating unit represented by the following formula (6) and at the same time, the C Log P value of the resin (P) after leaving of $Y^1$ and $Y^2$ and decomposition of $S^1$ in the following formula (6) to generate an acid in the side chain is 2.6 or more,

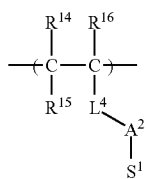

(6)

wherein each of $R^{14}$, $R^{15}$ and $R^{16}$ independently represents a hydrogen atom or a monovalent substituent, $L^4$ represents an arylene group, $A^2$ represents a single bond or a divalent linking group, and $S^1$ represents a structural moiety capable of decomposing upon irradiation with an actinic ray or radiation to generate an acid in the side chain.

6. The actinic ray-sensitive or radiation-sensitive resin composition according to claim 1, wherein X is a group formed by removing one arbitrary hydrogen atom bonded to an atom constituting a plurality of aromatic rings or $R^{11}$ in the structural moiety represented by any one of the following formulae (X1) to (X6):

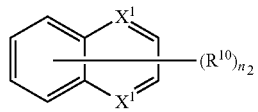

(X1)

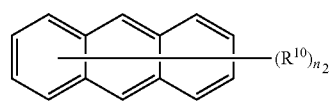

(X2)

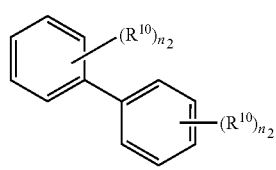

(X3)

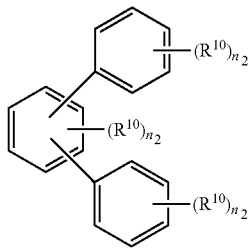

(X4)

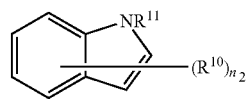

(X5)

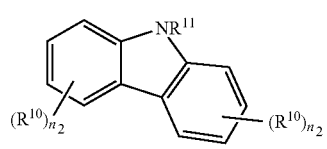

(X6)

wherein $R^{10}$ represents a monovalent substituent and when a plurality of $R^{10}$'s are present, each $R^{10}$ may be the same as or different from every other $R^{10}$;

$R^{11}$ represents a hydrogen atom, an alkyl group, a cycloalkyl group or a bond bonded to $M^1$;

$n_2$ is independently an integer of 0 to 14;

$X^1$ represents CH or N, and two $X^1$'s may be the same or different; and each of $M^1$ and $R^{10}$ may be bonded to any atom constituting the plurality of aromatic rings.

7. The actinic ray-sensitive or radiation-sensitive resin composition according to claim 1, wherein the resin (P) further contains a repeating unit represented by the following formula (6):

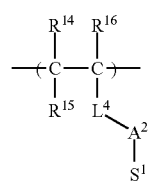

(6)

wherein each of $R^{14}$, $R^{15}$ and $R^{16}$ independently represents a hydrogen atom or a monovalent substituent, $L^4$ represents an arylene group, $A^2$ represents a single bond or a divalent linking group, and $S^1$ represents a structural moiety capable of decomposing upon irradiation with an actinic ray or radiation to generate an acid in the side chain.

8. The actinic ray-sensitive or radiation-sensitive resin composition according to claim 1, wherein the molecular weight distribution (Mw/Mn) of the resin (P) is from 1.00 to 1.30.

9. The actinic ray-sensitive or radiation-sensitive resin composition according to claim 1, which is exposed with an electron beam, an X-ray or EUV light.

10. A resist film formed using the actinic ray-sensitive or radiation-sensitive resin composition according to claim 1.

11. A resist-coated mask blank coated with the resist film according to claim 10.

12. A pattern forming method comprising exposing the resist-coated mask blank according to claim 11 and developing the exposed mask blank.

13. A pattern forming method comprising exposing the resist film according to claim 10 and developing the exposed film.

14. The pattern forming method according to claim 13, wherein the exposure is performed using an electron beam, an X-ray or EUV light.

15. The actinic ray-sensitive or radiation-sensitive resin composition according to claim 1, wherein $M^1$ is an alkylene group.

* * * * *